(12) United States Patent
Kiyomoto et al.

(10) Patent No.: US 7,300,183 B2
(45) Date of Patent: Nov. 27, 2007

(54) OPTICAL DEVICE AND APPARATUS COMPRISING THE OPTICAL DEVICE

(75) Inventors: Hironobu Kiyomoto, Kyoto (JP); Hayami Hosokawa, Tsuzuki-gun (JP); Naru Yasuda, Uji (JP); Kenji Homma, Kyoto (JP); Yukari Terakawa, Kyoto (JP)

(73) Assignee: Omron Corporation, Kyoto (JP)

( * ) Notice: Subject to any disclaimer, the term of this patent is extended or adjusted under 35 U.S.C. 154(b) by 100 days.

(21) Appl. No.: 11/135,581

(22) Filed: May 23, 2005

(65) Prior Publication Data

US 2005/0212089 A1    Sep. 29, 2005

Related U.S. Application Data

(63) Continuation of application No. 10/148,242, filed as application No. PCT/JP00/04807 on Jul. 17, 2000, now abandoned.

(30) Foreign Application Priority Data

| Nov. 30, 1999 | (JP) | ................... 11-341344 |
| Feb. 4, 2000 | (JP) | ................... 2000-28330 |
| Mar. 15, 2000 | (JP) | ................... 2000-73058 |
| Mar. 16, 2000 | (JP) | ................... 2000-74976 |
| Mar. 28, 2000 | (JP) | ................... 2000-89859 |
| Jul. 14, 2000 | (JP) | ................... 2000-214261 |

(51) Int. Cl.
*F21V 7/00* (2006.01)
*F21V 5/00* (2006.01)
*F21V 7/04* (2006.01)

(52) U.S. Cl. .................. 362/297; 362/327; 362/555; 250/216

(58) Field of Classification Search ............... 362/296, 362/297, 326, 327, 555, 310; 345/82–84; 353/98, 99; 250/216, 239; 257/98
See application file for complete search history.

(56) References Cited

U.S. PATENT DOCUMENTS 5,084,804 A * 1/1992 Schairer ..................... 362/459
6,342,670 B1 * 1/2002 Lin et al. .................... 136/251

FOREIGN PATENT DOCUMENTS

JP          1-143368        6/1989

OTHER PUBLICATIONS

English translation of Japanese Patent Application No. H1-143368, Publication Date: Jun. 5, 1989, 10 pages.

* cited by examiner

*Primary Examiner*—John Anthony Ward
(74) *Attorney, Agent, or Firm*—Osha Liang LLP

(57) ABSTRACT

On a front wall of a mold resin (13) sealing a light emitter (12), a direct emission region (18), through which the light emitted from the light emitter (12) directly passes to the outside, and a total reflection region (19), by which the light emitted from the light emitter (12) is totally reflected, are formed. The direct emission region (18) is formed into a shape of a convex lens. A light reflection portion (20) which is made of a concave mirror is provided on the rear face of the mold resin (13). When a part of the light emitted from the light emitter (12) passes through the direct emission region (18), it is affected by the lens to be emitted to the front direction. After another part of the light emitted from the light emitter (12) is totally reflected by the total reflection region (19), it is reflected by the light reflection portion (20) to be emitted to the front direction through the total reflection region (19).

7 Claims, 111 Drawing Sheets

PRIOR ART

EMISSION LIGHT (a)

(b)

LIGHT EMISSION AREA
BY LIGHT EMISSION SOURCE

OPTICAL DEVICE AND APPARATUS COMPRISING THE OPTICAL DEVICE

CROSS-REFERENCE TO RELATED APPLICATION

This application is a continuation of U.S. patent application Ser. No. 10/148,242, filed May 29, 2002 now abandoned.

TECHNICAL FIELD OF INVENTION

This invention relates to an optical device and an apparatus employing the optical device. More specifically, this invention relates to a light emission source having a solid light emitter such as a light emitting diode, a light receiver having a photo detector such as a photo diode, phototransistor, a photoelectric transducer (a solar cell) etc., an optical component employing the light emission source and the photo detector, and an optical device including the light emission source, the light receiver, and the optical component. Further, this invention relates to a light emission method, a light incident method and a method for manufacturing an optical component. In addition, this invention relates to a photoelectric sensor employing the optical device, a self light generating apparatus, a display apparatus, a light source for an automobile lamp and an outdoor display apparatus.

BACKGROUND OF INVENTION (Light Emission Source)

In a conventional light emission source in which a light emitting diode is sealed in a mold resin, light emitted from the light emitting diode to its front is emitted from the light emission source as it is, but light emitted in a diagonal direction from the light emitting diode is totally reflected on a boundary surface of the mold resin and scattered in an inside wall of a housing to be lost, resulting into deterioration of use efficiency of light.

Heretofore, there has been proposed a light emission source capable of efficiently emitting the light emitted in a diagonal direction which is disclosed in the Japanese Laid-Open Patent Publication No. Hei 1-143368. FIG. 1 shows a sectional side view of a light emission source including a light emitting diode 1, a transparent glass substrate 2, lead frames 3 and 4, a bonding wire 5, a light reflecting member 6, and a mold resin 8 made of an optically transparent resin. The lead frames 3 and 4 are disposed on a rear wall of the transparent glass substrate 2, and the light emitting diode 1 is mounted on a rear wall of the lead frame 3 to be connected with the lead frame 4 by the bonding wire 5. A light reflecting wall 7 of the light reflecting member 6 is formed as a polyhedron by plural monotonous surfaces.

In this conventional light emission source, light is emitted backside from the light emitting diode 1 to be reflected by the reflecting wall 7 and emitted forward through the mold resin 8 and the transparent glass substrate 2. In particular, light emitted from the light emitting diode 1 in a diagonal direction is reflected back by the reflection wall 7 to be emitted forward through the mold resin 8 and the transparent glass substrate 2, thereby improving the light use efficiency.

This conventional light emission source, however, has the disadvantage that light reflected by the light reflecting member is obstructed by the light emitting diode and the lead frames when it is emitted forward, thereby producing shadows of these components and deteriorating the advantage of utilization of light near the optical axis center where quantity of light should be provided most well. Furthermore, because of darkness near the optical axis center in the directivity pattern of light emitted by the light emission source, its appearance is bad as a light source for a display, and its visual performance also is bad.

FIG. 2 shows a side sectional view of conventional another light emission source, wherein a light emitting diode 1 such as an LED chip is die-bonded on a leading edge of one lead frame 3 to be connected with another lead frame 4 by means of a bonding wire 5, which is sealed in a transparent mold resin 8. On a central part of a front wall (resin boundary surface) of the mold resin 8, there is disposed a lens portion 9 so as to agree with an optical axis of the light emitting diode 1.

In this conventional light emission source of FIG. 2, the light emitting diode 1 is not positioned behind the lead frame 3, and light emitted from the light emitting diode 1 is emitted forward from the lens portion 9 without any obstruction in this conventional light emission source, however, only light emitted from the light emitting diode 1 to its front is used for external emission, thereby decreasing the use efficiency of light. Moreover, just one light emission source becomes so-called point light source, so that the light emission area cannot be enlarged.

(Photo Detector)

For example, a photodiode serving as a sensor is improved about its sensitivity as the quantity of incident light is increased, and a photoelectric transducer increases an electric energy as the quantity of incident light is increased. Accordingly, it is desirable in these photo detectors to increase the quantity of incident light as far as possible.

In order to increase the quantity of incident light when the intensity of incident light is the same, it is an approach to increase the light receiving area of the photo detector. However, this approach to increase the chip area of the photo detector reduces the number of chips which can be taken from one piece of monocrystal wafer, resulting into large increase of the manufacturing cost.

Moreover, it is another approach to dispose an optical lens ahead of a photo detector to condense the light striking against the lens to the photo detector. This photo detector needs a large optical lens, and the thickness is increased by the spacing between the photo detector and the lens, whereby the element becomes a large-scale.

SUMMARY OF THE INVENTION

It is, therefore, a first object of this invention to provide an optical device such as a light emission source or a light receiver provided with a desired directivity pattern.

It is a second object of this invention to improve the use efficiency of the light emitted from a solid light emitter such as a light emitting diode.

It is a third object of this invention to increase a light emission area of the light emitted from a solid light emitter such as a light emitting diode.

It is a fourth object of this invention to raise the light receiving efficiency of a photo diode or a photoelectric transducer by making the light receiving area big.

It is a fifth object of this invention to raise the assembly accuracy of a light emission source and a light receiver and make the manufacturing easy.

It is a sixth object of this invention to suppress degradation of the visual performance of a light emission source or a component employing the same when it is viewed from a lower part thereof (for example, ground) by disturbance light.

A optical device according to this invention includes an optical element, a resin boundary surface for almost totally reflecting light deviated from a predetermined front area of the optical element, and a light reflecting member, in which the optical element, the resin boundary surface and the light reflecting member are positioned so that a light path from the optical element to the external of the optical device can reflect back at least more than once with each of the resin boundary surface and the light reflecting member. The optical element is represented by a light emitter such as a light emitting diode, or a photo detector such as a photo diode or a photoelectric transducer. According to this optical device, the light deviated from the predetermined area is reflected by the resin boundary surface and the light reflecting member in the light path between the optical element and the front of the optical device, whereby a desired directivity pattern may be realized by the configuration of the resin boundary surface and the light reflecting member, and the optical device may be thinned.

In a first light emission source according to this invention, a light emitter is positioned to be covered by a resin so that the light deviated from a predetermined front area in the light emitted from the light emitter is almost totally reflected by a resin boundary surface, and a light reflecting member is disposed behind the resin boundary surface so as to reflect the light emitted from the light emitter and almost totally reflected by the resin boundary surface to be emitted forward. The resin boundary surface almost totally reflecting the light may be a boundary surface between the resin and air or between the resin and other resin or a multilayer light reflecting film.

In this first light emission source, the light almost totally reflected by the resin covering the light emitter is reflected by the light reflecting member to be emitted forwardly, thereby improving the use efficiency of light. The light directly emitted forward by the light emitter can be emitted forward without any obstruction by the light emitter itself, thereby further improving the use efficiency of light and the directivity pattern without darkening a center of light emission source. Moreover, the directivity pattern of the light emitted from the light emission source may be optionally varied by changing the configuration of the resin boundary surface and the light reflecting member.

According to a first aspect of the first light emission source, at least a part of the resin boundary surface slants against a plane perpendicular to an optical axis of the light emitter in an area contacting with the above-mentioned predetermined area. In the light emission source of the first aspect, most of the light beams emitted from the light emitter to the boundary of the resin boundary surface and the predetermined area make angles with the optical axis smaller than the critical angles of total reflection of the light reaching the resin boundary surface. By making the angle between the light reaching the boundary of the resin boundary surface from the light emitter and the optical axis of the light emitter smaller than the critical angle of the total reflection, the light emitted from the light emitter by a smaller angle against the optical axis than the critical angle of the total reflection in the resin boundary surface is totally reflected by the resin boundary surface and further reflected forward by the light reflecting member. As a result, the ratio of stray light in the predetermined area in a front of the light emitter is reduced and the use efficiency of light is improved. All light emitted from the light emitter to the boundary of the resin boundary surface and the predetermined area is not always necessary to have an angle to the optical axis smaller than the critical angle of the total reflection of light reaching the resin boundary surface. As far as the angles of most of light beams to the optical axis are smaller than the critical angle of total reflection of light reaching the resin boundary surface, such an effect can be expected.

According to a second aspect of the first light emission source, at least a region of the light reflecting member reached by the light totally reflected by the resin boundary surface constitutes a concave mirror having a focal point at a mirror image position of the light emitter with respect to the resin boundary surface. According to the light emission source of this second aspect, the light reflected by the light reflecting member is emitted forward as approximately collimated light.

According to a third aspect of the first light emission source, distribution field of curvature in the light reflecting surfaces of light reflecting member is different on a pair of mutually perpendicular sections crossing the optical axis of the light emitter. The difference of distribution field of curvature means that the distribution fields of curvature are not the same, and includes the cases that the distribution fields are not mutually overlapped, the distribution fields are partially overlapped but mutually shifted, or one distribution field is wider than another distribution field.

According to the light emission source of the third aspect, because of difference in the distribution fields of curvature in light reflecting plane of the light reflecting member on the mutually perpendicular two sections passing the optical axis of the light emitter, spread of the light reflected by the light reflecting surface varies with its direction even if light emitted from the light emitter is emitted equally in a circumference of the optical axis. For instance, there may be provided a light emission source having an a symmetry directivity pattern in a circumference of the optical axis, such as a directivity pattern spreading sideways, depending on application.

According to a fourth aspect of the light emission source of the third aspect, an optical lens disposed in a predetermined area in front of the light emitter, and the distribution fields of curvature on a surface of the optical lens are different on mutually perpendicular sections crossing the optical axis of the light emitter. The difference of distribution field of curvature has the same meaning in the light reflecting member. According to the light emission source of the fourth aspect, the optical lens condenses the light emitted forward. Since the lens has an a symmetry configuration around the optical axis, the light emitted forward from the light emitter through the lens has an a symmetry or ununiform directivity pattern around the optical axis. Accordingly, for example, the light emitted forward from a center of the light emitter may be spread sideways on application.

According to a fifth aspect of the first light emission source, a light emitter is positioned to be covered by a resin so that light deviated from a predetermined area of front in the light emitted from the light emitter is almost totally reflected by a resin boundary surface, and a light reflecting member is positioned behind the resin boundary surface for reflecting the light emitted from the light emitter to be almost totally reflected by the resin boundary surface, wherein the light reflected by the light reflecting member is emitted slanting against the optical axis of the light emitter. Since the light reflected by the light reflecting member is emitted slanting against the optical axis of the light emitter, the light emission direction can be positioned in a direction different from an installation direction of the light emission source. Accordingly, by emitting light to a desired direction, for example, downward, and installing the light emission source upward, disturbance light such as the afternoon sun or the morning sun is prevented from downward reflection by the light emission source. In this light emission source, the light emitted in a direction having a large angle to the optical axis is totally reflected by the resin boundary surface and further reflected forward by the light reflecting member to be emitted forward from the light emission source, thereby improving the use efficiency of light.

According to a sixth aspect of the first light emission source, at least a region of the light reflecting member reached by the light totally reflected by the resin boundary surface constitutes a concave mirror, and a light emitter is disposed in a location deviated from a mirror image position at the focal point of the concave mirror with respect to the resin boundary surface. The light can be emitted toward the optical axis declining against the front of the light emission source, thereby increasing the degrees of freedom of directivity pattern of the light emission source.

According to a seventh aspect of the first light emission source, there is provided a second light reflecting member reflecting the light emitted from a side of the light emitter in a forward direction, in which the angle of inclination of the second light reflecting member is set so that most of light reflected by the second light reflecting member can reach the resin boundary surface. The light emitted from the side of the light emitter is reflected by the second light reflecting member to be directly emitted to the external from the predetermined area without emission in a direction largely declining from the optical axis of the light emission source. In other words, the light emitted from the side of the light emitter is reflected by the second light reflecting member to be directed to the resin boundary surface, whereby the light totally reflected by the resin boundary surface is directed to the light reflecting member and its emission direction is controlled by the light reflecting member so as to emit the light in the optical axial direction of the light emission source.

According to an eighth aspect of the light emission source of the seventh aspect, the second light reflecting member is disposed on a lead frame mounted by the light emitter. When the light emitter is disposed on the lead frame, the second light reflecting member may be made by the lead frame, thereby reducing the number of components.

According to a ninth aspect of the first light emission source, at least a part of the light reflecting member comes into contact with an outer circumferential part of the resin composing the resin boundary surface. When the light emission source is produced by resin molding, the light reflecting member can be positioned by contacting an internal circumference part of a mold cavity and a location accuracy of the light reflecting member can be easily obtained.

In an light receiver molding a photo detector within a resin according to this invention, a light reflecting member is disposed behind a boundary surface on a light receiving side of the resin so that it reflects the light entering into a region deviated from a predetermined area in front of the photo detector to be totally reflected by a resin boundary surface to be received by the photo detector.

In this light receiver, the light entering into an outside of the photo detector is reflected by the light reflecting member to enter into the photo detector after total reflection by the resin boundary surface, whereby the light receiving area of the light receiver is increased without increasing the area of the photo detector, thereby improving the light receiving efficiency of the light receiver. Moreover, light is gathered by the light reflecting member located behind the boundary surface on the light receiving side of the resin and the resin boundary surface, whereby the light receiver can have a relatively thinned configuration.

According to a first aspect of the light receiver, at least a part of the light reflecting member of the light receiver comes into contact with the outer circumferential part of the resin layer composing the resin boundary surface. According to the light receiver of the first aspect, when the light receiver is produced by resin molding, the light reflecting member can be positioned by contacting an internal circumference part of a mold cavity and a location accuracy of the light reflecting member can be easily obtained.

A optical component according to this invention to be positioned on a front of a light source includes a resin boundary surface for almost totally reflecting the light emitted from the light source and a light reflecting member for reflecting the light almost totally reflected by the resin boundary surface to be emitted forward. According to the optical component, functions and effects same as the above-mentioned first light emission source can be performed by combining with the light emitter. This optical component is a separate component from the light emitter, whereby its handling is easy because it may be later mounted on the light emitter.

This optical component may provide same functions and effects when it is applied to a light source such as an electric lamp or a fluorescent lamp in addition to the light emitter.

A second optical component according to this invention, which is positioned on a front of a photo detector, includes a light reflecting member for reflecting the light entering from an external and a resin boundary surface for totally reflecting the light reflected by the light reflecting member to strike against the photo detector. According to the second optical component, functions and effects same as the above-mentioned light receiver can be performed by combining with the photo detector. This optical component is separate from the photo detector, whereby its handling is easy because it may be later mounted on the photo detector.

According to a first aspect of each of the first and second optical components, the optical component includes a recess on an opposite face of each component against the resin boundary surface in order to at least dispose either the light emitter or the photo detector. According to the optical component of the first aspect, the light emitter or the photo detector is disposed within the recess, whereby the light emitter, the photo detector or the optical component can be easily positioned.

According to a second aspect of each of the first and second optical components, at least apart of the above-mentioned light reflecting member comes into contact with an outer circumferential part of the resin layer providing the resin boundary surface. According to the above-mentioned second aspect of each of the optical components, when the optical component is manufactured by a resin mold, the light reflecting member is put on an internal circumference part of a cavity of a mold for fixing the position, thereby easily obtaining a positional accuracy of the light reflecting member.

A first manufacturing process of an optical component including a resin layer having a resin boundary surface for almost totally reflecting the light deviating from a predetermined region in front of a light emitter and a light reflecting member for forwardly emitting the light almost totally reflected by the resin boundary surface according to this invention is provided with a process for resin-injecting at least a part of an outer circumferential part of the light reflecting member striking against an internal surface of a cavity of a mold.

According to the first manufacturing process of an optical component of this invention, the first optical component can be produced, and the light reflecting member strikes against an internal circumferential part of the cavity of the mold for fixing the position, thereby easily obtaining a positional accuracy of the light reflecting member.

A second manufacturing process of an optical component including a light reflecting member for reflecting the light entering into a region deviating from a predetermined region in front of a photo detector and a resin layer having a resin boundary surface for almost totally reflecting the light reflected by the light reflecting member according to this invention is provided with a process for resin-injecting at least a part of an outer circumferential part of the light reflecting member striking against an internal surface of a cavity of a mold.

According to the second manufacturing process of an optical component of this invention, the second optical component can be produced, and the light reflecting member strikes against an internal circumferential part of the cavity of the mold for fixing the position, thereby easily obtaining a positional accuracy of the light reflecting member.

In a light emission method according to this invention, the light deviated from a predetermined front area among the light emitted from a light source is almost totally reflected by a resin boundary surface, and the light totally reflected by the resin boundary surface is emitted forward by the light reflecting member disposed behind the resin boundary surface. According to this light emission method, the light deviated from the predetermined area is reflected by the resin boundary surface and the light reflecting member in a light path emitted from the light source, thereby realizing a desired directivity pattern by the configurations of the resin boundary surface and the light reflecting member.

In a light incidence method according to this invention, the light deviated from a predetermined area in front of a photo detector among the light entered from an external is almost totally reflected by a light reflecting member, and the light reflected by the light reflecting member is totally reflected by a resin boundary surface to strike against the photo detector. According to this light incidence method, the light deviated from the predetermined area is reflected by the resin boundary surface and the light reflecting member in a light path entering into the photo detector, thereby realizing a desired directivity pattern by the configurations of the resin boundary surface and the light reflecting member.

The light emission source and the light receiver according to this invention can be applied to various kinds of apparatuses. For example, the photoelectric sensor according to this invention includes the light receiver employing a photoelectric transducer as a photo detector according to this invention and a light projecting element, in which the light emitted by the light projecting element or the light emitted by the light projecting element and reflected by an object is detected by the light receiver. A self light generating apparatus according to this invention includes the light receiver employing a photoelectric transducer as the photo detector according to this invention, a rechargeable battery for charging electric energies generated by the light receiver, and light receiver. A display apparatus according to this invention is arranged by a plurality of light emission sources according to this invention or a plurality of optical components according to this invention. A light source for an automobile lamp according to this invention is arranged by a plurality of light emission sources according to this invention or a plurality of optical components according to this invention. An outdoor display apparatus according to this invention is arranged by a plurality of light emission sources according to this invention or a plurality of optical components according to this invention.

The above-mentioned components of construction can be optionally combined as far as possible.

DETAILED DESCRIPTION OF THE INVENTION

Embodiments of this invention will be described in detail hereinafter referring to drawings.

FIRST PREFERRED EMBODIMENT

Figure 1:
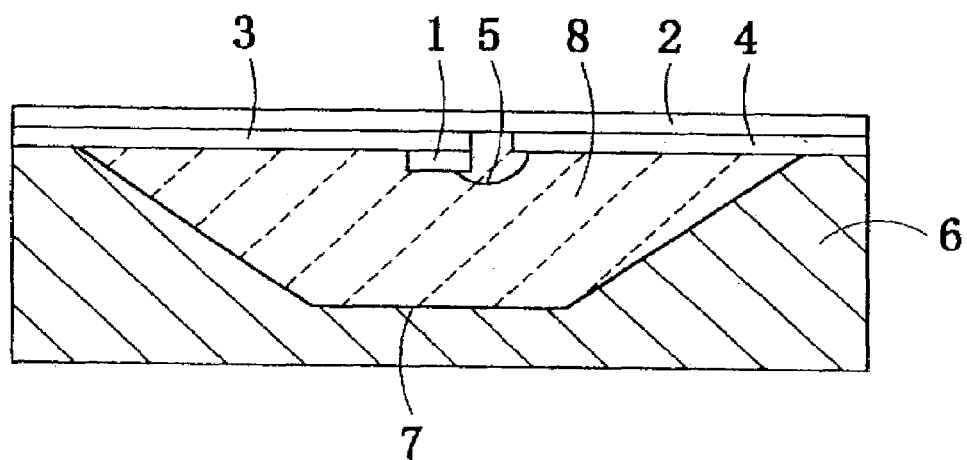
FIG. 1 is a sectional view of a conventional light emission source.
Figure 2:
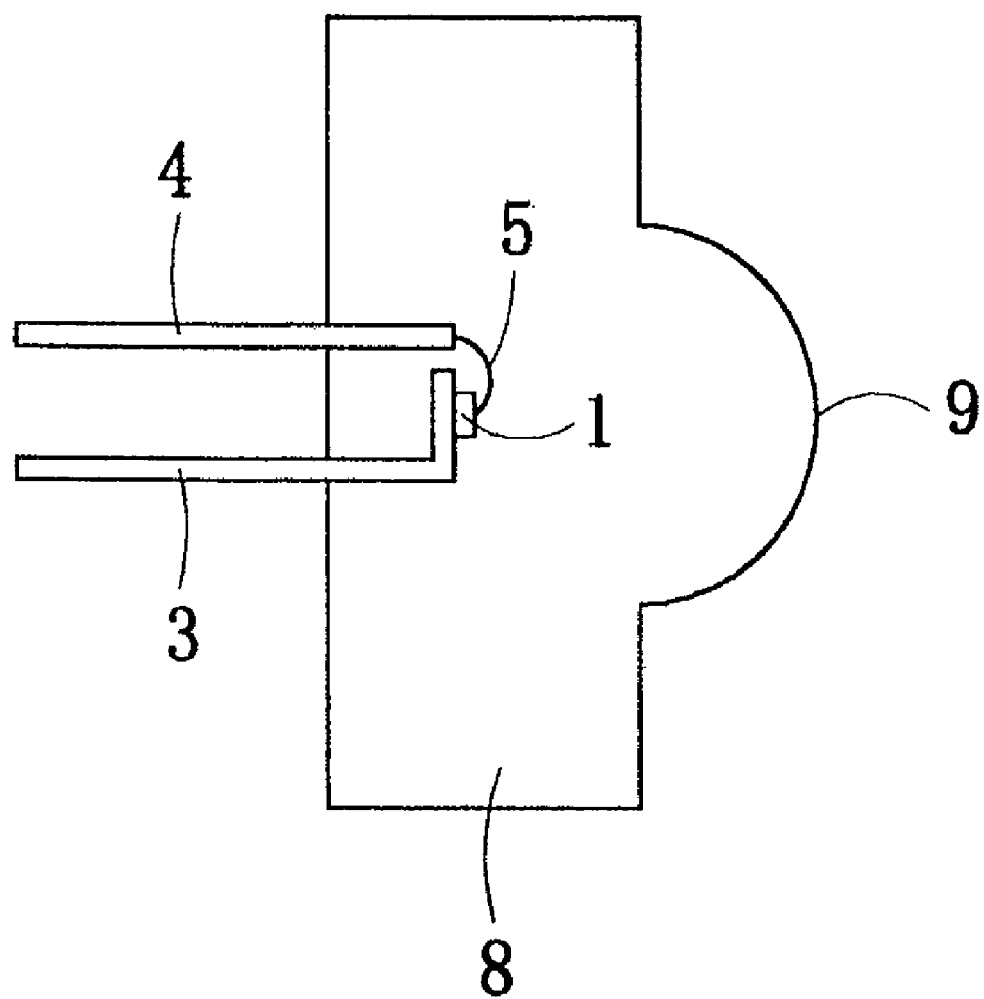
FIG. 2 is a sectional view of another conventional light emission source.
Figure 3:
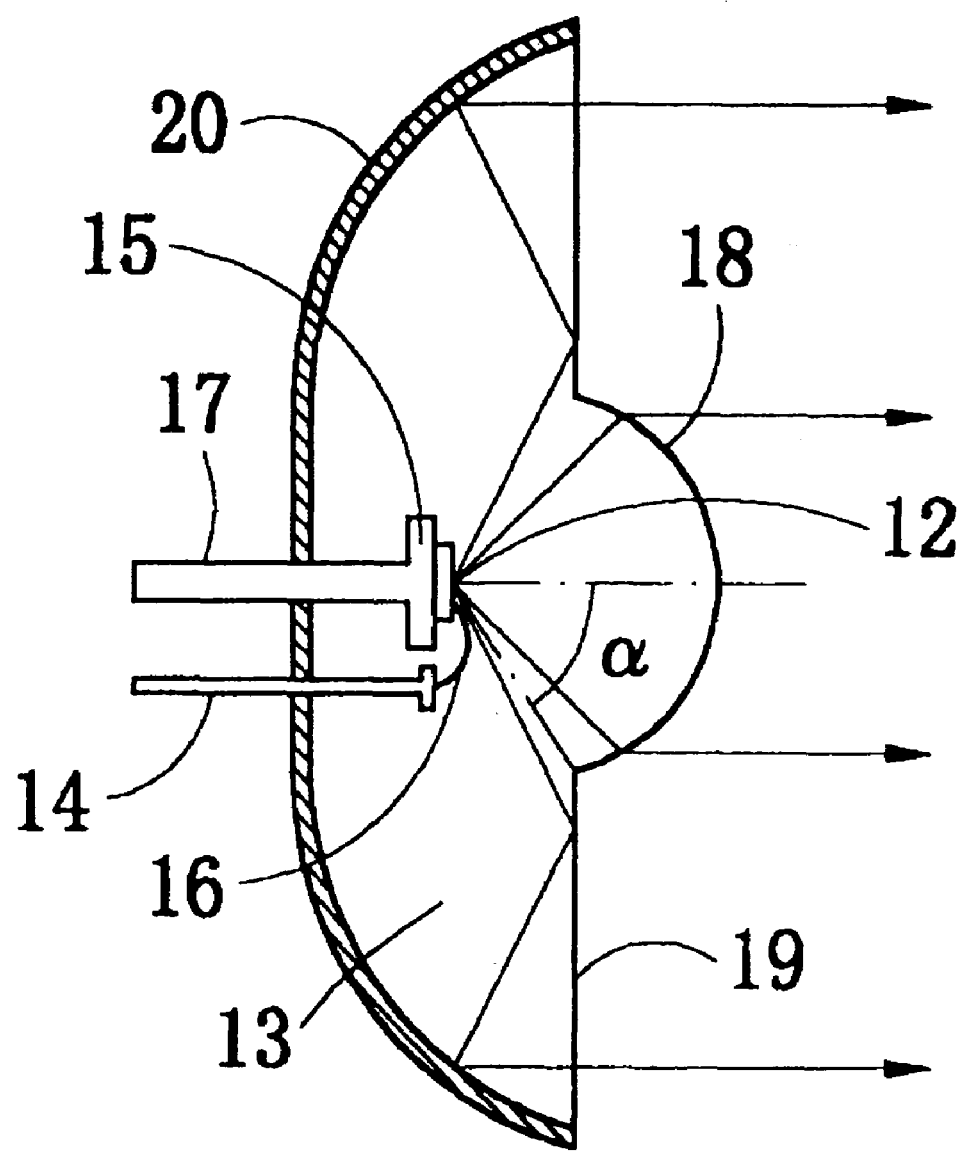
FIG. 3 is a sectional view of a light emission source according to a first preferred embodiment of this invention.

As a first preferred embodiment, a section of a light emission source 11 is shown in FIG. 3. According to this embodiment, a light emitter 12 of a light emitting diode (LED chip) is sealed in a mold resin 13 made of optically transparent resin materials. The light emitter 12 sealed in the mold resin 13 is mounted on a stem 15 disposed on a leading edge of a lead frame 17, and connected with another lead frame 14 by a bonding wire 16 so that a light emission side is disposed toward a front of the light emission source 11.

In a front central part of the mold resin 13, there is disposed a direct emission region 18 having a convex lens configuration such as a spherical lens shape, an aspherical lens shape, or a paraboloid shape. A total reflection region 19 in a flat shape is formed to surround the direct emission region 18. The direct emission region 18 is formed so that its medial axis can accord with medial axis of the light emitter 12, and the total reflection region 19 is formed to be a flat plane perpendicular to an optical axis of the light emitter 12. The light emitter 12 is located in focal point of the direct emission region 18 or the neighborhood. The angle α of a direction, viewed from the light emitter 12 to the boundary between the direct emission region 18 and the total reflection region 19, from the optical axis of the light emitter 12 is equal to a critical angle θc of total reflection between the mold resin 13 and air or larger.

Therefore, light emitted to the direct emission region 18 in the light emitted from the light emitter 12 is emitted approximately in parallel directly from a front of the mold resin 13 to front. Light emitted to the total reflection region 19 in the light emitted from the light emitter 12 is totally reflected by its resin boundary surface to be directed to a rear face of the mold resin 13.

The rear face of the mold resin 13 is coated with a metal film having a high reflectivity such as aluminum or silver by vacuum deposition or a multilayer reflection film to provide a light reflection portion 20. At least a region of the light reflection portion 20 hit by the light reflected by the total reflection region 19 provides a concave mirror, such as a spherical mirror or revolution-parabolic mirror, having a focal point around a mirror image position of the light emitter 12 with respect to the total reflection region 19.

Accordingly, light emitted from the light emitter 12 and totally reflected by the total reflection area 19 strikes against the light reflection portion 20 to be reflected thereby and emitted forward from the total reflection region 19 in approximately parallel.

Therefore, according to the light emission source 11 of this embodiment, approximately all light forwardly emitted from the light emitter 12 (including the light totally reflected by the total reflection region 19) can be taken toward a forward direction of the light emission source 11, resulting into high efficiency of light use. Moreover, the light emitted forward from the light emitter 12 can be emitted from the direct emission region 18 without any obstruction, whereby darkness on the optical axis as found in a conventional light emission source can be avoided and the directivity pattern also can be improved.

Furthermore, the light emitted from the light emitter 12 in a diagonal direction is totally reflected by the total reflection region 19 and further reflected by the light reflection portion 20 for forward emission, whereby the optical path length is elongated, thereby reducing its aberration and providing a high accuracy of the light emission source 11.

Figure 4:
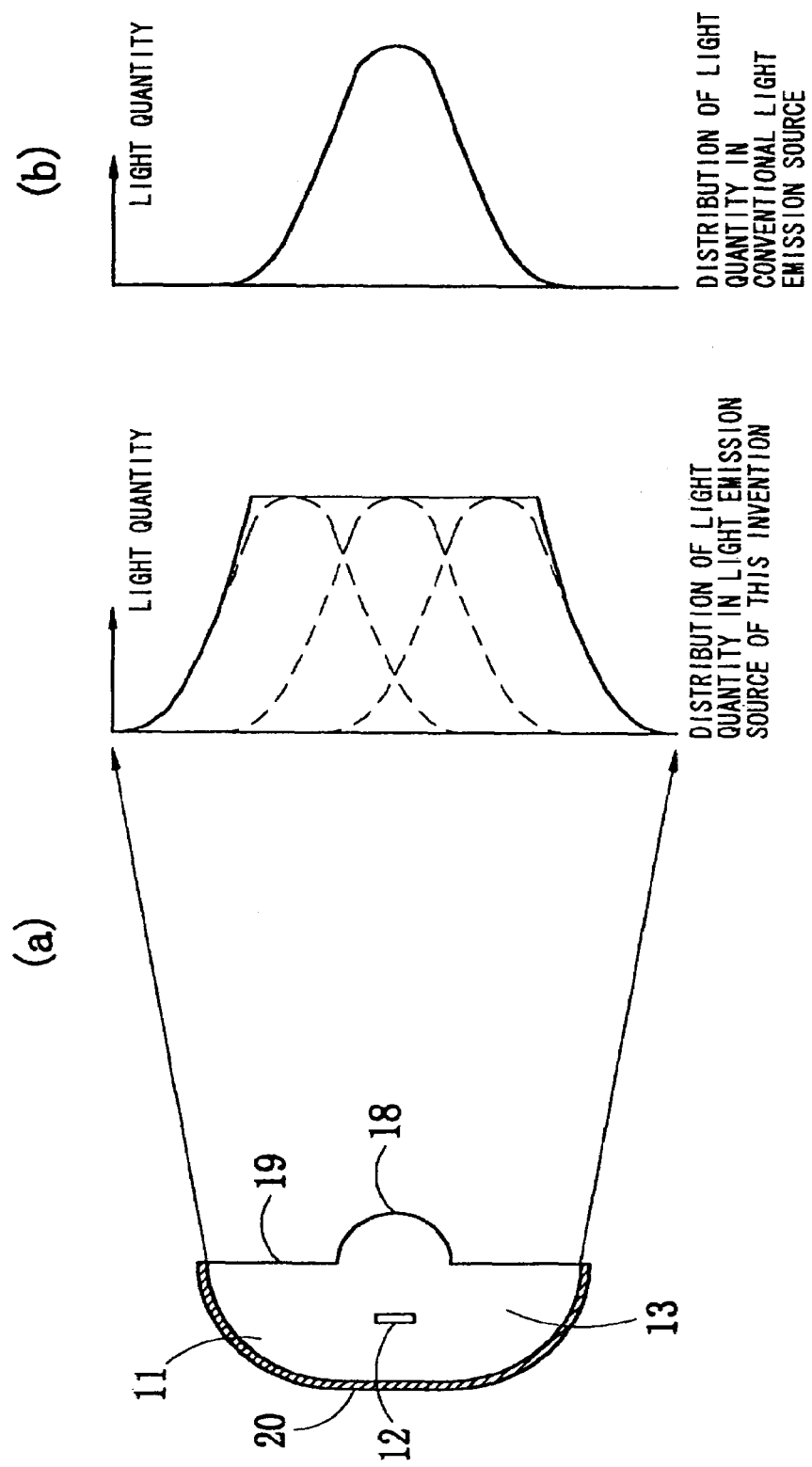
FIG. 4 at (a) and (b) shows the light emission source of FIG. 3 and a light quantity distribution of the same, and a light quantity distribution of a convention light emission source.

In a conventional light emission source employing a light emitting diode, most of light totally reflected by a mold resin is not emitted forward, thereby providing a narrow distribution about quantity of light as shown in FIG. 4 at (b). As shown in FIG. 4 at (a), according to the light emission source 11 of this embodiment, the light emitted from the light emitter 12 is spread over a whole front face of the mold resin 13 and approximately paralleled, thereby providing a width-wide and uniform distribution of light quantity (beam profile).

In this embodiment, the light emission source 11 is designed to emit the paralleled light. If desired, the directivity pattern of the light emitted from the light emission source 11 can be changed to a desired pattern by changing the position of the light emitter 12, the focal position and the surface configuration of the direct emission region 18 providing a convex lens, or the focal position and the surface configuration of the light reflection portion 20 providing a concave mirror.

SECOND PREFERRED EMBODIMENT

Figure 5:
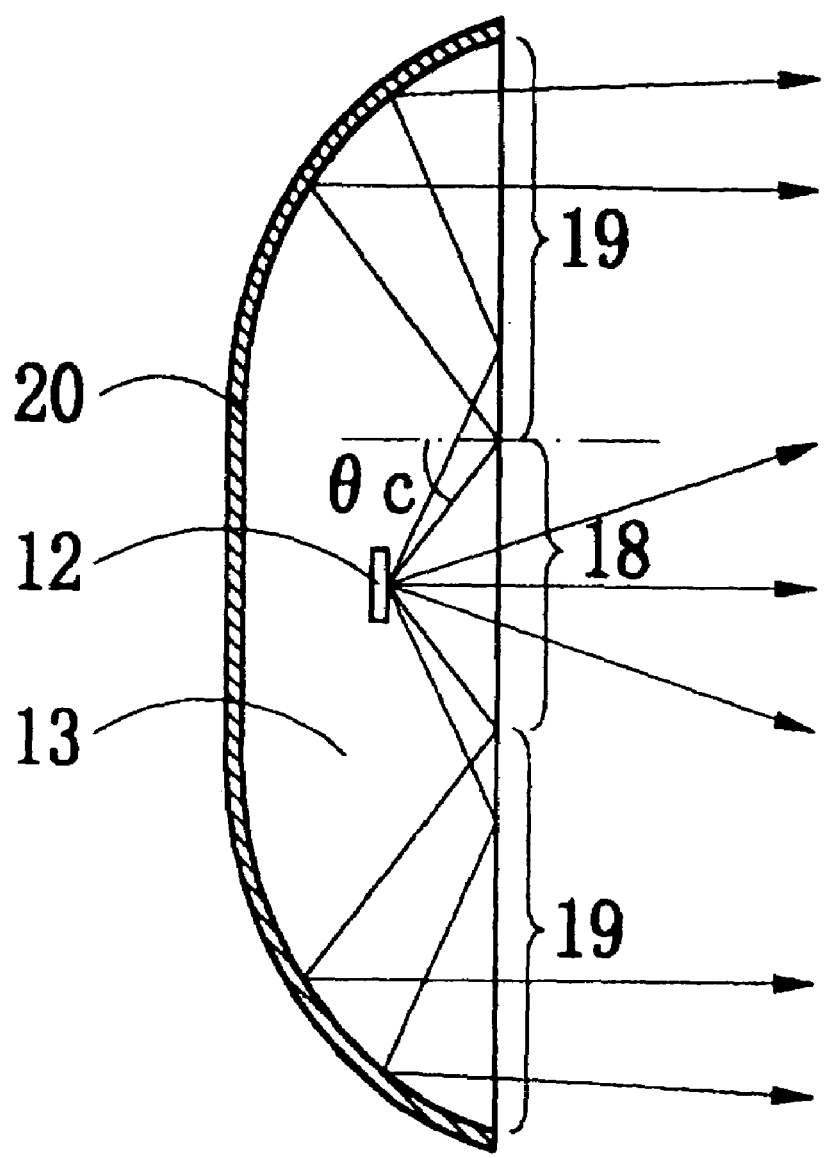
FIG. 5 is a sectional view of a light emission source according to a second preferred embodiment of this invention.

FIG. 5 shows a sectional view of a light emission source 21 according to a second preferred embodiment. FIG. 5 omits the components of a stem, a lead frame, and a bonding wire (delineation of lead frame and others might be omitted in a light emission source shown in FIG. 6 and its subsequent figures). In this embodiment, a direct emission region 18 in a boundary surface of a mold resin 13 is formed to be flat. Accordingly, direct emission region 18 and total reflection region 19 cannot be distinguished from their appearance, but can be distinguished by the movement of light beams emitted from a light emitter 12. The position of the light striking against a boundary surface of the mold resin 13 from the light emitter 12 at a critical angle θc of its total reflection becomes a boundary of the direct emission region 18 and the total reflection boundary 19. Therefore, the incident light striking against the direct emission region 18 inside of the boundary is directly emitted from the direct emission region 18, and the light striking against the total reflection region 19 outside of the boundary is totally reflected by the total reflection region 19 to be reflected by a light reflection portion 20 for forward emission.

In this embodiment, total reflection is made by the boundary surface of the mold resin 13, and the efficiency of light use is improved also. The direct emission region 18 is formed to be plane, whereby the light emitted from the direct emission region 18 is spread and the angle of beam spread of light emitted from the region can be broadly widened. When the angle of beam spread is desired to be widened or the limitation to the angle is minor, the direct emission region 18 can be formed to be flat so as to simplify the front configuration of the mold resin 13 like this embodiment.

THIRD PREFERRED EMBODIMENT

Figure 6:
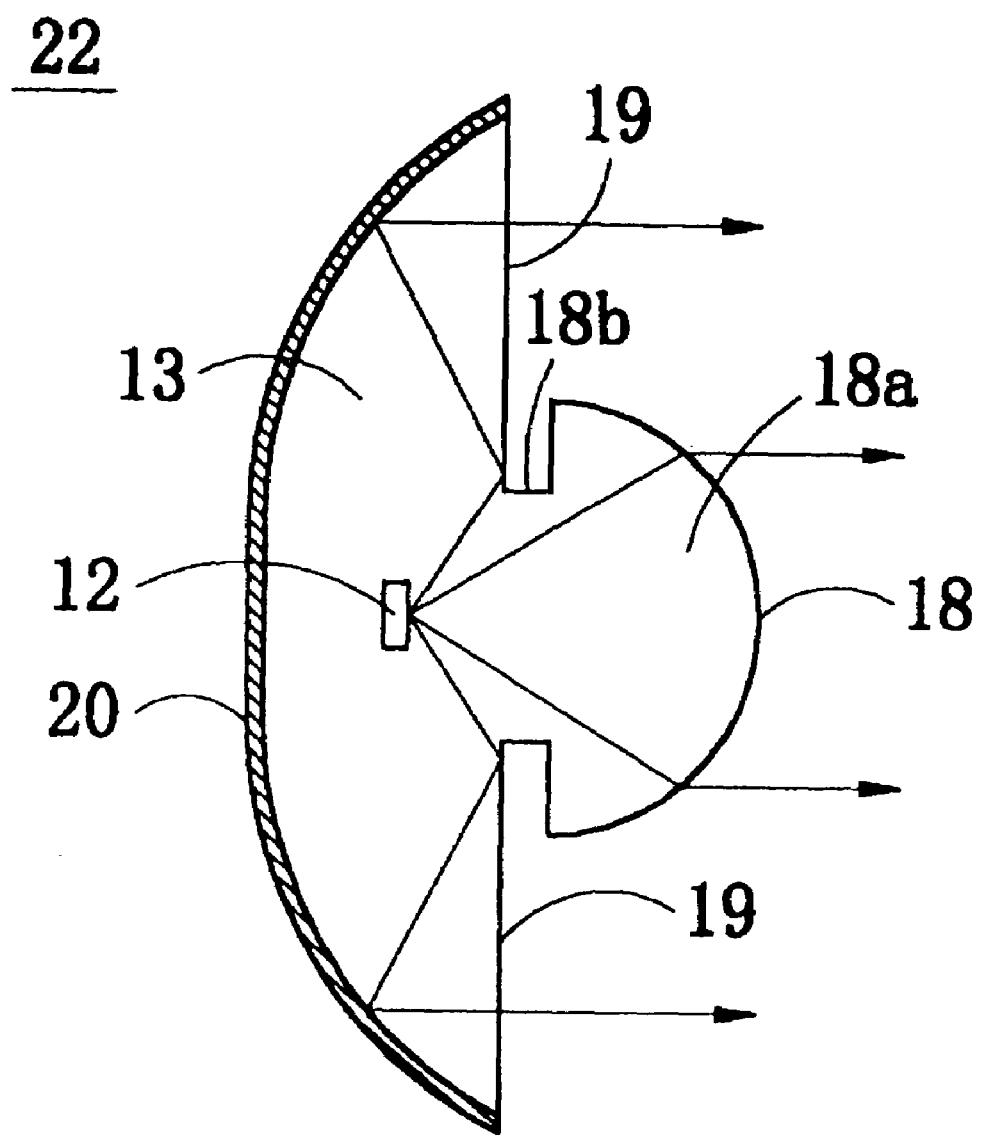
FIG. 6 is a sectional view of a light emission source according to a third preferred embodiment of this invention.

FIG. 6 is a sectional view of a light emission source 22 according to a third preferred embodiment, in which a front portion 18a of a direct emission region 18 is formed to be larger than a base portion 18b and to provide a lens configuration. When the light totally reflected by a resin boundary surface and further reflected by a light reflection portion 20 is approximately paralleled, a region where any light is not emitted appears in an internal circumference portion of a total reflection region 19, so that the lens configuration of the direct emission region 18 can have a large diameter without narrowing the total reflection region 19 by enlarging the front portion 18a of the direct emission region 18 as far as light emitted from the total reflection region 19 is not obstructed. According to this configuration, the ratio of the light emitted from the direct emission region 18 of a lens configuration and the light emitted from the total reflection region 19 can be efficiently designed, thereby providing a high performance of the light emission source 22.

FOURTH PREFERRED EMBODIMENT

In the light emission source 11 shown in FIG. 3, the light striking against an edge (outer circumferential portion) of the direct emission region 18 is blocked so that it cannot be emitted forward, whereby the blocked light emitted from the light emitter 12 becomes loss. When the distance between the light emitter 12 and the direct emission region 18 is short, the curvature of the direct emission region 18 becomes large, whereby the light emitted to the edge of the direct emission region 18 can be emitted in a traverse direction or totally reflected. Moreover, the edge of the direct emission region 18 has to be positioned outside of a direction of an angle from the medial axis of the light emitter 12 which is equal to the critical angle of total reflection, so that because of a lower limit in the dimension (diameter viewed from the front) of the direct emission region 18, area of the circumference part of the direct emission region 18 becomes large and loss of light emitted from the light emitter 12 becomes large. Moreover, because of a lower limit in the dimension of the direct emission region 18, the curvature of a surface of the direct emission region 18 also has an upper limit and the design flexibility of the direct emission region 18 is limited.

Figure 7:
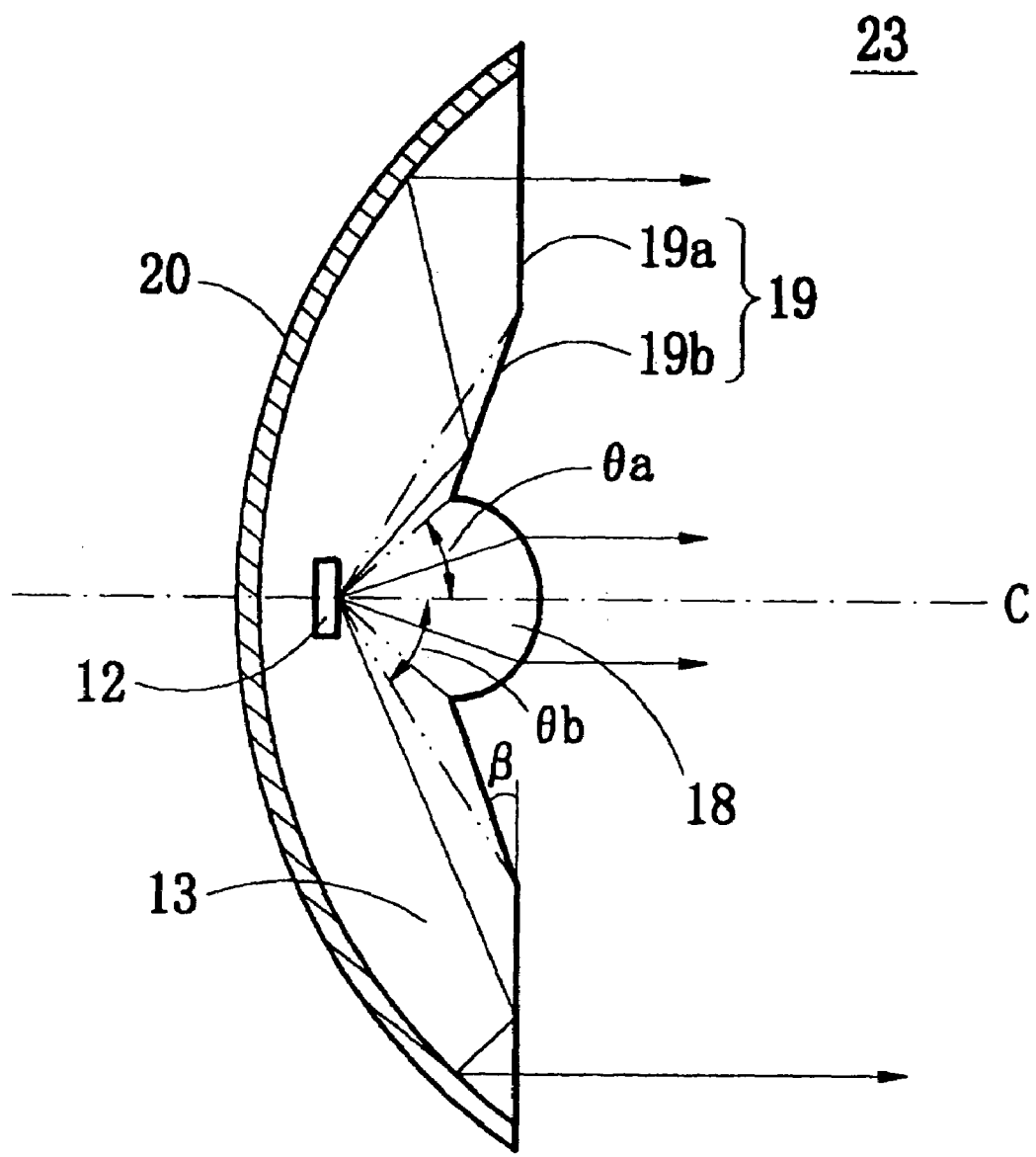
FIG. 7 is a sectional view of a light emission source according to a fourth preferred embodiment of this invention.

In view of the above, FIG. 7 shows a sectional view of a light emission source 23 according to a fourth preferred embodiment, in which a direct emission region 18 is disposed in the center of a surface of a mold resin 13 and a total reflection region 19 is disposed outside its circumference. The direct emission region 18 has a generally hemispheric shape, and its medial axis accords with an optical axis C of light emitter 12. In the light emission source 23, the light emitted from the light emitter 12 toward the direct emission region 18 is refracted and emitted approximately forward from the direct emission region 18.

The total reflection region 19 is composed of a taper-shaped portion 19b in a conical (block) shape or a pyramid (block) shape, and a flat portion 19a, wherein a medial axis of the taper-shaped portion 19b agrees with an optical axis C of the light emitter 12, and the flat portion 19a has a face perpendicular to the optical axis C of the light emitter 12. The section of the taper-shaped portion 19b passing the medial axis is straight but may be curve. For example, the taper-shaped portion 19b may be a surface of revolution of curve with a rotation axis representing the medial axis.

The angle θb of a direction, which is viewed from the light emitter 12 to a boundary between the flat portion 19a and the taper-shaped portion 19b, from the optical axis C of the light emitter 12 is designed to be larger than the critical angle θc of the total reflection in the boundary surface of the mold resin 13 (for example, against air). Therefore, all light emitted from the light emitter 12 and striking against the flat portion 19a is reflected by the flat portion 19a so as to be directed to a light reflecting portion 20.

In addition, the angle θa of the direction, which is viewed from the light emitter 12 to an edge of the direct emission region 18 (the boundary between the direct emission region 18 and the taper-shaped portion 19b), from the optical axis C of the light emitter 12 is designed to be smaller than the critical angle θc of the total reflection in the boundary surface of the mold resin 13 (for example, against air). In other words, when viewed from a front, the dimension of the direct emission region 18 is smaller, and the sharing ratio of the outer circumferential part of the direct emission region 18 against the all is smaller, in comparison with the light emission source 11 shown in FIG. 3. Accordingly, the light lost by the sideway emission at an edge of the direct emission region 18 or total reflection in the light emission source shown in FIG. 3 is totally reflected by the taper-shaped portion 19b and reflected by the light reflecting portion 20 to be emitted forward, thereby decreasing the loss of light. Since the direct emission region 18 is small, the curvature in the surface of the direct emission region 18 can be large, thereby decreasing the constraint of design.

All light striking against the taper-shaped portion 19b is totally reflected by the taper-shaped portion 19b. For example, when the section of the taper-shaped portion 19b is designed to be straight as shown in FIG. 7 and θc is assumed to be a critical angle of the total reflection, and the gradient β of the taper-shaped portion 19b is designed by the equation below;

$$\beta \geq \theta c - \theta a$$

Therefore, all light emitted from the light emitter 12 to strike against the taper-shaped portion 19b is totally reflected by the taper-shaped portion 19b to be directed toward the light reflecting portion 20.

The configuration of the light reflecting portion 20 is designed so that the light totally reflected by the flat portion 19a and the taper-shaped portion 19b is reflected by the light reflecting portion 20 to be emitted forward from the total reflection region 19.

Therefore, according to this embodiment, the loss of light is reduced, and the design flexibility of the direct emission region 18 is improved.

FIFTH PREFERRED EMBODIMENT

Figure 8:
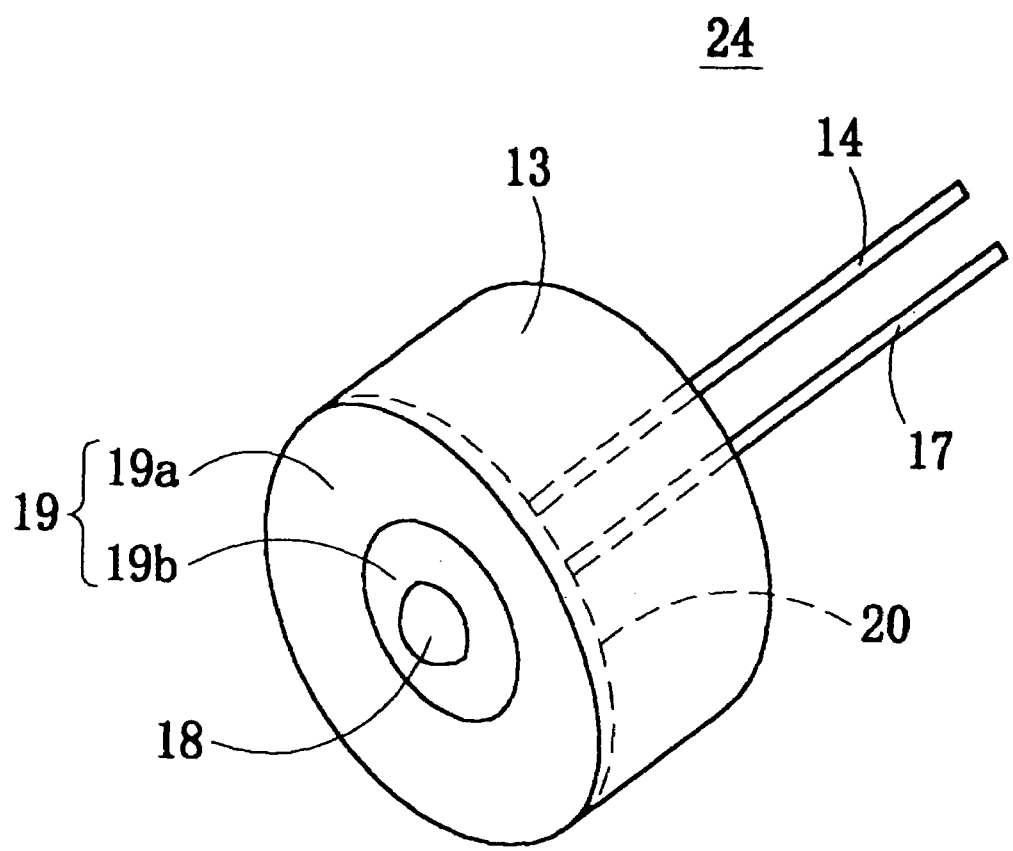
FIG. 8 is a perspective view of a light emission source according to a fifth preferred embodiment of this invention.
Figure 9:
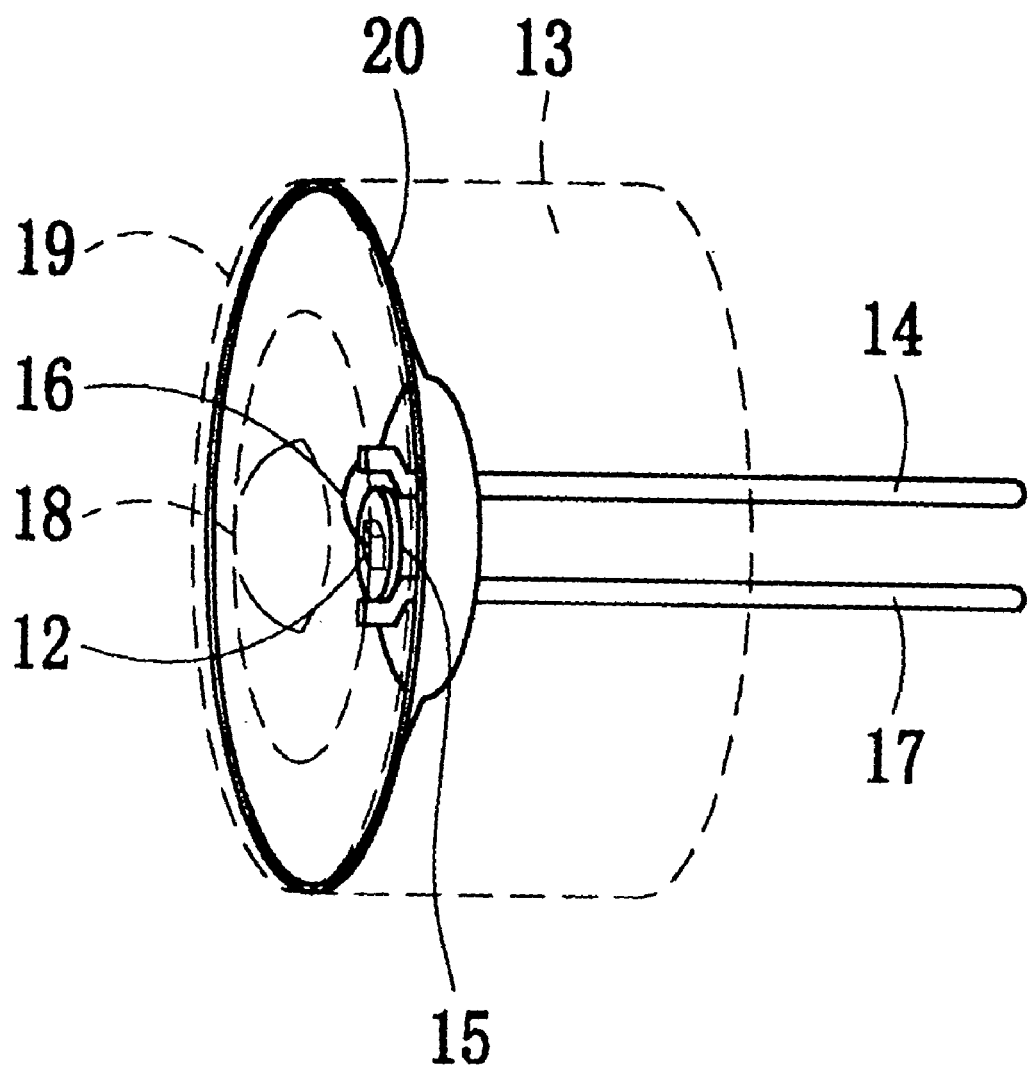
FIG. 9 is a perspective view of the light emission source of FIG. 8 inside a mold resin.
Figure 10:
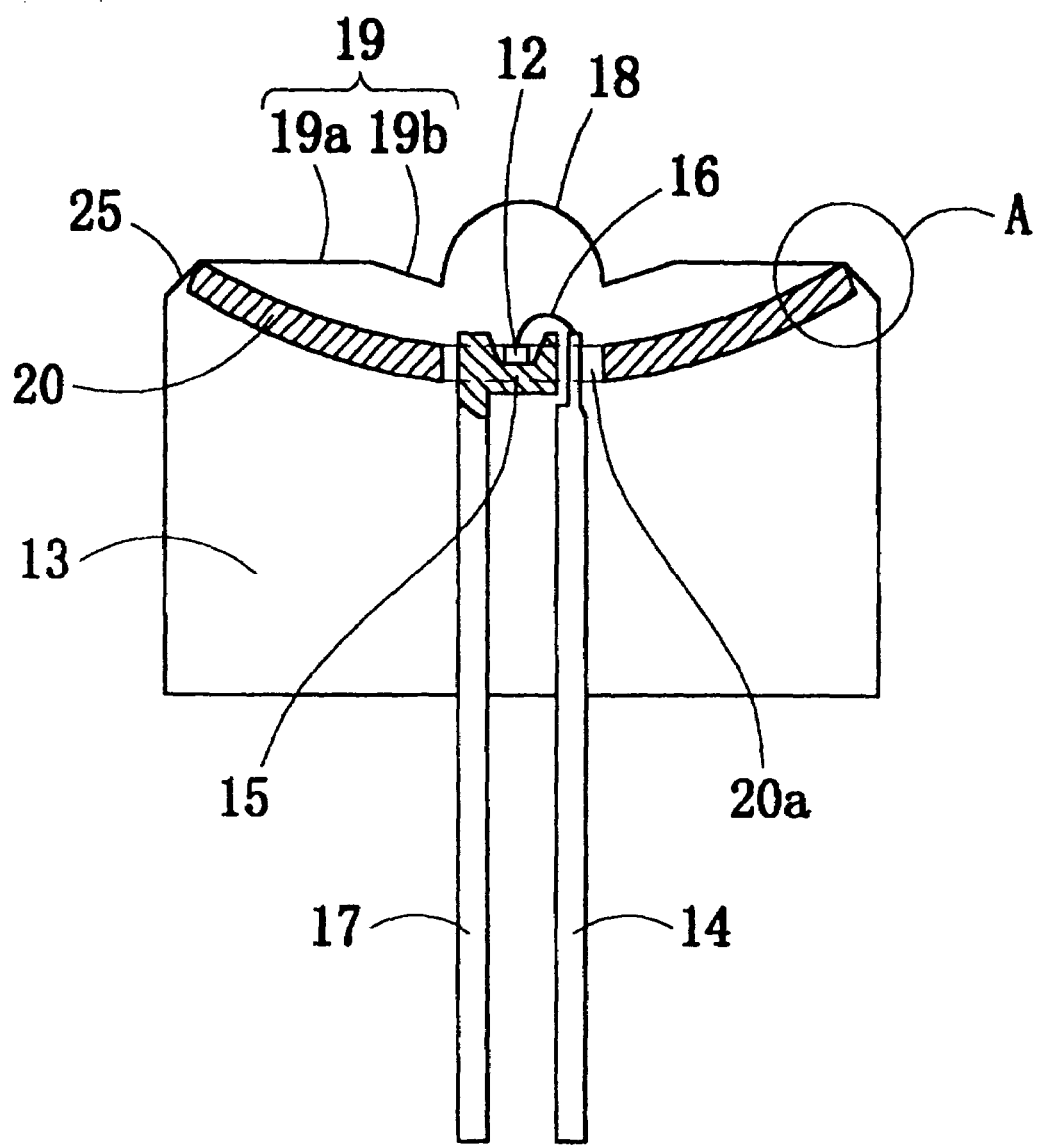
FIG. 10 is a sectional view of the light emission source of FIG. 8.
Figure 11:
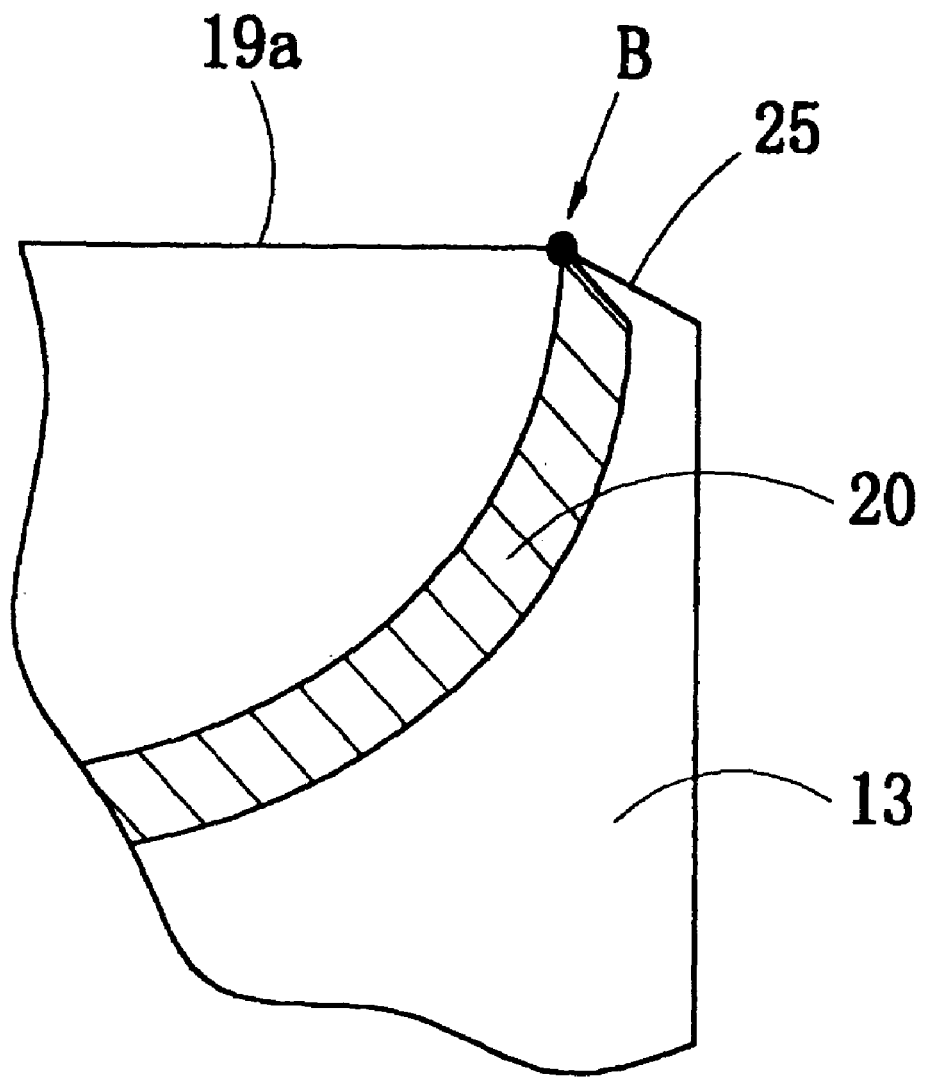
FIG. 11 is a magnified view of a portion A of FIG. 8.

FIGS. 8 and 10 show perspective and sectional views of a light emission source 24 according to a fifth preferred embodiment of this invention. FIG. 9 shows a perspective view showing an inner component of the light emission source 24 viewed through a mold resin 13. FIG. 11 is an enlarged view of a portion A of FIG. 10. The light emission source 24 employs a light reflecting portion 20 which has a parabola-shaped metal member formed by press working and is plated with aluminum or silver on a surface of the portion for a specular working. If desired, the light reflecting portion 20 may employ a pressing part with aluminum or silver which is chemically processed to bring glossiness on a surface thereof.

The light reflecting portion 20 at a core thereof includes an aperture 20a for accommodating a stem 15. The stem 15 mounted by a light emitter 12 is put without any contact with the aperture 20a, and the light reflecting portion 20 is sealed within a mold resin 13 together with lead frames 14 and 17.

On a front wall of the mold resin 13, there are formed a direct emission region 18 in the center of the resin, a taper-shaped portion 19b around the region, and a flat portion 19a around the portion 19b, in the same manner as the configuration of the embodiment shown in FIG. 7.

According to this light emission source 24 having such above-mentioned construction, any evaporation film (light reflecting portion 20) is not necessary to be disposed on a rear wall of the mold resin 13 as shown in the embodiment of FIG. 3, and the light reflecting portion 20 formed together with the light emitter 12 and the lead frames 14 and 17 as a single isolated unit has only to be set within a mold, thereby simplifying the manufacturing process of the light emission souce 24.

As shown in FIG. 11, an outer circumference portion of a front of the mold resin 13 is provided with a taper-shaped beveling portion 25, and an edge of outer circumferential face of the light reflecting portion 20 is positioned at an edge B of the beveling portion 25. Accordingly, when the mold resin 13 is molded, setting can be done while the edge of the outer circumference at a reflection side of the light reflecting portion 20 contacts an inner wall of a cavity of the mold, the light reflecting portion 20 can be fixed its position to be precisely inserted within the mold resin 13, thereby improving the mounting accuracy of the light reflecting portion 20.

SIXTH PREFERRED EMBODIMENT

Figure 12:
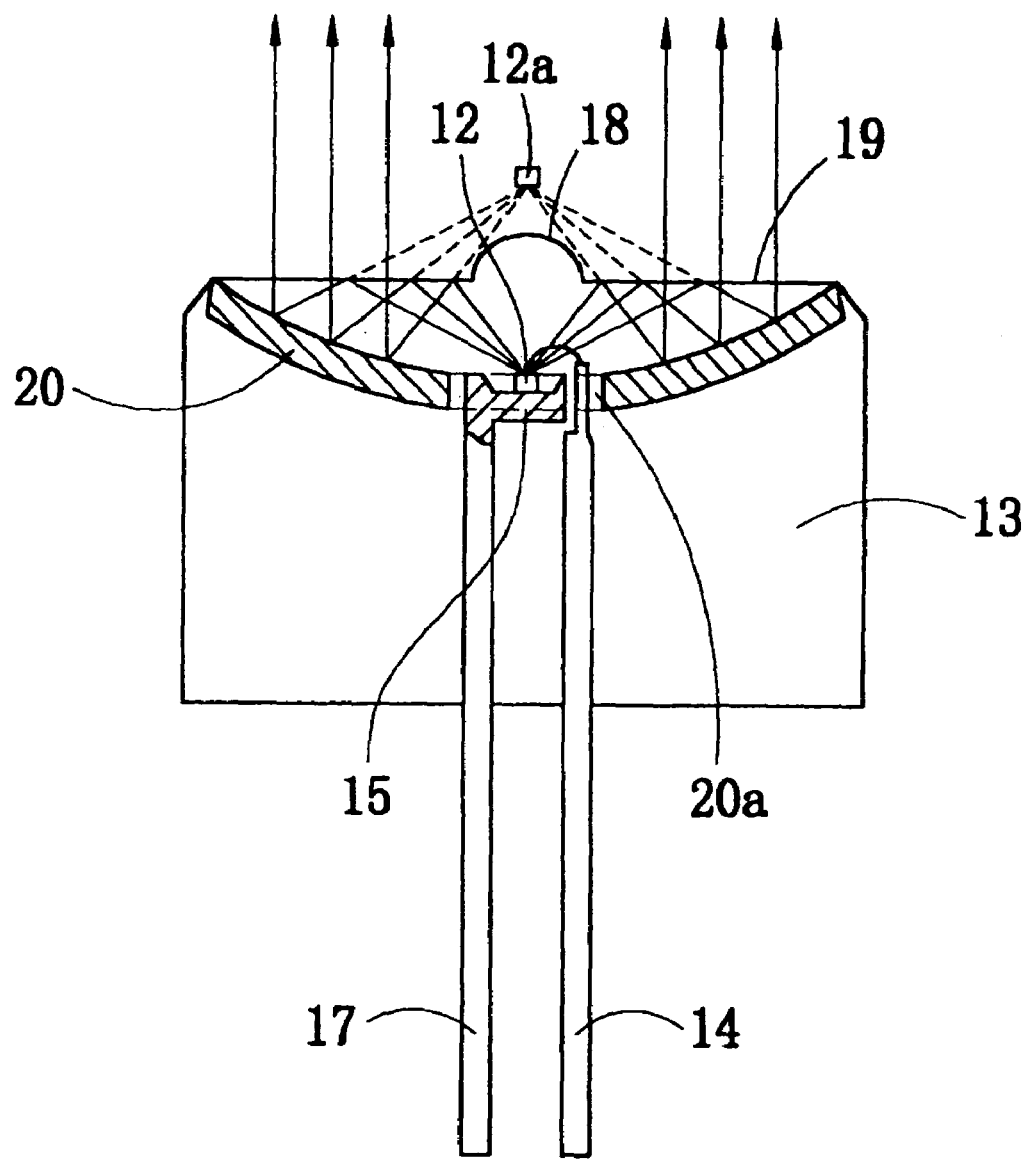
FIG. 12 is a sectional view of a light emission source according to a sixth preferred embodiment of this invention.

FIG. 12 is a sectional view of a light emission source 26 according to a sixth preferred embodiment of this invention. This light emission source 26 has a similar construction to that of the fifth embodiment, but a total reflection region 19 is composed of only a flat portion perpendicular to an optical axis of a light emitter 12.

In addition, at least a region of the light reflecting portion 20 stricken by the light reflected by the total reflection region 19 serves as a concave mirror, such as a spherical mirror or a parabolic mirror of revolution, having a focal point at a position of a mirror image 12*a* of the light emitter 12 with respect to the total reflection region 19, as similarly described in the first embodiment. Accordingly, the light emitted from the light emitter 12, totally reflected by the total reflection region 19, and reflected by the light reflecting portion 20 passes through the total reflection region 19 to be emitted forward as paralleled light.

SEVENTH PREFERRED EMBODIMENT

Figure 13:
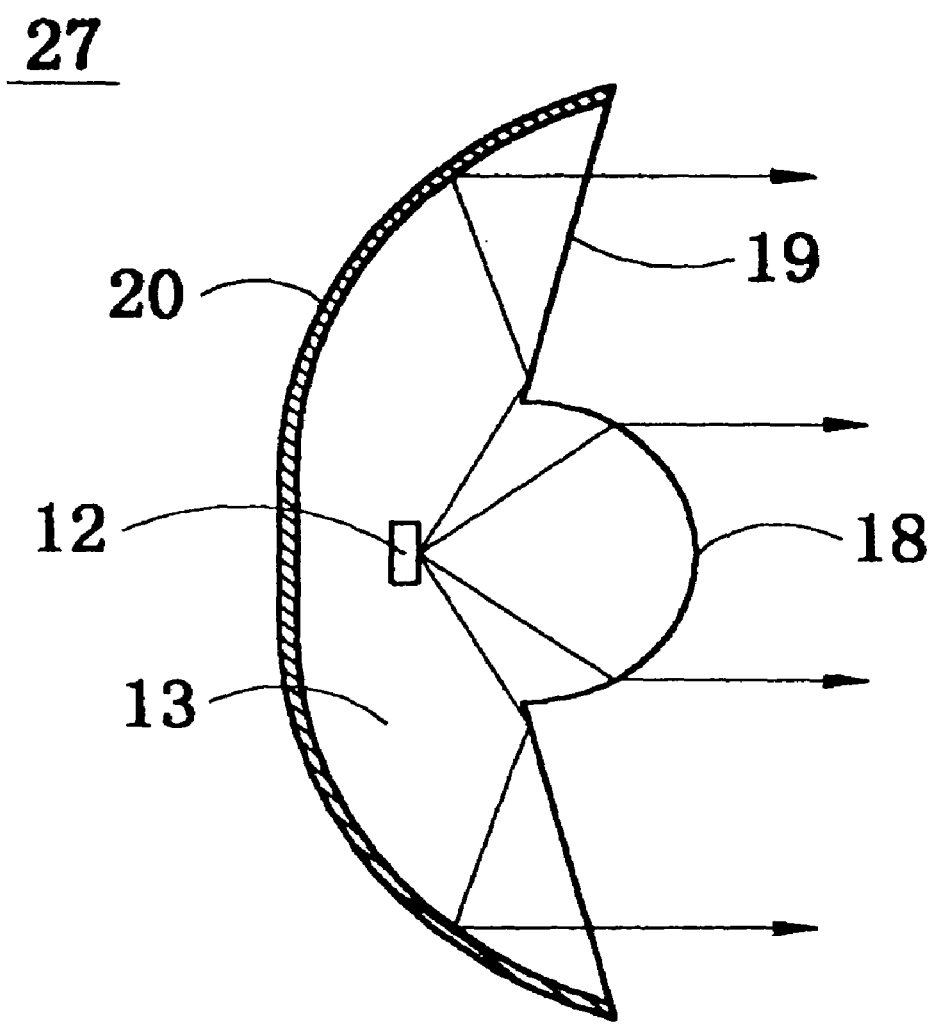
FIG. 13 is a sectional view of a light emission source according to a seventh preferred embodiment of this invention.

FIG. 13 is a sectional view of a light emission source 27 according to a seventh preferred embodiment of this invention, in which a total reflection region 19 has a reverse circular cone-shaped configuration. Since the total reflection region 19 is formed to have the reverse circular cone-shaped configuration so that its outer circumferential portion appears forward, an incident angle of light emitted from the light emitter 12 and striking against the total reflection region 19 can be designed to be large, whereby an aperture of an inner circumference portion of the total reflection region 19 can be made small. Accordingly, the ratio of light totally reflected by the total reflection region 19 and reflected by the light reflection portion 20 to be emitted from the total reflection region 19 can be large, whereby a light emission source having an optional directivity can be easily realized by optimally designing the configuration of the light reflecting portion 20.

Though not shown, the total reflection region 19 may be modified to have a circular cone-shaped configuration so that its outer peripheral potion appears backward. When the total reflection region 19 has the circular cone-shaped configuration, the light emitted from the total reflection region 19 can be gathered inner side, whereby a dark area of the total reflection region 19 near the direct emission region 18 can be minimized.

EIGHTH PREFERRED EMBODIMENT

Figure 14:
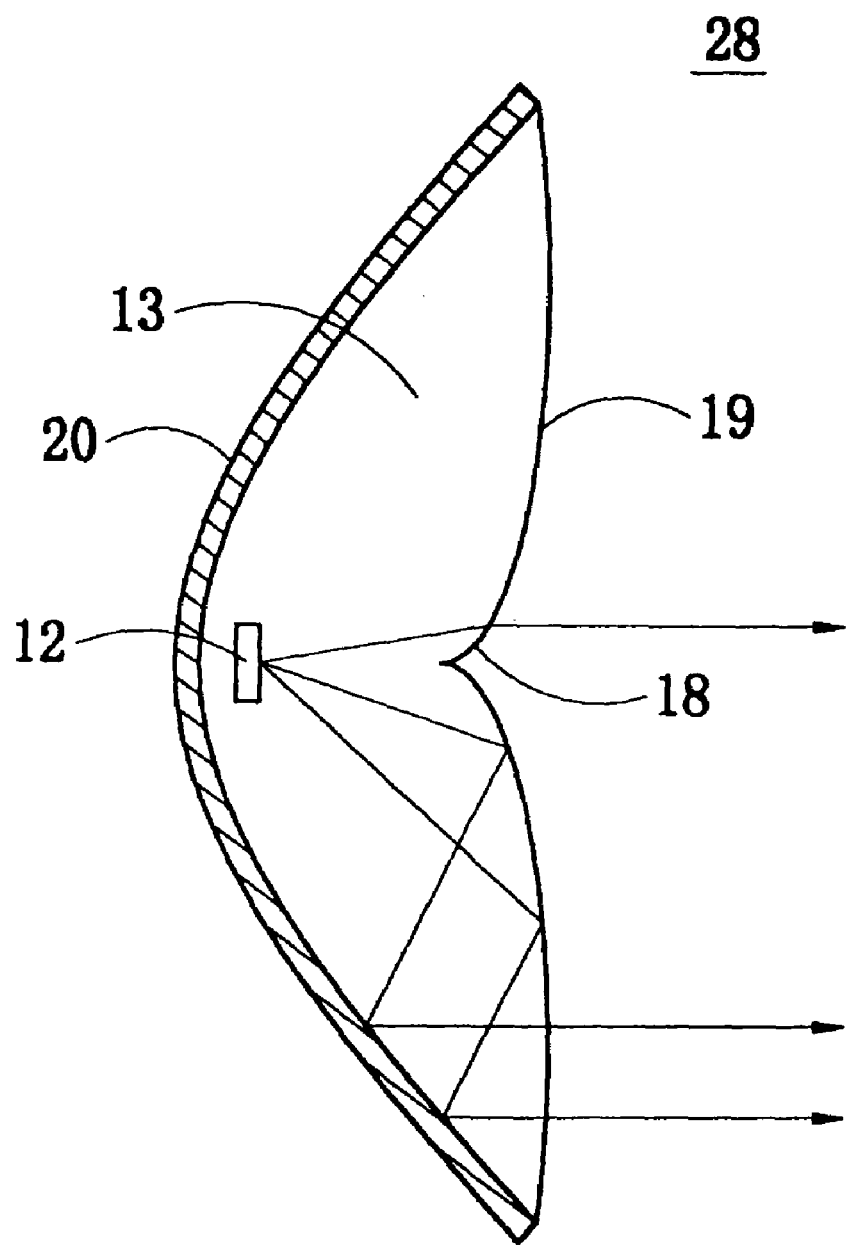
FIG. 14 is a sectional view of a light emission source according to an eighth preferred embodiment of this invention.

FIG. 14 is a sectional view of a light emission source 28 according to an eighth preferred embodiment. In this light emission source 28, a front wall of a mold resin 13 is formed to have a curved surface on which a direct emission region 18 and a total reflection region 19 are smoothly formed, whereby most of light emitted forward from a light emitter 12 is totally reflected by the front wall of the mold resin 13 (the total reflection region 19) and reflected by a light reflecting portion 20 to be emitted forward. According to the light emission source 28 of such a configuration, the design flexibility of the light emission source 28 is improved.

NINTH PREFERRED EMBODIMENT

Figure 15:
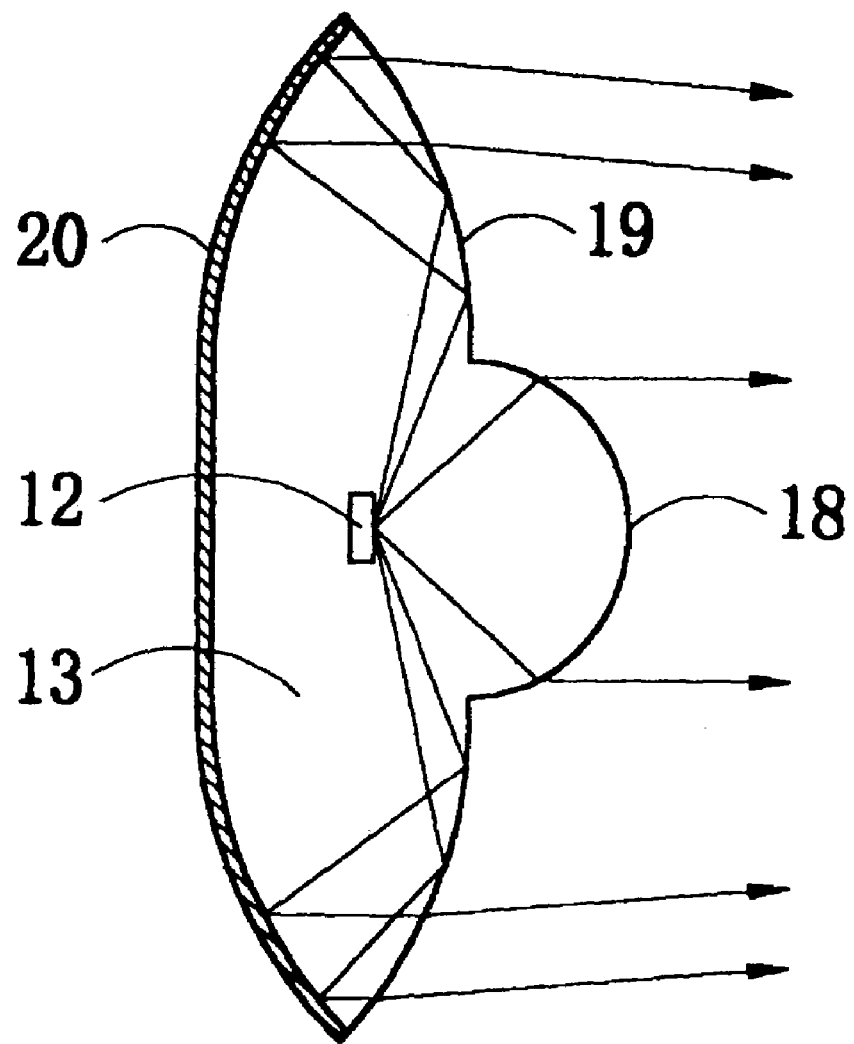
FIG. 15 is a sectional view of a light emission source according to a ninth preferred embodiment of this invention.

FIG. 15 is a sectional view of a light emission source 29 according to a ninth preferred embodiment. In this embodiment, a total reflection region 19 has a continuously varying curved face such as lens-curved face, and the degree of freedom of design is further improved.

TENTH PREFERRED EMBODIMENT

Figure 16:
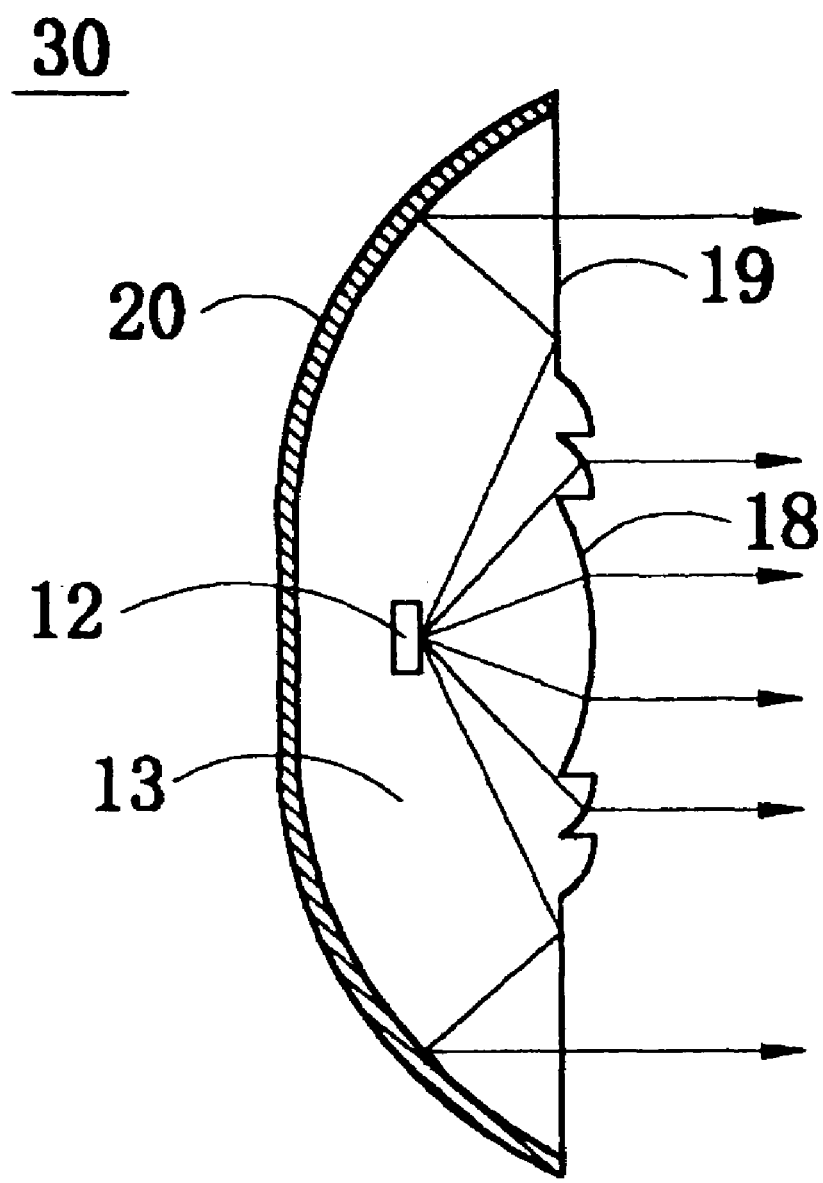
FIG. 16 is a sectional view of a light emission source according to a tenth preferred embodiment of this invention.

FIG. 16 is a sectional view of a light emission source 30 according to a tenth preferred embodiment. In the light emission source 30 of this embodiment, a lens configuration of a lens-shaped direct emission region 18 is formed to be a Fresnel lens to decrease the thickness of the direct emission region 18 or the light emission source 30.

ELEVENTH PREFERRED EMBODIMENT

Figure 17:
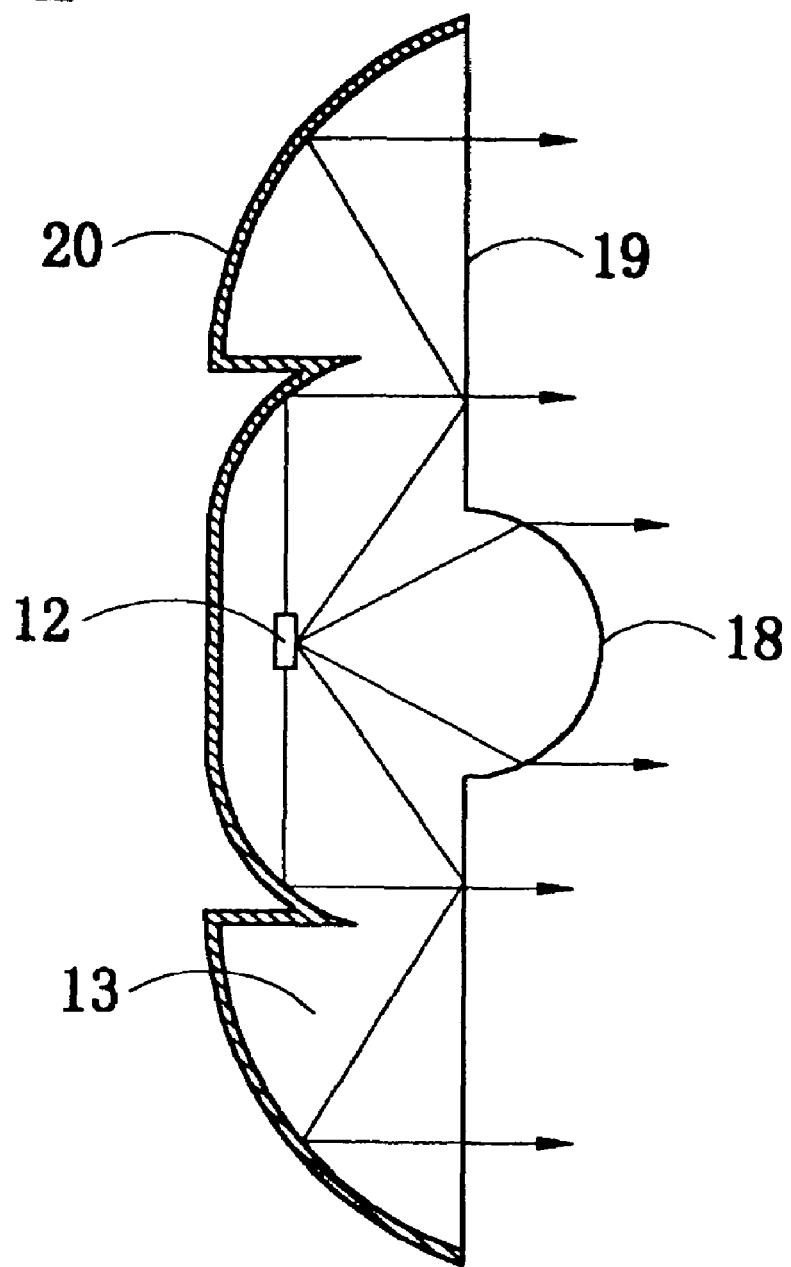
FIG. 17 is a sectional view of a light emission source according to an eleventh preferred embodiment of this invention.

FIG. 17 is a sectional view of a light emission source 31 according to an eleventh preferred embodiment. In the light emission source 31 of this embodiment, a rear face of a mold resin 13 is formed to include a Fresnel lens on a surface of which a light reflecting portion 20 is formed. In this embodiment, the thickness of the light emission source 31 can be reduced.

TWELFTH PREFERRED EMBODIMENT

Figure 18:
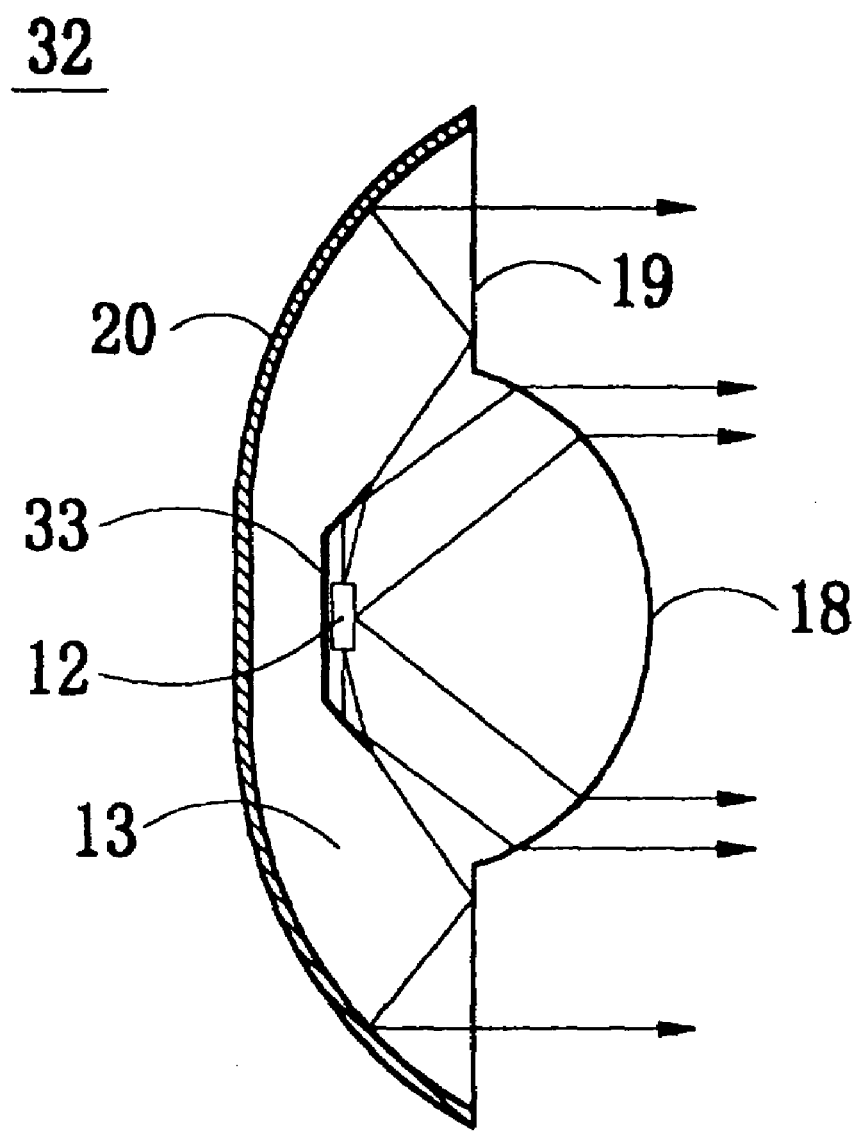
FIG. 18 is a sectional view of a light emission source according to a twelfth preferred embodiment of this invention.

FIG. 18 is a sectional view of a light emission source 32 according to a twelfth preferred embodiment. In this embodiment, a mirror 33 is disposed near a light emitter 12 within a mold resin 13 so as to reflect the light emitted sideway from the light emitter 12 toward a total reflection region 19. The light reflected by the mirror is totally reflected by the total reflection region 19, and further reflected by a light reflecting member 20 to be emitted forward from the total reflection region 19. If desired, the mirror 33 may be formed on an inner wall of a stem 15 (see FIG. 24).

According to this embodiment, the light emitted sideway in the light emitted from the light emitter 12 is directly reflected by the light reflecting portion 20 to be avoided from becoming lost light, whereby the light emitted in a side direction is effectively used and the use efficiency of light emitted from the light emitter 12 is further improved.

THIRTEENTH PREFERRED EMBODIMENT

Figure 19:
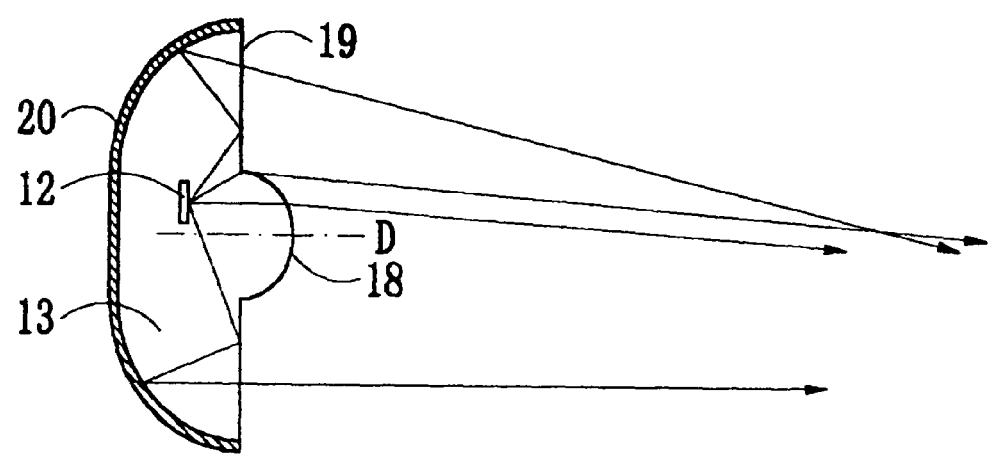
FIG. 19 is a sectional view of a light emission source according to a thirteenth preferred embodiment of this invention.

FIG. 19 is a sectional view of a light emission source 34 according to a thirteenth preferred embodiment. In this embodiment, a light emitter 12 is disposed in the location deviated from an optical axis D of a mold resin 13. Since the light emitter 12 is located apart from the axis D of a direct emission region 18 and a total reflection region 19, so that biased light is emitted from the light emission source 34 in an inclined direction. In other words, the directivity pattern can be a symmetry within a plane which light emitter 12 is located.

FOURTEENTH PREFERRED EMBODIMENT

Figure 20:
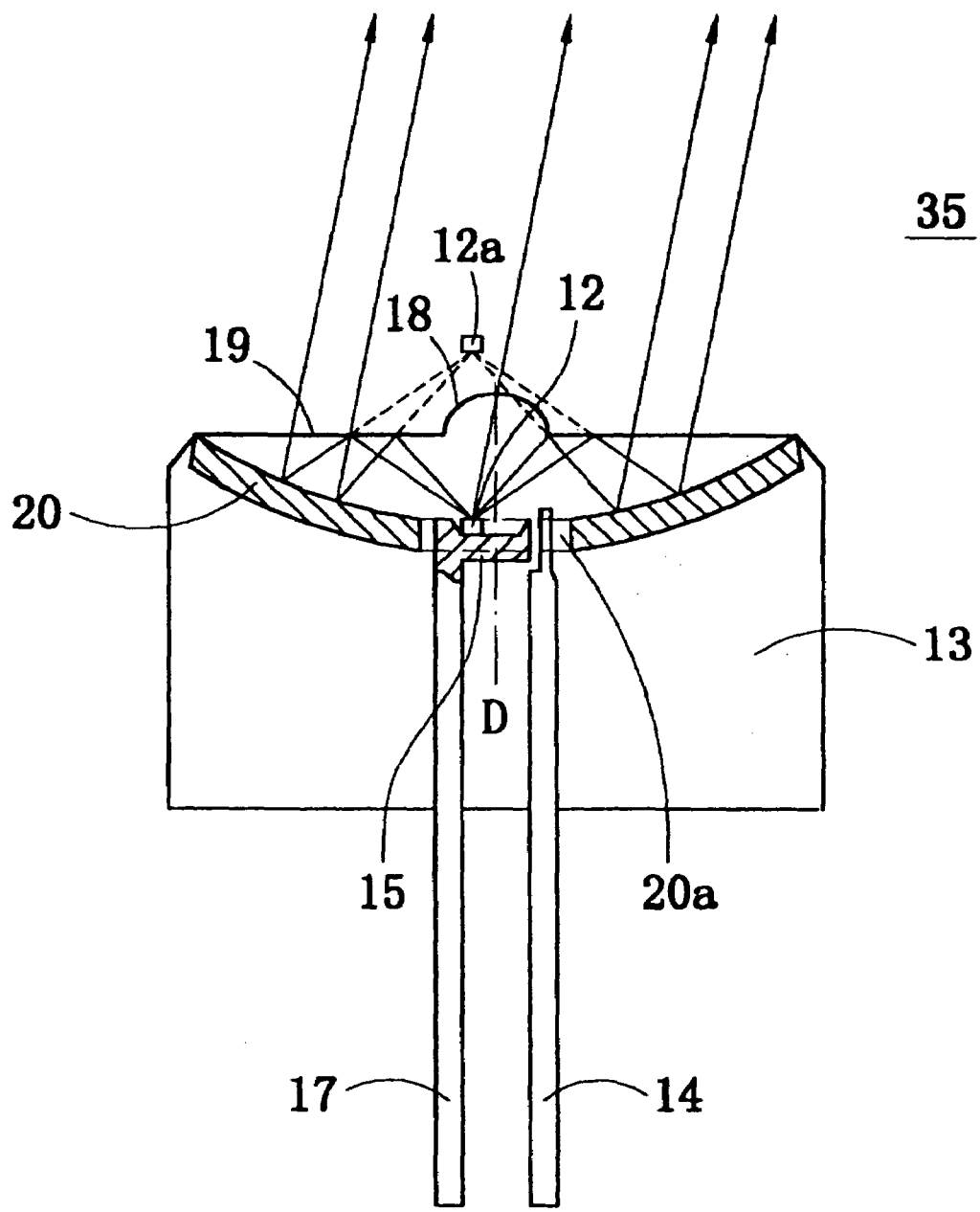
FIG. 20 is a sectional view of a light emission source according to a fourteenth preferred embodiment of this invention.

FIG. 20 is a sectional view of a light emission source 35 according to a fourteenth preferred embodiment of this invention. The light emission source 35 of this embodiment has a similar construction to that of the light emission source 26 as shown in FIG. 12, but the position of light emitter 12 is shifted from the center of light reflecting portion 20 and an optical axis D of direct emission region 18.

In other words, the light emitter 12 is disposed at a little displaced location to a direction perpendicular to the optical axis of the direct emission region 18. At least a region of the light reflecting portion 20 stricken by the light reflected by total reflection region 19 serves as a concave mirror, such as a spherical mirror or a parabolic mirror of revolution, and a center of the light reflecting portion 20 is disposed so as to accord with the optical axis D of the direct emission region 18. The concave mirror and the light emitter 12 have a positional relationship such that a mirror image 12a of the light emitter 12 with respect to the total reflection region 19 is located at a position apart from a focal point of the concave mirror in a wall which passes the focal point of the concave mirror and is perpendicular to the optical axis of the concave mirror. In other words, the light emitter 12 is disposed at the location displaced from a mirror image position of the focal point of the concave mirror with respect to the total reflection region 19.

Therefore, in this light emission source 35, the light emitted from the light emitter 12 passes the direct emission region 18 to be emitted in a diagonal direction as approximately paralleled light. The light emitted from the light emitter 12, totally reflected by total reflection region 19 and further reflected by the light reflecting portion 20 is emitted in a diagonal direction to the same direction as approximately paralleled light.

FIFTEENTH PREFERRED EMBODIMENT

Figure 21:
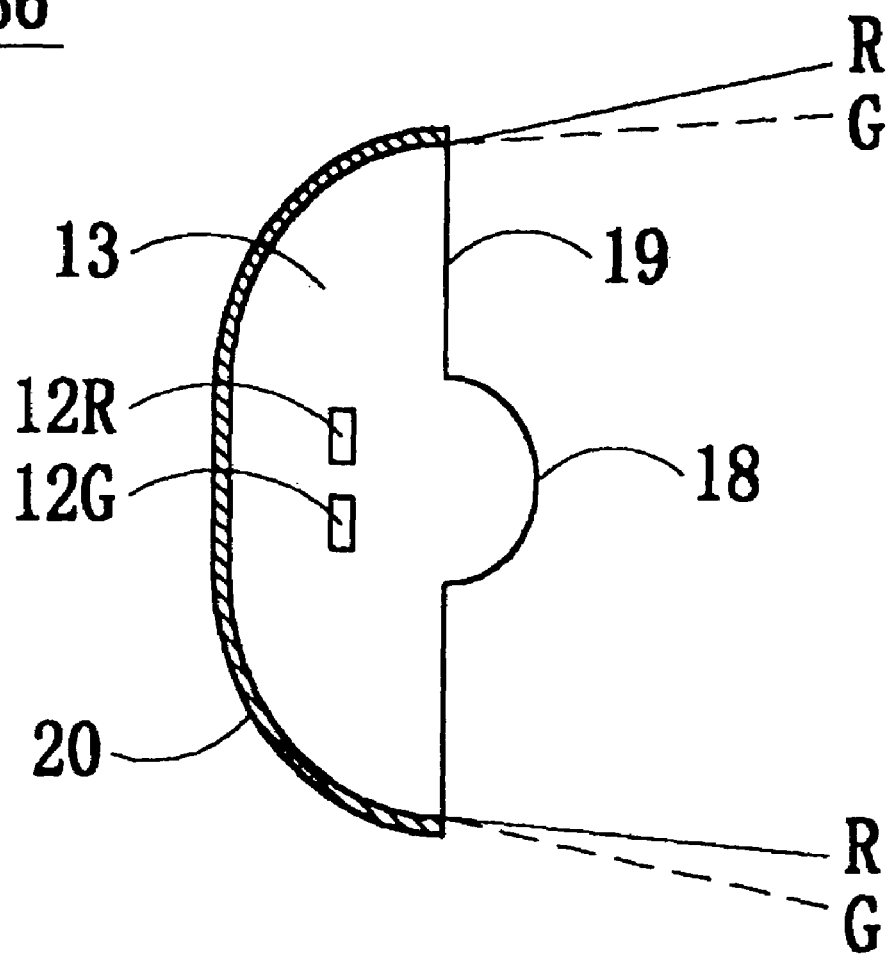
FIG. 21 is a sectional view of a light emission source according to a fifteenth preferred embodiment of this invention.

FIG. 21 is a sectional view of a light emission source 36 according to a fifteenth preferred embodiment. In this embodiment, a plurality of light emitters 12R and 12G having different light emission colors respectively (for example, a red light emitting diode, a green light emitting diode) are sealed within the mold resin 13.

Figure 22:
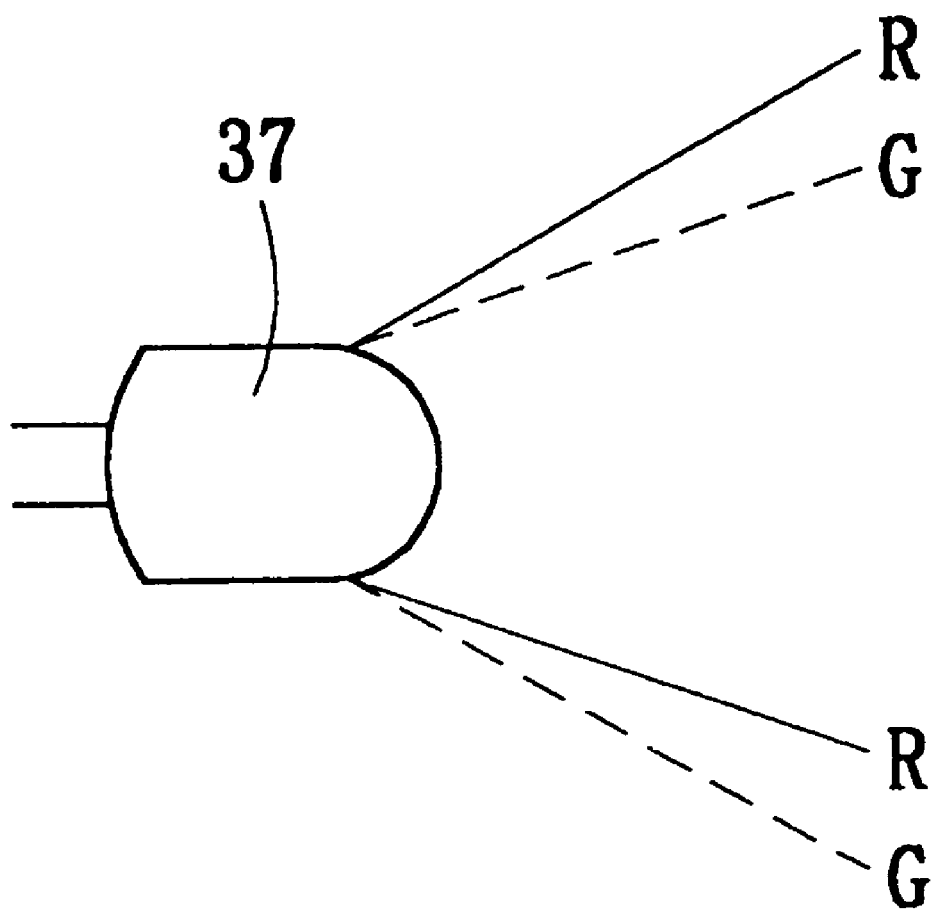
FIG. 22 shows color splitting in a conventional light emission source in a two chip-shape

When a plurality of light emitters each in a chip shape are enclosed within the mold resin in a cannonball-shaped light emission source 37 (a comparative example) as shown in FIG. 22, the color isolation is large and varies depending on a viewing direction, and visual performance depends on the viewing direction. In the light emission source 36 of this invention, the configuration of a direct emission region 18 and a total reflection region 19, whereby the difference of degrees of color isolation by its viewing direction can be small, and its visual performance can be uniformed.

SIXTEENTH PREFERRED EMBODIMENT

Figure 23:
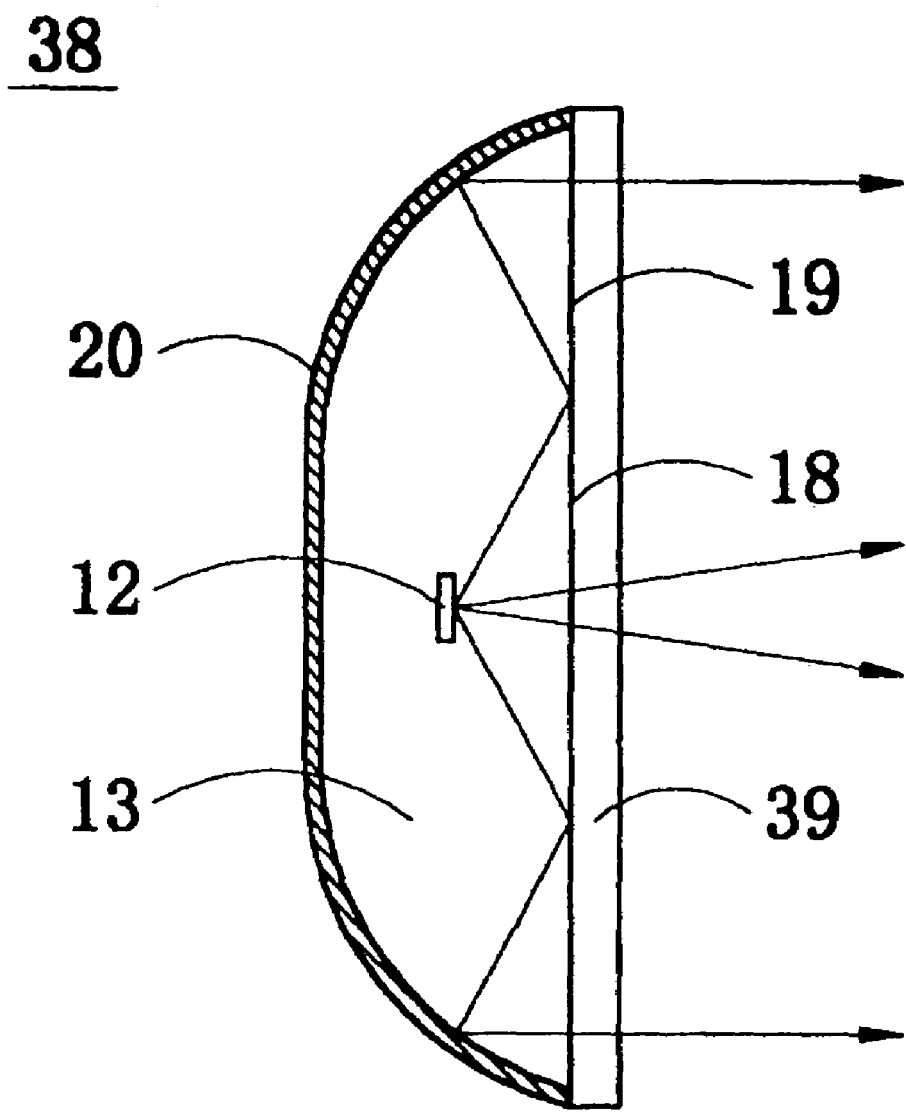
FIG. 23 is a sectional view of a light emission source according to a sixteenth preferred embodiment of this invention.

FIG. 23 is a sectional view of a light emission source 38 according to a sixteenth preferred embodiment. In this embodiment, an optical multilayer film 39 is formed over a whole front wall of a mold resin 13. By forming the optical multilayer film 39 on the front wall of the mold resin 13, the light having an incident angle larger than a particular angle is reflected by a boundary surface and the light having an incident angle smaller than the particular angle is driven to pass through. Moreover, the particular angle can be optionally chosen by design of the optical multilayer film 39, thereby increasing the degree of freedom of the design. The light emission source including the optical multilayer film 39 may be any of light emission sources shown in FIGS. 3 to 20 or other light emission source, if desired.

SEVENTEENTH PREFERRED EMBODIMENT

Figure 24:
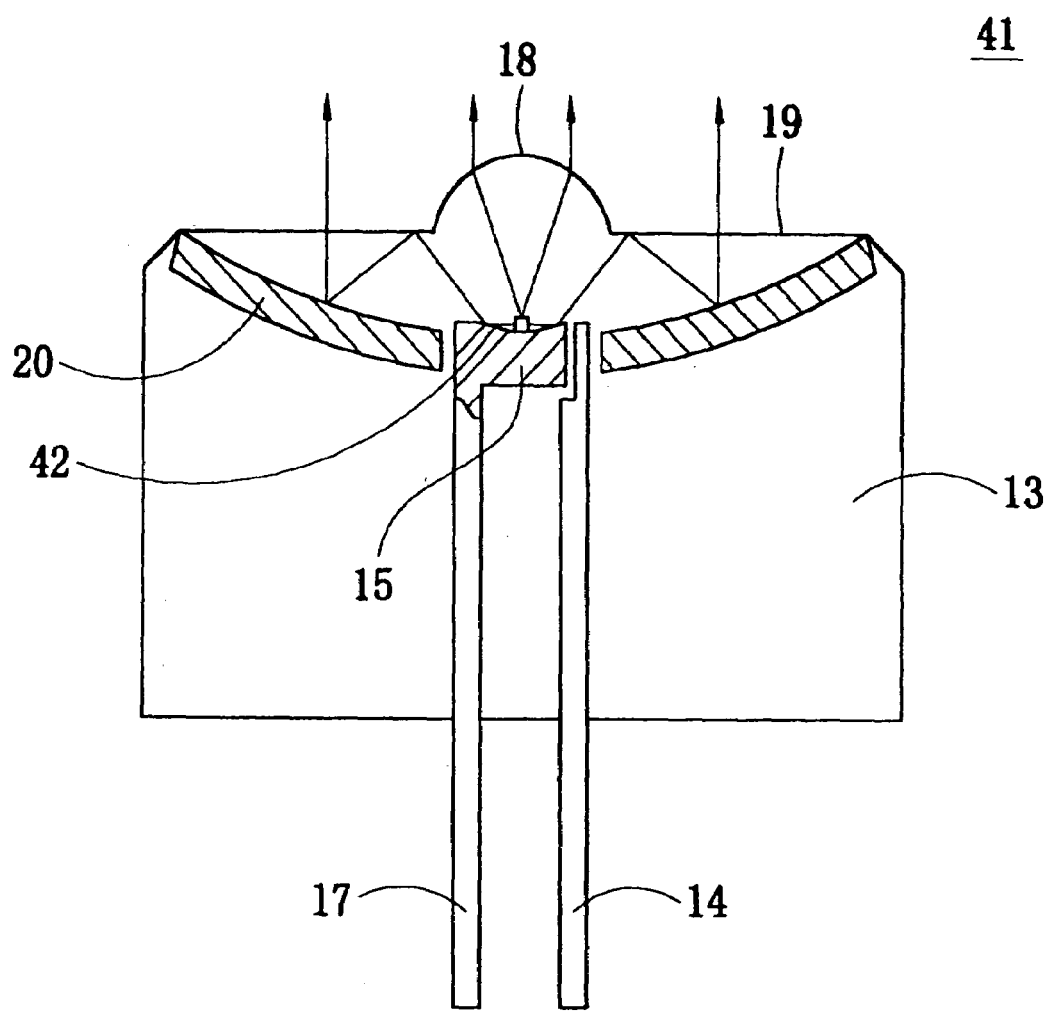
FIG. 24 is a sectional view of a light emission source according to a seventeenth preferred embodiment of this invention.

FIG. 24 is a sectional view of a light emission source 41 according to a seventeenth preferred embodiment. Before describing the light emission source 41 of this embodiment, embodiments for comparison will be described hereinafter to ease understanding this embodiment.

For instance, in the light emission source as shown in FIG. 10 or 12, the cup in a parabola shape (light reflecting member) is disposed on the stem 15 at a top end of the lead frame 17 so that the light emitter 12 mounted within the stem 15 is surrounded by the cup. This is because the light emitted from a side wall of the light emitter 12 (LED bare chip) is reflected by an inner surface of the cup to be emitted forward. Thus cup within the stem is conventionally employed, but the conventional cup is slanted toward roughly 45 degrees against the optical axis of the light emitter.

Figure 27:
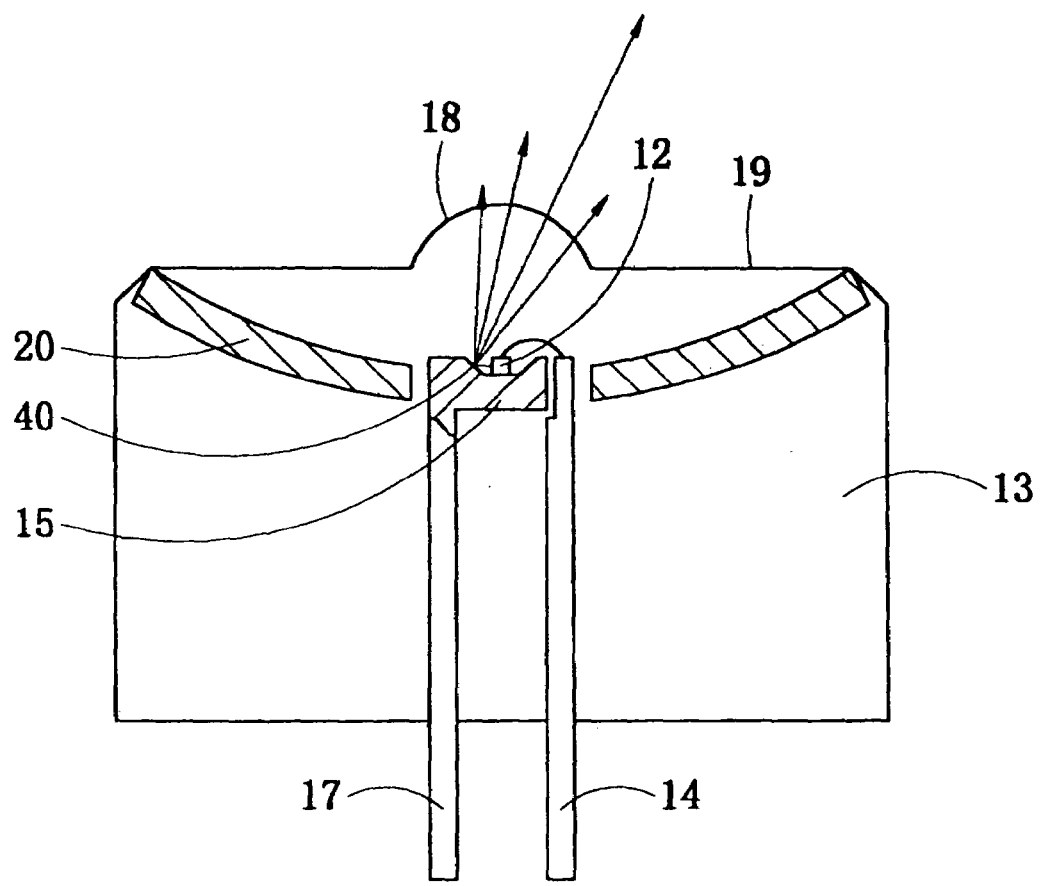
FIG. 27 is a sectional view showing an embodiment to be compared with the embodiment of FIG. 24.
Figure 28:
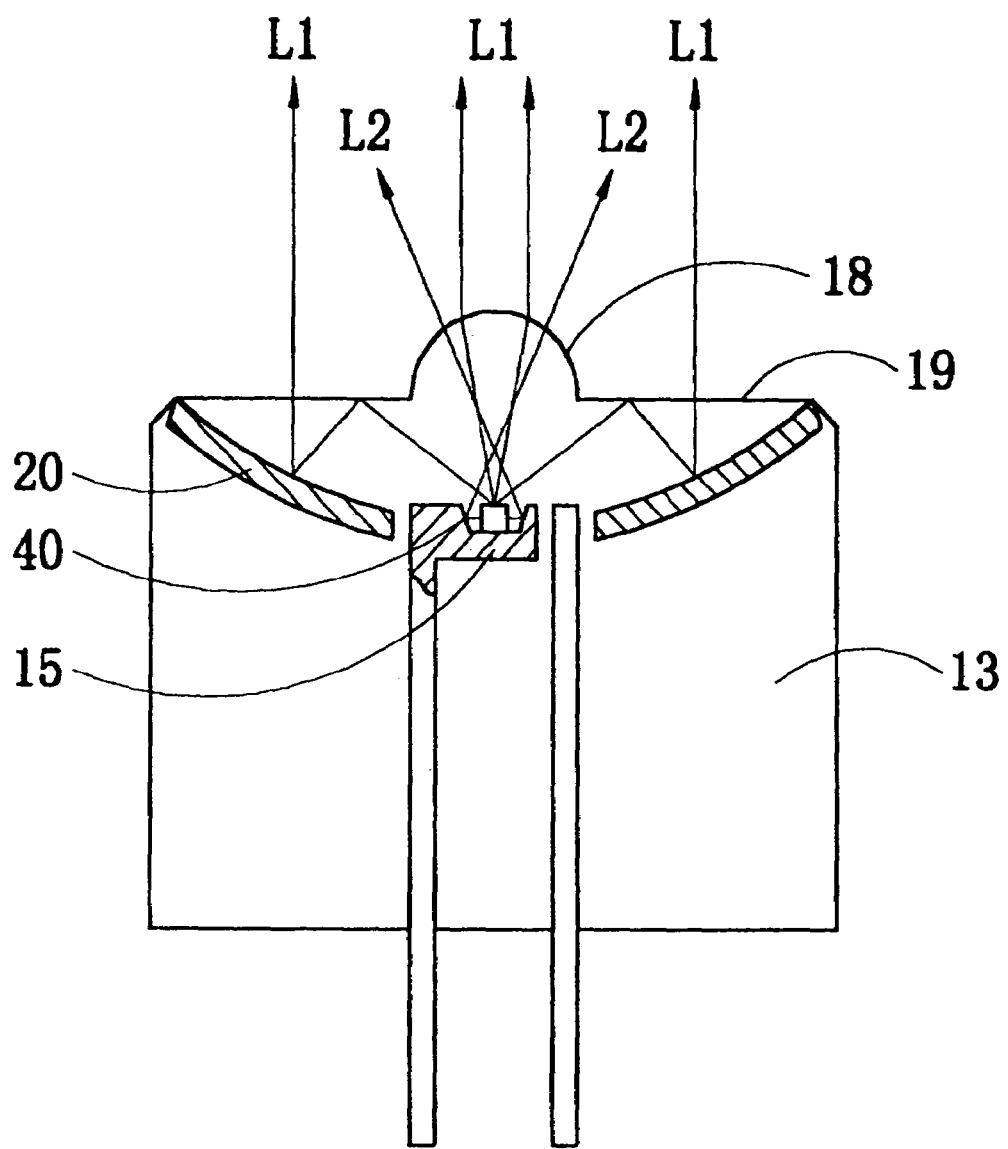
FIG. 28 is a view showing light movement in the embodiment of FIG. 27.

FIG. 27 shows an embodiment in which a conventional cup 40 is employed in the light emission source shown in FIG. 12 as it is. The optical axis of light emitted from direct emission region 18 is fixed by an angle connecting a light emission point with a principal point of the direct emission region 18. The light emitted by the cup 40 can be regarded as the light where the cup 40 is a virtual light source. Namely, a mirror image of the light emitter 12 with respect to the cup 40 appears in a ring shape near an outer circumference of an inner wall of the cup 40. The distance between the light emitter 12 and the cup 40, however, is very short, so that the mirror image of the light emitter 12 appears very near the cup 40, or almost accords with the cup 40. As shown in FIG. 27, the light emitted after reflection by the cup 40 can be regarded as the light emitted from respective points on a surface of the cup 40 (virtual light source), so that an optical axis of the light which is emitted from the light emitter 12, reflected by the cup 40 and emitted from the direct emission region 18 declines, and the light is emitted in a slant direction.

In a conventional light emission source with the use of this cup 40 (for example, a cannonball shape as shown in FIG. 22), the distance between the light emitter and the lens is long, so that the gradient of the optical axis of such emitted light is small, so that any substantial problem has not happened. In the light emission source of this invention, the distance between the light emitter 12 and the direct emission region 18 is short, so that the gradient of the optical axis of the emitted light reflected by the cup 40 becomes large, whereby the light which is emitted forward from the light emitter 12 and the light which is emitted from a side of the light emitter 12 and reflected by the cup 40 cannot be emitted in approximately same direction.

As a result, when the light emission source of this invention employs a conventional cup having a gradient roughly 45°, the light emitted from the light emitter 12 is mixed with the light L1 emitted in approximately in the optical axis and the light L2 emitted in a direction greatly deviated from the optical axis. In particular, as it becomes far from the light emission source, the light emitted in different directions is split so that the light L2 appears in a ring shape around the light L1. Moreover, the direct emission region 18 cannot be designed together with the front light and the sideway light of the light emitter 12, whereby the optical lens is designed about the front light, and the optical axis of the slant light L2 cannot be controlled by the design of a lens shape of the direct emission region 18.

Figure 25:
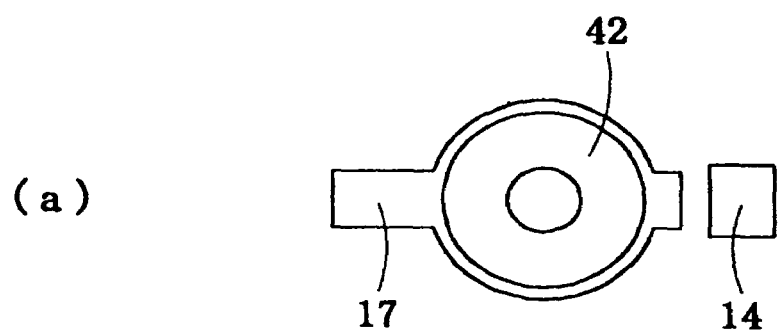
FIG. 25 shows at (a) a front enlarged view of a lead frame employed in the light emission source of FIG. 24, and at (b) a partially broken side view of the same.
Figure 25:
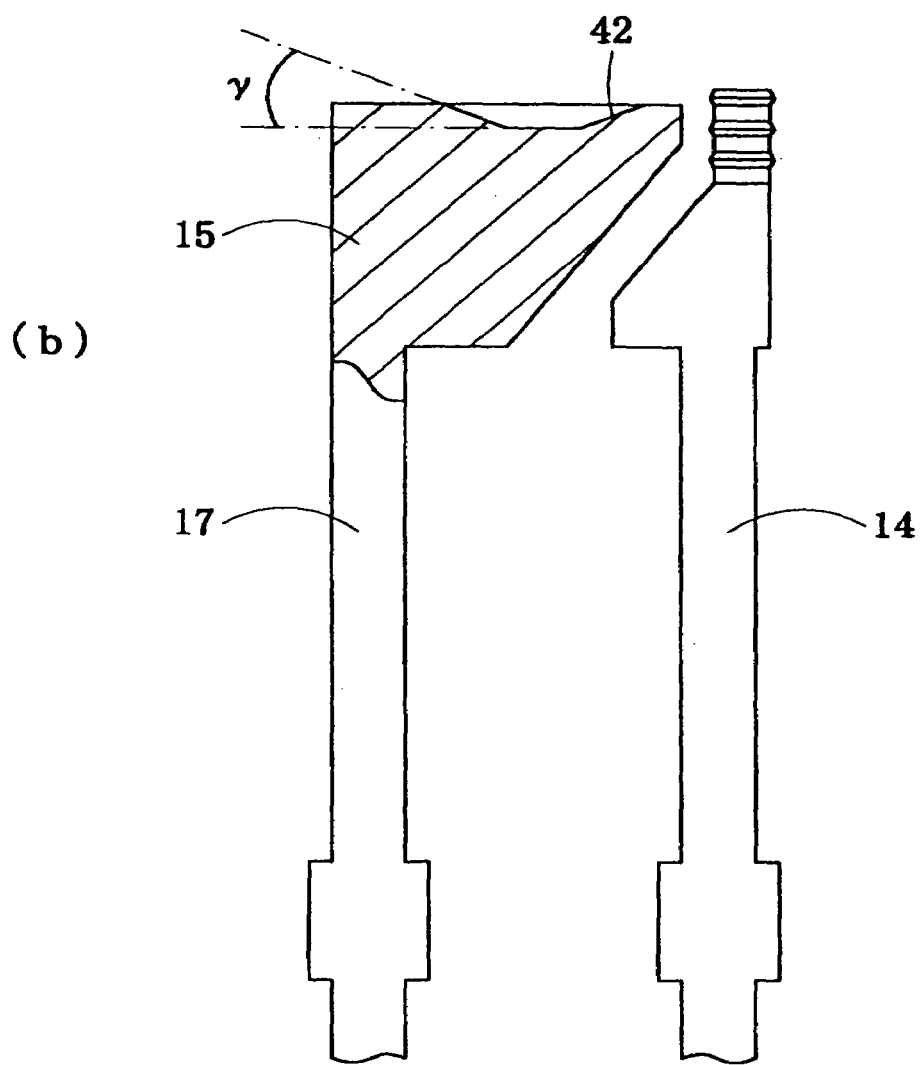
Figure 26:
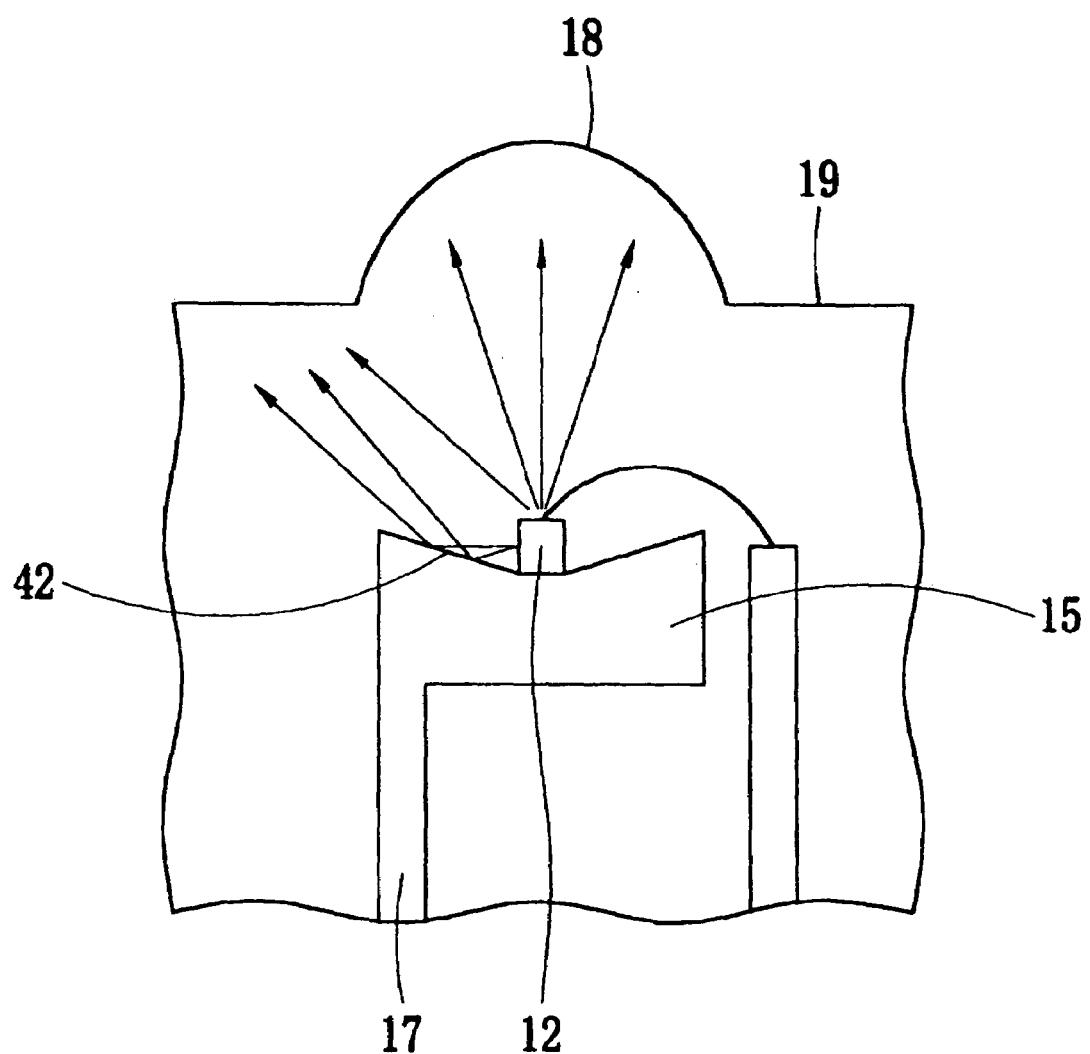
FIG. 26 is an enlarged sectional side view of a portion of FIG. 24 to express light movement.

The above-mentioned embodiments are improved by stem 15 in this seventeenth embodiment. The light emission source 41 of FIG. 24 employs a similar construction to the embodiment shown in FIG. 12, and provides an improvement. FIG. 25 at (a) and (b) shows a front view of a lead frame and a partially sectional side view of the same. In this embodiment, stem 15 also is disposed for mounting light emitter 12, and a cup 42 for light reflection is disposed around a mounting position for the light emitter on the stem 15. The light emitter 12 is mounted on an inside face of the cup 42 on a front wall of the stem 15. As shown in FIG. 26 which is a partially magnified view of FIG. 24, the configuration of the cup 42 is designed so that the light emitted sideway from the light emitter 12 and reflected by the cup 42 can be directed to the total reflection region 19 without going to the direct emission region 18. As concretely shown in FIG. 25, a gradient angle γ of the cup 42 from a bottom inner wall of the stem at an inner side of the cup 42 is designed to be 22 degrees.

Since the gradient angle γ of the cup 42 is small and the light reflected by the cup 42 is directed to the total reflection region 19 in this light emission source 41, the light emitted from a side wall of the light emitter 12 and reflected by the cup 42 is totally reflected by the total reflection region 19 to be directed to the light reflecting portion 20, and further reflected by the light reflecting portion 20 to pass through the total reflection region 19 for forward emission as shown in FIG. 24. The light emitted from a front wall of the light emitter 12 and striking against the total reflection region 19 is also totally reflected by the total reflection region 19 to be directed to the light reflecting portion 20, and further reflected by the light reflecting portion 20 to pass through the total reflection region 19 for forward emission. The light striking against the direct emission region 18 among the light emitted from a front of the light emitter 12 becomes subject to a lens function on the direct emission region 18, and is emitted forward.

Thus, the light reflected by the cup 42 is totally reflected by the total reflection region 19 to be directed to the light reflecting portion 20, whereby the light path can be freely controlled by the light reflecting portion 20. Accordingly, when the light reflected by the cup 42 employing lead frames 14 and 17 is directed to the total reflection region 19, almost all light emitted from the light emitter 12 can be emitted to a desired direction (for example, a direction in parallel with the optical axis of the light emitter 12). In this embodiment, the light emission source 41 is free from becoming large.

The reason why the light path can be freely controlled by directing the light reflected by the cup 42 toward the total reflection region 19 will be explained hereinafter. Before the light emitted from a front and a side of the light emitter 12 reaches the light reflecting portion 20, the light path is bent by the reflection at the total reflection region 19, so that the light path length from the light emitter 12 to the light reflecting portion 20 becomes long, whereby the light reflecting portion 20 receives the light emitted from a front of the light emitter 12 and the light emitted from a side of the light emitter 12 and reflected by the cup 42 in approximately same directions respectively. Accordingly, they can be simultaneously controlled. When the curvature of the light reflecting portion 20 is designed, both are possible to be generally designed.

EIGHTEENTH PREFERRED EMBODIMENT

Figure 29:
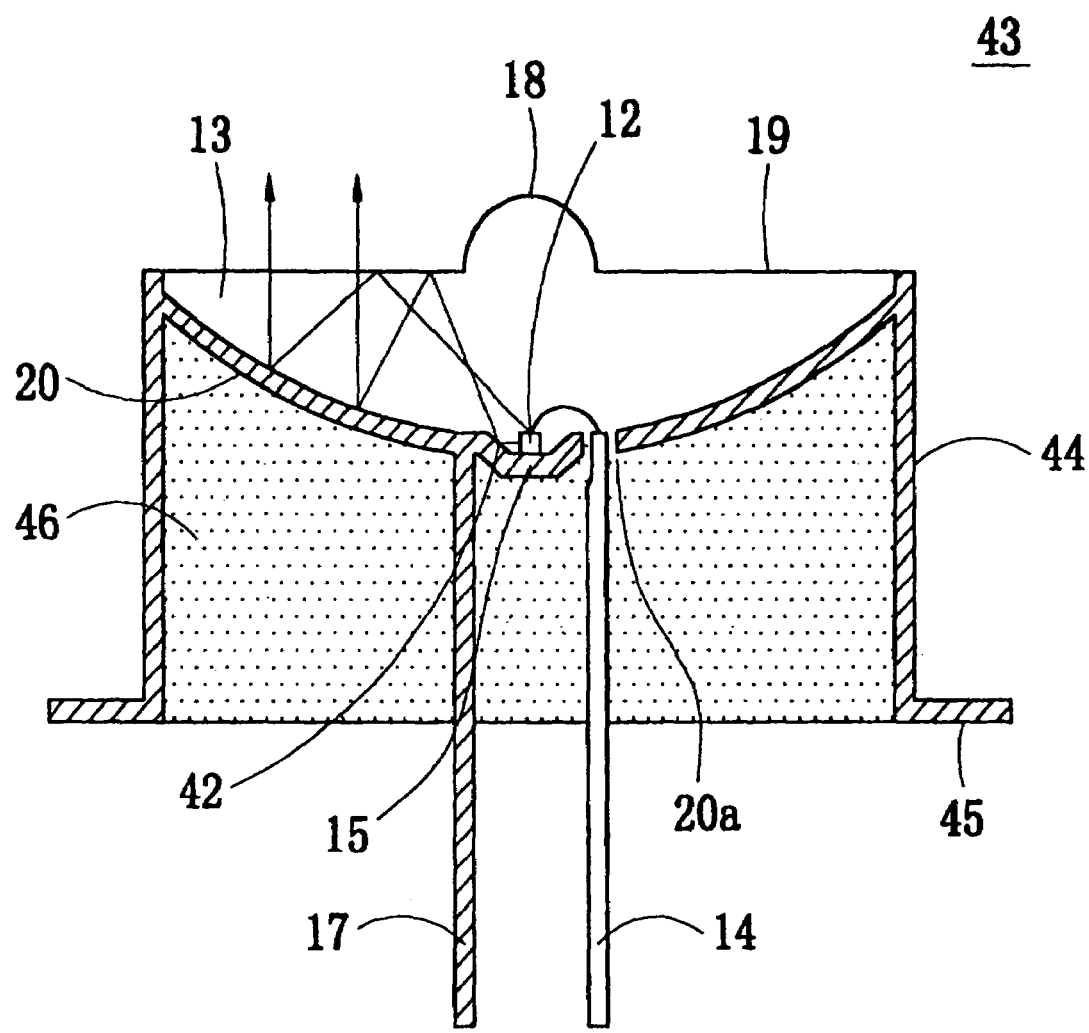
FIG. 29 is a sectional view of a light emission source according to an eighteenth preferred embodiment of this invention.

FIG. 29 is a sectional view of a light emission source 43 according to an eighteenth preferred embodiment. This embodiment is of a can package type, in which a front wall of a light reflecting portion 20 is filled with a transparent mold resin 13, a rear wall of the light reflecting portion 20 is filled with an insulating material 46, a cylindrical housing 44 extending from outer circumferential portion of the light reflecting portion 20 covers an outer peripheral surface of the insulating material 46, and a flange 45 is disposed at a periphery of a rear end of the housing 44.

In addition, the light reflecting portion 20 in the center thereof is formed with the stem 15 as a single unit. Further, light reflecting portion 20, stem 15, lead frame 17, cylindrical housing 44 and flange 45 are formed as a single unit by metallic material. A head of the lead frame 14 is inserted within an aperture 20a of the light reflecting portion 20 without contact with the same.

Therefore, according to this embodiment, the number of parts is reduced, the assembly is easy, and manufacturing cost is reduced. In particular, it gets possible to produce it by a production process same as general can package products. Furthermore, the housing 44 and the flange 45 united with the stem 15 are exposed to a surface, whereby heat dissipation nature of the heat which is occurred with the light emitter 12 is improved, and the allowance forward current quantity is increased, thereby performing high brightness.

Furthermore, in this embodiment, the cup 42 disposed on the stem 15 is designed so that the light emitted from a side of the light emitter 12 and reflected by the cup 42 can be directed toward the total reflection region 19, whereby each emission direction of the light emitted from the light emission source 43 can be aligned in one direction.

Several embodiments for a light receiver will be described hereinafter.

NINETEENTH PREFERRED EMBODIMENT

Figure 30:
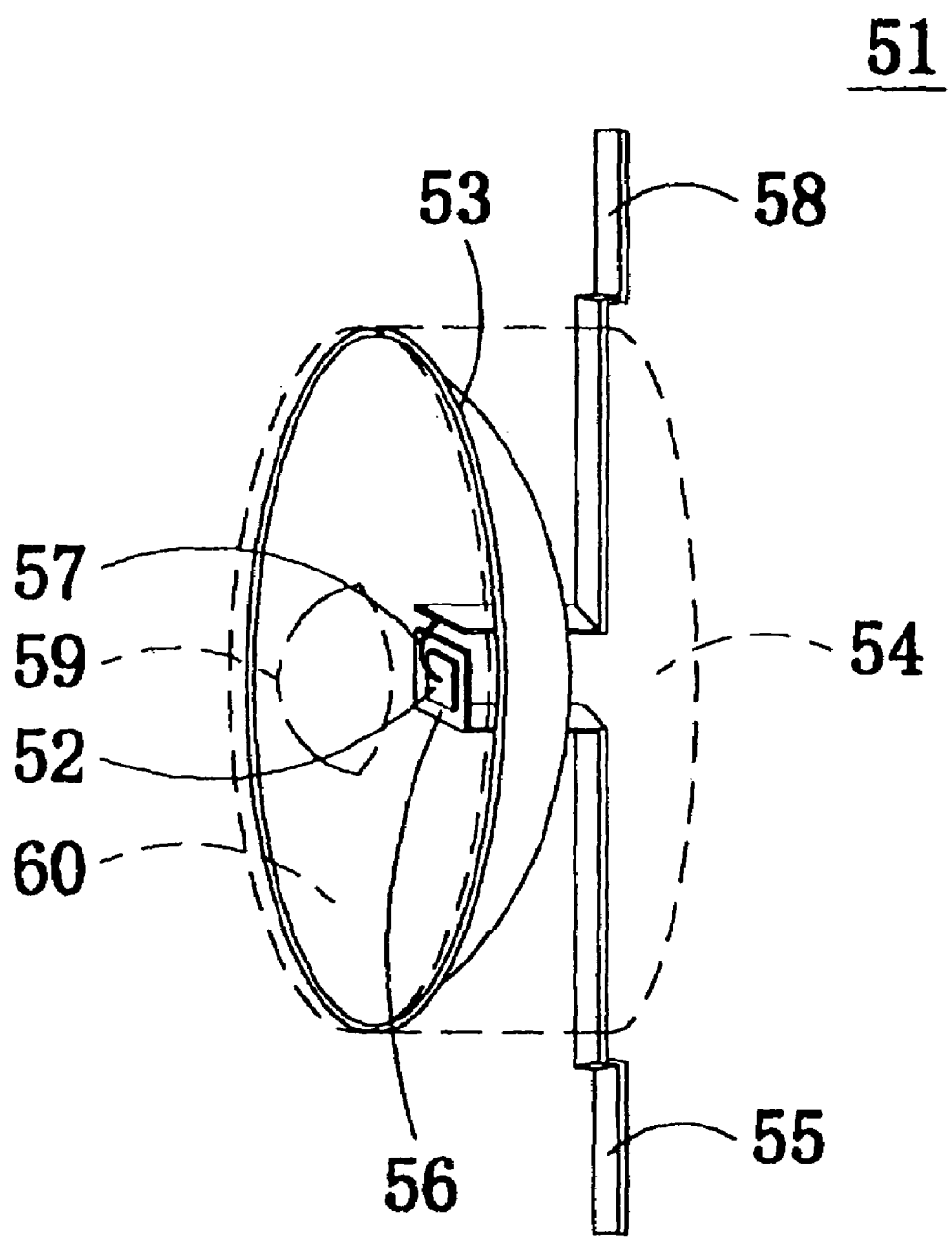
FIG. 30 is a perspective view of a light receiver according to a nineteenth preferred embodiment of this invention.
Figure 31:
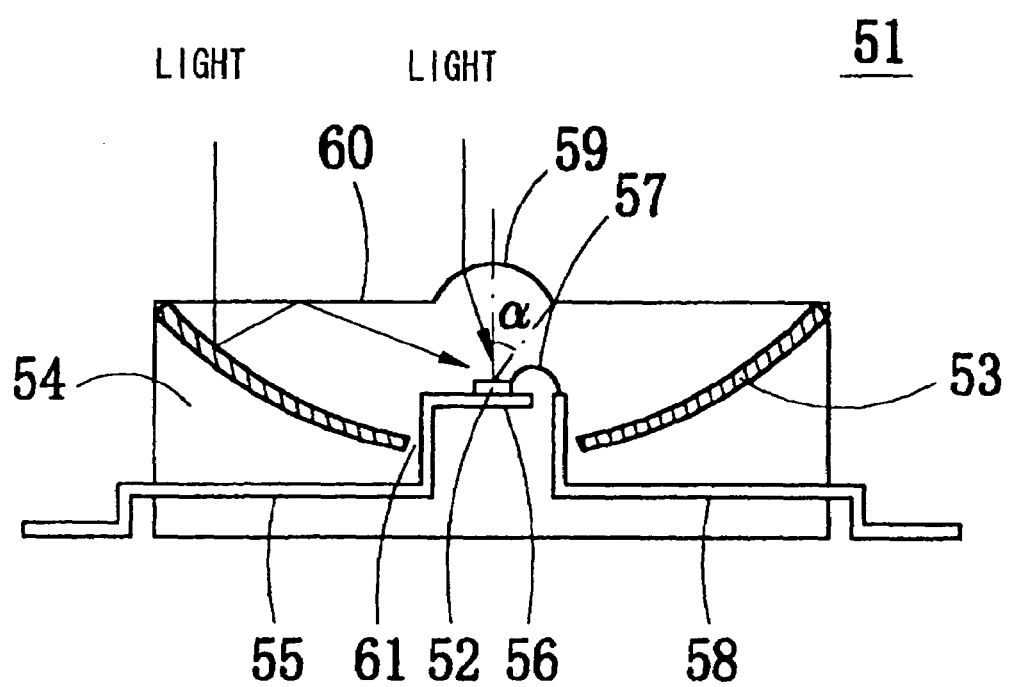
FIG. 31 is a sectional view of the light receiver of FIG. 30.

FIG. 30 is a perspective view of an inner configuration of a light receiver 51 according to a nineteenth preferred embodiment of this invention, and FIG. 31 is a sectional view of the receiver. According to this light receiver 51, a photo detector 52 in a chip shape, such as a photo diode or photo-transistor or the like, and a light reflecting portion 53 are sealed within a mold resin 54 made of a transparent resin material. The photo detector 52 sealed within the mold resin 54 is mounted on a stem 56 disposed on a head of a lead frame 55, connected with another lead frame 58 by a bonding wire 57, and disposed so that its light receiving wall faces forward.

In a front central part of the mold resin 54, there is provided a direct incidence region 59 having a convex lens configuration such as a spherical lens shape, an aspherical lens shape, or a paraboloid shape. A flat region 60 (resin boundary surface) having flatness is formed to surround the direct incidence region 59. The direct incidence region 59 is formed so that its medial axis may accord with an optical axis of the photo detector 52. The flat region 60 has a flat face perpendicular to the optical axis of the photo detector 52. The photo detector 52 is located at a focal point of the direct incidence region 59 or its neighborhood, and the light striking against the direct incidence region 59 in the light approximately perpendicularly striking against the photo detector 51 is focused to the photo detector 52 to be received by its light receiving face thereof.

An angle α of a direction, viewed from the photo detector 52 toward a boundary between the direct incidence region 59 and the flat region 60, from the optical axis is equal to a critical angle θc of the total reflection between the mold resin 54 and air or larger.

A light reflection portion 53 is a metal plate which is molded to a parabola shape by press working and plated with aluminum or silver on its surface for specular working. If desired, the light reflection portion 53 may employ a pressed part of aluminum or silver which is applied by chemical treatment for providing glossiness on its surface. The light reflecting portion 53 at its center is provided an aperture 61 for accommodating a stem 56, and is sealed within a mold resin 54 together with lead frames 55 and 58 wherein the stem 56 mounted by the photo detector 52 is accommodated within the aperture 61. A configuration of a section of the light reflecting portion 53 is designed so that the light perpendicularly striking against the flat region 60 of the mold resin 54 and reflected by the light reflecting portion 53 may be totally reflected by the flat region 60 to enter into the photo detector 52.

Accordingly, the light striking against the direct incidence region 59 in the light approximately perpendicularly striking against the light receiver 51 is refracted to be focused on the photo detector 52 when it passes the direct incidence region 59. The light striking against the flat region 60 is reflected by the light reflecting portion 53, and totally reflected by the flat region 60 to be focused on the photo detector 52. Thus, most of light approximately perpendicularly striking against the light receiver 51 can be focused on the photo detector 52, whereby the light receiver 51 having a high efficiency of light receipt can be produced. The quantity of receiving light can be increased by increasing the light receive area which can be performed by enlarging the light reflecting portion 53 without depending on the area of the photo detector 52, thereby increasing the quantity of receiving light and the light receiving efficiency at a reduced cost. Moreover, thinning the light receiver 51 can be performed by increasing the light receiving efficiency without thickening the receiver.

According to the light receiver 51 having such a configuration, the light reflecting portion 53 which is a discrete part together with the photo detector 52 and the stem 56 has only to be set within a mold, thereby simplifying the manufacturing process of the light receiver 51.

The edge of a circumference face of the light reflecting portion 53 is adjusted to the edge portion of the mold resin 54. Accordingly, when the mold resin 54 is molded, an outer circumferential edge on a reflection side of the light reflecting portion 53 coming into contact with an inner wall of a cavity of the mold can be set, whereby the light reflecting portion 53 is fixed about its position to be precisely inserted within the mold resin 54, thereby improving the mounting accuracy of the light reflecting portion 53.

TWENTIETH PREFERRED EMBODIMENT

Figure 32:
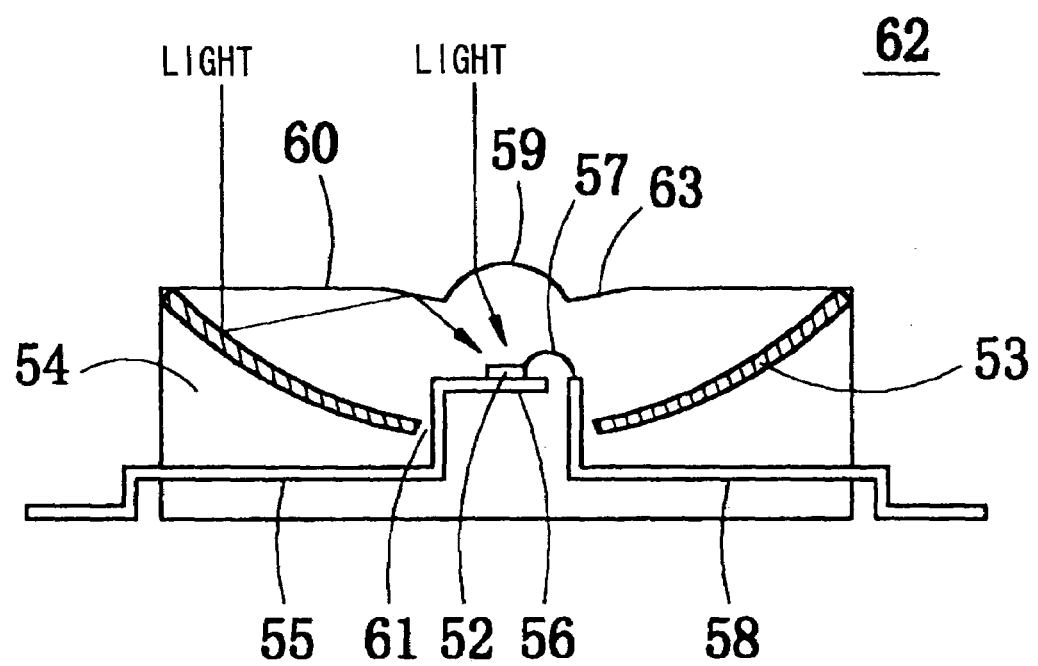
FIG. 32 is a sectional view of a light receiver according to a twentieth preferred embodiment of this invention.

FIG. 32 is a sectional view of a light receiver 62 according to a twentieth preferred embodiment. In this embodiment, a direct incidence region 59 is disposed at a center of a surface core of the mold resin 54, a taper-shaped portion 63 in a circular cone (block) or pyramid (block) shape which hollows at its center is disposed around the direct incidence region 59, and a flat region 60 is disposed outside the portion 63. The medial axis of the taper-shaped part 63 agrees with an optical axis of a photo detector 52, and the flat region 60 has a face perpendicular to a photo detector 52.

According to this light receiver 62, the incident light to the direct incidence region 59 is refracted to be directed to the photo detector 52. The light almost perpendicularly striking the flat region 60 is reflected light reflecting portion 53, and further totally reflected by the flat region 60 to be directed to the photo detector 52. The taper-shaped portion 63 is designed so that the light entering through the flat region 60 to be reflected by an outer circumferential portion of the light reflecting portion 53 can be directed to the photo detector 52 without totally reflected in a direction deviating from the photo detector 52 when it is totally reflected near the direct incidence region 59. According to this embodiment, the light receiving efficiency is improved. The employment of the taper-shaped part 63 allows the projection length of the direct incidence region 59 to be decreased and the light receiver 62 to be thinned.

According to thus construction, an angle α of a direction, viewed from the photo detector 52 toward a boundary between the direct incidence region 59 and of the taper-shaped part 63, from the optical axis can be smaller than a critical angle θc of the total reflection between the mold resin 54 and air.

TWENTY-FIRST PREFERRED EMBODIMENT

Figure 33:
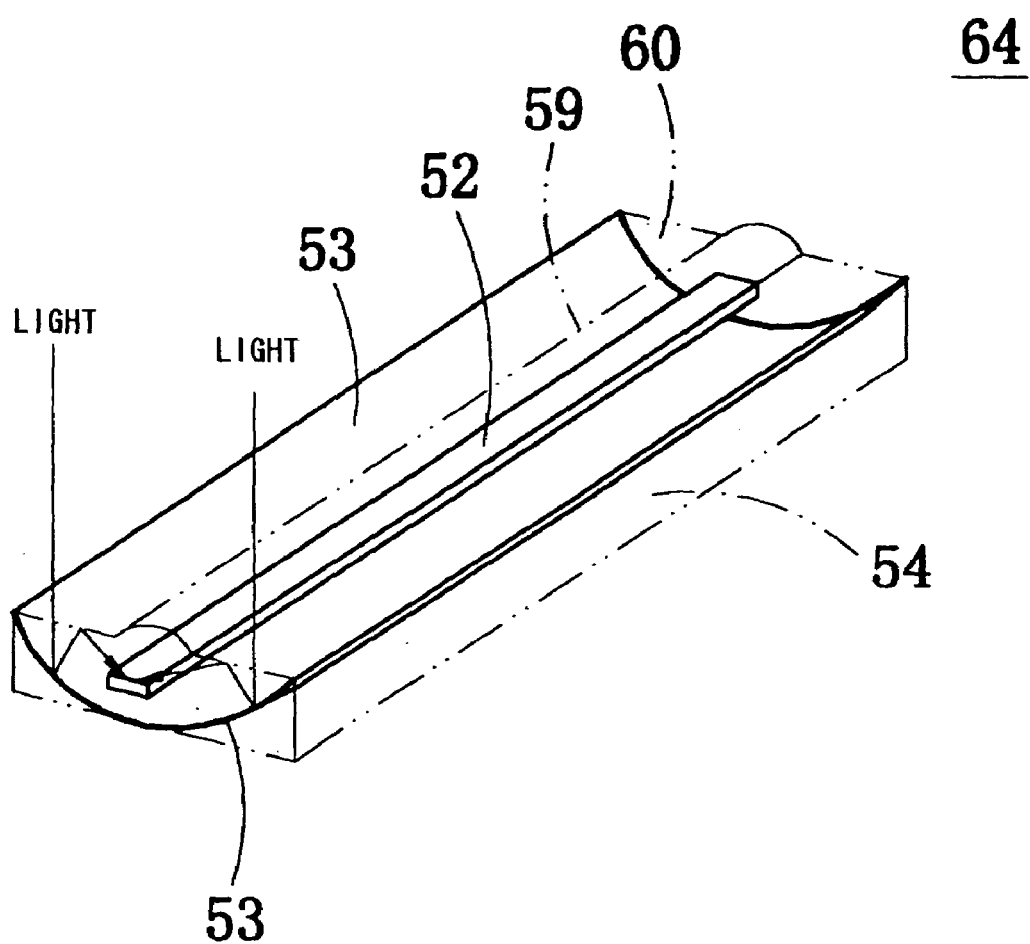
FIG. 33 is a perspective view of a light receiver according to a twenty-first preferred embodiment of this invention.

FIG. 33 is a perspective view of a light receiver 64 according to a twenty-first preferred embodiment, which is used as a solar cell. In this light receiver 64 (solar cell), a light reflecting portion 53 having a longitudinally uniform section of which has a parabola-shape is sealed within mold resin 54. In front of the light reflecting portion 53, there is disposed a photo detector 52 (a photoelectric transducer such as a silicon photoelectric transducer of amorphous, polycrystal or monocrystal). In the center of a front wall of the mold resin 54 there is disposed a direct incidence region 59 in a longitudinally cylindrical lens-shape, and a flat region 60 is formed at each side thereof.

The light striking against the direct incidence region 59 in the light perpendicularly striking against the light receiver 64 is directly focused on the photo detector 52. The light striking against the flat region 60 is reflected by the light reflecting portion 53, and further totally reflected by the flat region 60 to be received by the photo detector 52. Since the photo detector 52 is long in one direction, the light receiving area can be increased, thereby performing large focused quantity and providing a high generating capacity as a solar cell.

Generally, the energy conversion efficiency of a conventional solar cell is only 15%. Accordingly, in order to increase the generating capacity, the area of the photoelectric transducer itself has to be increased with increasing manufacturing cost. According to the light receiver 64 (solar cell) of this invention, however, the light receiving area can be increased so as to efficiently focus the light striking against the light receiving area to the photo detector 52 by increasing the whole area of the light receiver 64 without increasing the area of the photoelectric transducer itself, thereby enhancing the generating capacity with an economy means. In particular, according to the configuration of this embodiment, the light focus efficiency can be increased two times or more, and the substantial energy conversion efficiency also can be increased two times or more.

Furthermore, according to this light receiver 64, the efficiency can be enhanced with retaining the thin configuration, whereby a thin configuration can be applied to a solar panel put on a roof of a house, a road tack, or delineator.

In the light receiver 64 shown in FIG. 30 or 31, a photoelectric transducer can be mounted as the photo detector 52.

TWENTY-SECOND PREFERRED EMBODIMENT

Figure 34:
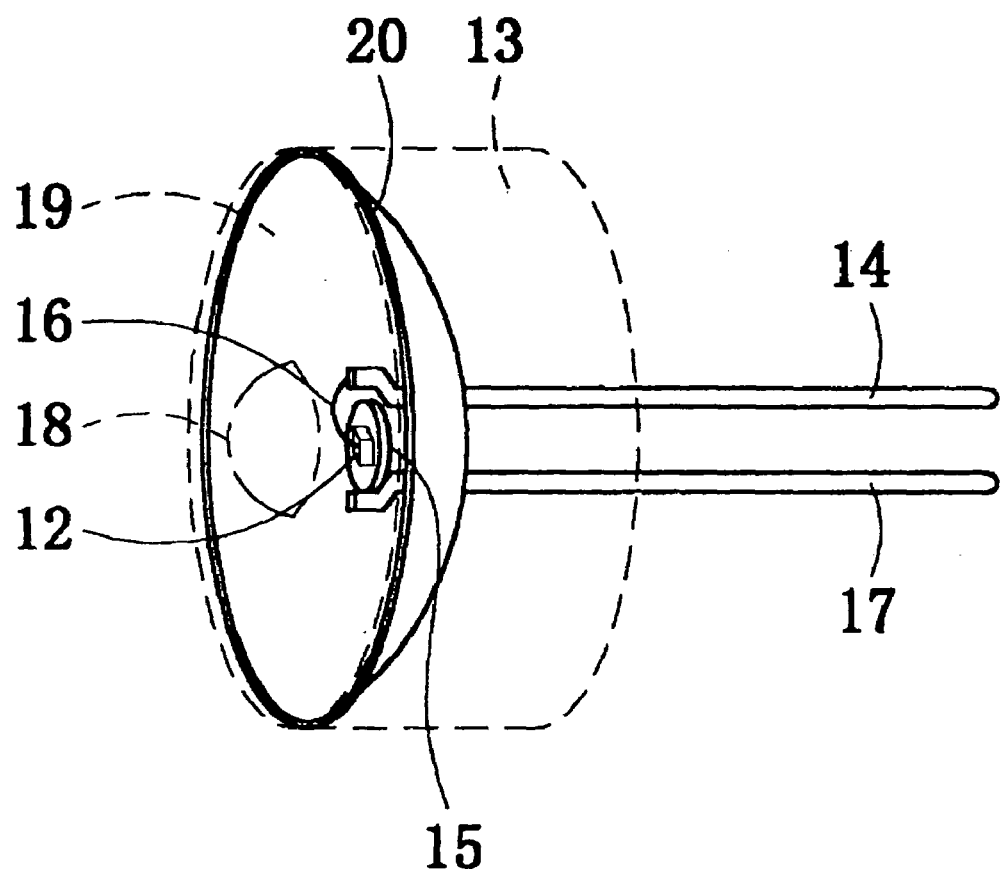
FIG. 34 is a perspective view of a light emission source according to a twenty-second preferred embodiment of this invention.
Figure 35:
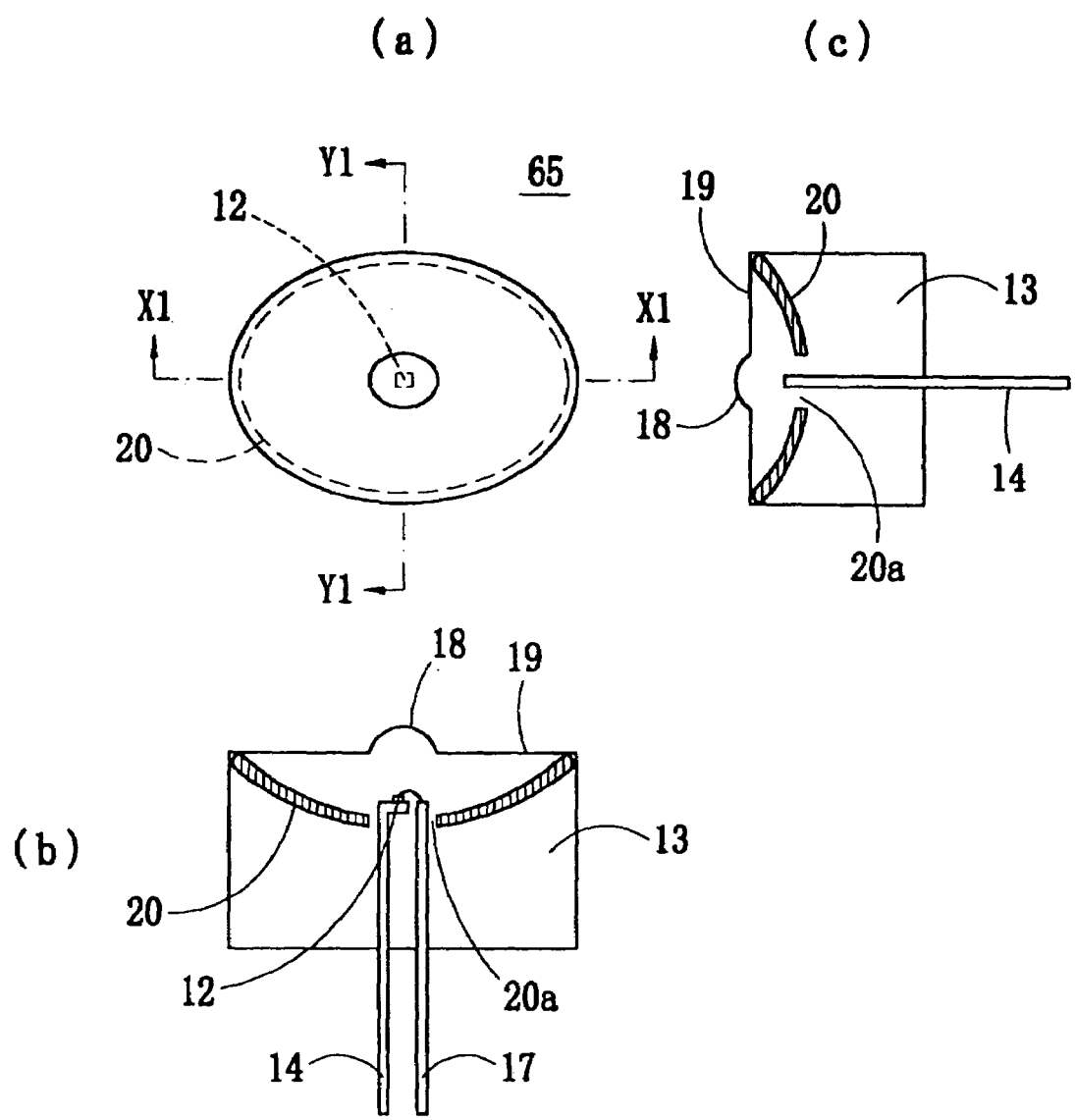
FIG. 35 shows at (a) a front view of the light emission source of FIG. 34, at (b) a sectional view taken along line X1-X1 of FIG. 35 at (a), and at (c) a sectional view taken along line Y1-Y1 of FIG. 35 at (a)

FIG. 34 is a perspective view of a light emission source 65 according to a twenty-second preferred embodiment, FIG. 35 at (a) is a front view of the source, FIG. 35 at (b) is a sectional view taken along line X1-X1 of FIG. 35 at (a), and FIG. 35 at (c) is a sectional view taken along line Y1-Y1 of FIG. 35 at (a). In this embodiment, a light emitter 12 such as a light emitting diode (LED chip) is sealed in a mold resin 13 made of a transparent resin material. The light emitter 12 sealed in the mold resin 13 is mounted on a stem 15 disposed on a leading edge of a lead frame 17, and connected with another lead frame 14 by means of a bonding wire 16, and a light emission side thereof is disposed toward a front of the light emission source 65.

A light reflecting portion 20 is composed of a metallic component which is molded in a parabola shape by press working, and its surface is applied by specular working of plating aluminum or silver thereon. If desired, the light reflecting portion 20 may be done by chemical processing applied to a pressed part made of aluminum or silver to bring glossiness on the surface thereof. The light reflecting portion 20 at a center thereof includes an aperture 20a for accommodating the stem 15, and is sealed with the lead frames 14 and 17 within the mold resin 13 where the aperture 20a accommodates the stem mounted by the light emitter 12.

As shown in FIG. 35 at (a), the light reflecting portion 20 has major and minor axis directions when it is viewed from its front, and a generally elliptic shape in this embodiment. An outer circumferential edge of the light reflecting portion 20 is formed to be in parallel with a front face of the mold resin 13, whereby any large clearance does not occur between the outer circumferential edge of the light reflecting portion 20 and the front face of the mold resin 13 so that any light is prevented from leaking through the clearance and becoming loss.

The section in the major axis direction as shown in FIG. 35 at (b) and the section in the minor axis direction as shown in FIG. 35 at (c) are curved in a concave, but in different shapes. In other words, the distribution field of curvature of the section in the major axis direction is different from the distribution field of the section in the minor axis direction. The distribution field of curvature of the section in the major axis direction is shifted toward a smaller value than the distribution field of the section in the minor axis direction.

As long as the section of the light reflecting portion 20 is in an arc shape either in the major and minor axis directions, when a radius of a section in the major axis direction is R1 and a radius of the section in the minor axis direction is Rs;

$$(1/R1) < (1/Rs)$$

In other words, the radius R1 in the major axis direction is larger than the radius Rs in the minor axis direction (R1>Rs).

When the section of the light reflecting portion 20 is not arc-shaped, the curvature varies with a location in the sections of the major and minor directions so that it has a spread (distribution). For instance, this case can be featured by a central value of a distribution of curvature. Assuming that the curvature in the major direction has the minimum value $(\rho1)min$ and the maximum value $(\rho1)max$ and the curvature in the minor direction has the minimum value $(\rho s)min$ and the maximum value $(\rho s)max$, the respective central values $(\rho1)c$ and $(\rho s)c$ are expressed by the following equations;

Major axis direction: $(\rho1)c = \{(\rho1)min + (\rho1)max\}/2$

Minor axis direction: $(\rho s)c = \{(\rho s)min + (\rho s)max\}/2$

Accordingly, in the light reflecting member 20 employed in the light emission source 65 according to this invention, the central value $(\rho1)c$ of the curvature in the section in the major axis direction has only to be smaller than the central value $(\rho s)$ of the curvature in the section in the minor axis direction as expressed by the following equation;

$$(\rho1)c < (\rho s)c$$

If desired, both ends of the distribution of curvatures are featured by the minimum and maximum values, and the following equation may be made;

$$(\rho1)min \leq (\rho s)min$$

$$(\rho1)max \leq (\rho s)max$$

provided that this equal sign does not happen simultaneously.

In a front central portion of the mold resin 13, there are formed a direct emission region 18 in a convex lens shape, and a total reflection region 19 of a flat shape to surround the direct emission region 18. The direct emission region 18 is formed so that its optical axis accords with the optical axis of the light emitter 12, and the total reflection region 19 is a plane perpendicular to the optical axis of the light emitter 12. The light emitter 12 is located in a focal point of the direct emission region 18 or in its neighborhood. The angle of a direction against the optical axis, viewed from the light emitter 12 toward a boundary between the direct emission region 18 and the total reflection region 19, is designed to be equal to the critical angle θc of the total reflection between the mold resin 13 and air, or larger.

When the direct emission region 18 having a lens shape is viewed from its front, it has a generally ellipse shape having a major axis direction and a minor axis direction, and the respective major and minor axis directions accord with the major and minor axis directions of the light reflecting portion 20. In the direct emission region 18, the distribution field of curvature of a section in a major axis direction is different from the distribution field of curvature of a section in a minor axis direction, and, particularly, the curvature distribution of the section in the major axis direction is shifted to a side of a smaller value than the curvature distribution of the section in the minor direction. Shifting the curvature distribution of the section in the major axis direction to the side of the smaller value than the curvature distribution of the section in the minor direction has same meaning as that of the light reflecting portion 20.

The light radiated to the direct emission region 18 in the light emitted from the light emitter 12 is directly emitted forward from a front of the mold resin 13 as an approximately paralleled light. The light emitted to the total reflection region 19 in the light emitted from the light emitter 12 is totally reflected by a resin boundary surface, and almost of the totally reflected light by the resin boundary surface is reflected by the light reflecting portion 20 to be emitted forward from the total reflection region 19. Thus, almost all light emitted forwardly from the light emitter 12 (viz. including the light totally reflected by the total reflection region 19) can be brought into a front of the light emission source 65, thereby improving the efficiency of light use.

Moreover, the light emitted forward from the light emitter 12 is emitted from the direct emission region 18 without any obstruction, whereby darkness on the optical axis as found in the above-described conventional light emission source is avoided and the directivity pattern is improved.

Furthermore, the light emitted from the light emitter 12 in a diagonal direction is totally reflected by the total reflection region 19, and reflected by the light reflecting portion 20 to be emitted forward so as to prolong the light length becomes long, whereby the aberration is reduced and the light emission source 65 can be provided with a high accuracy.

Figure 36:
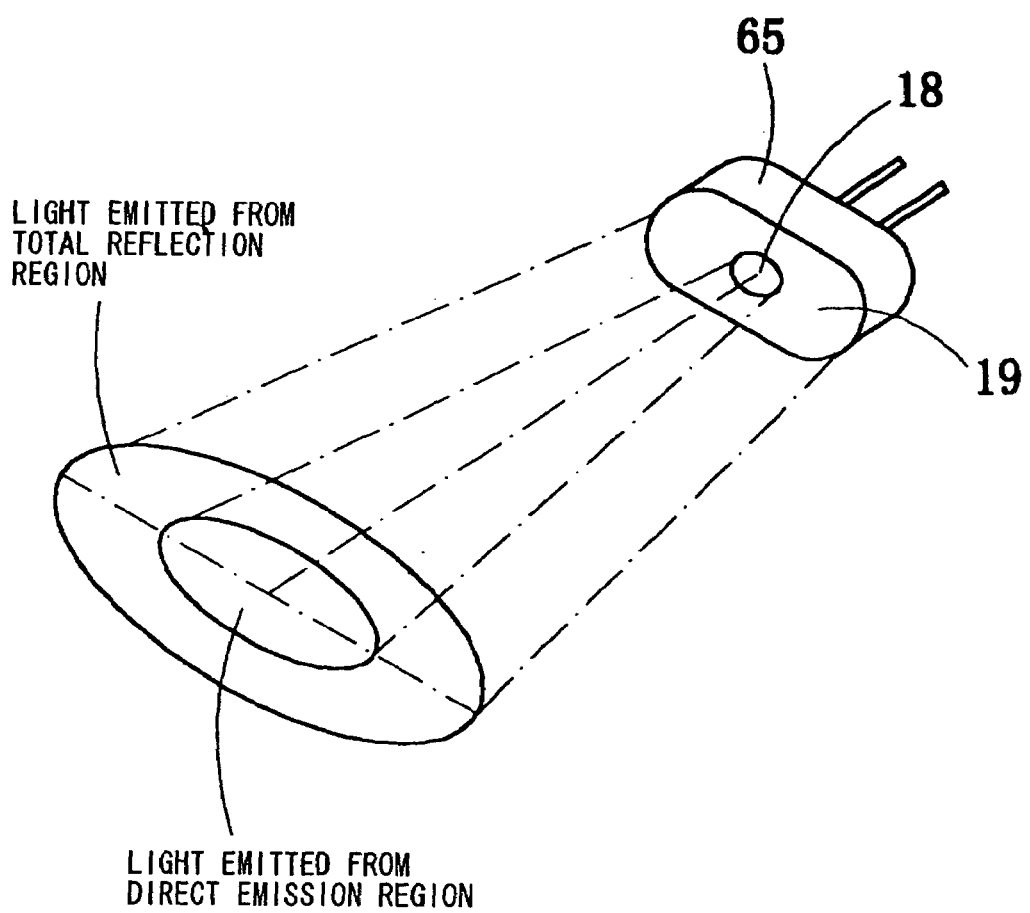
FIG. 36 shows a profile of light beams emitted by the light emission source of FIG. 34.
Figure 37:
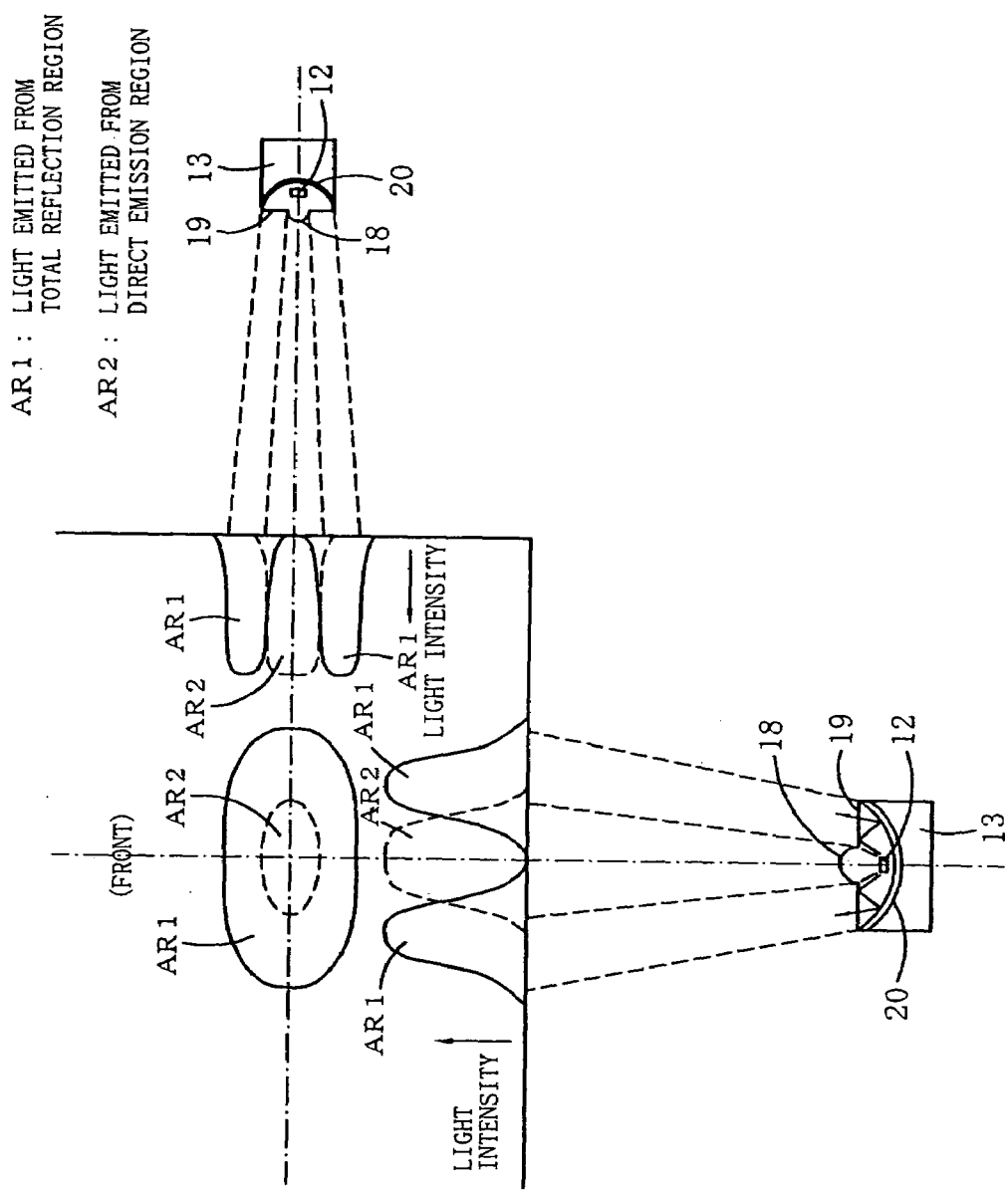
FIG. 37 shows an intensity distribution of light emitted by the light emission source of FIG. 34.

The light reflecting portion 20 has a generally ellipse configuration, whereby the light reflected by the light reflecting portion 20 to be emitted forward becomes beams having an emission profile in a generally elliptic shape as shown in FIG. 36. The direct emission region 18 also has a generally elliptic shape a major axis direction of which accords with the major axis direction of the light reflecting portion 20, so that the light beams emitted from the direct emission region 18 have a section in a generally elliptic shape. Accordingly, as shown in FIG. 37, the light emitted from the direct emission region 18 supplements the light emitted from the total reflection region 19, so that combination of the light emitted from the direct emission region 18 and the light emitted from the total reflection region 19 provides emission light having an approximately uniform intensity elliptic profile.

When, in order to emit light in a generally elliptic shape spreading in one direction, a hemisphere-shaped metal member having a constant curvature in an optional direction is prepared and both sides of the metal member are cut to provide a light reflecting portion which is lengthened longitudinally, there appears a large clearance between the cut portion and a front face of the mold resin through which light leaks, thereby deteriorating the efficiency of light use. Such a clearance can be reduced by having a curvature varying with directions, thereby enhancing brightness of the light emission source 65. When the curvatures in orthogonal two directions in the light reflecting portion 20 having a circle in its front view are different, the spread of the reflection light can be different, thereby providing emission light of a generally elliptic profile spreading in one direction. When the light reflecting portion 20 has an elliptic shape, the design of the light reflecting portion 20 becomes easy.

Figure 38:
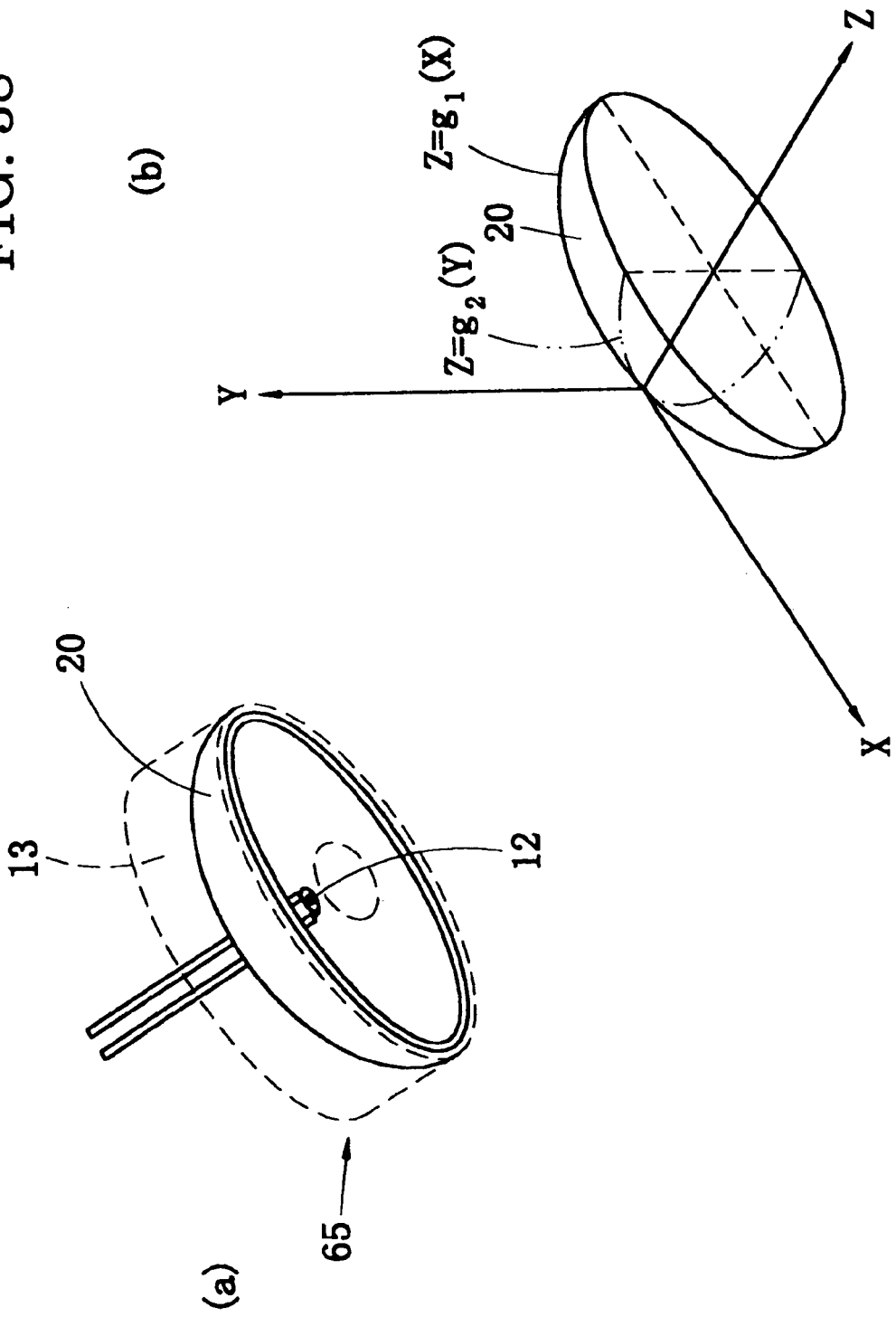
FIG. 38 shows at (a) a perspective view of a light reflection portion having a biconical surface, and at (b) a relationship between the biconical surface and the coordinate.

The light reflecting portion 20 can be realized by employing an aspherical surface of a toric surface or a biconical surface, and a more uniform beam profile can be designed. FIG. 38 at (a) shows a light reflecting portion 20 formed with a biconical surface. When the light reflecting portion 20 has an X axis in a major axis direction, a Y axis in a minor axis direction, and a Z axis in a front direction as shown in FIG. 38 at (b), the light reflecting surface of the light reflection portion 20 having the biconical surface can be expressed by the following equation (1);

$$z = \frac{cvxX^2 + cvY^2}{1 + \sqrt{1 - cvx^2(ccx+1)X^2 - cv^2(cc+1)Y^2}} + aX^4 + bY^4 + cX^6 + dY^6 + \ldots \quad (1)$$

When a sectional configuration in a XZ plane of the biconical surface is expressed by "Z=g1(X)", a curvature of the curve is expressed by "cv", the conic coefficient is expressed by "cc", and a sectional configuration in a YZ plane is expressed by "Z=g2(Y)", the curvature of this curve becomes "cvx(≠cv)", and the conic coefficient becomes "ccx", provided that "a,b,c,d" are coefficients of terms of high order.

TWENTY-THIRD PREFERRED EMBODIMENT

Figure 39:
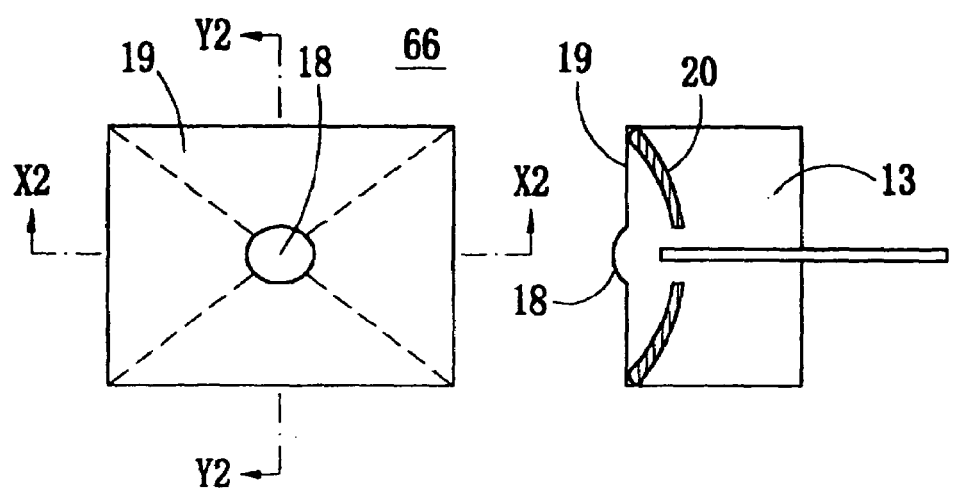
FIG. 39 shows at (a) a front view of a light emission source according to a twenty-third preferred embodiment of this invention, at (b) a sectional view taken along line X2-X2 of FIG. 39 at (a), and at (c) a sectional view taken along line Y2-Y2 of FIG. 39 at (a)

FIG. 39 at (a) is a front view of a light emission source 66 according to a twenty-third preferred embodiment. FIG. 39 at (b) and (c) shows sectional views taken along lines X2-X2 and Y2-Y2 of FIG. 39 at (a). A front of a light reflecting portion 20 is of a rectangular, and formed to be curved in a convex shape on sections in its major and minor axis directions. The light reflecting portion 20 is sealed within a mold resin 13 molded in a rectangular shape, and an external of the light emission source 66 has a rectangular configuration when it is viewed from its front.

Figure 40:
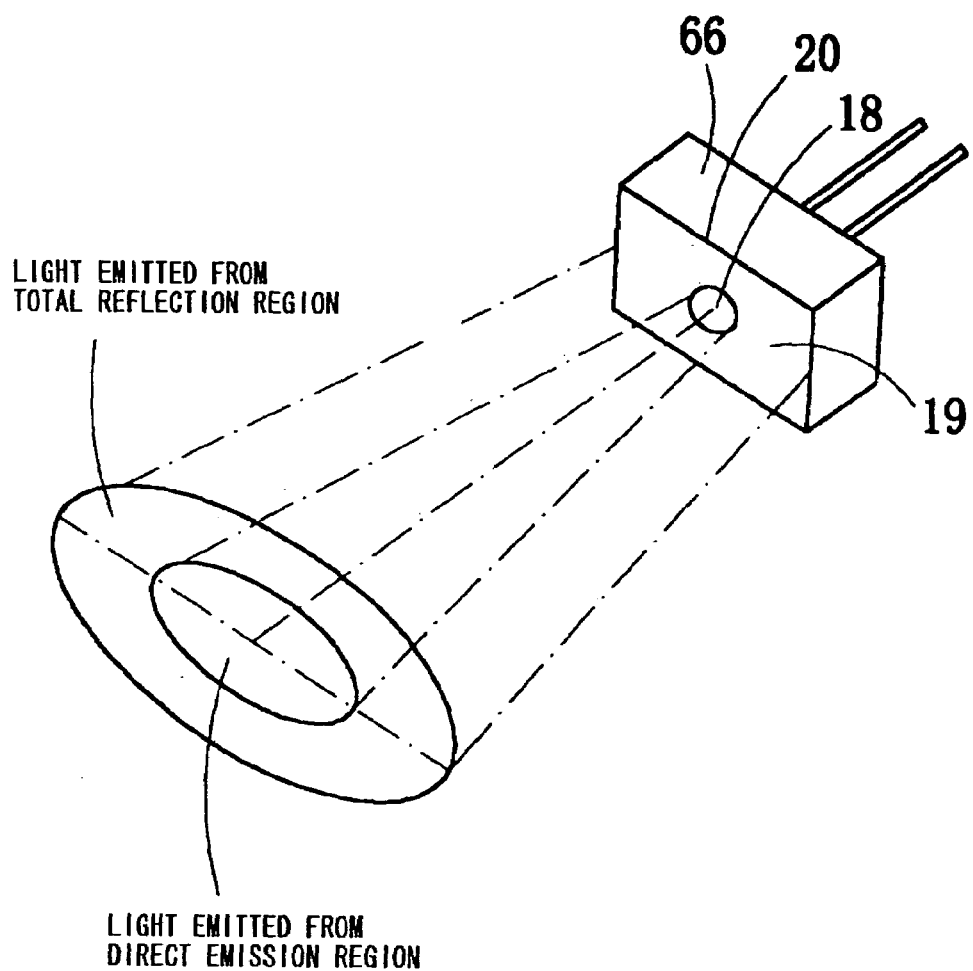
FIG. 40 shows a profile of light beams emitted by the light emission source of FIG. 39.

The light emission source 66 having such a configuration can emit light beams that are uniform in a generally elliptic-shaped profile as shown in FIG. 40, same as the fifteenth embodiment.

TWENTY-FOURTH PREFERRED EMBODIMENT

Figure 41:
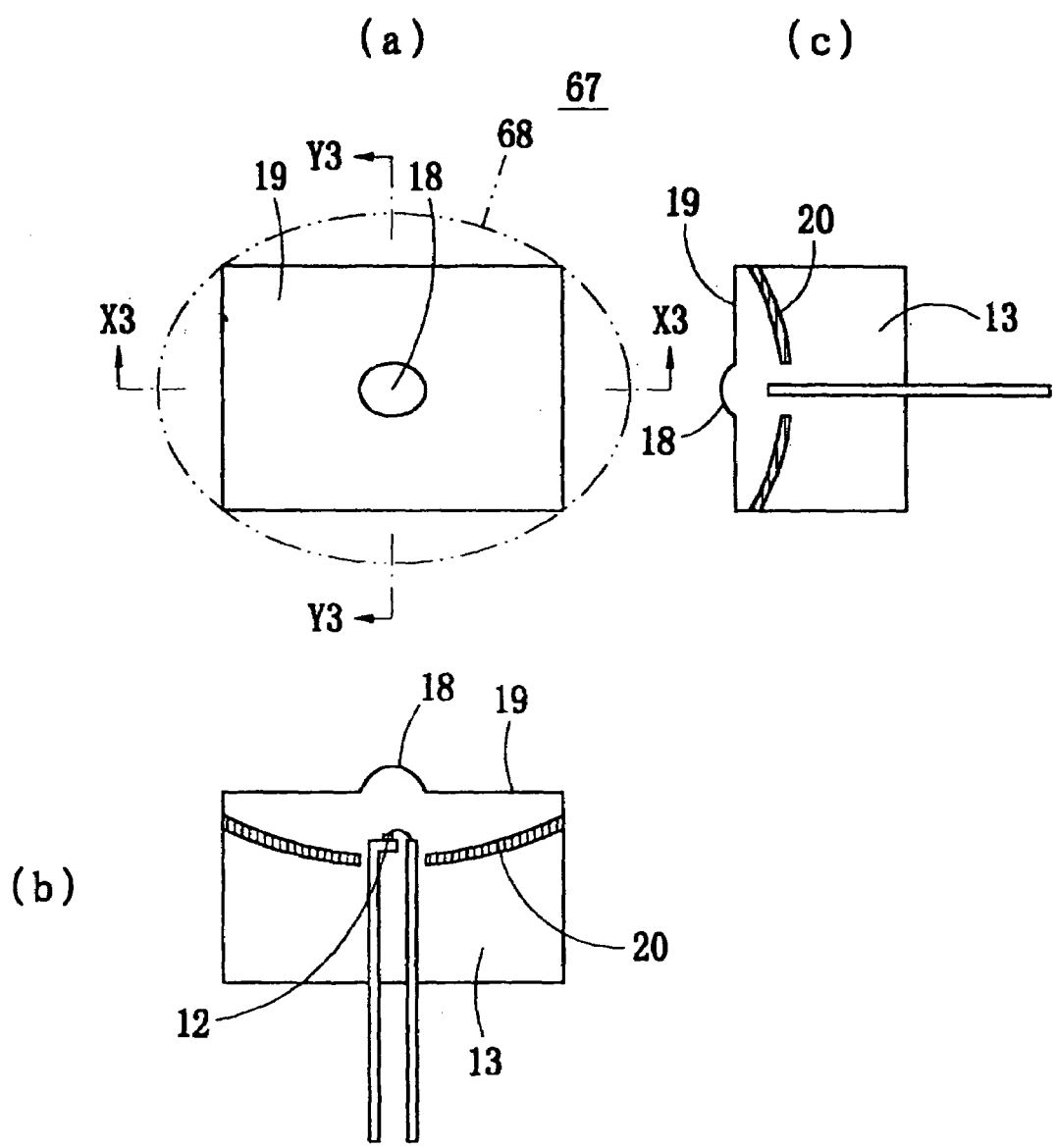
FIG. 41 shows at (a) a front view of a light emission source according to a twenty-fourth preferred embodiment of this invention, at (b) a sectional view taken along line X3-X3 of FIG. 41 at (a), and at (c) a sectional view taken along line Y3-Y3 of FIG. 41 at (a)

FIG. 41 at (a) is a front view of a light emission source 67 according to a twenty-fourth preferred embodiment. FIG. 41 at (b) and (c) shows sectional views taken along lines X3-X3 and Y3-Y3 of FIG. 41 at (a). In this embodiment, there is employed a light reflecting portion 20 having a front configuration in a generally rectangular shape which is made by cutting four sides of a light reflecting portion 68 having a front configuration in an elliptic shape as shown in two-dotted lines of FIG. 41. This is sealed within a mold resin 13 molded in a rectangular shape, and the external configuration of the light emission source 67 has a rectangular shape when it is viewed from its front.

Figure 42:
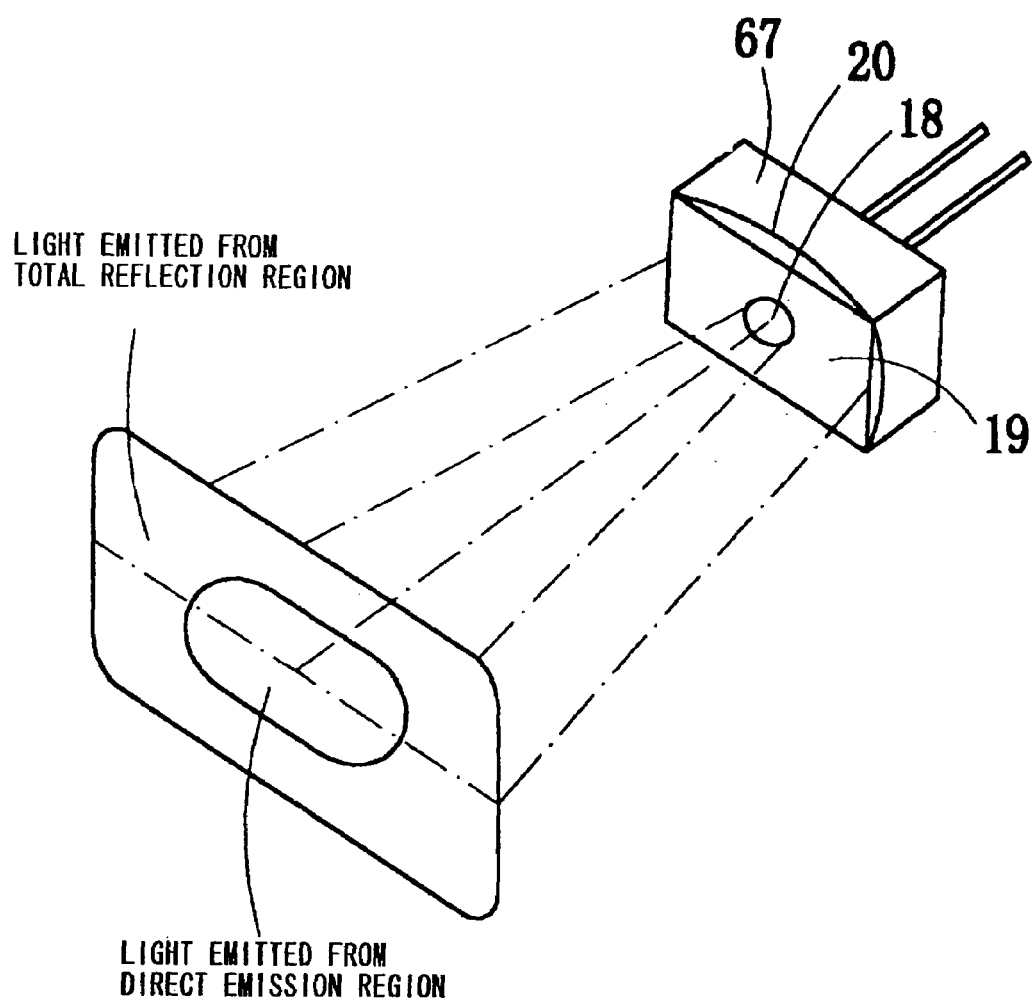
FIG. 42 shows a profile of light beams emitted by the light emission source of FIG. 41.

Thus constructed light emission source 67 can emit light beams having a profile in a rectangular shape as shown in FIG. 42. This source 67 is also preferable to the application of a high mount strap lamp mounted on an automobile because uniform beams are desired to be radiated to a limited rectangular area.

Though the design of a beam profile (directivity pattern) in a conventional light emission source (LED) depends on only the parameters of a curvature of an optical lens surface and a spacing between an LED chip and the lens surface causing the light emission source to become thick in a direction of an optical axis, the light emission source of this invention allows flexible design depending on a configuration of the light reflecting portion so that the light emission source 67 may become thin in a direction of an optical axis. In other words, the light emission sources of the twenty-second to twenty-fourth embodiments (FIGS. 34 to 42) may provide thin light emission sources capable of emitting light to a broad area. Particularly the light emission source 67 is desirable in the application, such as a high mount strap lamp, requiring an optically limited narrow space (particularly depth) and radiation to a wide area.

TWENTY-FIFTH PREFERRED EMBODIMENT

Figure 43:
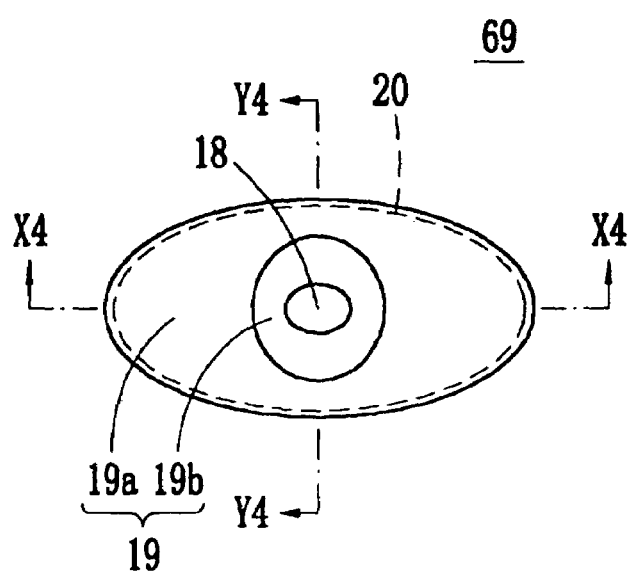
FIG. 43 shows at (a) a front view of a light emission source according to a twenty-fifth preferred embodiment of this invention, at (b) a sectional view taken along line X4-X4 of FIG. 43 at (a), and at (c) a sectional view taken along line Y4-Y4 of FIG. 43 at (a)
Figure 43:
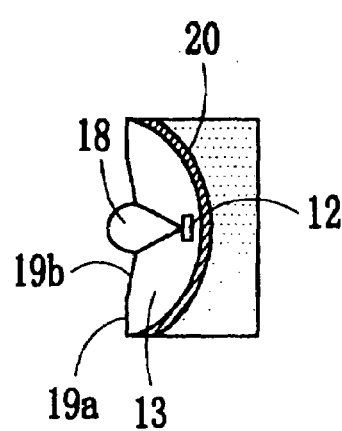
Figure 43:
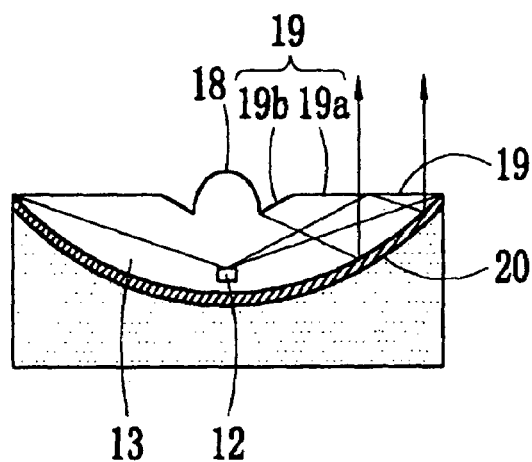

FIG. 43 at (a) is a front view of a light emission source 69 according to a twenty-fifth preferred embodiment. FIG. 43 at (b) and (c) shows sectional views taken along lines X4-X4 and Y4-Y4 of FIG. 43 at (a). The light emission source 69 of FIG. 43 includes a tapered portion 19b of a tapered configuration around a direct emission region 18 and a flat portion 19a around the tapered portion 19b. The tapered portion 19b makes an angle smaller than 90 degrees from a light emission direction of the light emitter 12, and the flat portion 19a is perpendicular to the optical axis. All light striking against the flat portion 19a is totally reflected by setting the angle of the direction from the light emitter 12, viewed from the light emitter 12 to a boundary between the tapered portion 19b and the direct emission region 18, to become bigger than the critical angle θc of the total reflection on a boundary surface of the mold resin 13. All light striking against the tapered portion 19b is totally reflected by setting the gradient angle so that the light striking against the boundary between the tapered portion 19b and the flat portion 19a can be totally reflected by the tapered portion 19b. Accordingly, the tapered portion 19b and the flat portion 19a provide a total reflection region 19, and the light which cannot be totally reflected on the flat portion 19a can be totally reflected on the tapered portion 19b, which are directed forward by reflection on light reflecting portion 20, thereby improving the efficiency of light emission by the light emission source 69.

When the light reflecting portion 20 having a generally elliptic shape in a front view is designed, particularly when the light emission profile and efficiency in a major direction of the elliptic shape is considered, the region (total reflection region 19) where the light emitted from the light emitter 12 is totally reflected on the boundary surface of the mold resin 13 becomes narrow or disappears in the minor direction.

In such a case, formation of the tapered portion 19b becomes effective. In order to increase the total reflection region shown in FIG. 43, the tapered portion 19b has only to be formed so that the ratio shared by the tapered portion 19b in the minor axis direction is larger than the ratio shared by the tapered portion 19a in the major axis direction and the external configuration of the tapered portion 19b does not have any similarity relationship with the external configuration of the direct emission region 18 nor the light reflecting portion 20 when the light emission source 69 is viewed from its front. There is a case such that the major and minor axis directions in the external shape of the tapered portion 19b when it is viewed from its front are reversed to the direct emission region 18 and the light reflecting portion 20. Thus construction can improve the efficiency of the light emission source 69 in its minor axis direction.

Figure 44:
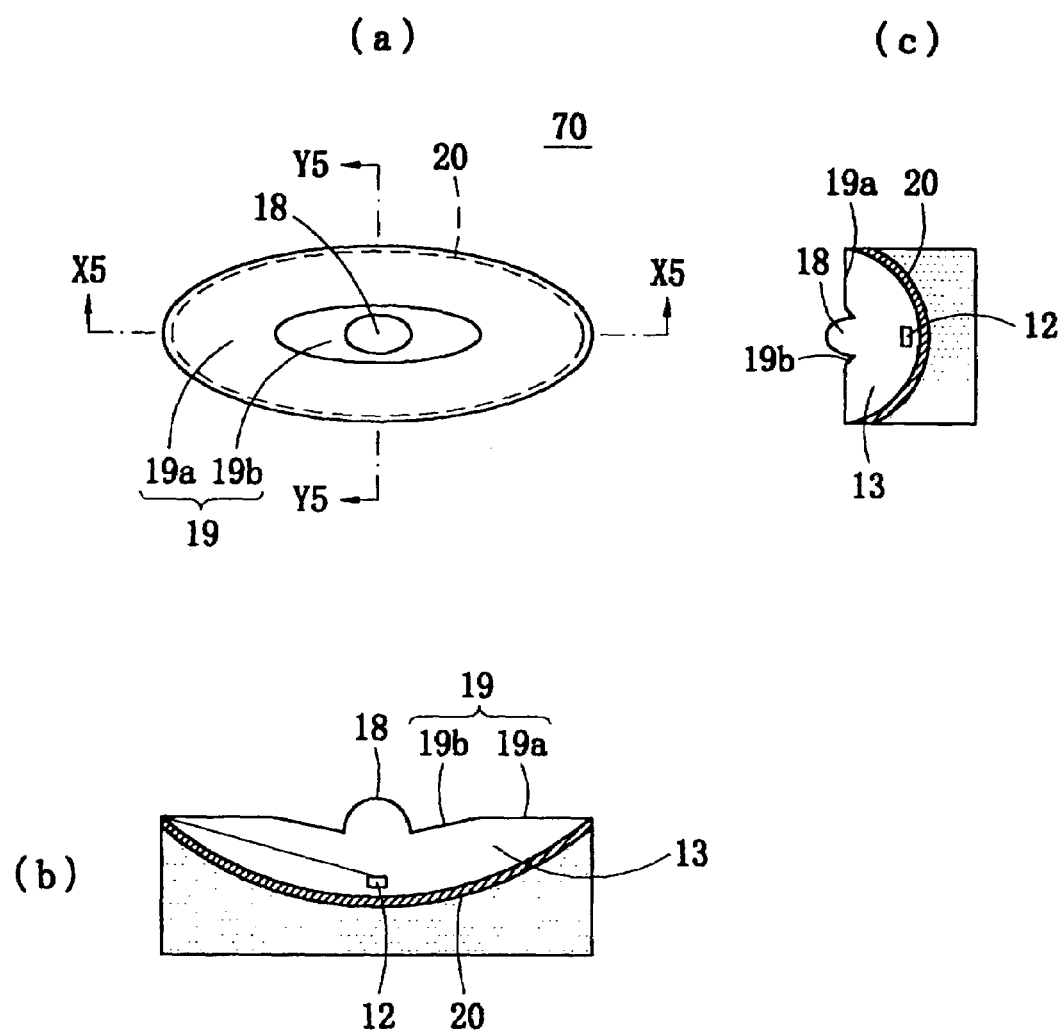
FIG. 44 shows at (a) a front view of a light emission source as a modification of the twenty-fifth embodiment, at (b) a sectional view taken along line X5-X5 of FIG. 44 at (a), and at (c) a sectional view taken along line Y5-Y5 of FIG. 44 at (a)
Figure 45:
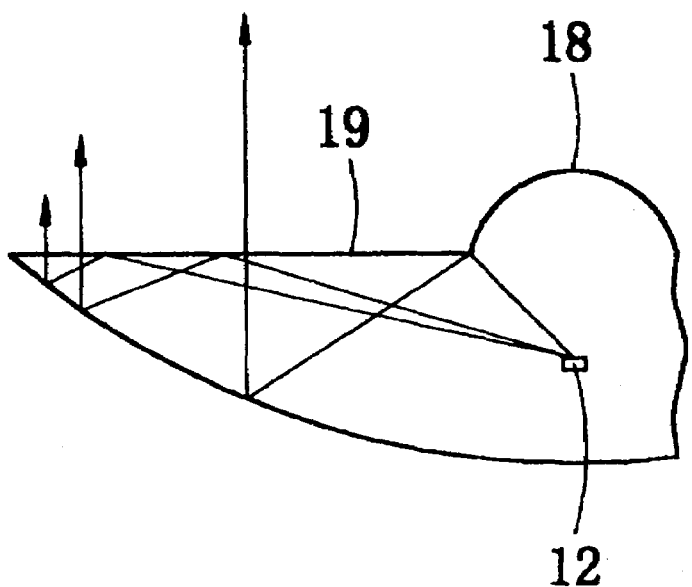
FIG. 45 shows at (a) movements of light emitted at an edge of a resin boundary surface in a light emission source having no slant wall, and at (b) movements of light emitted at an edge of a resin boundary surface in a light emission source having a slant wall.
Figure 45:
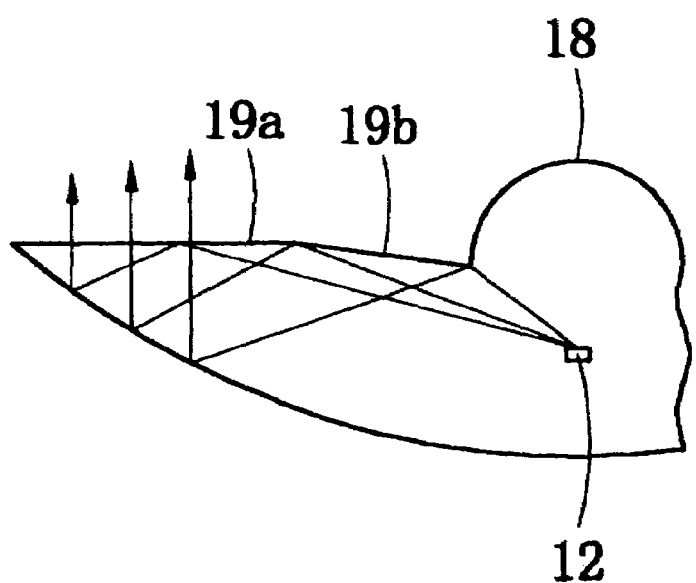

In addition, there is a case with the requirement which brings the light emitter 12 close to the resin boundary surface like a light emission source 70 shown in FIG. 44 when the light emission profile or the efficiency in the minor axis direction is considered in designing or when limitation is produced from the external configuration or the light emission profile of the light emission source 69. In such a case, there may happen a case such that an emission angle of light emitted from the light emitter 12 (angle from the optical axis) becomes large, for example, larger than 70 degrees at an edge of the resin boundary surface in the major axis direction as shown in FIG. 45 at (a). Thus light of the angle has low intensity, so that the light intensity of LED becomes small and the brightness of the light emission source 69 becomes uneven.

In such a case, the brightness at the edge of the resin boundary surface can be improved and the brightness of the light emission source 69 can become generally uniform by setting the angle of the tapered portion 19b in a section of the major axis direction into the total reflection angle or larger so as to bring the light totally reflected at the tapered portion 19b into the edge of the resin boundary surface as shown in FIG. 45 at (b). In this case, the external configuration of the tapered portion 19b when the light emission source 69 is viewed from its front does not always have a similarity relationship with the external configuration of the direct emission region 18 or the light reflecting portion 20, and there may be a case such that the ratio of the major axis and minor axis becomes larger.

The configuration having major and minor axis directions when it is viewed from its front as shown in FIG. 34 and its subsequent figures can be applied to a light receiver not shown in figures.

TWENTY-SIXTH PREFERRED EMBODIMENT

Figure 46:
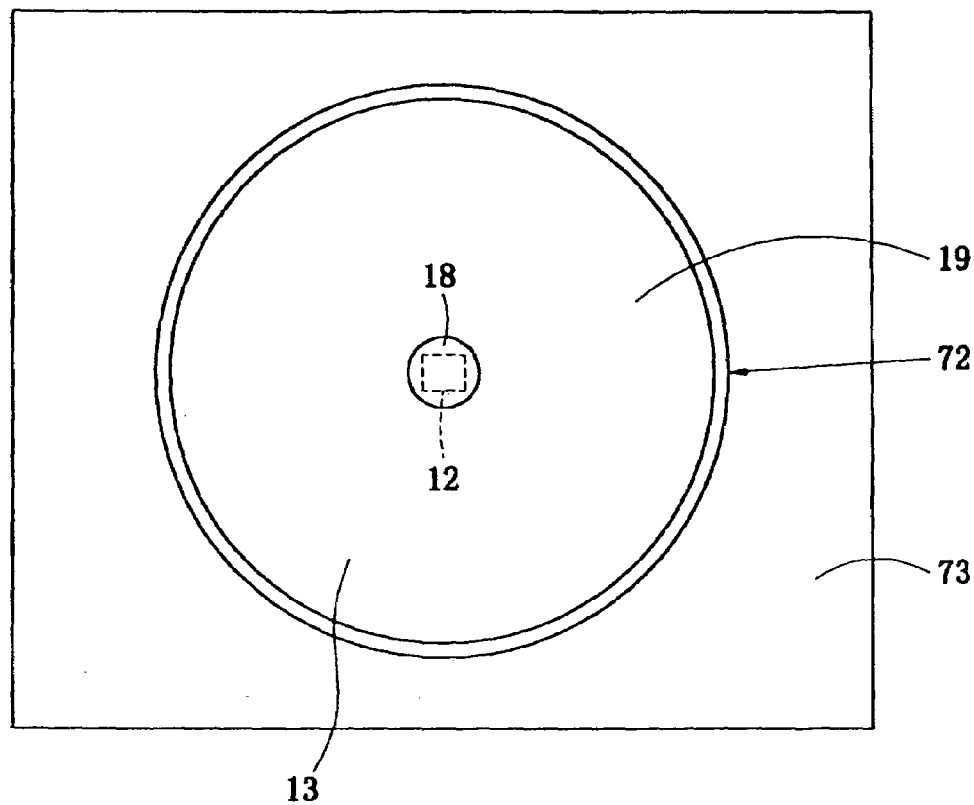
FIG. 46 shows at (a) a front view and at (b) a sectional view of a light emission source according to a twenty-sixth preferred embodiment of this invention.
Figure 46:
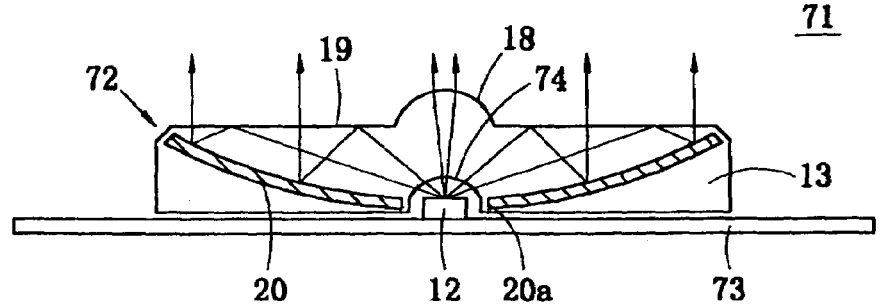

FIG. 46 at (a) and (b) shows front and sectional views of a light emission source 71 according to a twenty-sixth preferred embodiment. The light emission source 71 includes a chip-type light emitter 12 such as an LED chip mounted on a circuit board 73, and a disc-shaped optical module (optical component) 72 disposed to cover the emitter.

The optical module 72 is a mold in which a light reflecting portion 20 is insert-molded within a mold resin 13, and a convex lens-shaped direct emission region 18 and a total reflection region 19 are formed on a surface of the mold resin 13. In addition, an element mounting portion 74 in a concave shape is formed at a position on a rear face of the mold resin 13 corresponding to an aperture 20a of the light reflecting portion 20 to be accommodated within the aperture 20a. The element mounting portion 74 is formed in a generally hemispherical shape to be generally perpendicular to light in each direction so that an optical axis of light emitted from the light emitter 12 is not bent when the emitted light strikes against the optical module 72. The light emission source 71 is constructed so that the optical module 72 is put on the chip-type light emitter 12 of a surface-mount type which is mounted on the circuit board 73 so that the light emitter 12 may be housed within the element mounting portion 74. Positional adjustment of the light emitter 12 and the optical module 72 is eased and it can be efficiently assembled by matching the dimensions of the element mounting portion 74 with the external dimensions of the light emitter 12.

Employment of the optical module 72 can provide same functions and effects as those in the above-described light emission sources where the light emitter 12 is buried within the mold resin 13. As shown in FIG. 46 at (b), the light emitted forward from the light emitter 12 enters within the mold resin 13 through the element mounting portion 74 to advance within the mold resin 13 for forward emission from the direct emission region 18. The light emitted in a diagonal direction from the light emitter 12 intrudes into the mold resin 13 through the element mounting portion 74 to advance within the mold resin 13, reaches the total reflection region 19 to be totally reflected thereby, and is further reflected by the light reflecting portion 20 to be emitted forward through the total reflection region 19. Accordingly, the light from the light emitter 12 is widened to be emitted from the optical module 72 to a large area in comparison with the dimensions of the light emitter 12, thereby performing a large scale light emission face.

The optical loss by covering with the optical module 72 consists of the incidence loss into the optical module 72, the fresnel loss on emission from a front surface of the mold resin 13, and the minor reflection loss by the light reflecting portion 20, whereby approximately 90% of the light emitted from the light emitter 12 is efficiently emitted forward from the optical module 72.

Furthermore, the emission direction from the light emission source 71 employing the optical module 72 can be freely designed, so that spatially small construction can be performed in comparison with employment of an optical lens to obtain same effects. Though most of applications employing LED chips have spatial limitations, the employment of the optical module 72 is effective on the applications.

Thus optical module 72 can be applied to the light emitter 12 already mounted on the circuit board 73, so that larger scale and higher efficiency of the light emission area of the light emitter 12 can be performed in a later manufacturing process.

Though this embodiment employs the LED chip, same effects can be provided when the optical module 72 is enlarged in dimensions or applied to a light source such as an electric lamp or a fluorescent lamp other than the LED chip.

TWENTY-SEVENTH PREFERRED EMBODIMENT

Figure 47:
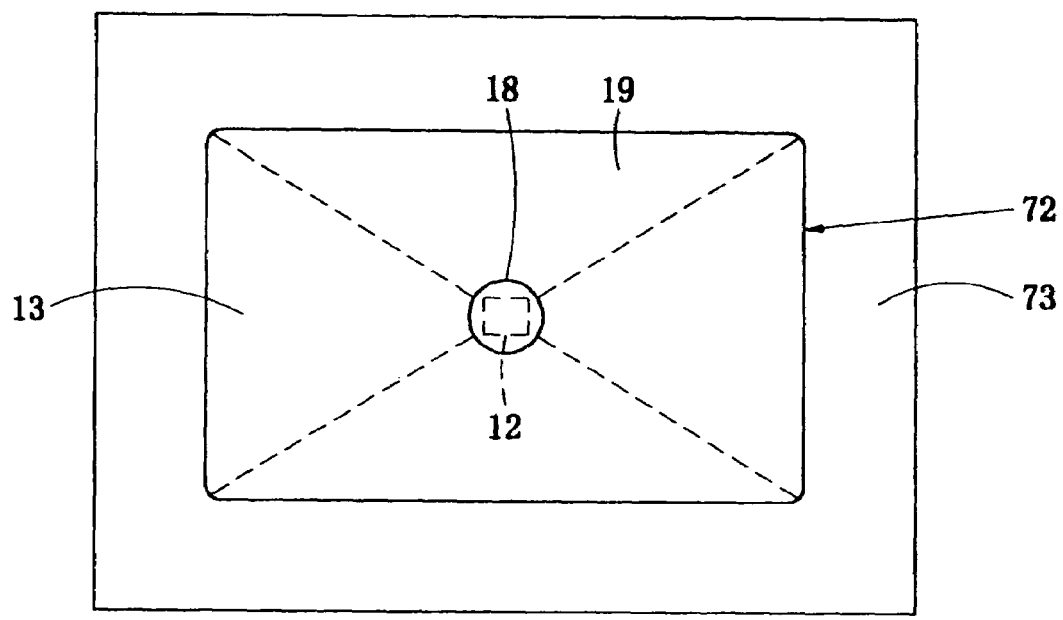
FIG. 47 is a front view of a light emission source according to a twenty-seventh preferred embodiment of this invention.

FIG. 47 is a front view of a light emission source 75 according to a twenty-seventh preferred embodiment. The light emission source 75 includes major and minor axis directions, and exemplarily employs an optical module 72 having a rectangular configuration. As the optical module 72 is employed, the light spread in the major axis direction is different from the same in the minor axis direction, so that emission light having a profile in a rectangular or elliptic shape can be performed, thereby providing light emission source 75 corresponding to the twenty-second embodiment (FIG. 34) by employing the optical module 72.

In addition to this, same functions as those of above-described kinds of light emission sources can be performed by changing the construction of the optical module 72.

TWENTY-EIGHTH PREFERRED EMBODIMENT

Figure 48:
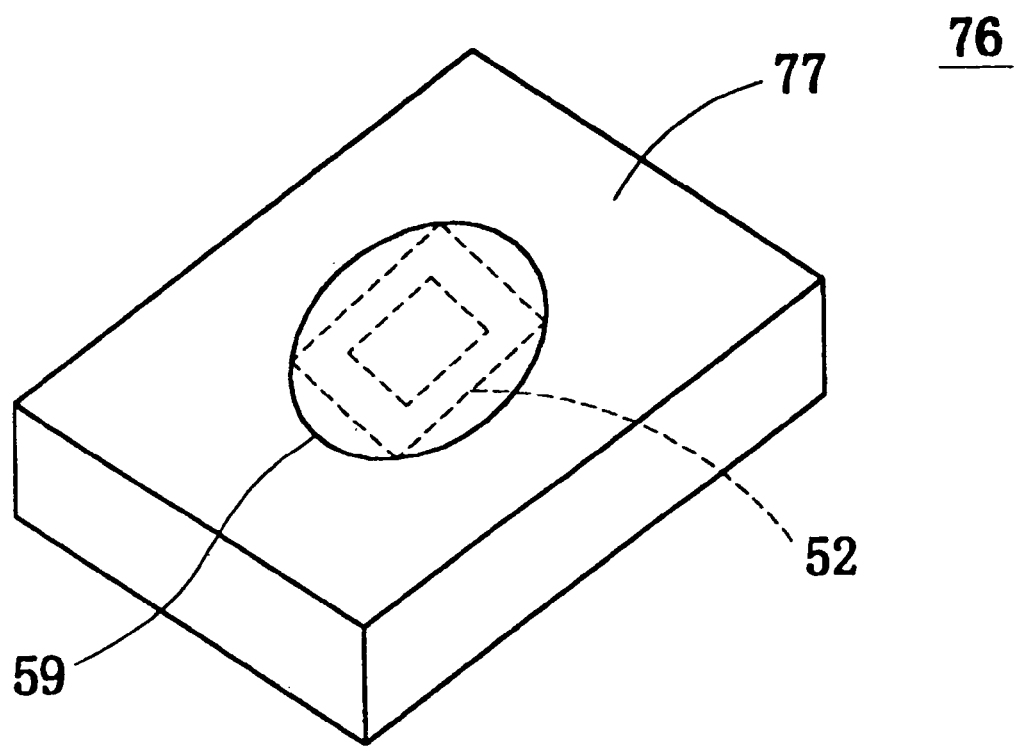
FIG. 48 is a front view of a light receiver according to a twenty-eighth preferred embodiment of this invention.
Figure 49:
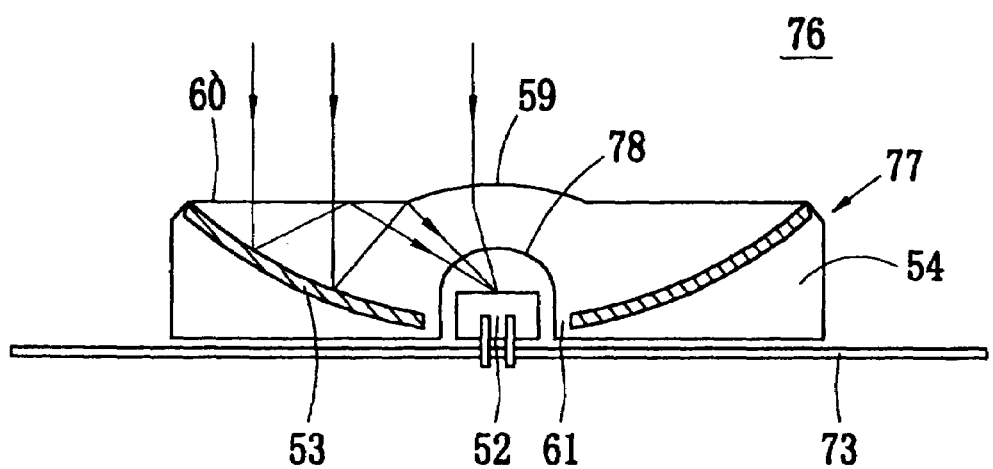
FIG. 49 is a sectional view of the light receiver of FIG. 48.
Figure 50:
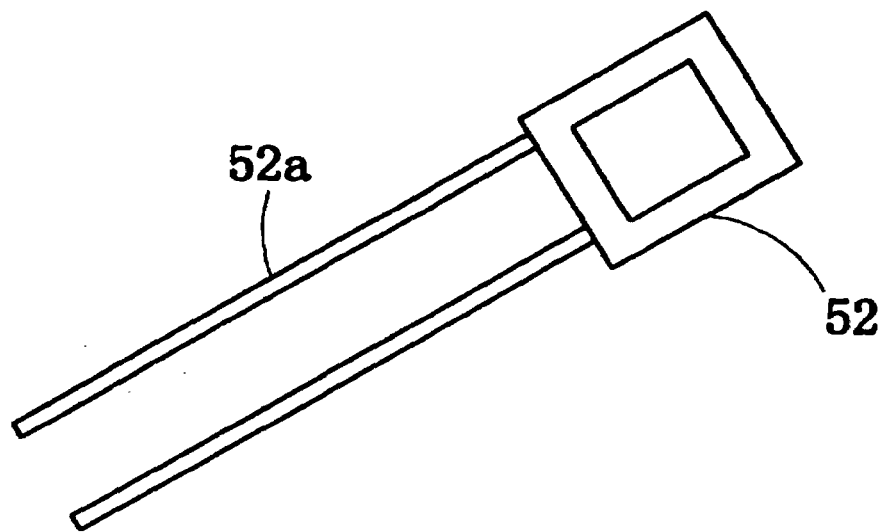
FIG. 50 shows at (a) a front view and at (b) a perspective view of photo detectors which can be employed in the light receiver of FIG. 48.
Figure 50:
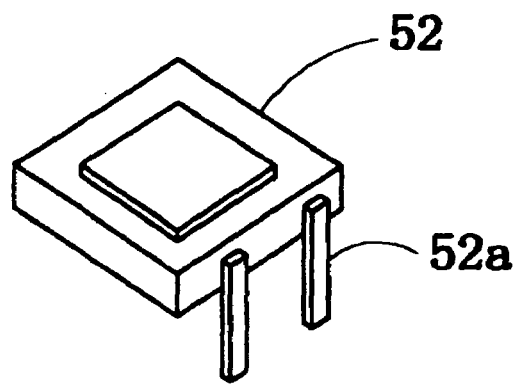

FIG. 48 shows a perspective view of a light receiver 76 according to a twenty-eighth preferred embodiment, and FIG. 49 shows a sectional view of the same. The light receiver 76 is constructed by covering a photo detector 52 mounted on a circuit board 73 with an optical module 77, and disposing the photo detector 52 within an element mounting portion 78. The kind of the photo detector 52 is not particularly limited, but can be applied to a general photodiode or phototransistor such as a light receiver having a lead 50a as shown in FIG. 50 at (a) and (b).

This optical module 77 is a mold in which a light reflecting portion 53 is insert-molded within a mold resin 54, and a direct incidence region 59 in a convex lens-shape and a flat region 60 are formed on a surface of the mold resin 54. In addition, an element mounting portion 78 in a concave shape is formed at a position on a rear face of the mold resin 54 corresponding to an aperture 61 of the light reflecting portion 53 to be accommodated within the aperture 61. The element mounting portion 78 is formed in a generally hemispherical shape to be generally perpendicular to light in each direction so that an optical axis of light emitted from the optical module 77 to the photo detector 52 is not bent. The light receiver 76 is constructed so that the optical module 77 may cover the photo detector 52 mounted on the circuit board 73 and the photo detector 52 may be housed within the element mounting portion 78. Positional adjustment of the photo detector 52 and the optical module 77 is eased and it can be efficiently assembled by matching the dimensions of the element mounting portion 78 with the external dimensions of the photo detector 52.

In the light receiver 76, the incident light striking against the direct incidence region 59 of the optical module 77 advances within the mold resin 54, and exists from the element mounting portion 78 to strike against the photo detector 52. The light striking against the flat portion of the optical module 77 advances within the mold resin 54 to be reflected by the light reflecting portion 53 toward the flat region 60, and the reflected light is further totally reflected by the flat region 60 to exit from the element mounting portion 78 for incidence to the photo detector 52. Accordingly, the optical module 77 serves as a large area optical lens, and light having a large area can be received by the photo detector 52 by employing the module 77 which is large in comparison with the photo detector 52.

Though spatially large area is necessary for obtaining similar functions and effects by employing a lens, a thin configuration can be performed by employing this optical module 77.

In case of light receiver, same function as that of the above-described various kinds of light receivers can be performed by changing the construction of the optical module 77.

Thought the optical module 72 for the light emission source and the optical module 77 for the light receiver are separately described here, but they may be used in common if desired.

TWENTY-NINTH PREFERRED EMBODIMENT

Figure 51:
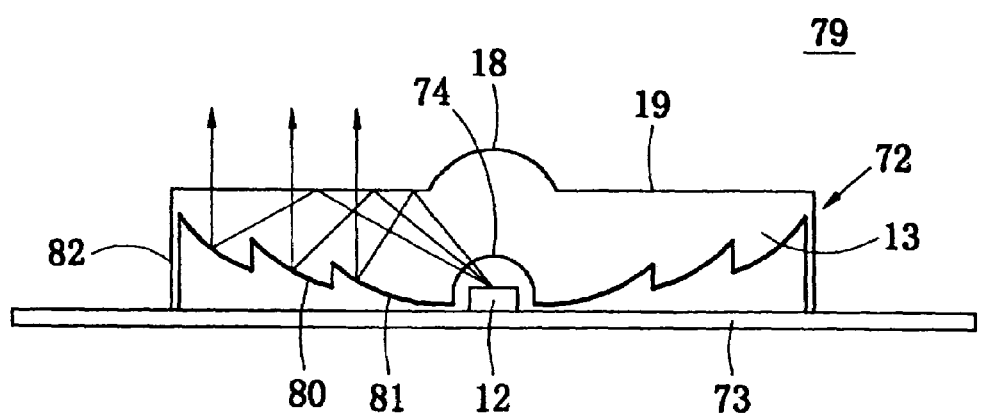
FIG. 51 is a sectional view of a light emission source according to a twenty-ninth preferred embodiment of this invention.

FIG. 51 shows a sectional view of a light emission source 79 according to a twenty-ninth preferred embodiment. In this embodiment, a light reflecting portion 20 is not inserted within an optical module 72 covering a light emitter 12. A Fresnel lens-shaped pattern 80 of a reflection type is formed on a rear surface of a mold resin 13 instead, and a reflection coating 81 consisting of a metal evaporation film is formed on a surface of the pattern 80. In addition, a support portion 82 of a cylindrical type is molded together with an outer circumferential portion of the mold resin 13 as a single unit for stabilization with a surface of a circuit board 73.

By such a configuration, same effect as that of the twenty-seventh embodiment (FIG. 46) is provided. Besides, because insert-molding the light reflecting portion 20 within the mold resin 13 is not necessary, the number of components can be reduced and the manufacturing cost also can be reduced. When the optical module 72 is molded, positioning the light reflecting portion 20 is not necessary, thereby improving efficiency of a molding process for the optical module 72.

THIRTIETH PREFERRED EMBODIMENT

Figure 52:
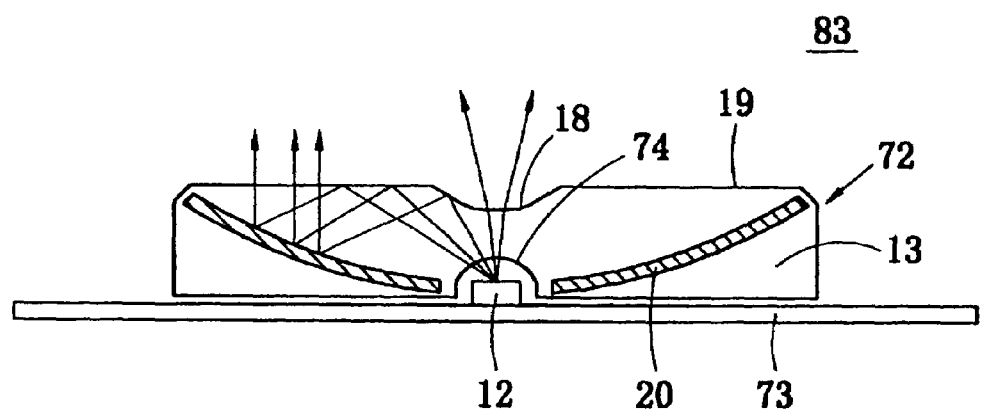
FIG. 52 is a sectional view of a light emission source according to a thirtieth preferred embodiment of this invention.

FIG. 52 shows a sectional view of a light emission source 83 according to a thirtieth preferred embodiment. In this embodiment, a direct emission region 18 is inconsiderably formed in the center of a surface of a mold resin 13, a major portion serves as total reflection region 19. The direct emission region 18 is composed of a shallow recess.

In this embodiment, the light emitted forward from the light emitter 12 is totally reflected by the total reflection region 19 as far as possible, and the emission direction can be controlled by the light reflecting portion 20. This embodiment can respond when any direct emission region 18 having a convex lens shape cannot be formed due to a spatial constraint by lifting controllability of outgoing beams, when the light emitted from the light emitter 12 has an unbalanced angle of beam spread and is not near lambert distribution, when light cannot be emitted in a desired direction in the convex lens-shaped direct emission region 18, and when a greater area is necessary and light is wanted to be distributed to an end surface direction of the optical module 72.

THIRTY-FIRST PREFERRED EMBODIMENT

Figure 53:
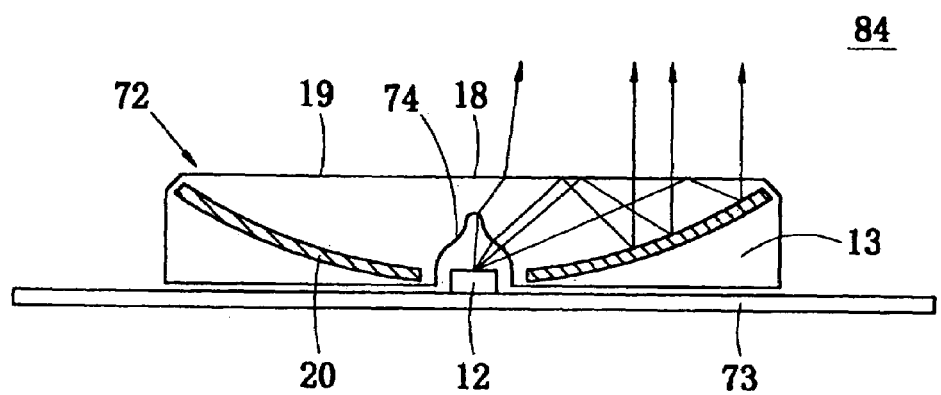
FIG. 53 is a sectional view of a light emission source according to a thirty-first preferred embodiment of this invention.
Figure 54:
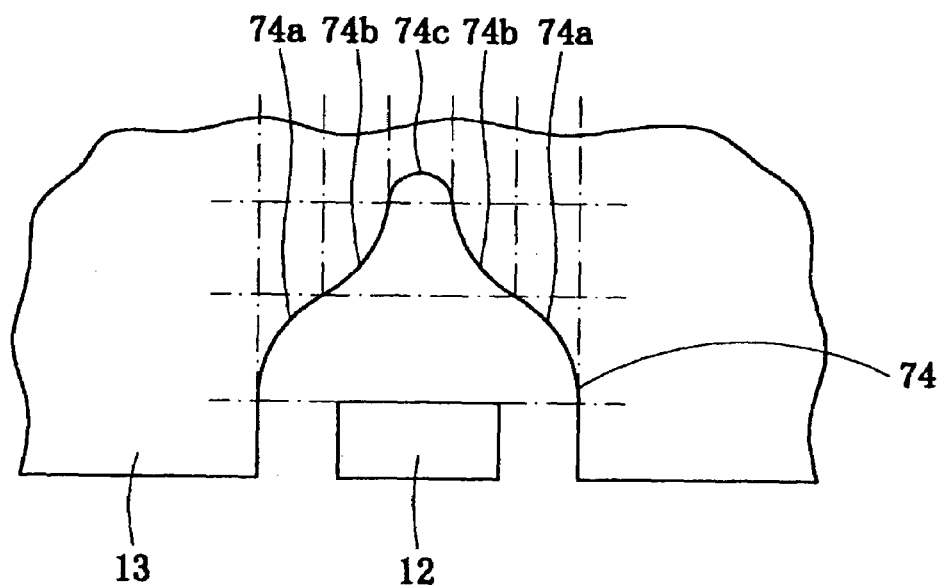
FIG. 54 shows an enlarged view of a portion of FIG. 53.

FIG. 53 shows a sectional view of a light emission source 84 according to a thirty-first preferred embodiment, in which a direct emission region 18 and a total reflection region 19 are formed in a planar fashion. As shown in FIG. 54, an element mounting portion 74 of an optical module 72 consists of a sphere-shaped division 74a and a small crater 74c having a narrow width which appears from a center of the division 74a to its front within a mold resin 13. A boundary portion 74b between the sphere-shaped division 74a and the crater 74c curves smoothly. The sphere-shaped division 74a and the crater 74c are formed to be approximately perpendicular to a direction of the light emitted from the light emitter 12, and boundary portion 74b slants against direction of the light emitted from the light emitter 12.

In the crater 74c the light emitted forward from the light emitter 12 advances forwardly to be emitted without changing the optical axis direction. Thus, when the light emission source 84 is viewed from its front, light is emitted from its center. In the boundary portion 74b, the light emitted forward from the light emitter 12 is refracted to be bent to the total reflection region 19, and its emission direction is controlled by the light reflecting portion 20. The light emitted from the light emitter 12 in a diagonal direction advances at the sphere-shaped division 74a toward the total reflection region 19 without almost changing its optical axis, and is reflected by the light reflecting portion 20 to control its emission direction. According to thus construction, the light emitted forward from the light emitter 12 is totally reflected by the total reflection region 19 as far as possible, and the emission direction of the light can be controlled by the light reflecting portion 20 in the same manner as that of the thirtieth embodiment (FIG. 52). Moreover, the crater 74c prevents a center of the light emission source 84 from becoming dark when it is viewed from its front.

THIRTY-SECOND PREFERRED EMBODIMENT

Figure 55:
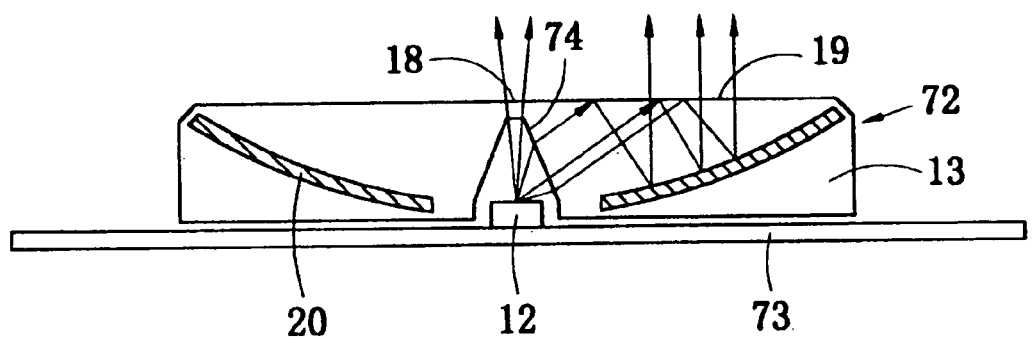
FIG. 55 is a sectional view of a light emission source according to a thirty-second preferred embodiment of this invention.

FIG. 55 shows a sectional view of a light emission source 85 according to a thirty-second preferred embodiment, in which a direct emission region 18 and a total reflection region 19 are formed in a planar fashion. An element mounting portion 74 sof an optical module 72 is formed in a truncated cone configuration.

Figure 56:
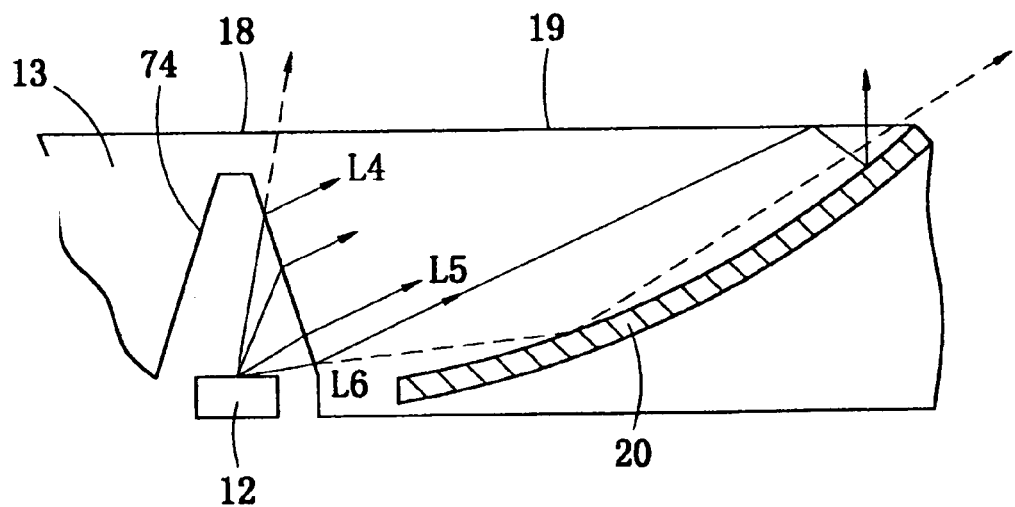
FIG. 56 shows an enlarged view of a portion of FIG. 55.

The optical module 72 employing the element mounting portion 74 having such a configuration can emit the light emitted from the light emitter 12 to a top face of the element mounting part 74 toward its front without changing its direction. As shown in FIG. 56, in the light emitted from the light emitter 12 to an incline surface of the element mounting portion 74, light L4 near the top face is refracted to the total reflection region 19 (this light L4 goes straight as shown by broken lines in the event of a sphere-shaped element mounting portion 74), and its emission direction is controlled by light reflecting portion 20. Light L5 perpendicularly striking against the incline surface of the element mounting portion 74 from the light emitter 12 goes straight to be totally reflected by the total reflection region 19, and its emission direction is controlled by the light reflecting portion 20. Accordingly, this embodiment can provide same effect as that of the thirty first embodiment.

Furthermore, when the element mounting part 74 is sphere-shaped, light L6 emitted from light emitter 12 to a side direction (at an angle of about 70 degrees or greater to the optical axis) directly strikes against the light reflecting portion 20 to be reflected thereby for spreading outwardly as shown in broken lines. When the element mounting part 74 is in a truncated cone shape, the light L6 is refracted with the incline of the element mounting portion 74 to go straight to the total reflection region 19 for total reflection, and the totally reflected light is reflected by the light reflecting portion 20 to be emitted forward.

THIRTY-THIRD PREFERRED EMBODIMENT

Figure 57:
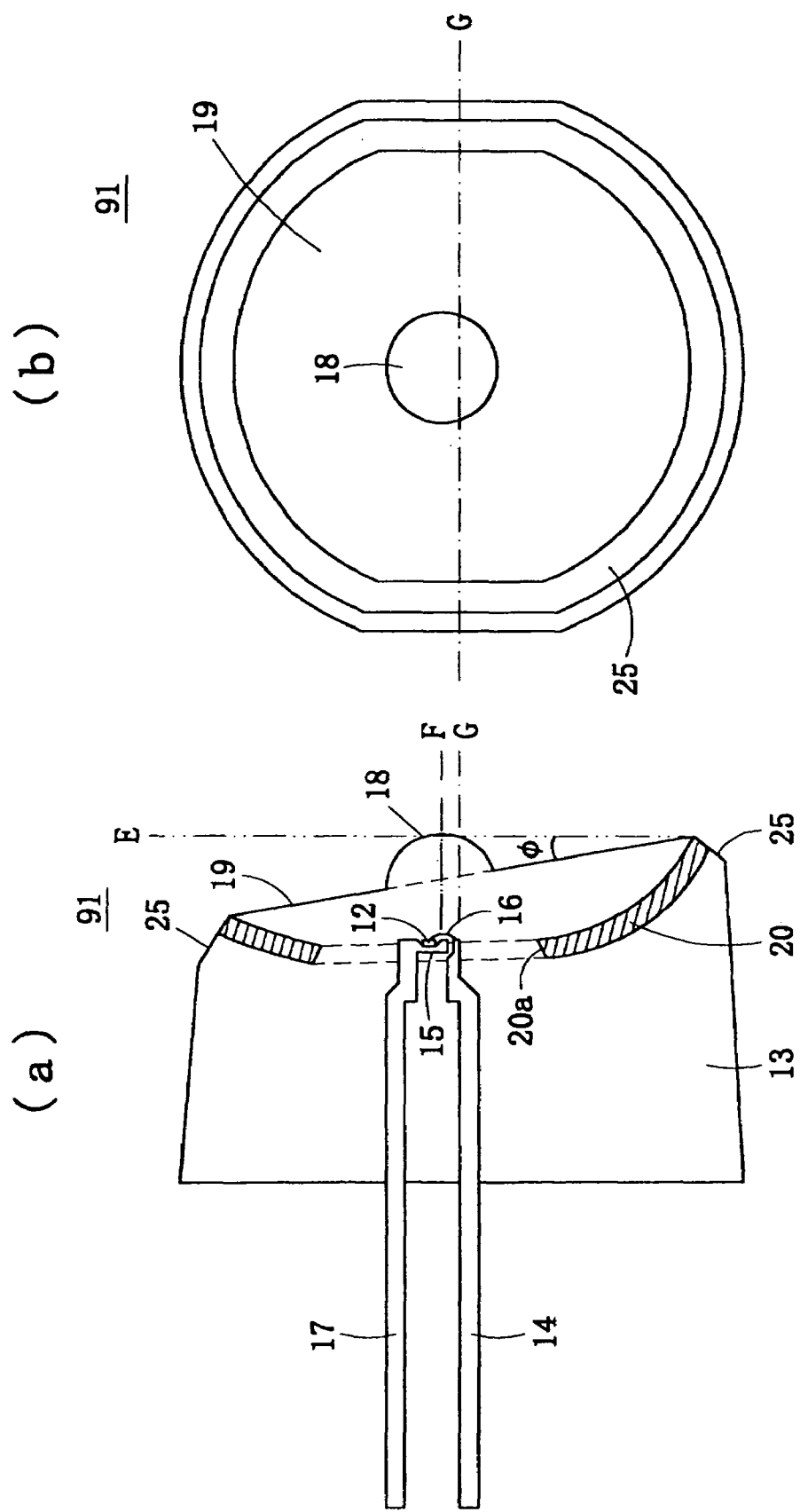
FIG. 57 at (a) and (b) shows sectional and front views of a construction of a light emission source according to a Thirty-third preferred embodiment of this invention.

FIG. 57 is a sectional view showing a configuration of a light emission source 91 according to a Thirty-third preferred embodiment. In this light emission source 91, a stem 15 is disposed on a leading edge of a lead frame 17, a light emitter 12 such as an LED chip is die-bonded on the stem 15, and another lead frame 14 is bonded with the light emitter 12 by means of a bonding wire 16. A light reflecting portion 20 is formed aspherical by a metal plate, a specular working is applied to an inner wall of the metal plate by means of metal plating or etching, and an opening 20a is disposed in a generally central portion.

Leading edges of the lead frame 17 mounted by the light emitter 12 and the lead frame 14 are passed in the opening 20a of the light reflecting portion 20 to be sealed together with the light reflecting portion 20 within a mold resin 13 made of a transparent resin having a high refractive index. A total reflection region 19 is formed on a front wall of the mold resin 13, and a direct emission region 18 in a convex lens-shape is formed in a generally central portion thereof.

When the light emission source 91 is turned on, the light directly striking against the direct emission region 18 in the light emitted from the light emitter 12 is focused by the direct emission region 18 to be emitted forward. The light directly striking against the total reflection region 19 around the direct emission region 18 among the light emitted from the light emitter 12 is totally reflected backward by the total reflection region 19, further reflected by the light reflecting portion 20 located at the backward of the total reflection region 19 to be squeezed so that the directivity pattern becomes small (preferably, approximately paralleled light), and emitted forward through the total reflection region 19. The light emitted in a direction at a large angle to the optical axis direction of the light emitter 12 can be emitted forward, thereby greatly improving the use efficiency of light. In addition, light can be emitted uniformly in a front of the light emitter 12.

Furthermore, in this light emission source 91, a front of the mold resin 13 (total reflection region 19) is inclined by φ against plane E perpendicular to an optical axis of the light emitter 12. The direct emission region 18 includes an aspherical lens, and an optical axis (center) F of the direct emission region 18 is shifted toward a tilt direction of the total reflection region 19 (upward direction in FIG. 57) than a geometrical center G of the total reflection region 19. The optical axis of the light emitter 12 is further shifted in the tilt direction of the total reflection region 19 than optical axis F of the direct emission region 18.

Figure 58:
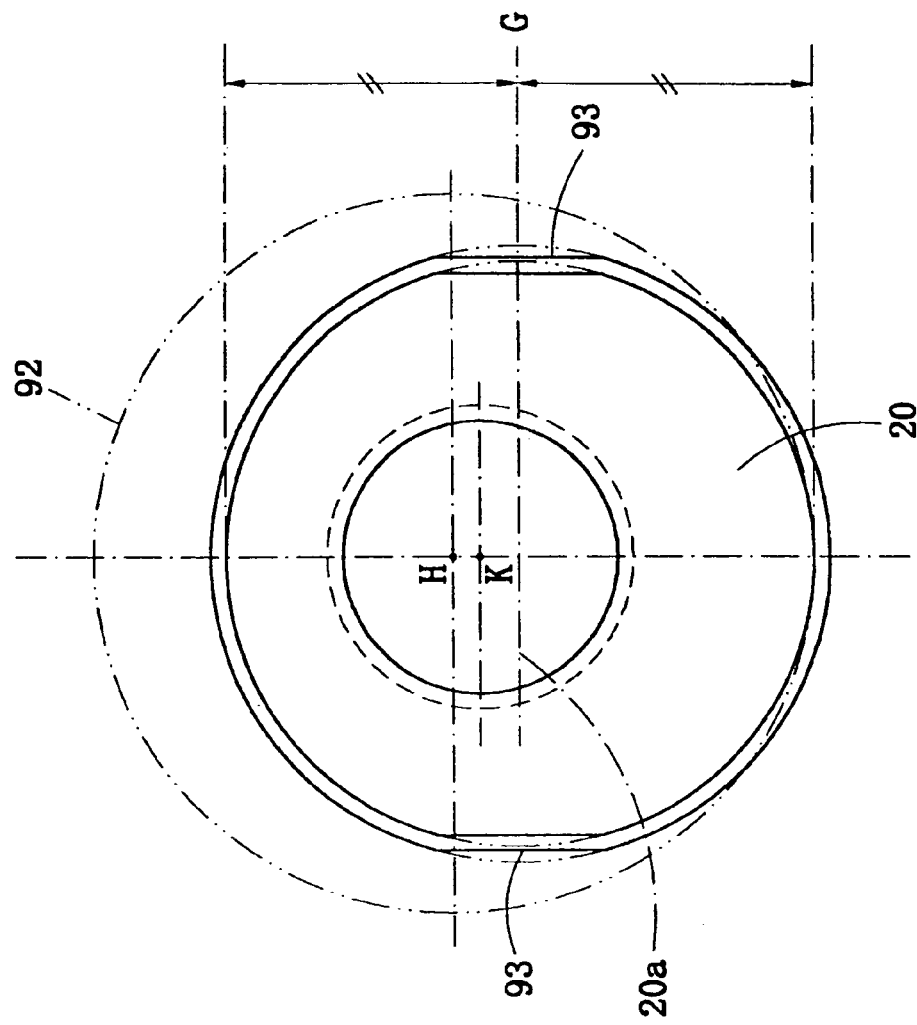
FIG. 58 at (a) and (b) shows sectional and front views of a construction of the light reflection member employed in the light emission source of FIG. 57.
Figure 58:
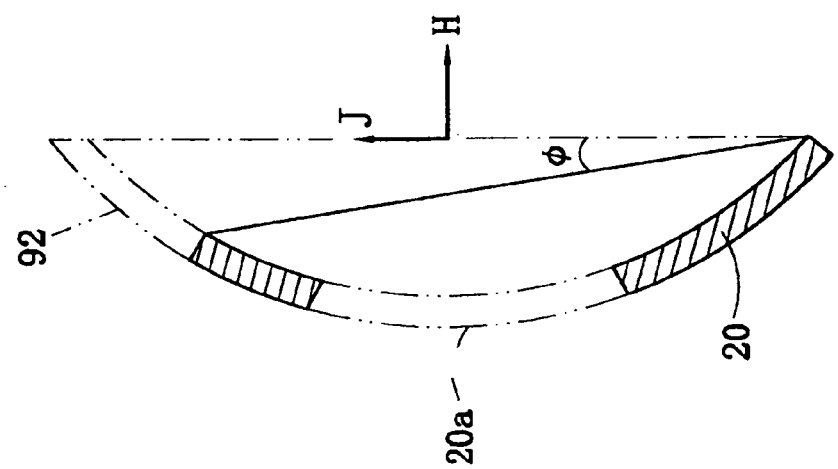

A curved shape of the light reflecting portion 20 is depicted by one aspheric surface expression, and the light reflecting portion 20 has an a symmetry configuration which seems to be made by a portion shifted from its center. The configuration of this light reflecting portion 20 will be explained in detail referring to FIG. 58. In FIG. 58 at (a) and (b), a curved surface plate 92 shown in two-dotted lines includes a curved surface expressed by an aspheric surface expression having H as a rotation symmetry shaft. The light reflecting portion 20 is cut by a wall inclining a edge of the curved surface plate 92 by the angle φ in a J direction. An opening 20a of the light-reflecting portion 20 is formed in a round shape, and its center K is located in medium with a rotation symmetry shaft H of curved surface plate 92 and a center G of the light reflecting portion 20. In addition, the center K of the opening 20a almost accords with the optical axis of the direct emission region 18. Both side edges 93 of light reflecting portion 20 are cut off, so that the configuration of the light emission source 91 viewed from its front becomes a straw bag pattern cut both side faces. This is because the light reflecting portion 20 is designed not to rotate in a mold molding on molding and not to be shifted about its location by giving directivity to the light reflection portion which is not in rotation symmetry.

Figure 77:
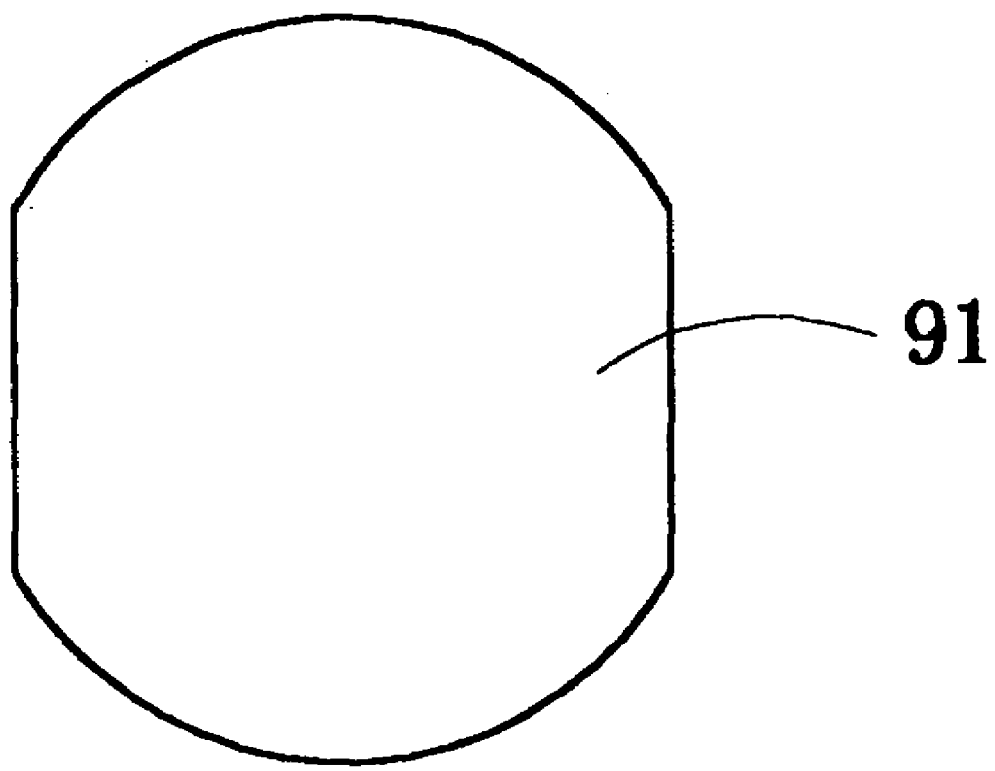
FIG. 77 shows a different shape front of the light emission source.
Figure 78:
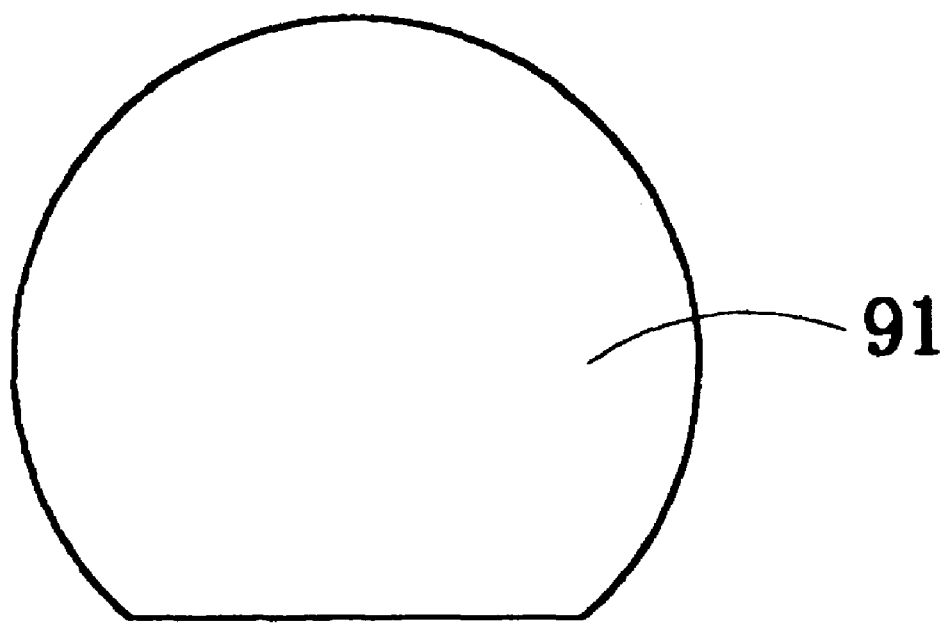
FIG. 78 shows a further different shape front of the light emission source.
Figure 79:
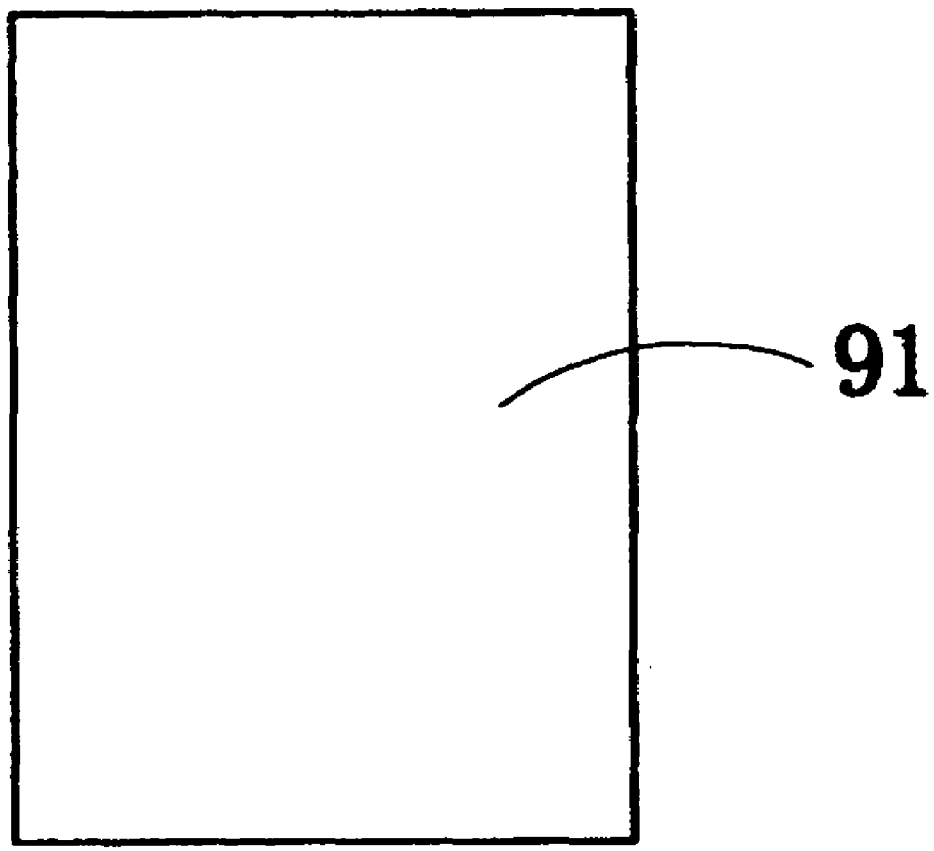
FIG. 79 shows a still further different shape front of the light emission source.
Figure 80:
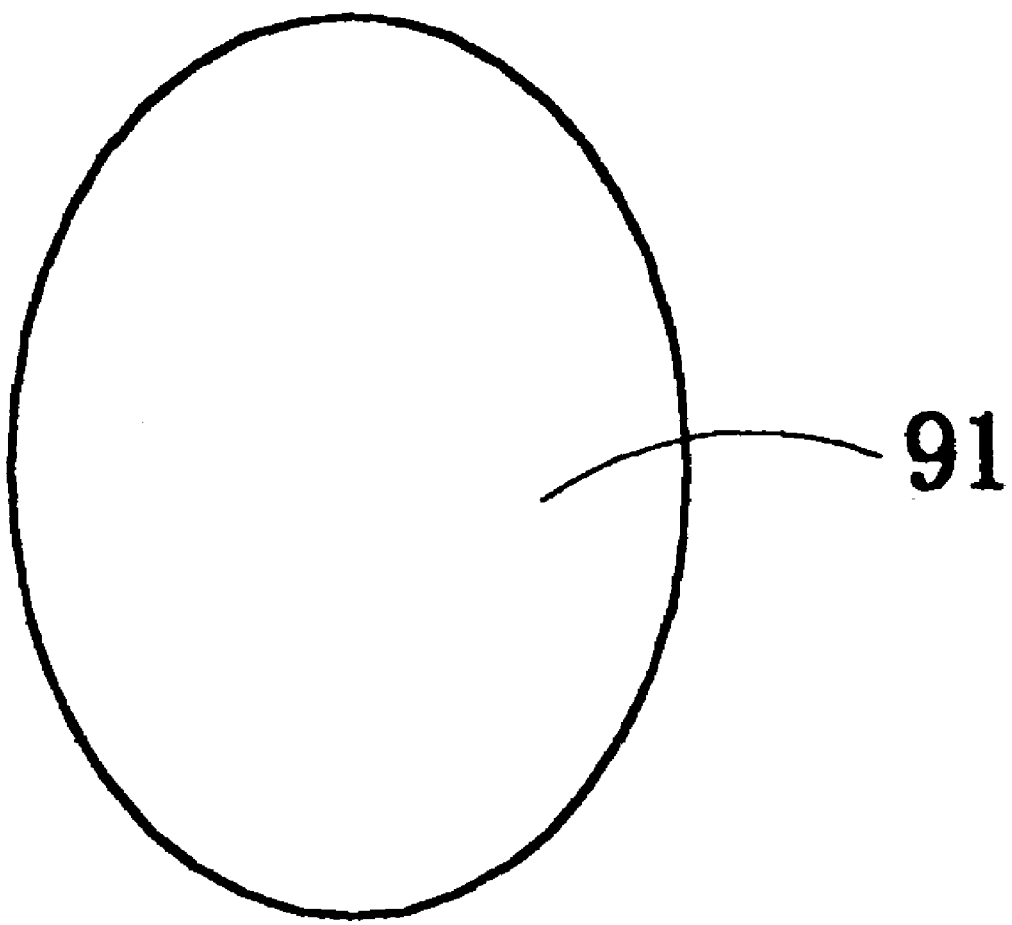
FIG. 80 shows a still further different shape front of the light emission source.

The configuration of the light emission source 91 viewed from its front face is not limited to the straw bag pattern shown in FIG. 77, but may be a round shape partially cut off as shown in FIG. 78, rectangle as shown in FIG. 79, or elliptic as shown in FIG. 80.

The optical axis of the light emitter 12 comes off from the center G of the light reflecting portion 20, and tilts to the gradient direction of the total reflection region 19.

Figure 59:
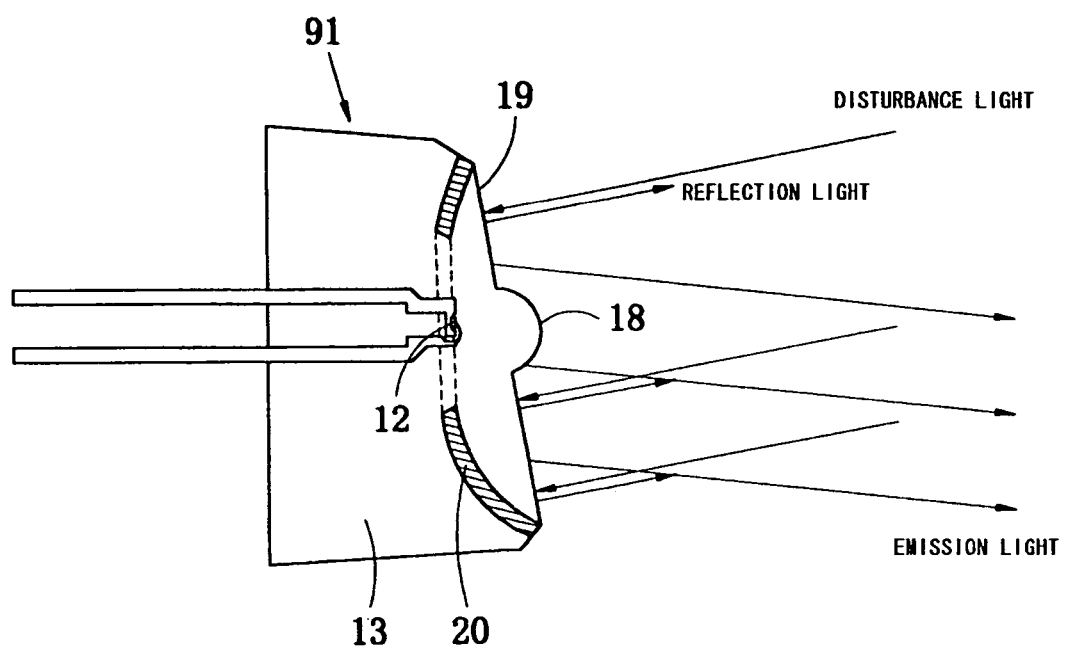
FIG. 59 is an operation explanatory view of the light emission source of FIG. 57.

In this light emission source 91, the total reflection region 19 and the light reflecting portion 20 are slantly positioned as described above. As shown in FIG. 59, when the total reflection region 19 is installed to face to a slant upward direction and disturbance light such as morning sun or afternoon sun enters from a slant upward position, the light reflected by the total reflection region 19 and the light reflecting portion 20 returns to its original slant upward direction and does not reach ground. Accordingly, this embodiment can avoid inconvenience such that the light emission source 91 seems to illuminate by means of reflection light when it is turned off.

The light emitter 12 is shifted upward from the optical axis F of the direct emission region 18, the light emitted from the light emitter 12 and passing through the direct emission region 18 is emitted to a downward area which is different from the light reflected by the total reflection region 19 and the light reflecting portion 20. The light reflecting portion 20 has the a symmetry configuration, and the light emitter 12 is shifted upward from the center of the light reflecting portion 20, so that the light, which is emitted from the light emitter 12, totally reflected by the total reflection region 19, and further reflected by the light reflecting portion 20 to be emitted through the total reflection region 19, is emitted to a downward area which is different from the reflection light in the total reflection region 19 and the light reflecting portion 20. Accordingly, the light emitted from the light emission source 91 can be surely watched from ground without prevention by any disturbance light, and it can be clearly determined whether the light emission source 91 illuminates or not.

Figure 60:
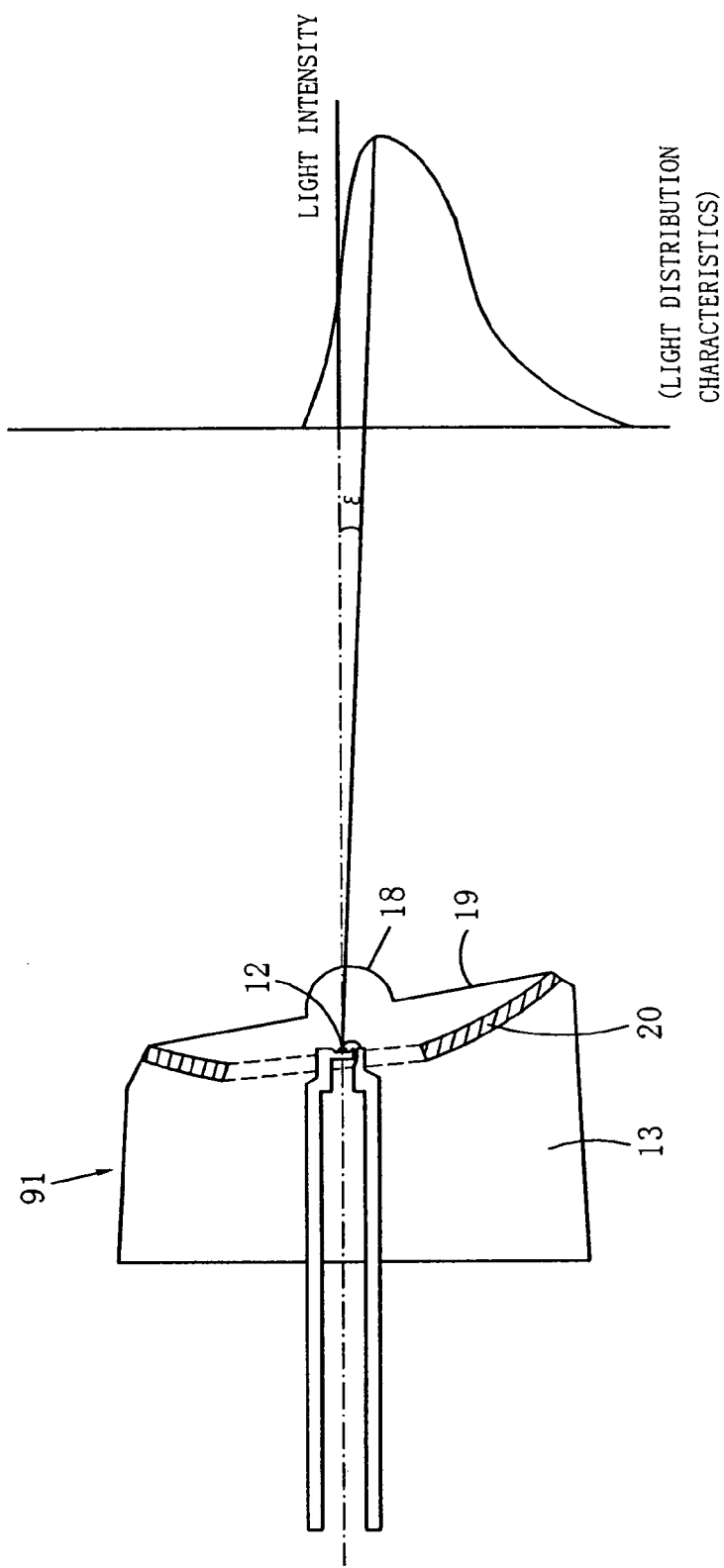
FIG. 60 shows light distribution characteristics of the light emission source of FIG. 57.

FIG. 60 shows an example of light distribution characteristic of the light emitted by the light emission source 91. This light distribution characteristic has a gradient ε downwardly against the optical axis of light emitter 12 or the medial axis of light emission source 91 to the lower part, and an a symmetry light distribution characteristic which is distributed in a narrow spectrum to tilt direction (upward) of the total reflection region 19 and a wide spectrum in the opposite side (downward).

According to such light distribution characteristic, when this light emission source 91 is used for a signal, it can be watched brightly when it is watched from far away but cannot be seen when it is looked up from the neighborhood, thereby realizing an ideal illumination demanded in the signal.

In this light emission source 91, the direct emission region 18 is formed to be the aspherical lens and the light reflecting portion 20 is expressed by the aspheric surface expression, so that the design of light emission source 91 is eased.

As shown in FIG. 57, an outer circumferential edge of the light reflecting portion 20 is located in a beveling potion 25 formed at a front circumference portion of mold resin 13. When the mold resin 13 is molded, the outer circumferential edge of light reflecting portion 20 abuts on an inside wall of the cavity of the mold to position the light reflecting portion 20, and the resin flows through the opening 20a of the light reflecting portion 20 so that the light reflecting portion 20 can be easily insert-molded.

The direct emission region 18 is not limited to the aspherical lens, but may be a spherical lens if desired.

THIRTY-FOURTH PREFERRED EMBODIMENT

Figure 61:
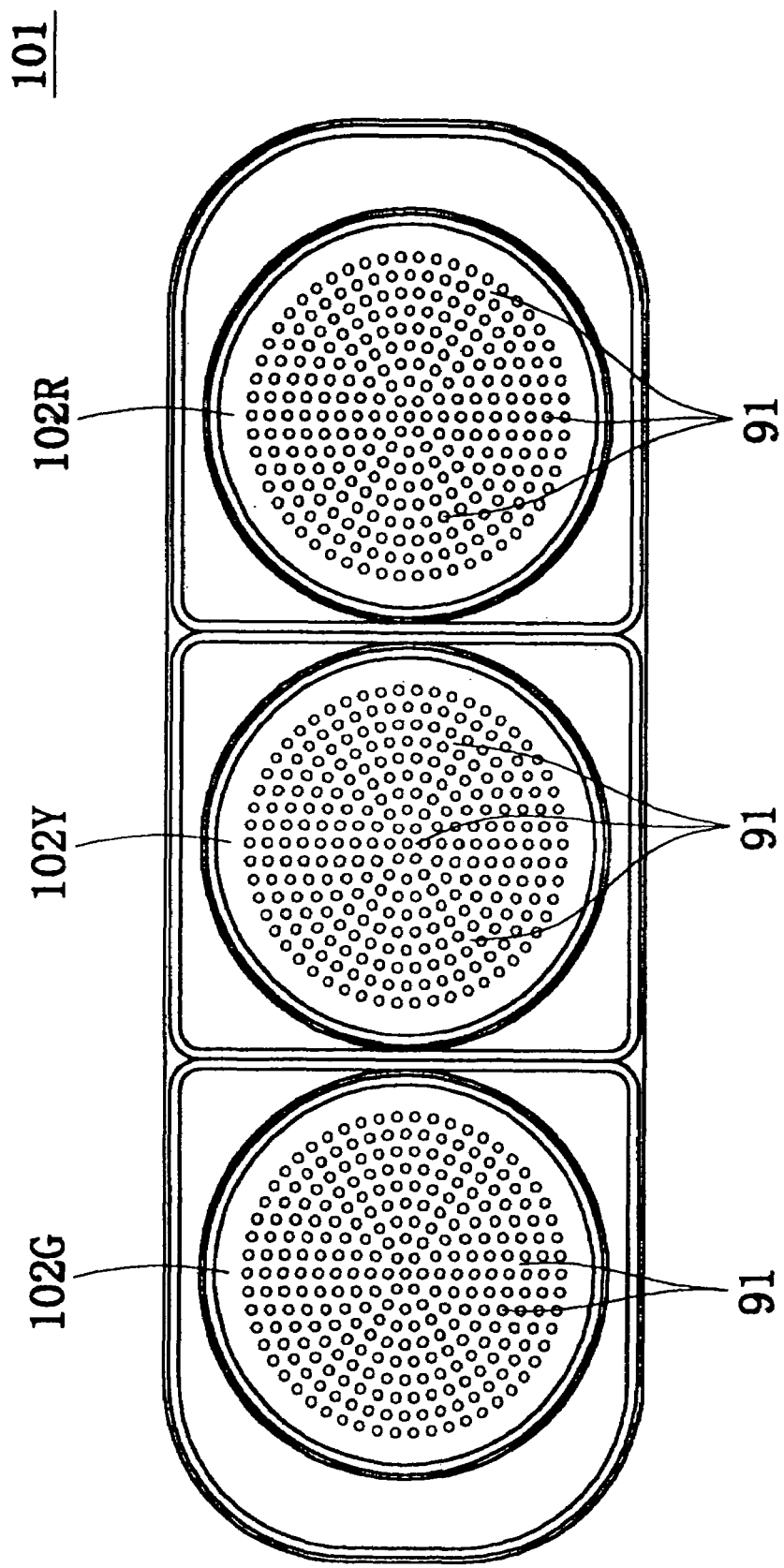
FIG. 61 is a front view of a signal according to a thirty-fourth preferred embodiment of this invention.
Figure 62:
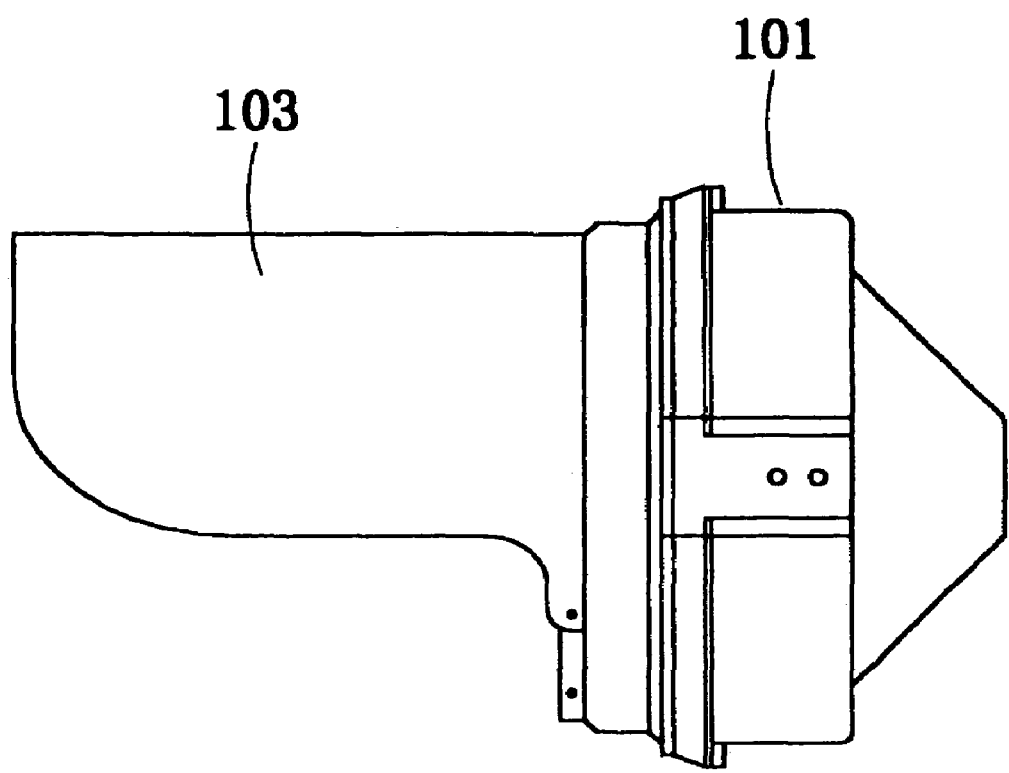
FIG. 62 is a side view of the signal of FIG. 61.
Figure 63:
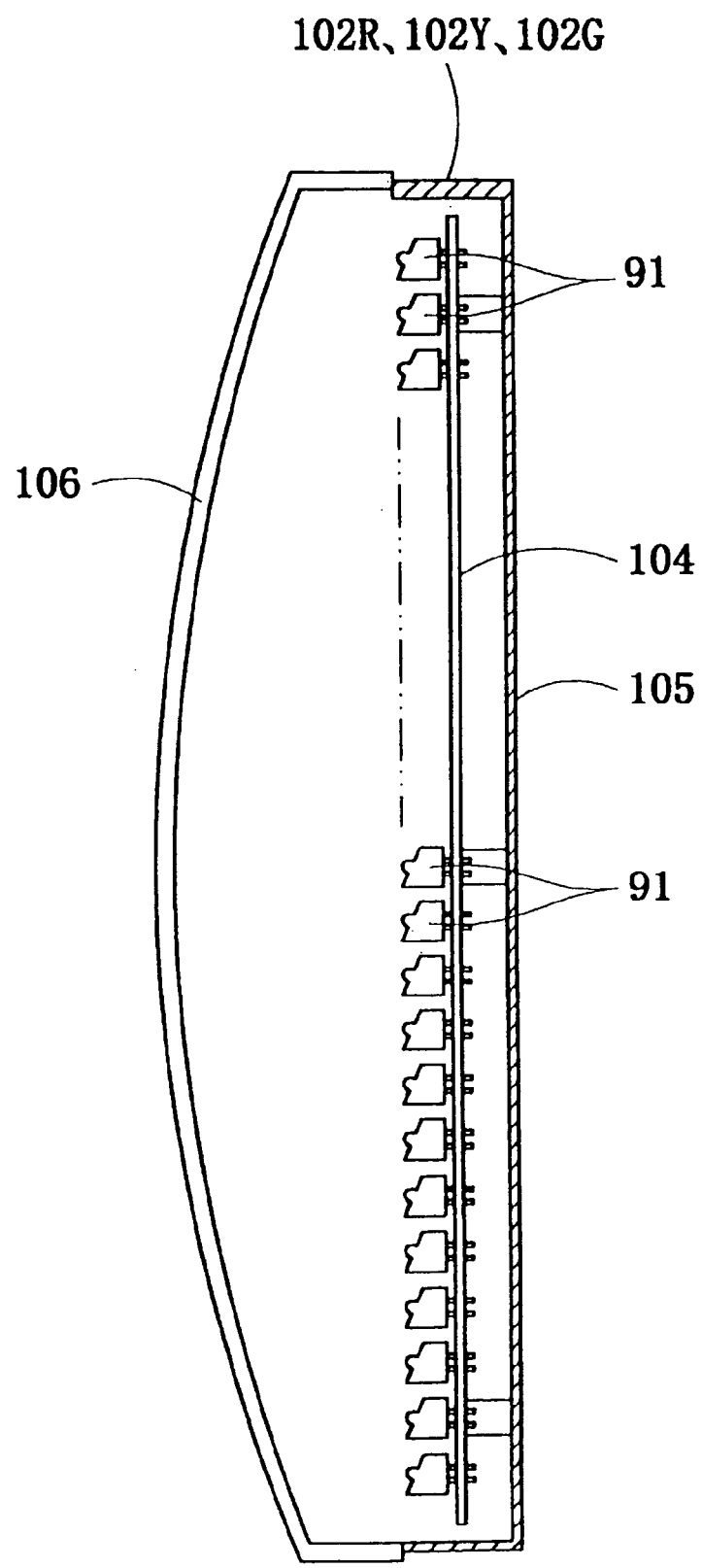
FIG. 63 is a sectional view of a signal lamp providing the signal of FIG. 61.

FIGS. 61 and 62 show front and sectional views of a signal 101 employing light emission sources 91 as described above according to a thirty-fourth preferred embodiment. The signal 101 is arranged by signal lamps 102R, 102Y and 102G for red, yellow and green colors, and its upper portion is covered with a hood 103. As shown in FIG. 63, in each of the signal lamps 102R, 1021Y and 102G for red, yellow and green, many light emission sources 91 of the corresponding light emission color are mounted on a substrate 104 along a direction to be housed within a housing 105 a front of which is covered with a milk-white or a semitransparent cover 106.

Figure 65:
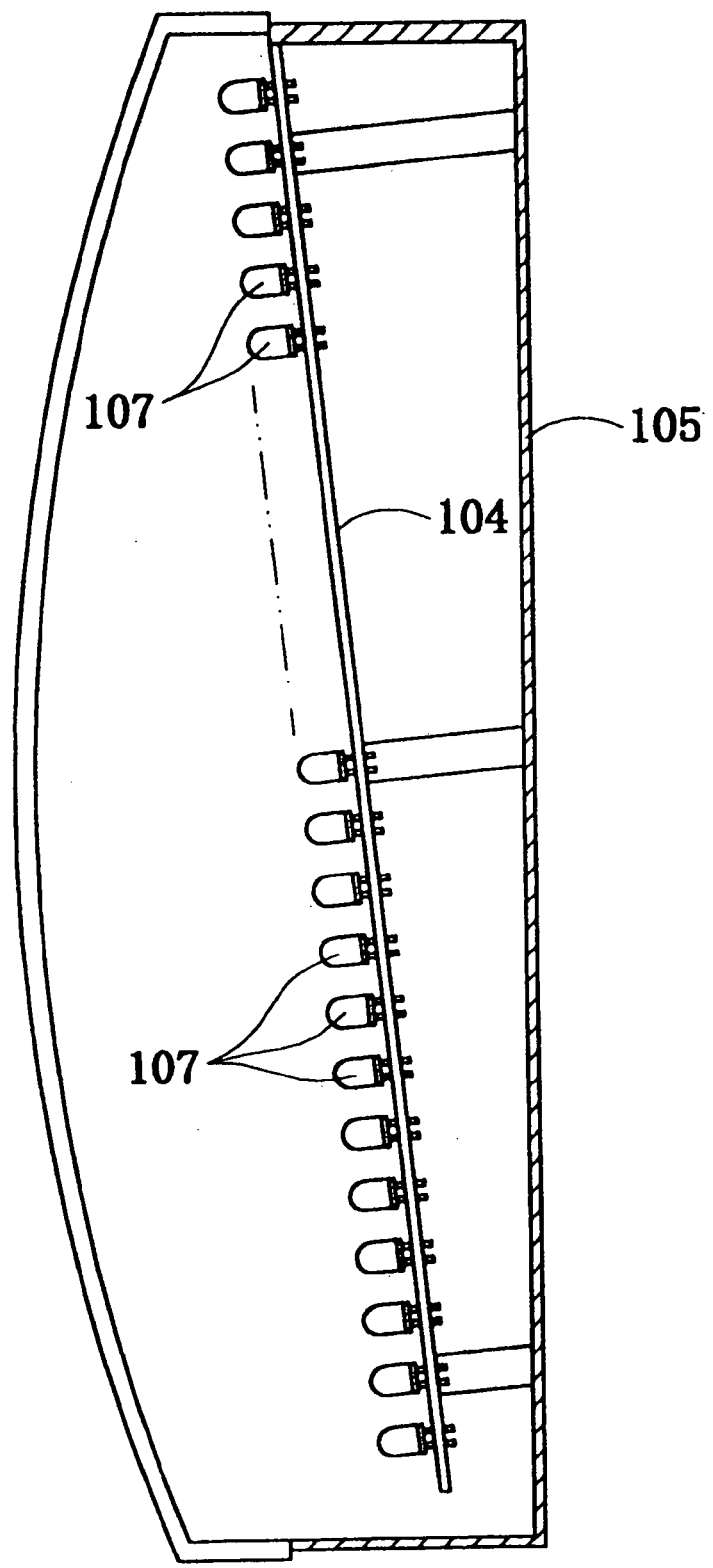
FIG. 65 is a sectional view of a comparative example of a signal lamp.

FIG. 65 is a sectional view showing a configuration of a signal lamp employing conventional LEDs 107 for comparison. In the conventional LED 107, light is emitted forward on straight, so that the substrate 104 has to be diagonally put within the housing 105 as shown in FIG. 65 in order to put the substrate 104 mounted by LEDs 107 within the signal lamp to emit light downwardly. Therefore, the construction for installing the substrate 104 within the housing 105 of the signal lamp becomes complicate. The thickness of the signal lamp also becomes thick because the substrate 104 has to be diagonally installed.

Figure 64:
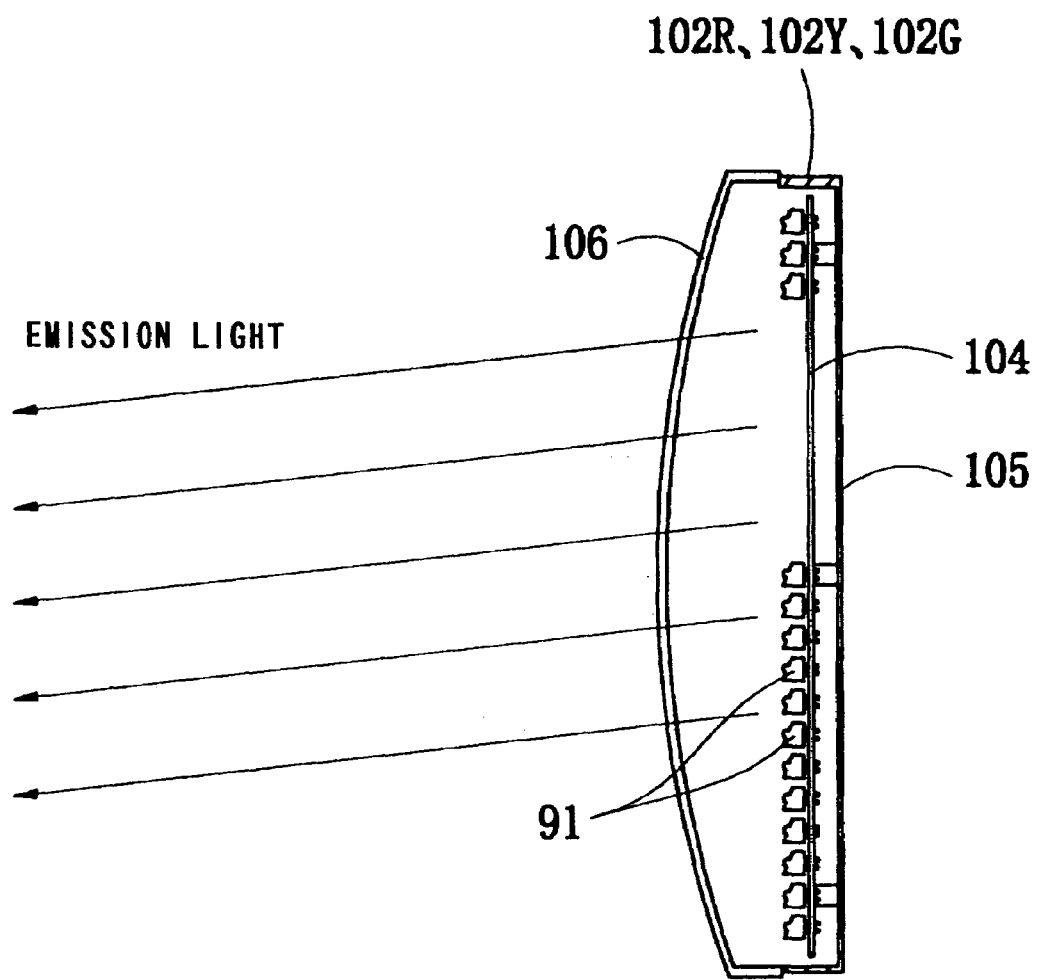
FIG. 64 shows a direction of light emitted from the signal of FIG. 61.

According to the signal 101 according to this invention, the light emission sources 91 themselves can emit light in a downward diagonal direction as shown in FIG. 64, and the substrate 104 can be installed in parallel with the housing 105 as shown in FIG. 63, thereby thinning the thickness of the signal lamps 102R, 102Y and 102G. The construction for installing the substrate 104 within each of the signal lamps 102R, 102Y and 102G becomes simple. The emission light is effectively distributed in an irradiation technical standard field of signal where upward is not necessary to be irradiated, thereby realizing signal 101 employing the light emission source 91 having a high luminous efficiency. In addition, any light reflected back with the light emission sources 91 are not reflected back downward, the visual performance about the signal lamps 102R, 102Y, and 102G is improved.

In order to illuminate non-white light such as red, green and blue like lamps for the signal 101, there may be proposals of a light emission source which seals light emitters 12, such as a red light LED, a green light LED and a blue light LED, within transparent mold resins 13, or which seals light emitters 12 generating white light, such as a white light LED, within mold resins 13 consisting of a red transparent resin, a green transparent resin, and a blue transparent resin. According to the former proposal, even if disturbance light such as sun light is reflected back toward ground by a surface of the mold resin 13 or the light reflecting portion 20, the reflected light cannot be seen with color like when the light emission source is turned on, the reflected light is erroneously recognized as if the light emission source is turned on when it is actually turned off.

THIRTY-FIFTH PREFERRED EMBODIMENT

Figure 66:
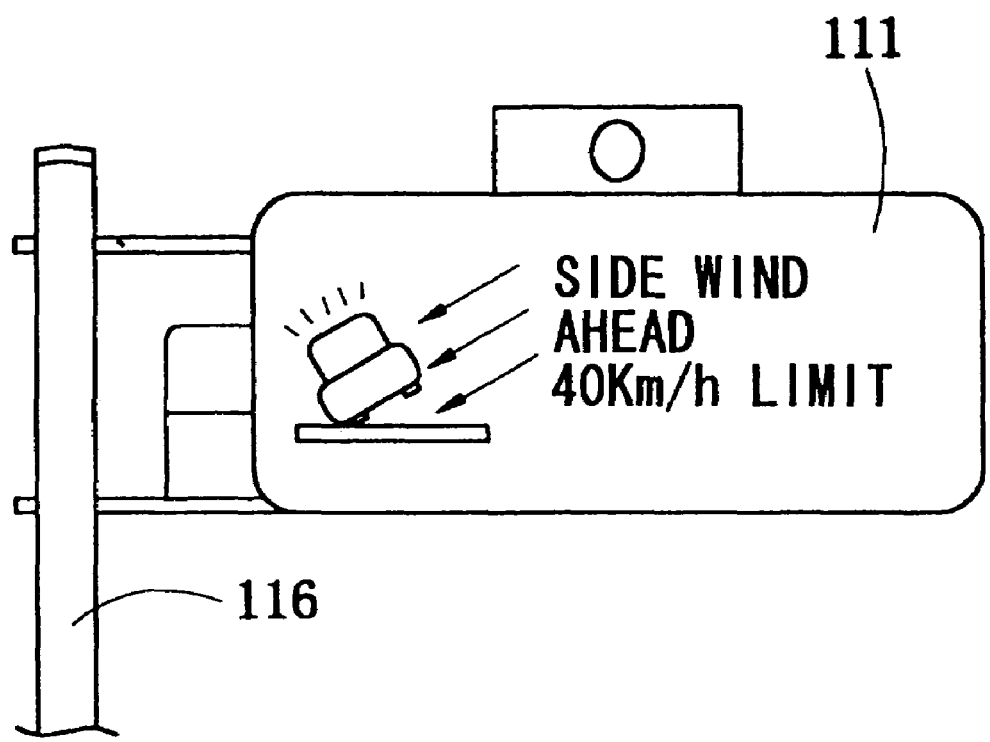
FIG. 66 is a front view of a light emission display apparatus according to a thirty-fifth preferred embodiment of this invention.
Figure 67:
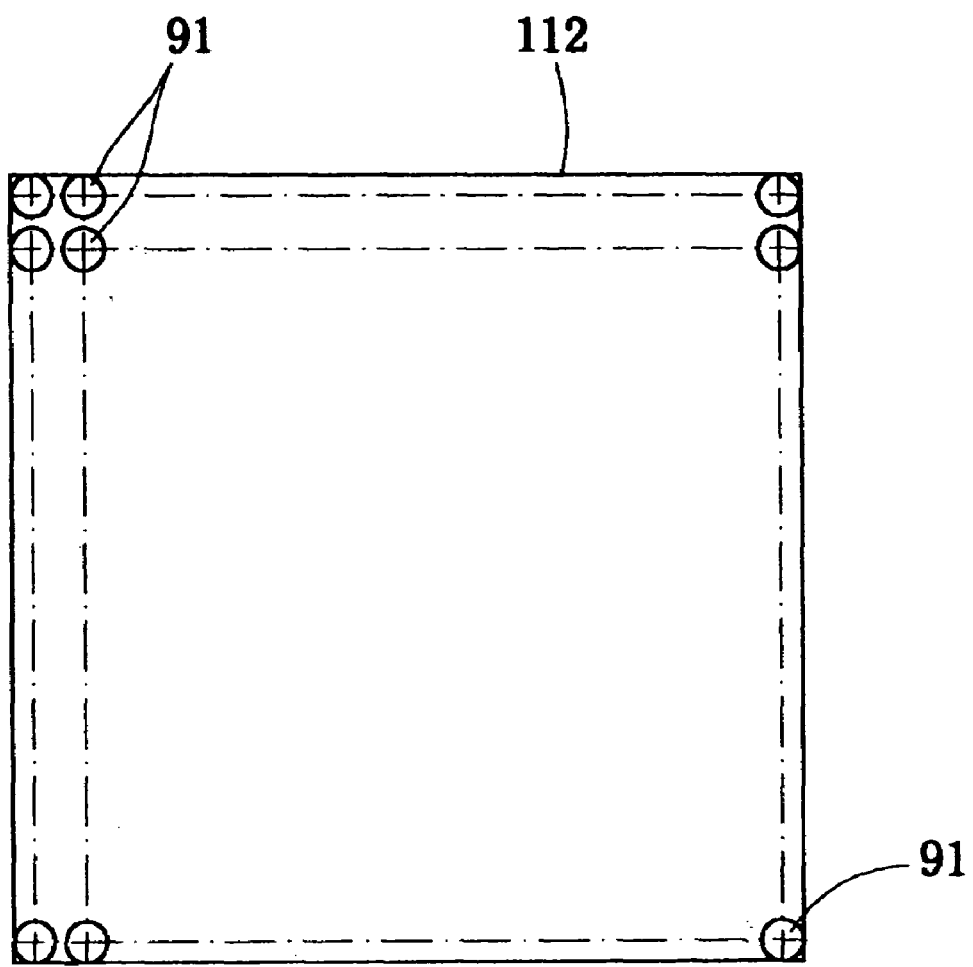
FIG. 67 is a front view of a light emission display unit providing the display apparatus of FIG. 66.
Figure 68:
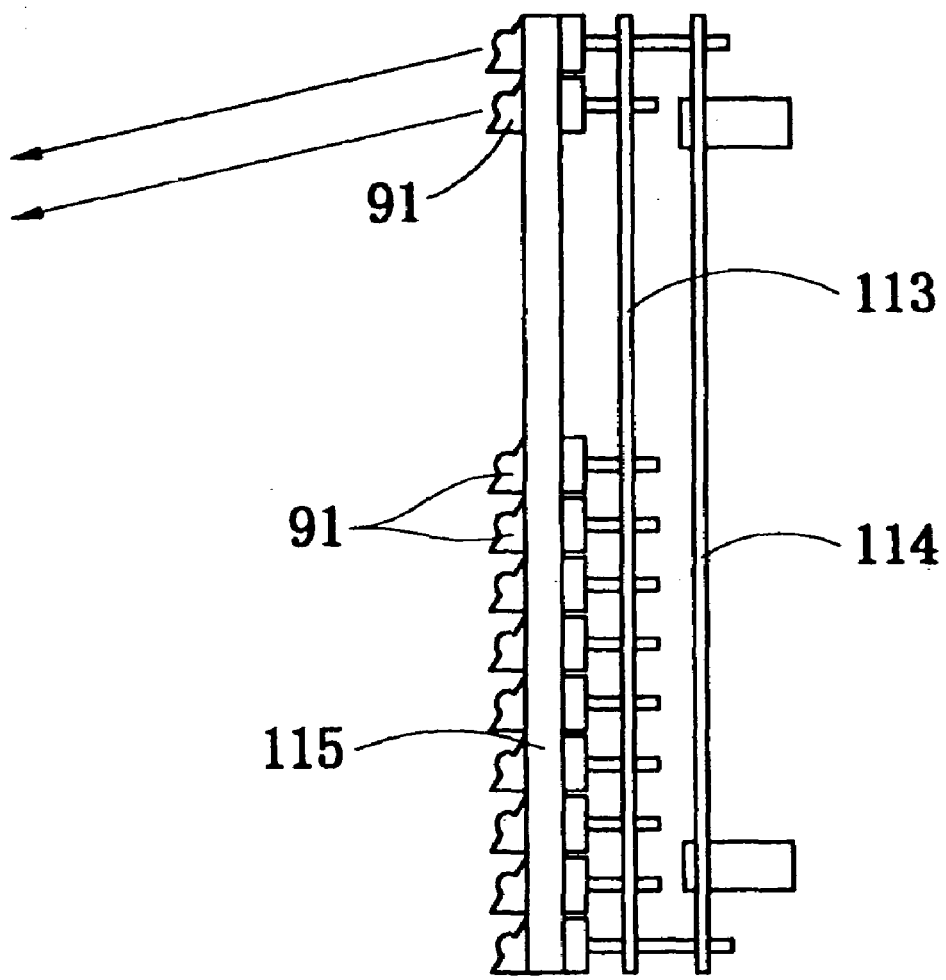
FIG. 68 is a side view of the light emission display unit of FIG. 67.

FIG. 66 is a front view of a light emission display 111 supported by a pole 116 according to a thirty-fifth preferred embodiment, for example, for showing a traffic condition or a whether information to drivers, in which letters and illustrations are composed of light emission sources 91. FIGS. 67 and 68 show front and sectional views of a light emission display unit 112 providing the light emission display 111. In the light emission display unit 102, light emission sources 91 as described in the thirty-third embodiment are mounted on a substrate 113, and the substrate 113 is located between a base 114 and a cover 115 so as to expose the respective light emission sources 91 from apertures of the cover 115. The light emission sources 91 are arranged on the substrate 113 in a suitable pattern so as to emit suitable color light in accordance with marks or letters to be displayed.

Figure 69:
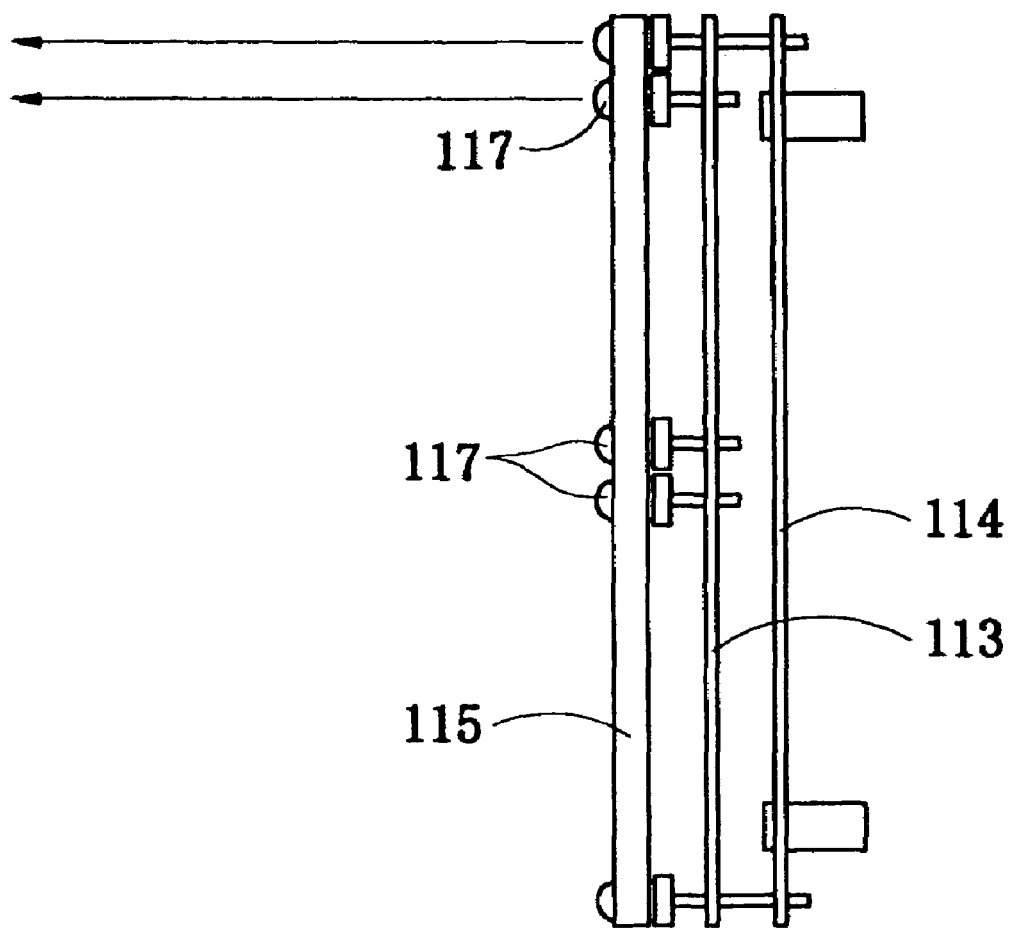
FIG. 69 is a side view a comparative example of a light emission display unit.

In the light emission display unit employing conventional LED 117, the light from each LED 117 is emitted on the straight as shown in FIG. 69, so that the light emission display unit has to be declined downward for installation when it is installed on a wall or a top of a pole brace to be easily watched from a lower position.

As shown in FIG. 68, in the light emission display 111 employing the light emission sources 91 according to this invention, the light emission sources 91 themselves can emit light in a diagonal-downward direction, so that light is emitted in the diagonal-downward direction without tilting the light emission display on installation and the display can be watched from ground with ease. Accordingly, the light emission display 111 can be easily installed, and become slim by thinning the same. Besides, because it is hard to become impossible to see the light emission display due to the reflection of disturbance light such as afternoon sun or morning sun, according to the light emission display 111 employing the light emission sources 91 of this invention, the light emission display 111 a display of which can be clearly recognized is provided by employing the light emission sources 91 having high luminous efficiency.

THIRTY-SIXTH PREFERRED EMBODIMENT

Figure 70:
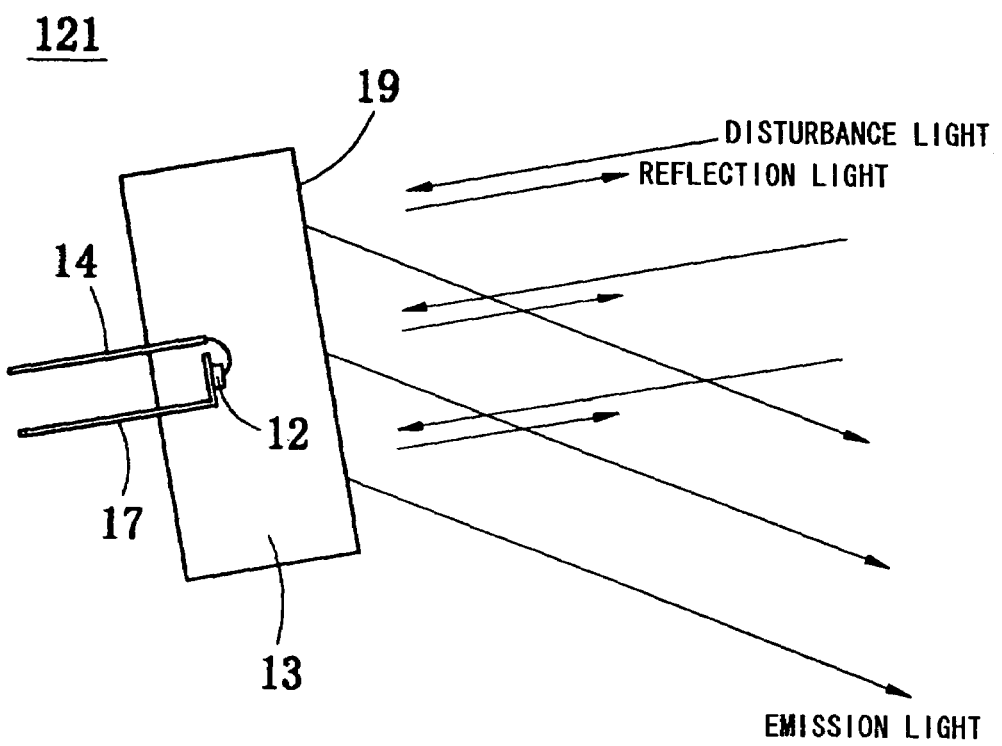
FIG. 70 is a sectional view of a light emission source according to a thirty-sixth preferred embodiment of this invention.

FIG. 70 shows a sectional view of a configuration of a light emission source 121 according to a thirty-sixth preferred embodiment, in which a mold resin 13 seals a lead frame 17 at its top end die-bonded by a light emitter 12 and a lead frame 14 wire-bonded with the light emitter 12, and in which a total reflection region 19 on a front flat wall of the mold resin 13 is formed on a plane perpendicular to an optical axis of the light emitter 12. This light emission source 121 is installed so that the total reflection region 19 of the mold resin 13 is diagonally set toward a direction of disturbance light.

In this light emission source 121, even if disturbance light from a low altitude, such as the afternoon sun or the morning sun, strikes against the light emission source 121, the light reflected back with the total reflection region 19 of the light emission source 121 is reflected back to the original direction (upward and diagonal) without arriving the ground, and it can be avoided that the light emission source 121 seems to be turned on when it is turned off.

On the other hand, if the angle of beam spread of light emitted by the light emission source 121 is designed to be broad, the light emitted downward can be viewed clearly from the lower part (ground), whereby the visual recognition performance is not sacrificed. In order to ease watching the light emission source 121 from a lower part, the optical axis of the light emitter 12 in the mold resin 13 may be directed toward the lower part so as to refract the light emitted from the light emitter 12 with the total reflection region 19 for downward emission.

Figure 71:
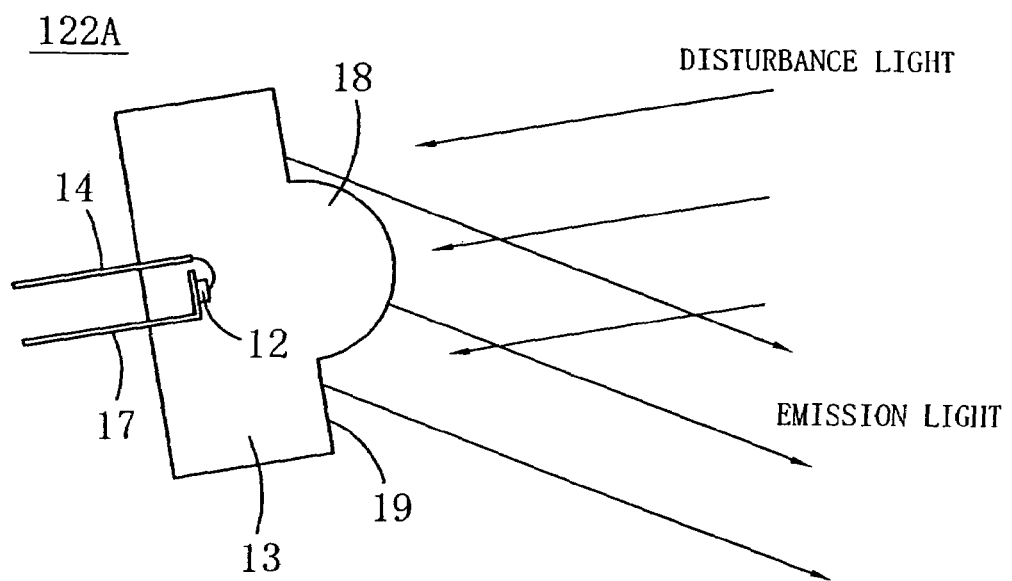
FIG. 71 is a sectional view of a light emission source according to a modification of the thirty-sixth embodiment of this invention.

If desired, the mold resin 13 may form a direct emission region 18 in the center of total reflection region 19 as the light emission source 122A as shown in FIG. 71, which can provide same effects as those of the light emission source 121 of FIG. 70.

Figure 72:
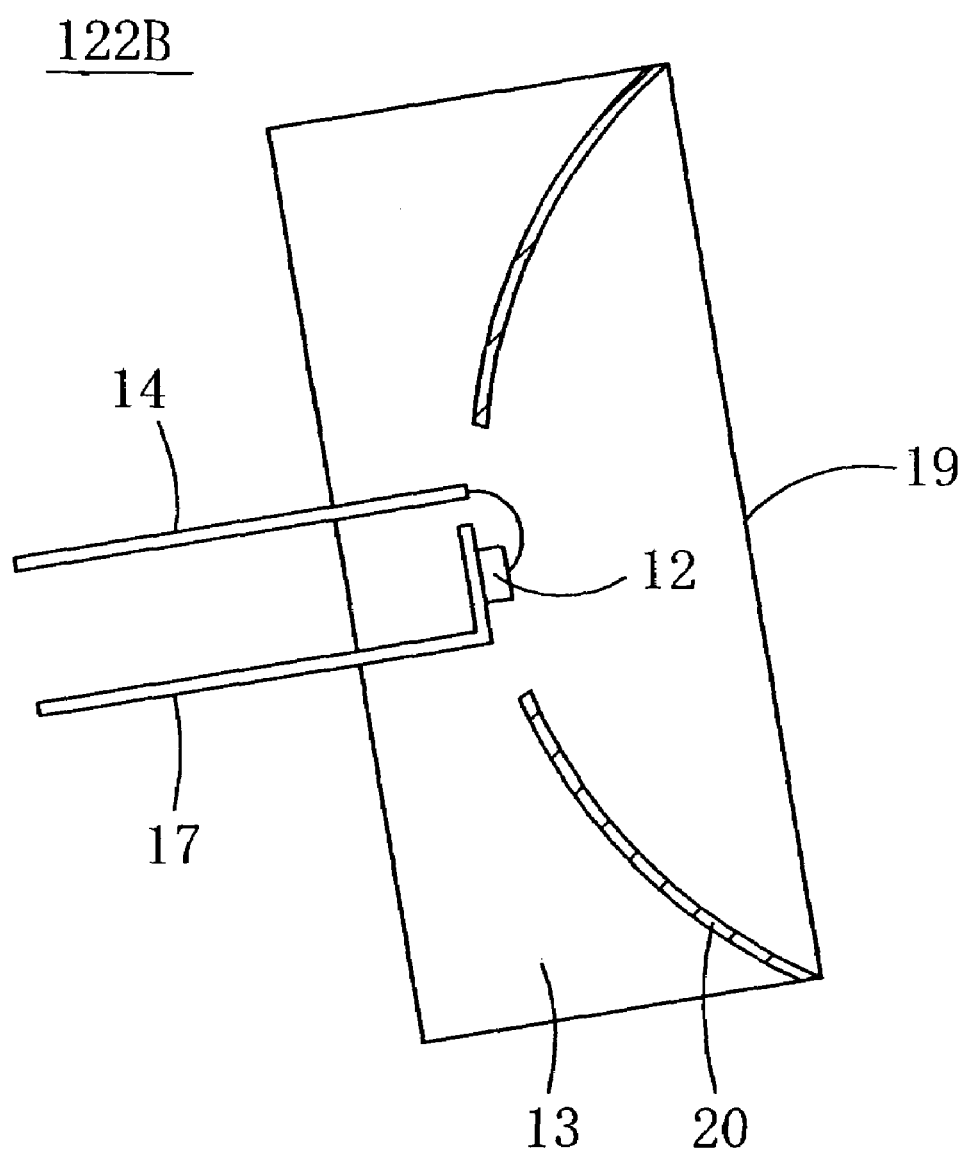
FIG. 72 is a sectional view of a light emission source according to a modification of the thirty-sixth embodiment of this invention.
Figure 73:
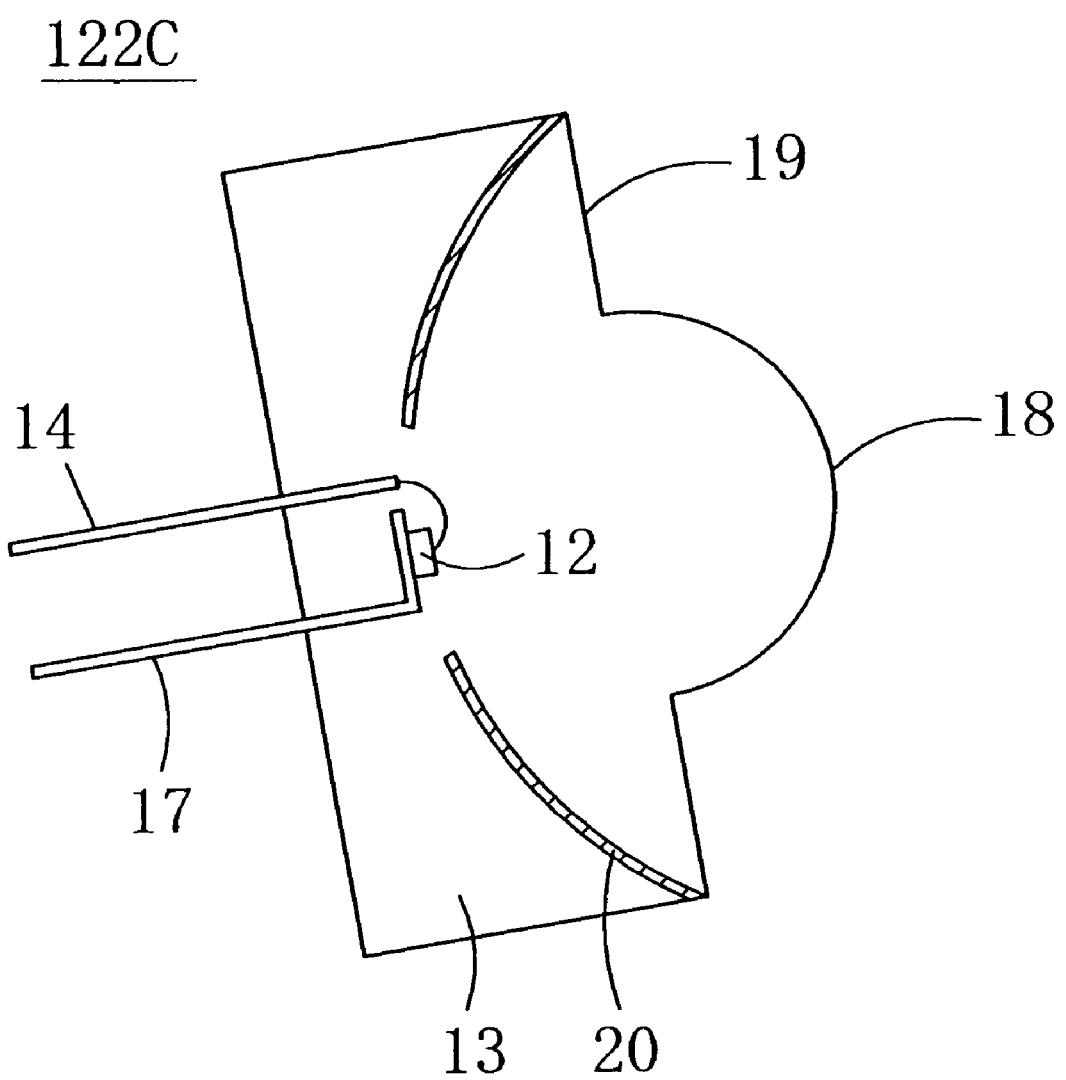
FIG. 73 is a sectional view of a light emission source according to another modification of the thirty-sixth embodiment of this invention.

A light emission source 122B shown in FIG. 72 is a modification of the light emission source 121 having a construction shown in FIG. 70, in which a light reflecting portion 20 having a symmetric configuration is disposed at a rearward of the total reflection region 19, and the light totally reflected by the total reflection region 19 is reflected by the light reflecting portion 20 to be emitted forward. A light emission source 122C shown in FIG. 73 is a modification of the light emission source 122B shown in FIG. 72 in which a direct emission region 18 is disposed in the center of the total reflection region 19 (or a modification of the light emission source 122A as shown in FIG. 71 in which a light reflecting portion 20 having a symmetric configuration is disposed).

THIRTY-SEVENTH PREFERRED EMBODIMENT

Figure 74:
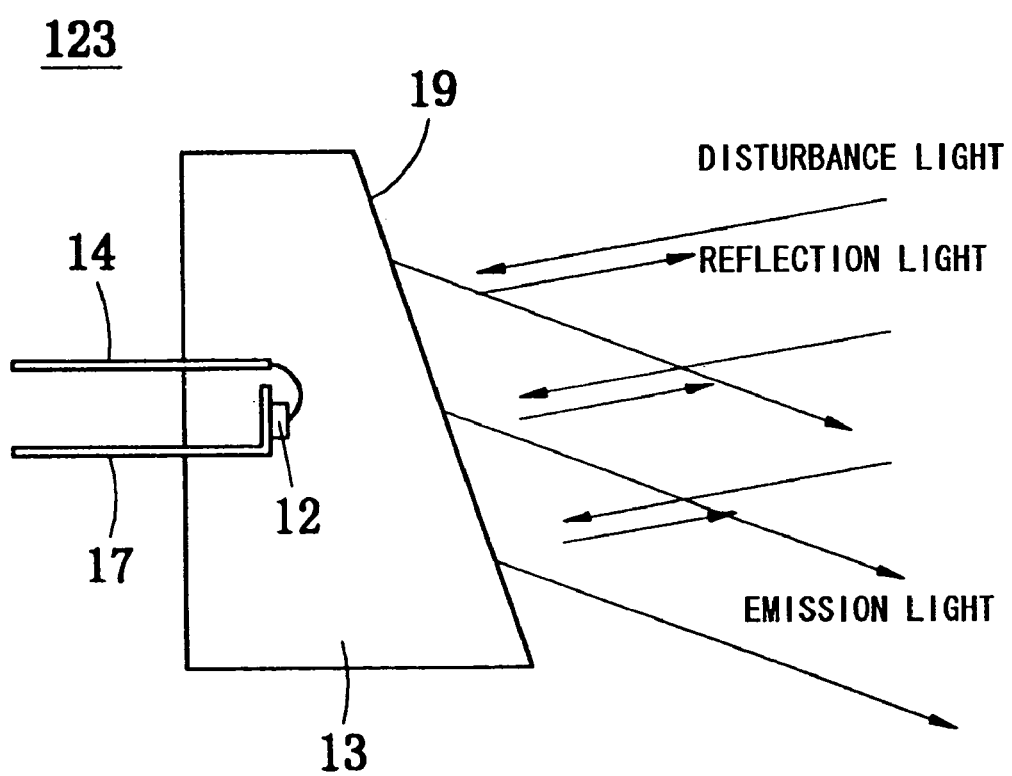
FIG. 74 is a sectional view of a light emission source according to a thirty-seventh preferred embodiment of this invention.

FIG. 74 is a sectional view of a configuration of a light emission source 123 according to a thirty-seventh preferred embodiment, in which a mold resin 13 seals a lead frame 17 at its top end die-bonded by a light emitter 12 and a lead frame 14 wire-bonded with the light emitter 12 and a total reflection region 19 on a front wall of the mold resin 13 is diagonally inclined against an optical axis of the light emitter 12. This light emission source 123 is generally horizontally installed so that the total reflection region 19 (inclined plane) of the mold resin 13 is set diagonally upward. A part of light emitted from the light emitter 12 is refracted downward because the total reflection region 19 is inclined. If desired, the optical axis of light emitter 12 may be inclined downward in order to emit more a lot of light to a diagonal lower part.

In this light emission source 123, even if disturbance light from a low altitude, such as the afternoon sun or the morning sun, strikes against the light emission source 123, the light reflected back with the total reflection region 19 of the light emission source 121 is reflected back to the original direction (upward and diagonal) without arriving the ground, and it can be avoided that the light emission source 121 seems to be turned on when it is turned off.

Figure 75:
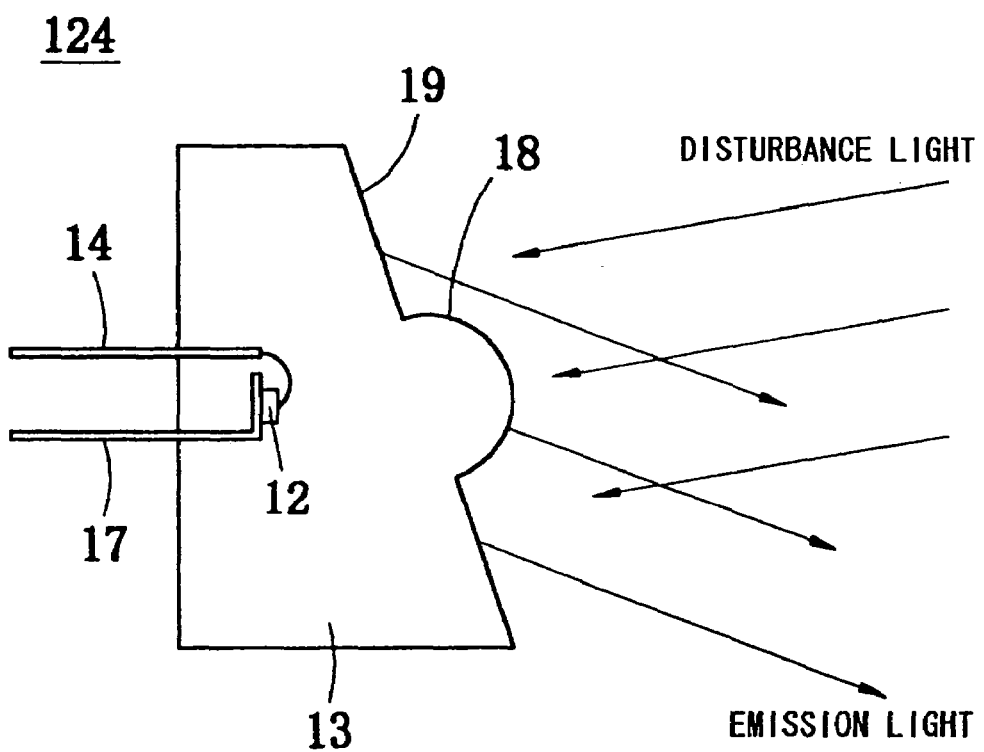
FIG. 75 is a sectional view of a light emission source according to a modification of the thirty-seventh preferred embodiment of this invention.

In addition, like the light emission source 124 as shown in FIG. 75, a direct emission region 18 may be disposed in the center of the total reflection region 19 of the mold resin 13. This case can provide same effects as those of the light emission source 123 of FIG. 74.

THIRTY-EIGHTH PREFERRED EMBODIMENT

Figure 76:
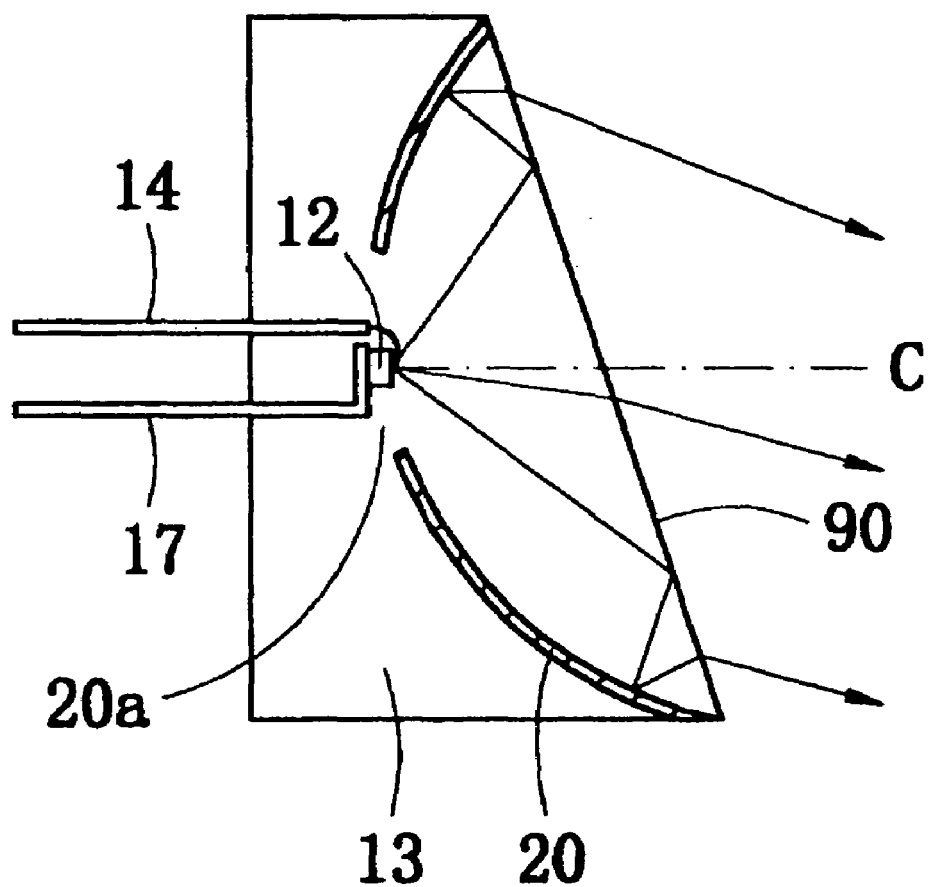
FIG. 76 is a sectional view of a light emission source according to a thirty-eighth preferred embodiment of this invention.

FIG. 76 is a sectional view of a configuration of a light emission source 125 according to a thirty-eighth preferred embodiment, in which a mold resin 13 seals a lead frame 17 at its top end die-bonded by a light emitter 12, a lead frame 14 wire-bonded with the light emitter 12, and a light reflecting portion 20, and in which a total reflection region 19 on a front wall of the mold resin 13 is diagonally inclined. An outer circumferential edge of light reflecting portion 20 is cut diagonally, and the configuration of light reflecting portion 20 is asymmetric above and below. This embodiment includes the light emission source 91 according to the thirty-third embodiment, wherein the direct emission region 18 is deleted.

This light emission source 125 is generally horizontally installed so that the total reflection region 19 (inclined plane) of the mold resin 13 is set diagonally upward. The light emitted from the light emitter 12 and totally reflected by the total reflection region 19 is reflected by the light reflecting portion 20, and refracted with the total reflection region 19 to be emitted downward. A part of light emitted forward from the light emitter 12 is refracted downward with the total reflection region 19. The optical axis of the light emitter 12 may be tilted downward if desired.

In this light emission source 125, even if disturbance light from a low altitude, such as the afternoon sun or the morning sun, strikes against the light emission source 125, the light reflected back with the total reflection region 19 of light emission source 125 is reflected back to its original direction (diagonally upward) without reaching the ground, so that the light emission source 125 can be avoided from seeming to be turned-on when it is turned-off.

In this light emission source 125, the light emitted from the light emitter 12 to a peripheral direction is totally reflected by the total reflection region 19, and further reflected by the light reflecting portion 20 to be emitted downward from the total reflection region 19, thereby improving the use efficiency of light.

THIRTY-NINTH PREFERRED EMBODIMENT

Figure 81:
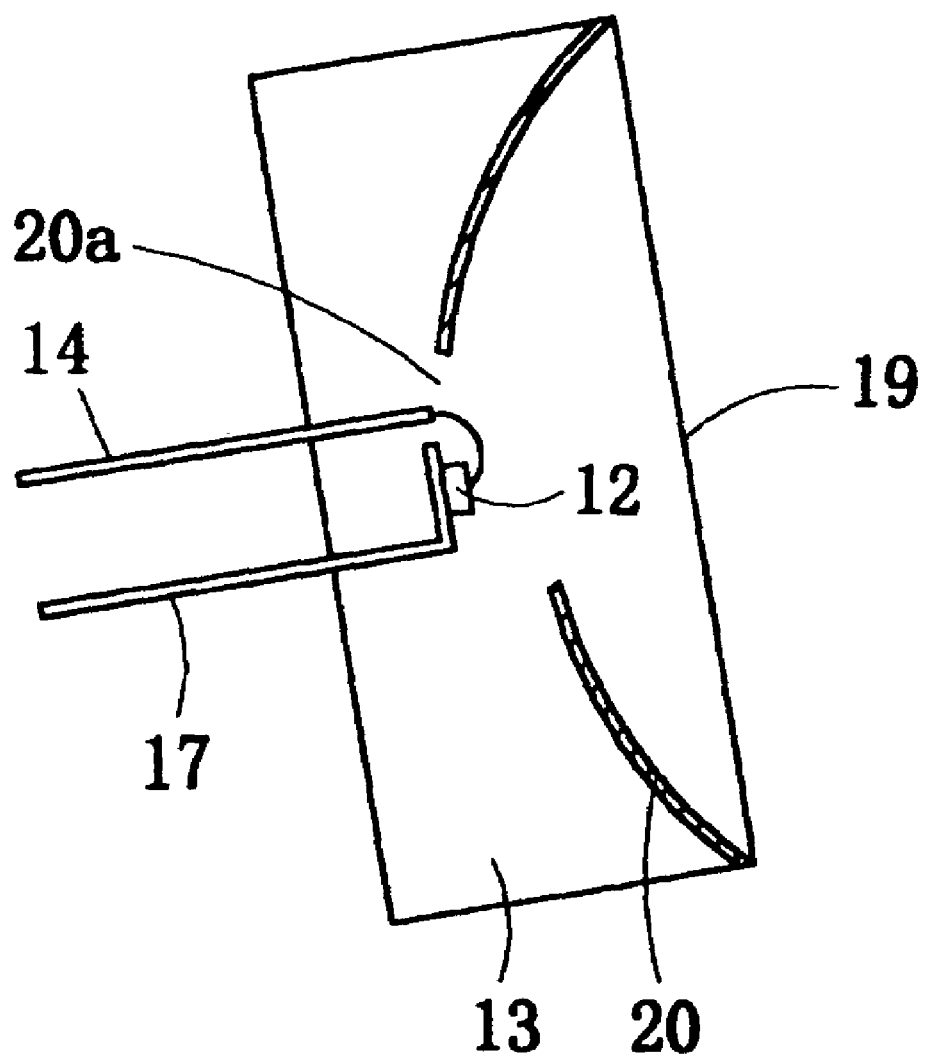
FIG. 81 is a sectional view of a light emission source according to a thirty-ninth preferred embodiment of this invention.

FIG. 81 is a sectional view of a configuration of a light emission source 126 according to a thirty-ninth preferred embodiment. In this embodiment, a total reflection region 19 on a front wall of a mold resin 13 is perpendicular to an optical axis of a light emitter 12, so that the light emission source 126 itself is diagonally set not to reflect disturbance light coming from a low altitude such as the afternoon sun or the morning sun to the lower part. On the other hand, a light reflecting portion 20 in the mold resin 13 has a face which is expressed by a symmetry or different aspheric surface expressions in an upper half and a lower half, whereby the light totally reflected by the total reflection region 19 and reflected back with the light reflecting portion 20 is emitted downward from the total reflection region 19.

When thus constructed light emission source 126 is turned off and struck by disturbance light such as the afternoon sun or the morning sun, it can be avoided that the disturbance light is reflected downward by the total reflection region 19 and the light reflecting portion 20 as if the light emission source 126 is turned on.

Figure 82:
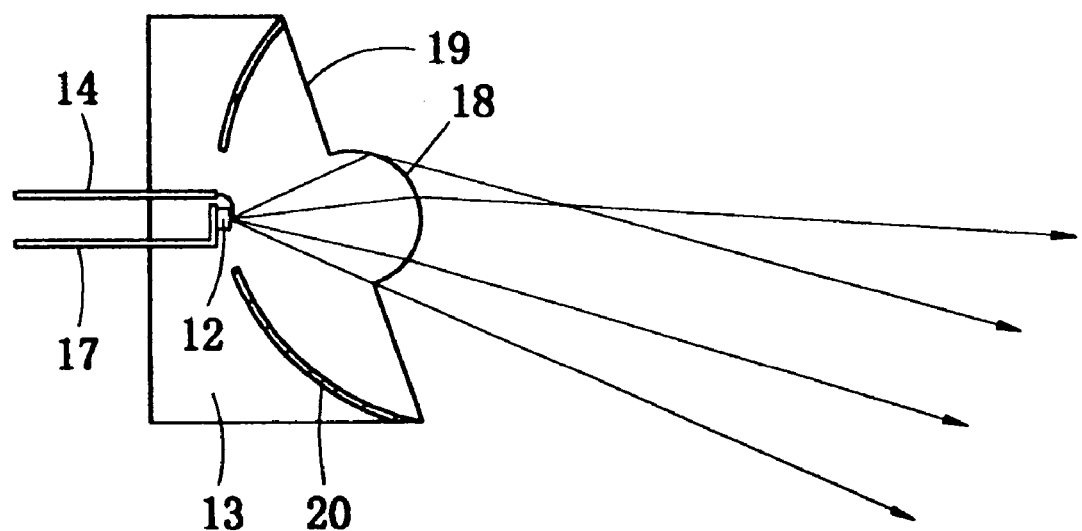
FIG. 82 is a sectional view of a light emission source according to a modification of the thirty-ninth embodiment of this invention.

In a light emission source 127 of an embodiment shown in FIG. 82, a direct emission region 18 has a profile that is a symmetry in an upper half and a lower half, whereby the light emitted from the direct emission region 18 is emitted downward from the direct emission region 18.

FORTIETH PREFERRED EMBODIMENT

Figure 83:
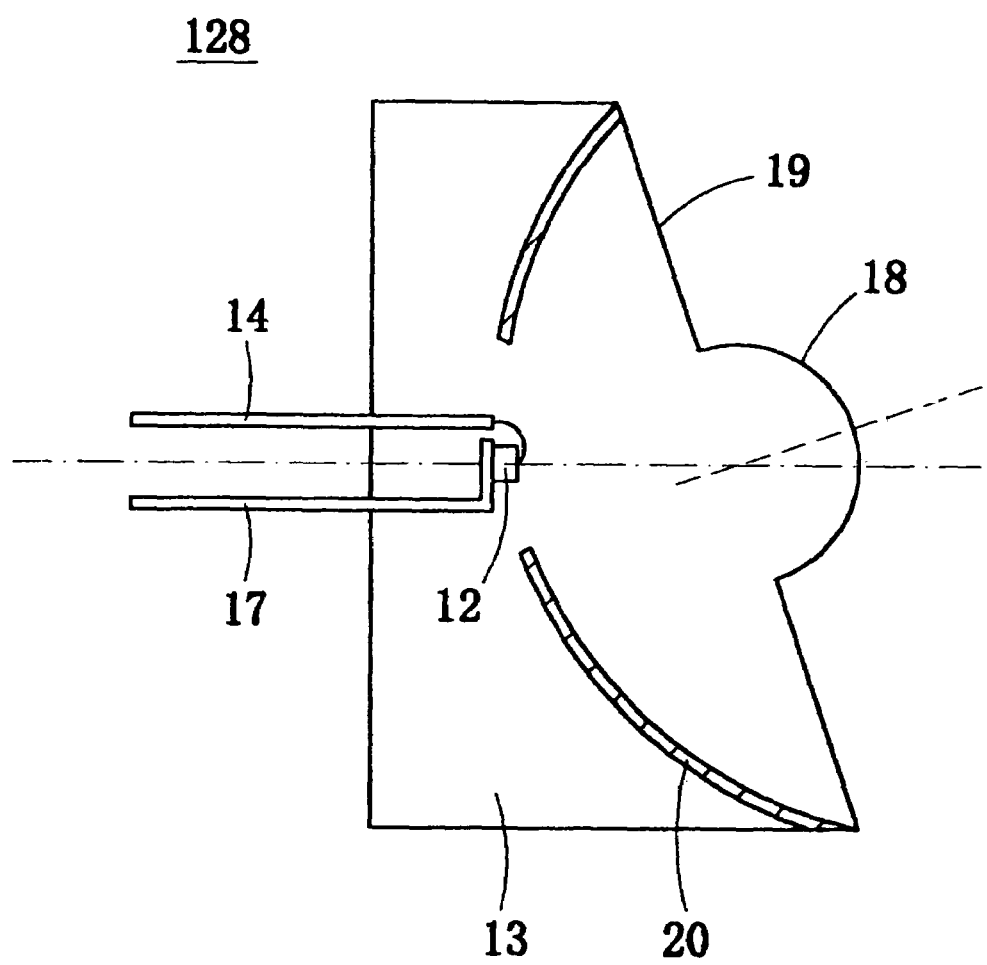
FIG. 83 is a sectional view of a light emission source according to a fortieth preferred embodiment of this invention.

FIG. 83 is a sectional view of a light emission source 128 according to a fortieth preferred embodiment, in which a center of a direct emission region 18 is located in the center of a total reflection region 19. When the center of direct emission region 18 is located in the center of total reflection region 19 like this light emission source 128, light can be emitted diagonally downward from the direct emission region 18 by moving the position of the light emitter 12 to be arranged in a proper position (higher position than the center of direct emission region 18).

FORTY-FIRST PREFERRED EMBODIMENT

Figure 84:
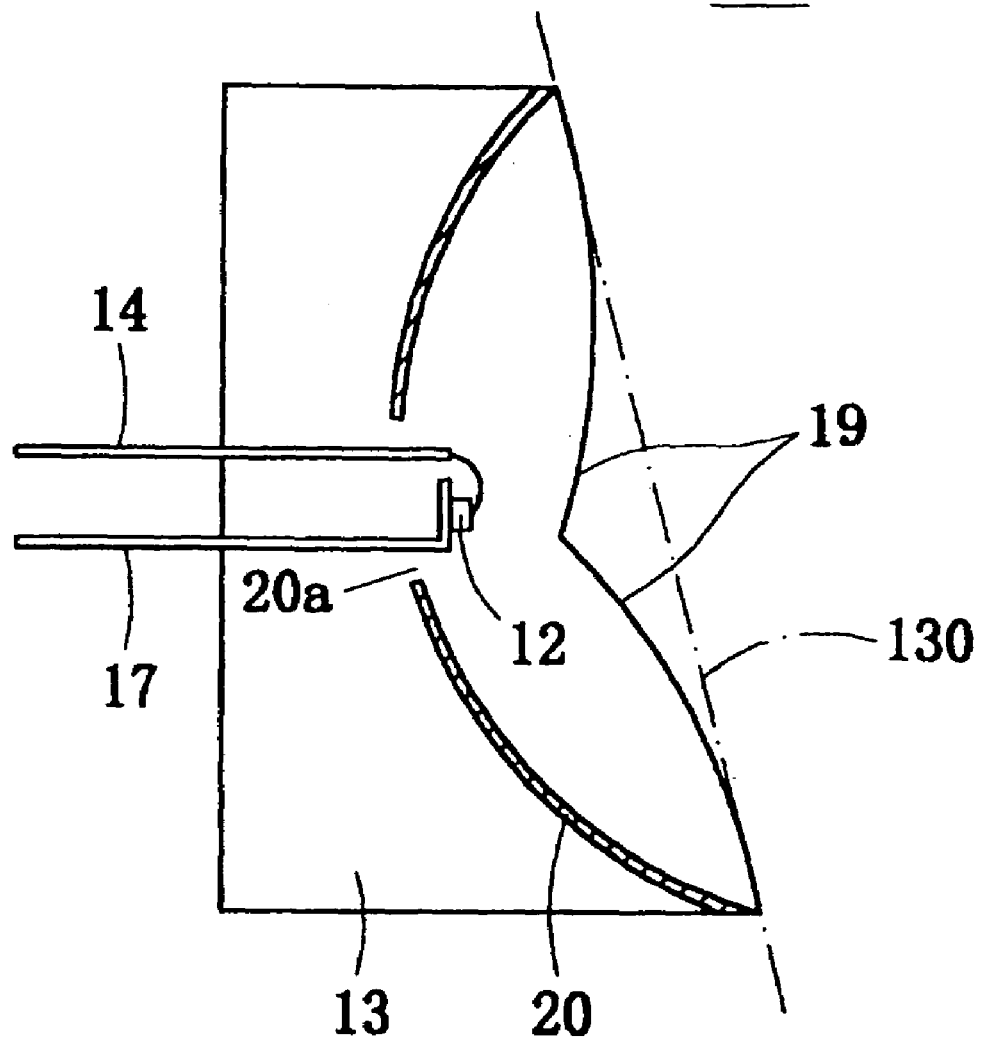
FIG. 84 is a sectional view of a light emission source according to a forty-first preferred embodiment of this invention.

FIG. 84 is a sectional view of a configuration of a light emission source 129 according to a forty-first preferred embodiment, in which a whole total reflection region 19 is formed with a curved surface. The total reflection region 19 is designed to totally reflect most of light emitted from a light emitter 12, in which most of light emitted from the light emitter 12 is totally reflected backward by the total reflection region 19 and further reflected by a light reflecting portion 20 to be emitted from the total reflection region 19. The configuration of the light reflecting portion 20 or the position of the light emitter 12 are designed so that the light emitted from the total reflection region 19 can be emitted downward. The total reflection region 19 is inclined toward an upward and diagonal direction, viz., a tangent plane 130 of the total reflection region 19 is slanted toward an upward and diagonal direction.

Therefore, in this light emission source 129, most of disturbance light such as the afternoon sun or the morning sun is reflected toward approximately original direction and hard to reach a lower portion. On the other hand, light emitted from the light emitter 12 is reflected several times to be emitted downward from the total reflection region 19. Accordingly, when the light emission source 129 is employed as a light emission source for a signal, it can be avoided that the light emission source 129 which is turned off is erroneously found as if it is turned on. When it is applied to a light emission display, a clear image can be watched without any slant installation.

In this embodiment, the area of the total reflection region of a front wall of the mold resin 13 is large in dimensions, and strong light near the optical axis of the light emitter 12 in the light emitted by the light emitter 12 with a Lambert distribution is reflected by the total reflection region 19 and the light reflecting portion 20 to be emitted from the light emission source 129, thereby providing a light emission source having high luminous efficiency.

Figure 85:
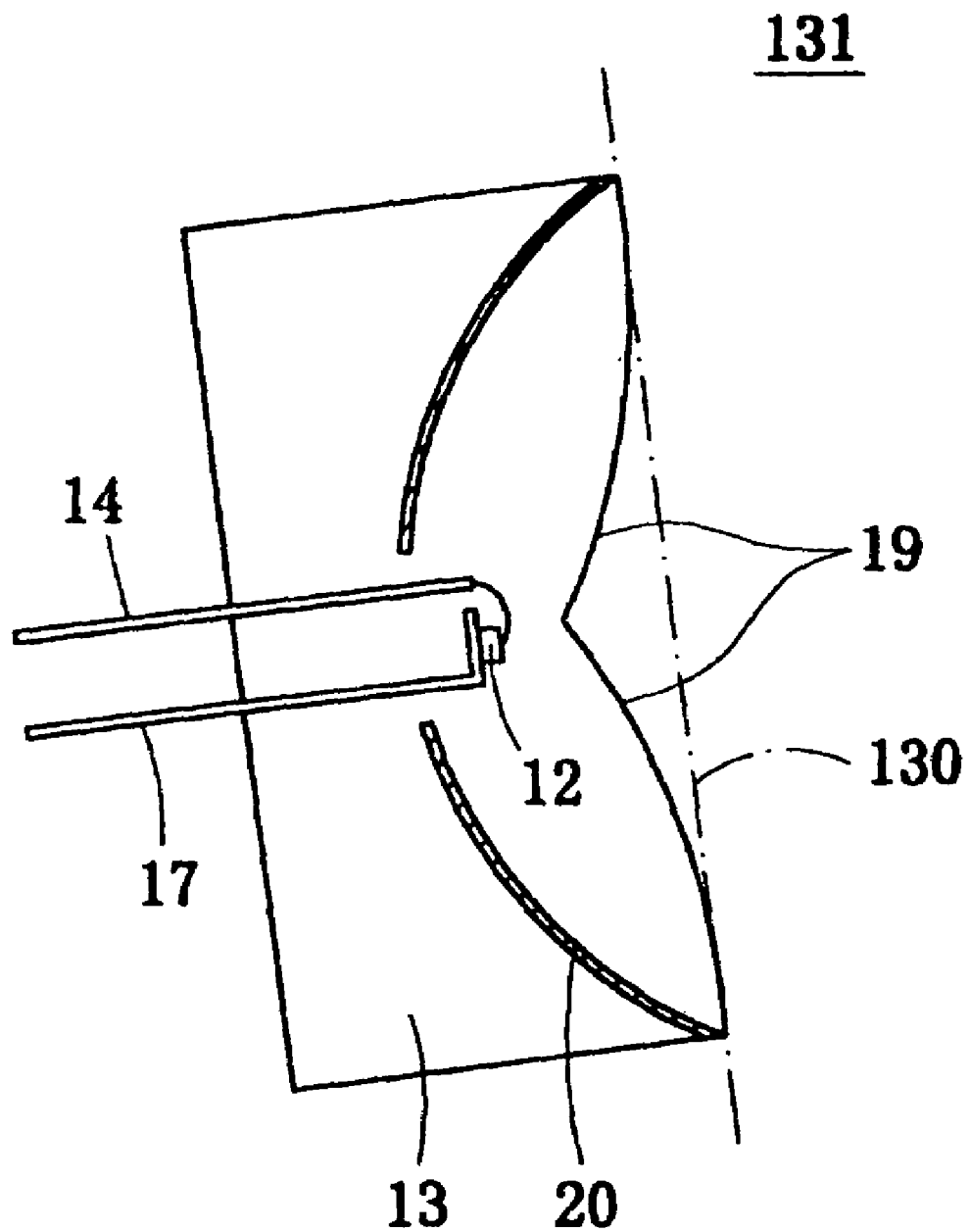
FIG. 85 is a sectional view of a light emission source according to a modification of the forty-first embodiment of this invention.

In FIG. 85, a light emission source 131 in whole is diagonally disposed toward a diagonally upward direction instead of inclining the total reflection region 19 (or tangent plane 130) toward the diagonally upward direction. Thus light emission source 131 can prevent disturbance light from being reflected downward, and emission light from the light emission source 131 can be emitted toward a diagonally downward direction.

FORTY-SECOND PREFERRED EMBODIMENT

Figure 86:
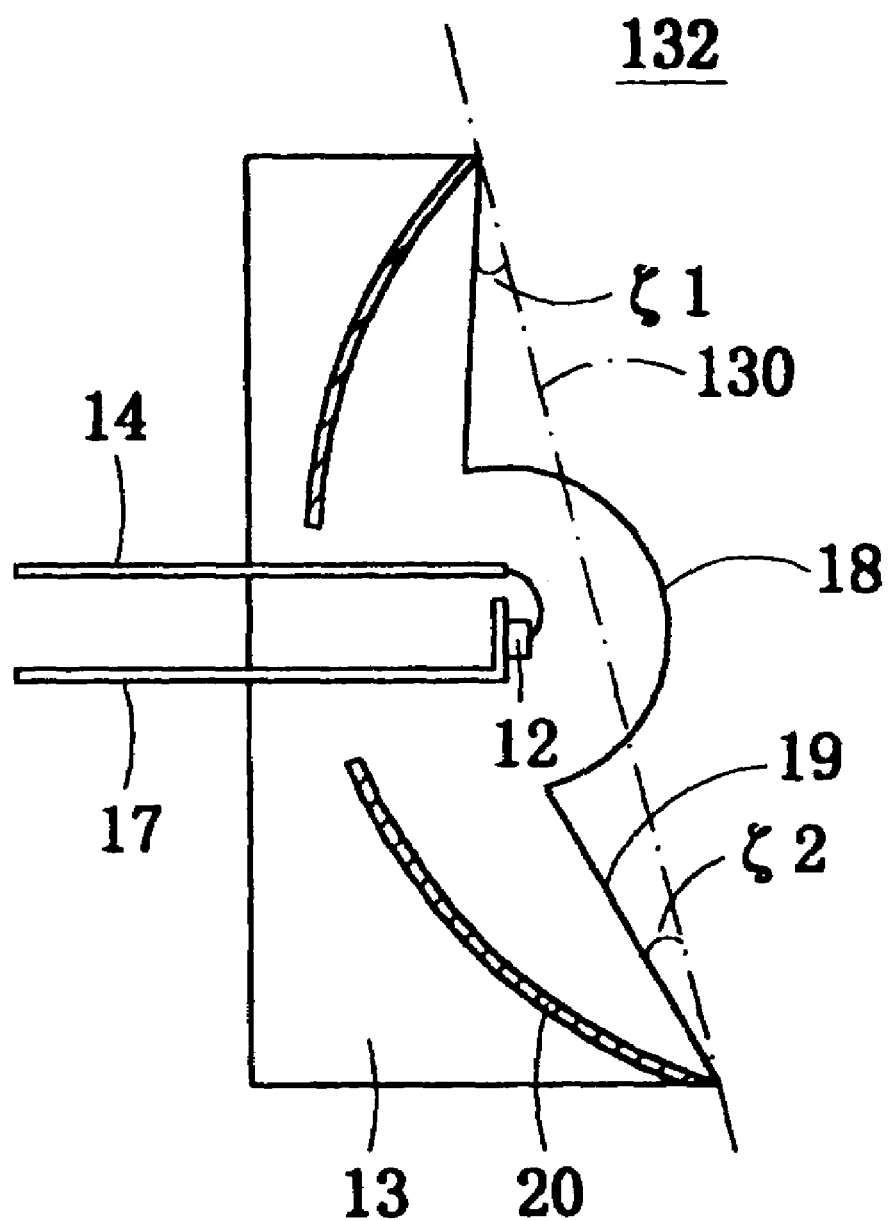
FIG. 86 is a sectional view of a light emission source according to a forty-second preferred embodiment of this invention.

FIG. 86 is sectional view of a light emission source 132 according to a forty-second preferred embodiment, in which a direct emission region 18 is disposed generally in the center of a front wall of a mold resin 13, and a total reflection region 19 in a coned-shape is formed around the region 18. A tangent plane 130 contacting an edge of the total reflection region 19 is inclined diagonally upward, and the angle of the total reflection region 19 from the tangent plane 130 becomes ζ1 in an upper section of the total reflection region 19 and ζ2 in a lower section thereof.

In the light emission source 132 according to this embodiment shown in FIG. 86, the total reflection region 19 is inclined diagonally upward so that disturbance light such as the afternoon sun or the morning sun entering from a low altitude is reflected toward its original direction without reaching the lower part (ground). Light is emitted diagonally downward from the light source 132 by the position of light emitter 12 and the configuration of light reflecting portion 20. Therefore, it can be avoided that the light emission source 132 turning off seems to illuminate by reflection of disturbance light.

Figure 87:
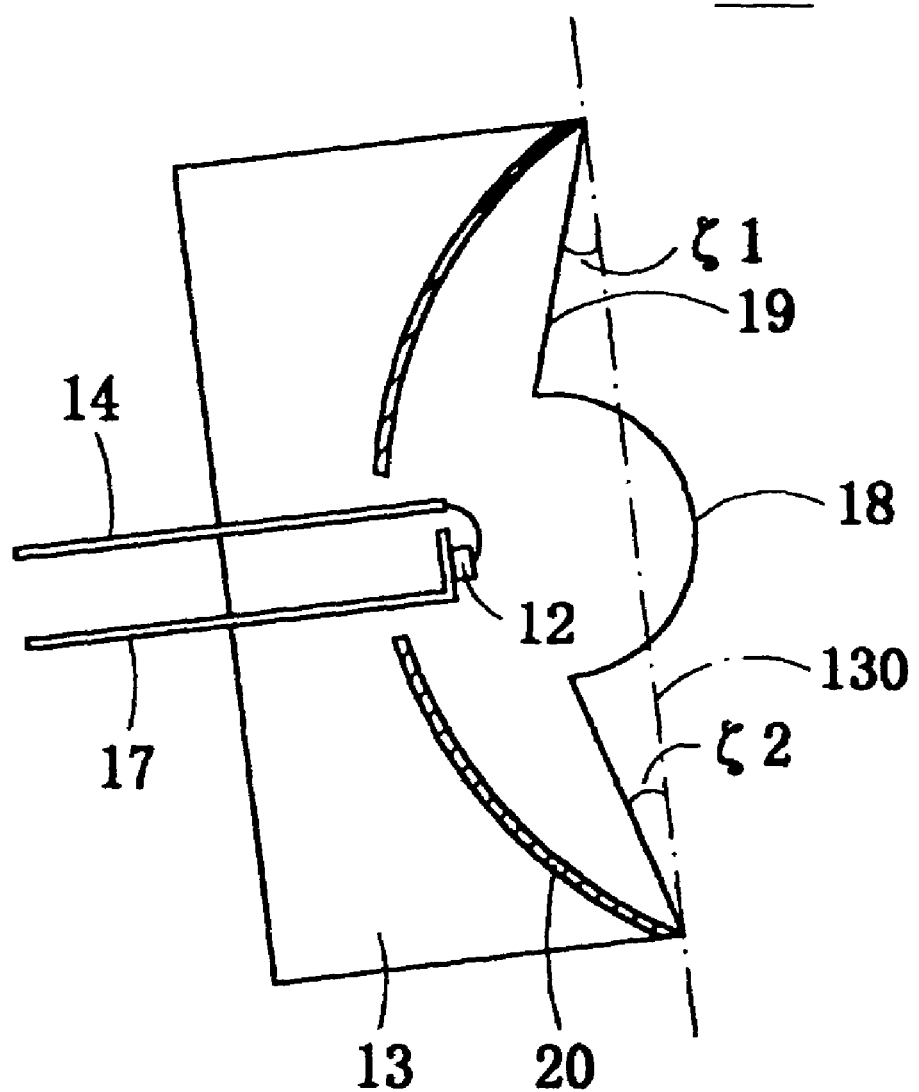
FIG. 87 is a sectional view of a light emission source according to a modification of the forty-second embodiment of this invention.

Instead of inclining the total reflection region 19 (or tangent plane 130) diagonally upward, a light emission source 133 in whole is disposed diagonally upward as shown in FIG. 87, in which disturbance light is prevented from downward reflection and the emission light from the light source 133 is diagonally downward.

FORTY-THIRD PREFERRED EMBODIMENT

Figure 88:
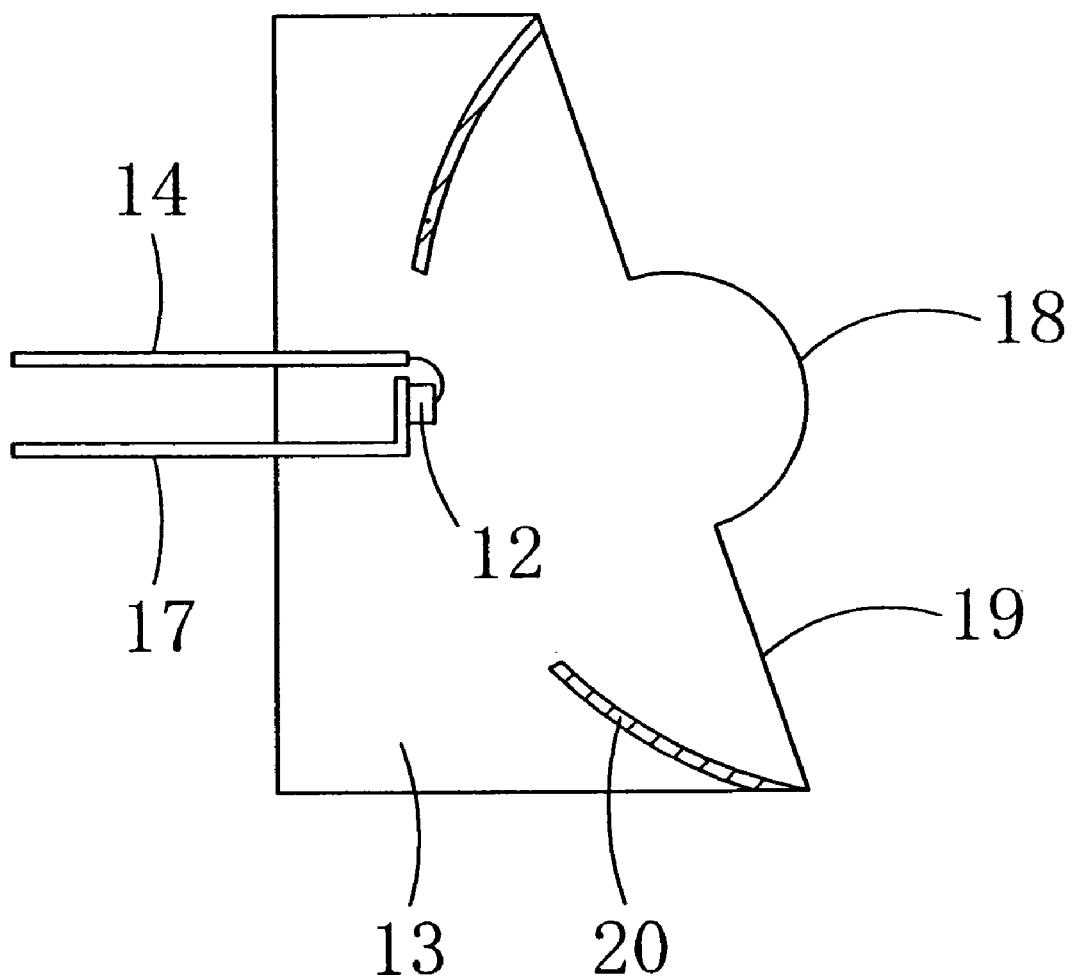
FIG. 88 is a sectional view of a light emission source according to a forty-third preferred embodiment of this invention.

FIG. 88 is a sectional view of a configuration of a light emission source 134 according to a forty-third preferred embodiment, in which a total reflection region 19 is disposed on a plane tilting from a plane perpendicular to an optical axis direction of a light emitter 12, a direct emission region 18 is disposed approximately in the center of the region 19, and a light reflecting portion 20 having a symmetrical shape is disposed rearward. The light emitter 12 is located in a position shifting from the center of light reflecting portion 20 and direct emission region 18, thereby emitting light diagonally downward.

FORTY-FOURTH PREFERRED EMBODIMENT

Figure 89:
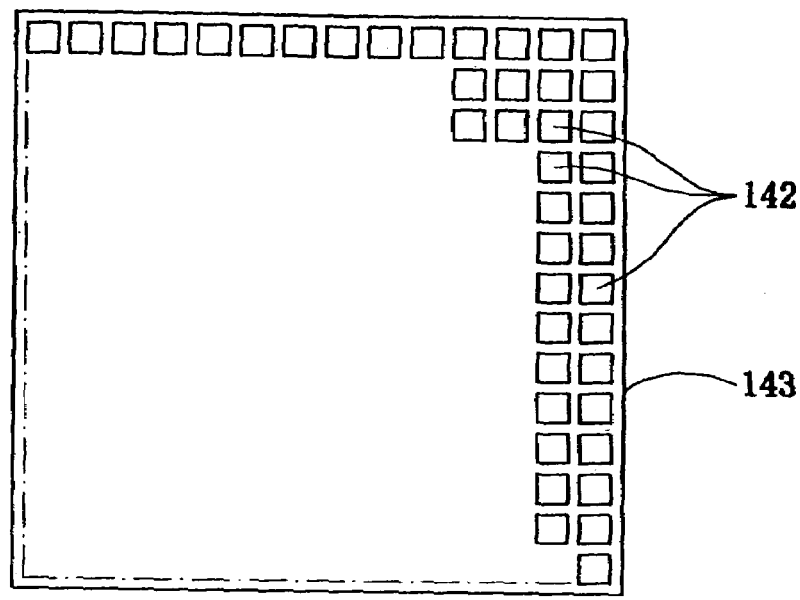
FIG. 89 at (a) and (b) shows front and side views of an outdoor display apparatus according to a forty-fourth preferred embodiment of this invention.
Figure 89:
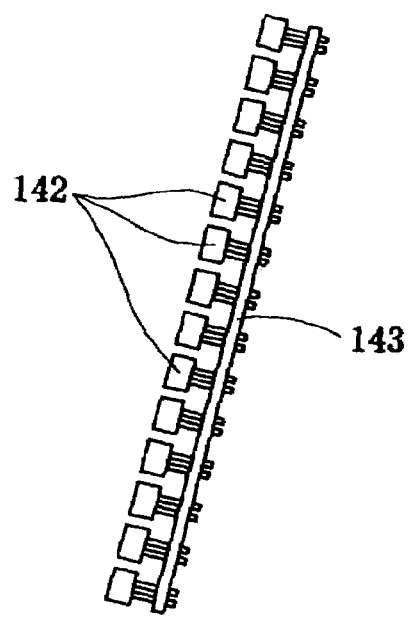

FIG. 89 at (a) and (b) shows front and side views of an outdoor type display 141 according to a forty-fourth preferred embodiment, in which light emission sources 142 having a quadrangle external configuration viewed from its front according to this invention are arranged on a substrate 143 in a matrix fashion. According to this outdoor type display apparatus 141, the light emission sources 142 can be arranged without clearance, so that the display can have a light emission face without any clearance which is uniform on lighting and seen neatly.

Figure 90:
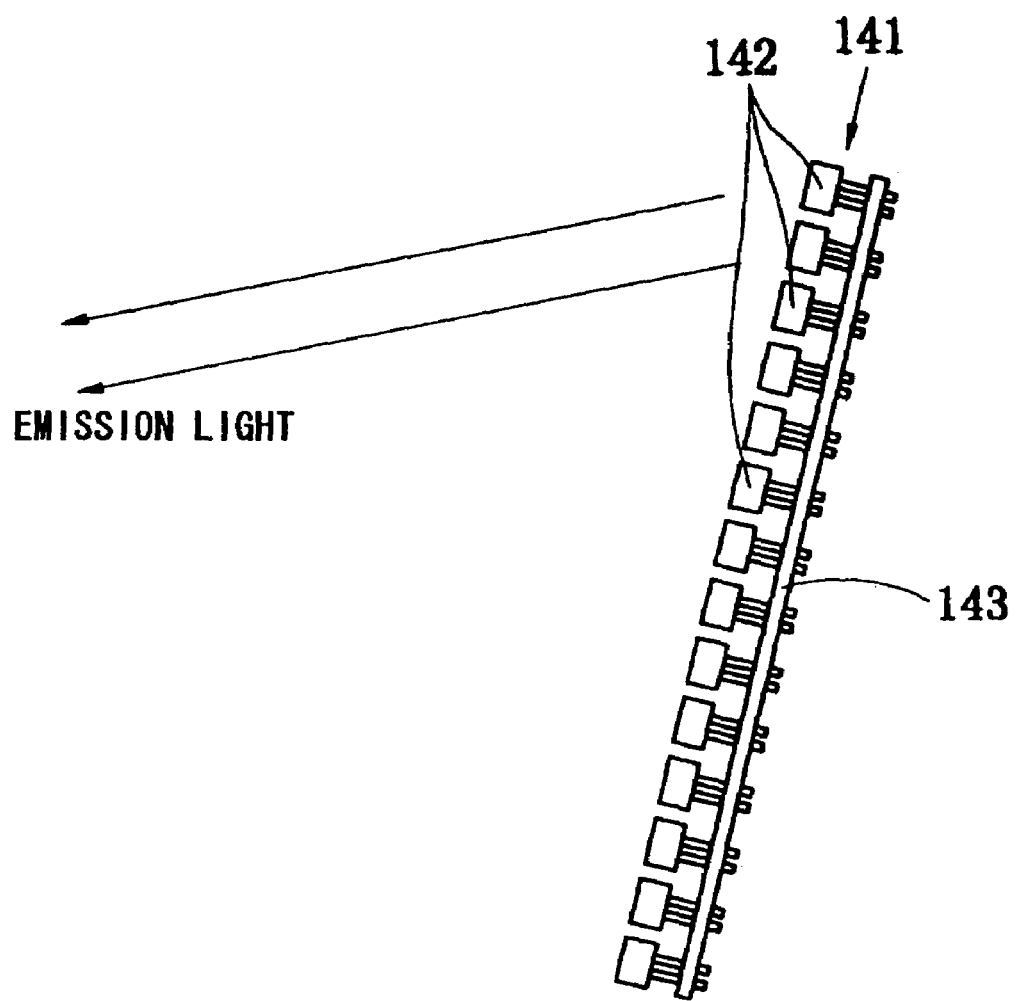
FIG. 90 is a side view of the outdoor display apparatus of FIG. 89 on use.

The outdoor type display apparatus 141 is installed in a high location to face a little diagonally upward direction as shown in FIG. 90, because each front face of the light emission sources 142 is in parallel with the substrate 143. Even if the outdoor type display apparatus 141 is installed diagonally upward, each light emission source 142 emits light diagonally downward, and the display can be watched clearly from a lower position.

FORTY-FIFTH PREFERRED EMBODIMENT

Figure 91:
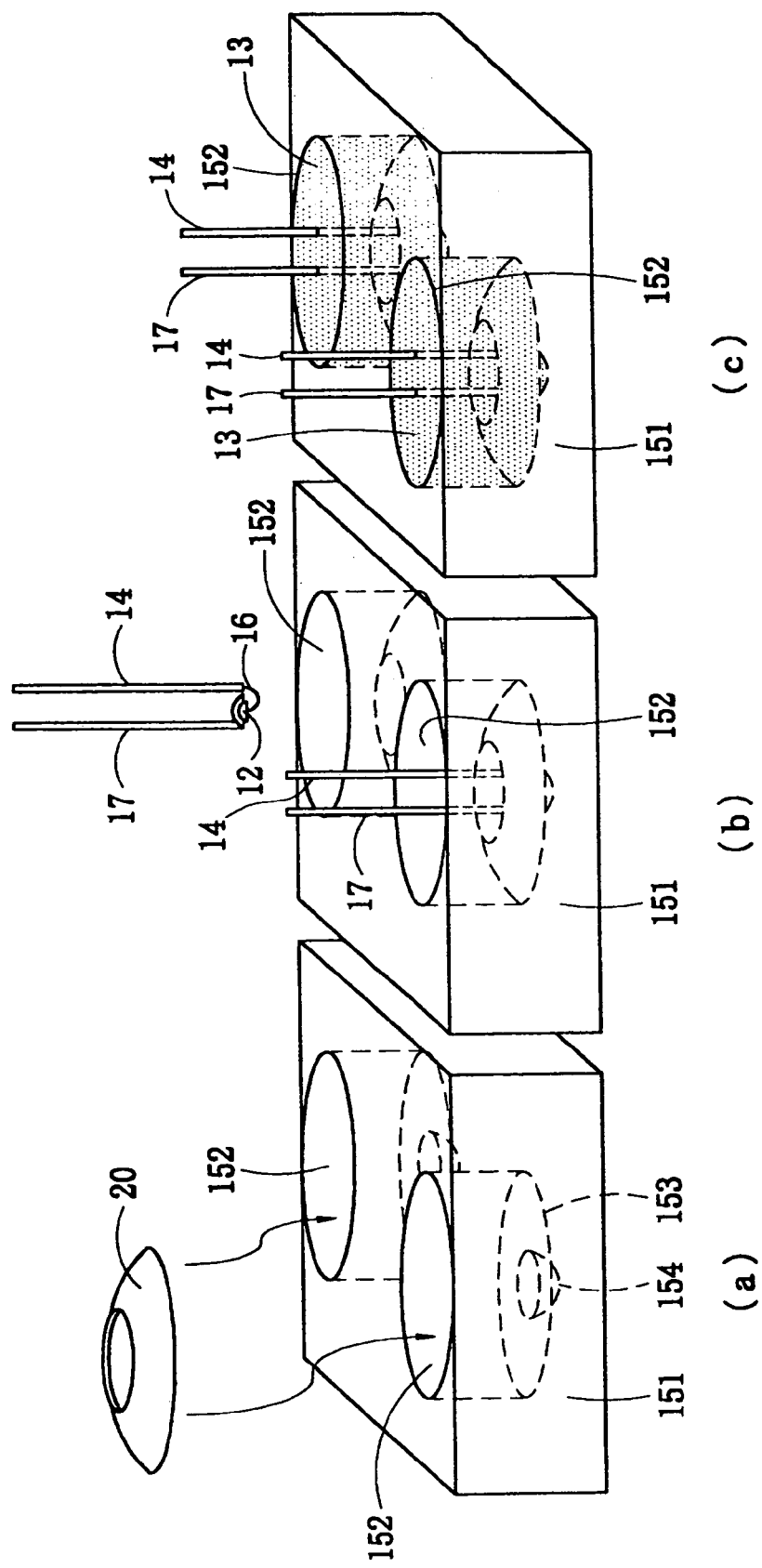
FIG. 91 shows a manufacturing process for a light emission source according to a forty-fifth preferred embodiment of this invention.

FIG. 91 at (a) to (c) shows one example of a manufacturing process for a light emission source according to forty-fifth preferred embodiment. Though a light emission source is described in this embodiment, a light receiver can be applied to this embodiment. In FIG. 91, there is shown a mold 151 for manufacturing a light emission source, which is provided with a cavity 152 for molding a mold resin 13. The cavity 152 at a bottom wall thereof is provided with a pattern face 153 for forming a total reflection region 19 and a pattern face 154 for forming a direct emission region 18.

When a light emission source is manufactured, as shown in FIG. 91, light reflecting portion 20 is inserted within the cavity 152. Since the external diameter of the light reflecting portion 20 is almost equal to the inside diameter of the cavity 152, the light reflecting portion 20 can be positioned within the cavity 152 by putting the light reflecting portion 20 on the bottom wall of cavity 152.

In FIG. 91 at (b), there is shown a component including a light emitter 12 die bonded on a stem 15 of a lead frame 17, and a lead frame 14 connected with the light emitter 12 by a bonding wire 16, which is produced in other process beforehand. As shown in FIG. 91 at (b), the component is put within the cavity 152 with positioning the light emitter 12 downward, and upper ends of the lead frames 14 and 17 are supported to fix the light emitter 12 at a predetermined position within the cavity 152.

With this condition, a mold resin 13 is injected within the cavity 152 to be inserted by the light emitter 12 and the light reflecting portion 20 to mold a direct emission region 18 and a total reflection region 19 as shown in FIG. 91 at (c). As the injected mold resin 13 is cooled and stiffened, it is taken out from the cavity 152 to produce the light emission device.

According to this manufacturing process, light reflecting portion 20 can be easily positioned, and mass production for the light emission sources or the light receivers can be performed.

Next, several applications of a light emission source according to this invention, such as a light emission source according to the embodiments shown in FIGS. 3 to 21, will be described hereinafter.

FORTY-SIXTH PREFERRED EMBODIMENT

Figure 92:
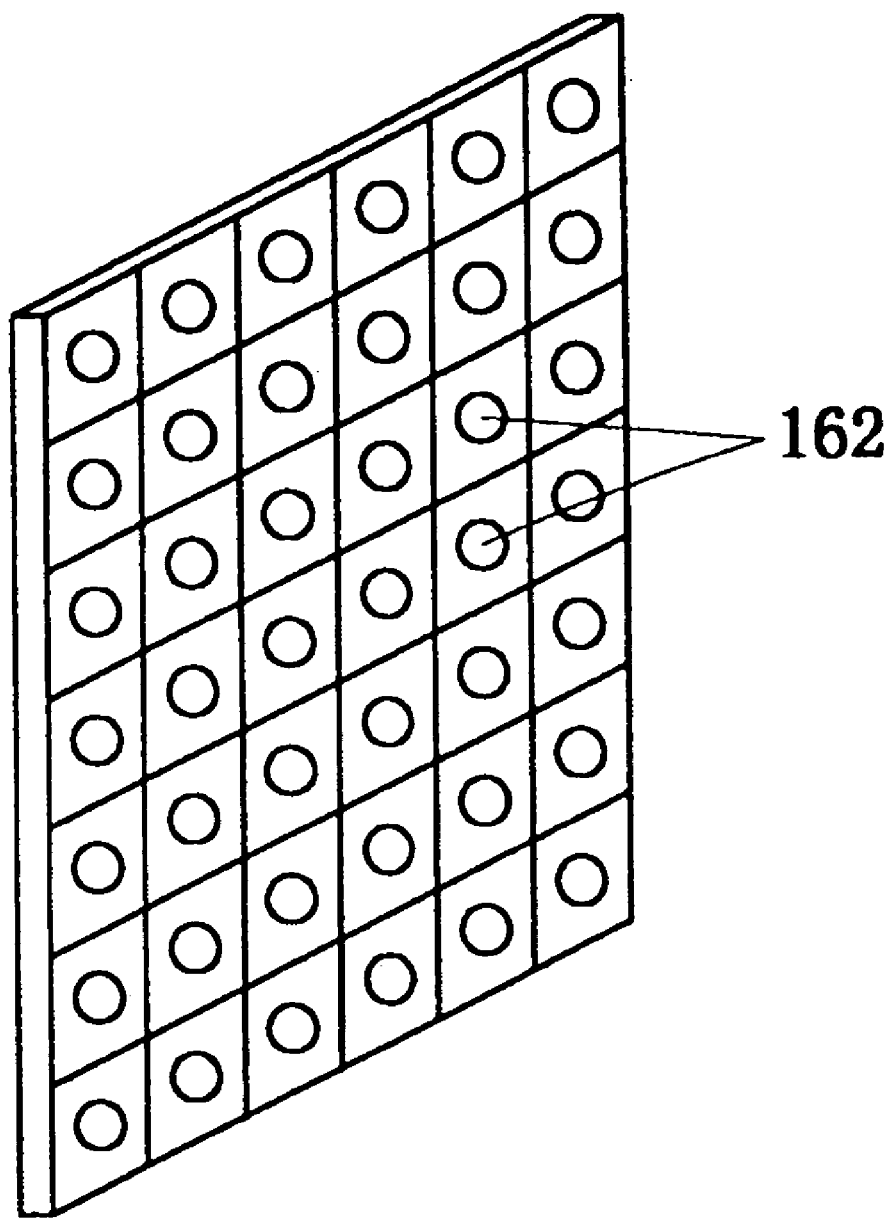
FIG. 92 is a perspective view of a light emission display according to forty-sixth preferred embodiment of this invention.
Figure 93:
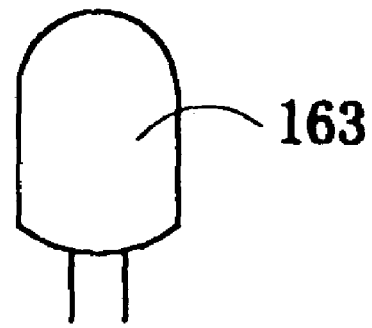
FIG. 93 shows at (a) a perspective view of a conventional light emission source employed in a light emission display, and at (b) an arrangement of the light emission source.
Figure 93:
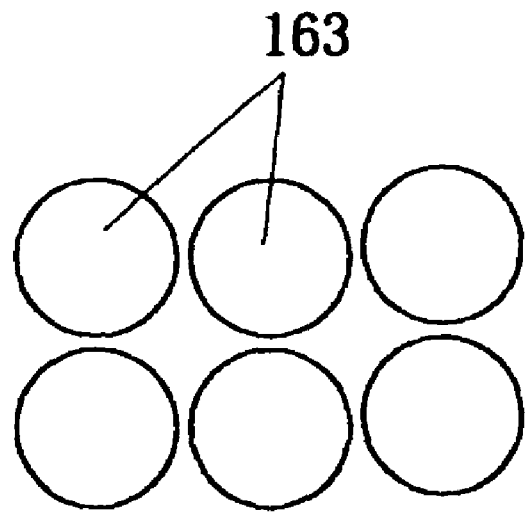

FIG. 92 shows a light emission display unit 161 arranged by light emission sources 162 depending on this invention as a forty-sixth preferred embodiment. When light emission sources 163 of a cannonball type as shown in FIG. 93 at (a) are employed to provide such a display 161, the beam profile is bright around its center but dark near its periphery (see FIG. 4 at (b)), so that its visual performance is not uniform. When cannonball-shaped light emission sources 163 as shown in FIG. 93 at (b) are arranged, there appears clearance between the light emission sources 163 to produce darkness, thereby decreasing its visual performance.

Figure 94:
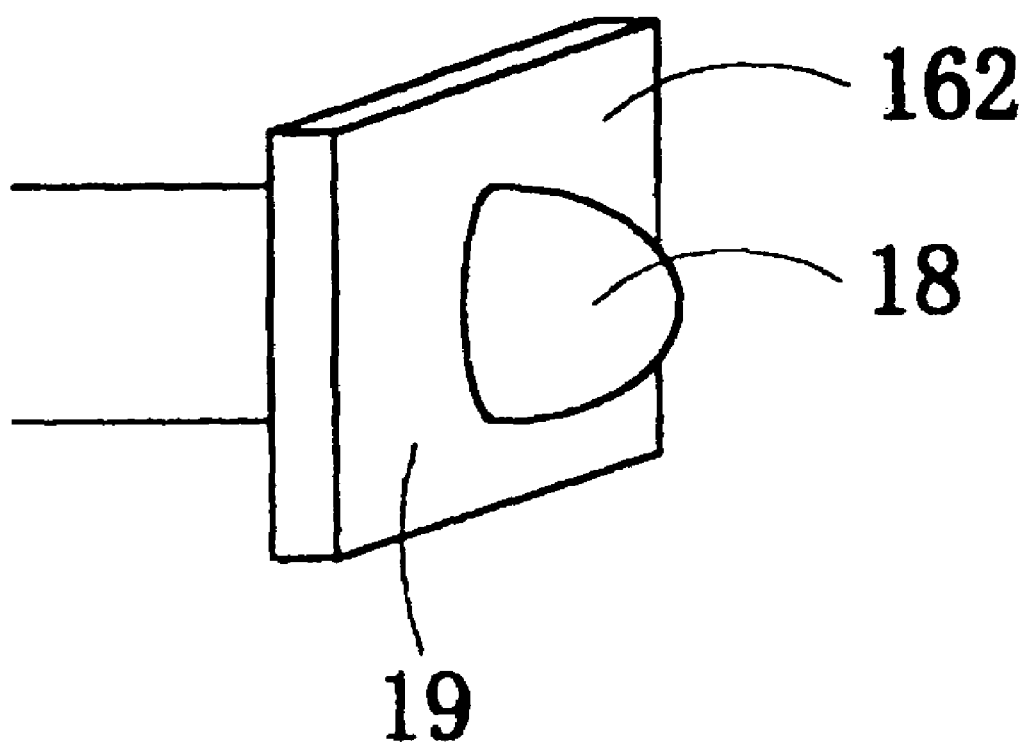
FIG. 94 is a perspective view of an external configuration of a light emission source employed in the light emission display of FIG. 92.

The light emission source 162 according to this invention, however, can have a rectangular configuration as shown in FIG. 94, whereby plural light emission sources 162 can be arranged without clearance as shown in FIG. 92 and darkness is avoided to appear between the sources 126, and its visual performance is improved. In addition, in the light emission source 162 according to this invention, uniform beam profile as shown in FIG. 4 at (a) can be provided by synthesizing light from direct emission region 18 in a lens shape and light from light reflecting portion 20. When pictorial image and letter is pictured as confluence of light emission sources 162, light emission points are easy to be connected each other and pictorial image and letter with smooth figuration can be displayed.

Figure 95:
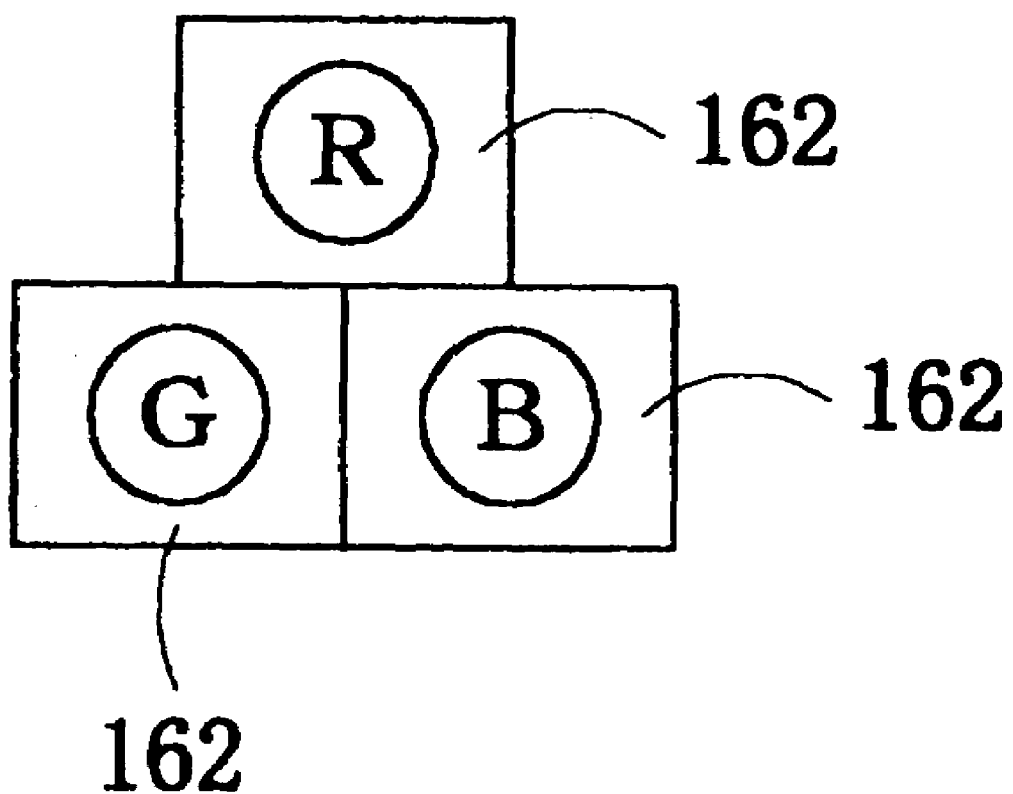
FIG. 95 shows one picture element of a full color light emission display in which a red light emission source, a green light emission source, a blue light emission source are arranged in a delta fashion.

As another application, there may be provided a full color light emission display arranged by light emission sources 162 respectively employing light emitters of red (R), green (G), and blue (B) as shown in FIG. 95.

When a multicolor light emission display (not shown in drawings) is arranged by light emission sources 36 emitting two or more emission colors as shown in FIG. 21, a display having little color isolation can be provided.

FORTY-SEVENTH PREFERRED EMBODIMENT

Figure 96:
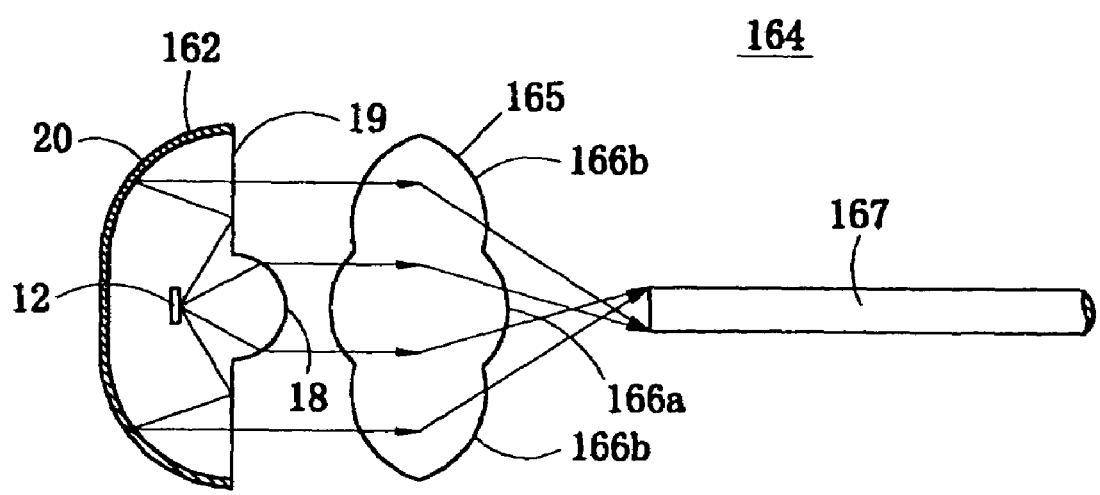
FIG. 96 is a schematic diagram showing an optical fiber coupler according to a forty-seventh preferred embodiment of this invention.

FIG. 96 shows an optical fiber coupler 164 employing a light emission source 162 according to this invention as a forty-seventh preferred embodiment. In this optical fiber coupler 164, an optical lens 165 is interposed between light emission source 162 and an end surface of an optical fiber 167, in which light emitted from the light emission source 162 is focused by the optical lens 165 to the end surface of the optical fiber 167 to be coupled with the optical fiber 167. The optical lens 165 has different optical lens constants at the points corresponding to direct emission region 18 and total reflecting region 19 in the light emission source 162, and a complex configuration with two kinds of convex lenses 166a and 166b. The light emitted from direct emission region 18 of the light emission source 162 is coupled with the end surface of the optical fiber 167 in a central part of the optical lens 165, and the light emitted from the total reflection region 19 is coupled with the end surface of optical fiber 167 by a circumscription part of the optical lens 165.

Thus, the light emitted from the direct emission region 18 in the central part and the light emitted from the total reflection region 19 in the circumscription part can be efficiently focused on the end surface of the optical fiber 167 by different lens parts, thereby improving the fiber association efficiency important in the system employing light emitting diodes.

FORTY-EIGHTH PREFERRED EMBODIMENT

Figure 97:
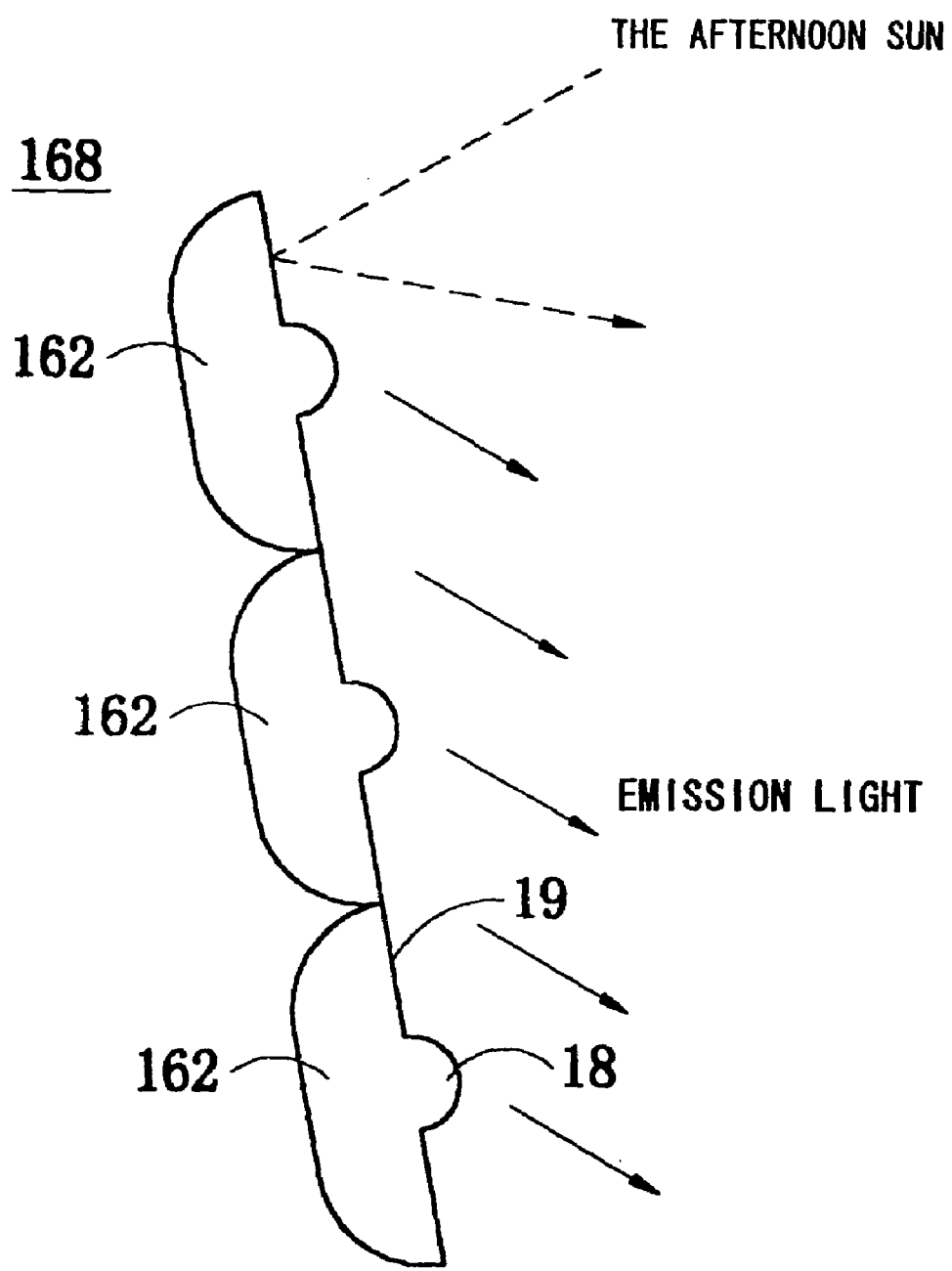
FIG. 97 is a schematic diagram showing a signal lamp according to a forty-eighth preferred embodiment of this invention.

FIG. 97 shows a side view of a signal lamp 168 employing light emission sources 162 according to this invention as a forty-eighth preferred embodiment, which is composed of a red signal lamp arranged by light emission source 162 of red light emission color, a green signal lamp arranged by light emission source 162 of green light emission color, and an yellow signal lamp arranged by light emission source 162 of yellow light emission color. The signal lamp 168 is installed diagonally upward not to direct the reflection light of the afternoon sun by the signal lamp 168 to any vehicles. Accordingly, hate for watching signal by the reflection light of the afternoon sun considered to be a problem in the signal is resolved.

The light emission source 162 employs such a light source 34 or 35 diagonally emitting light as shown in FIG. 19 or 20, and emits light toward a roadside diagonally downward. Thus, deterioration of the visual performance by the afternoon sun is prevented, and the signal lamp 168 is easy to be watched from a road. Luminous radiation to an upper direction is uselessness according to the technical standard of signal, so that the emitted light is focused downward, thereby improving the efficiency of light use and realizing a high bright signal lamp.

A conventionally used light emission source having a cannonball configuration is limited to a certain degree to provide an asymmetrical beam profile due to design relying on only a lens configuration. Accordingly, when a signal lamp employing the conventional light emission source is installed upward, it is hard to be watched from ground due to prevention against light reflection of the afternoon sun. According to this invention, however, the mirror configuration is designed to be asymmetrical, and position of a light emitter is shifted from its optical axis, thereby easily resolving it.

FORTY-NINTH PREFERRED EMBODIMENT

Figure 98:
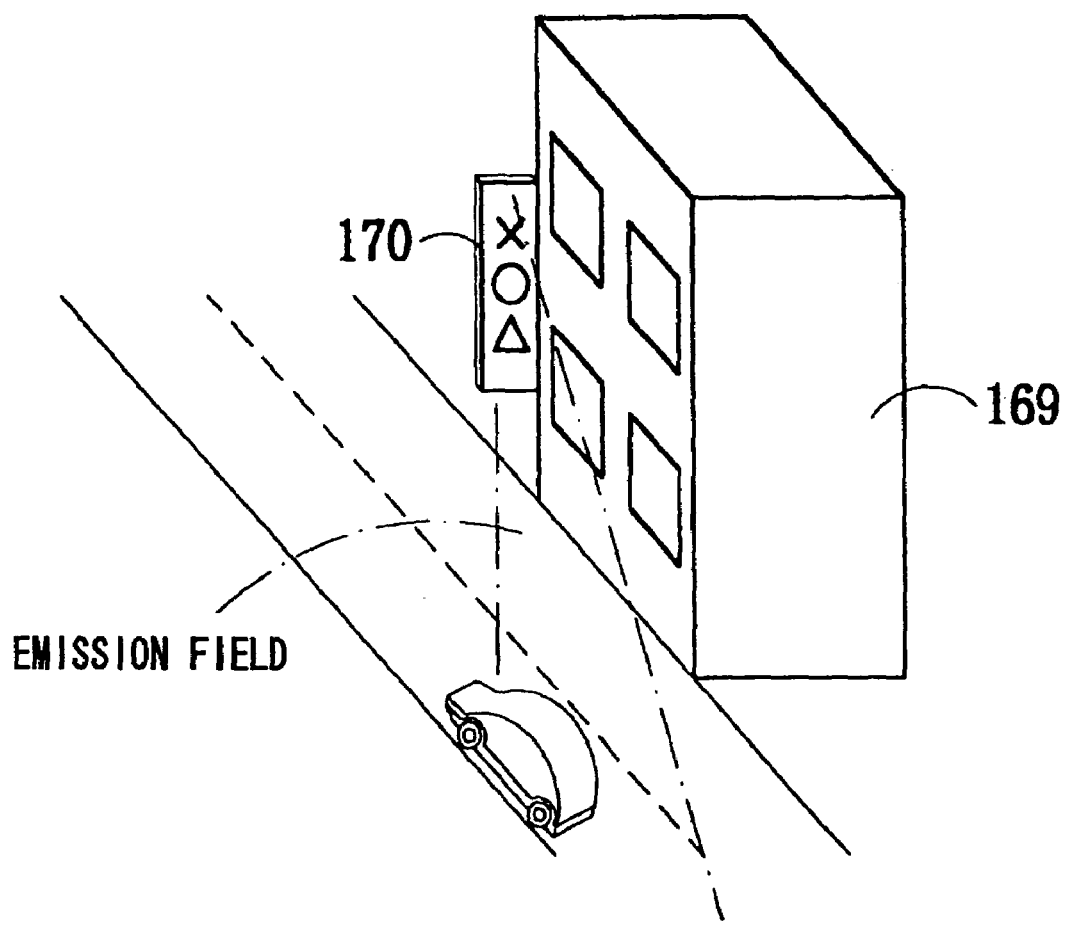
FIG. 98 is a schematic diagram showing an advertisement signboard according to a forty-ninth preferred embodiment of this invention.
Figure 99:
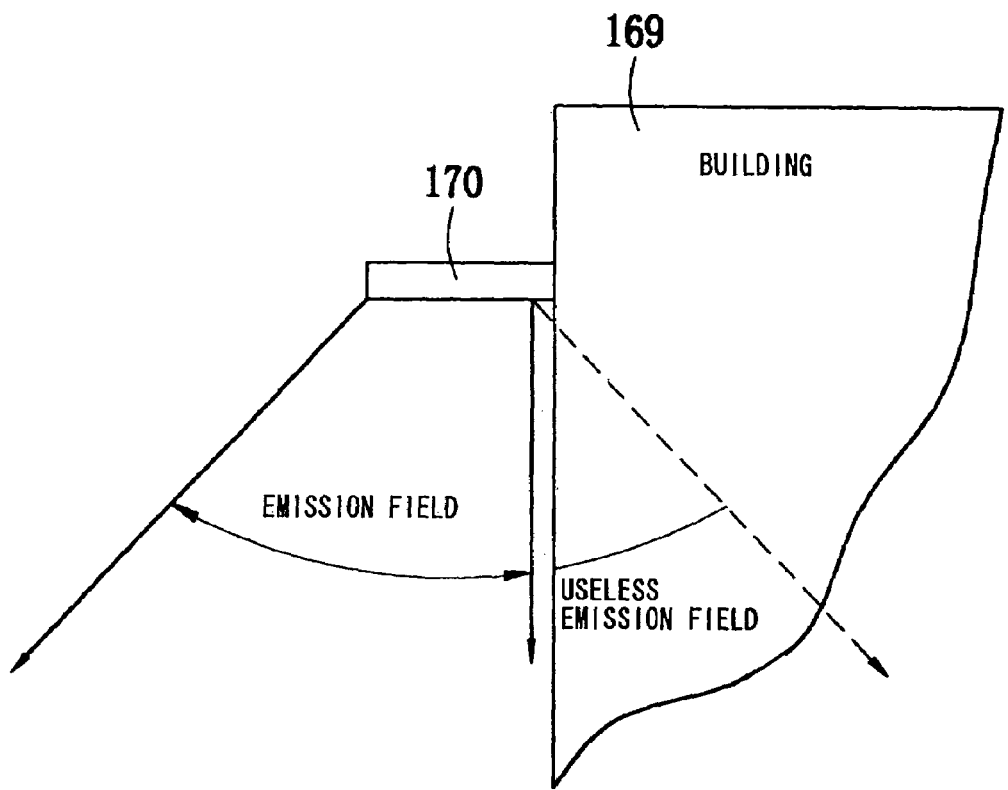
FIG. 99 is a schematic diagram showing an advertisement signboard according to a modification of the forty-ninth preferred embodiment of this invention.

FIG. 98 shows an advertisement signboard 170 employing a light emission source according to this invention as a forty-ninth preferred embodiment. The advertisement signboard (illumination signboard) 170 installed on a wall of a building 169 as shown in FIG. 98 is designed to emit light downward so that the visual performance is good when it is viewed from the ground. When the advertisement signboard 170 is designed not to emit light toward the wall of the building in a horizontal plane as shown in FIG. 99, higher brightness of the advertisement signboard can be performed by decreasing useless light.

FIFTIETH PREFERRED EMBODIMENT

Figure 100:
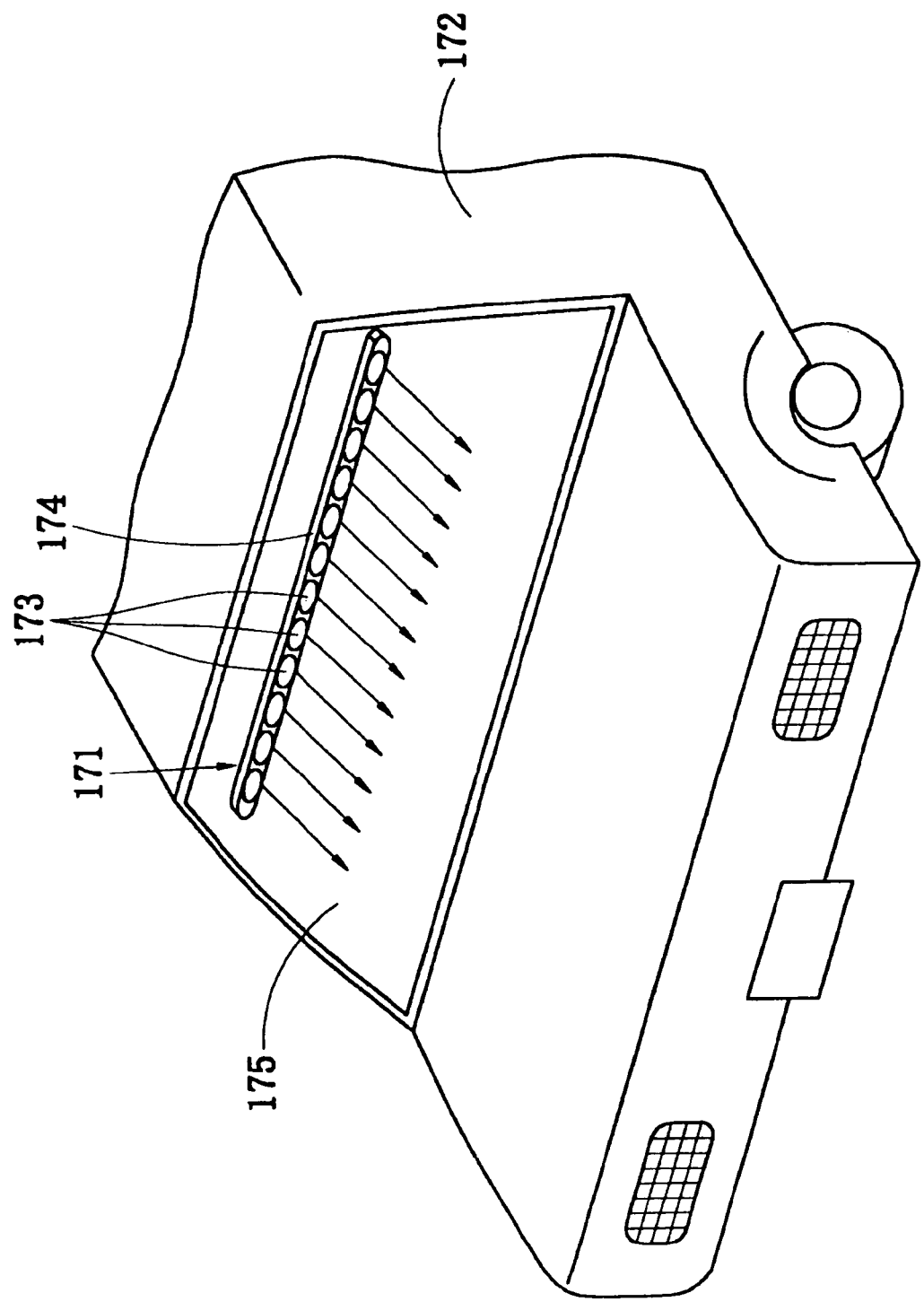
FIG. 100 is a perspective view of a high mount strap lamp according to a fiftieth preferred embodiment of this invention.
Figure 101:
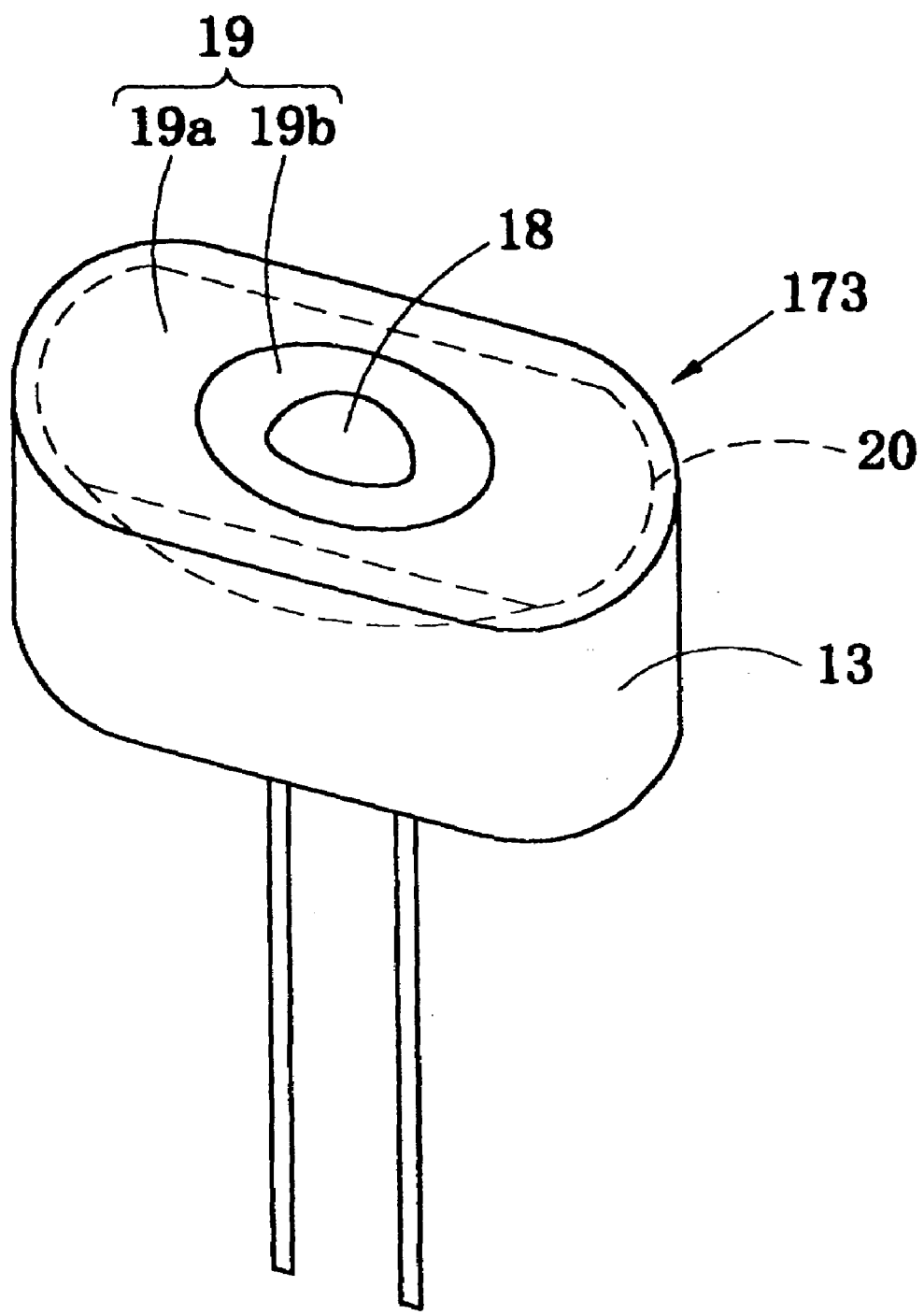
FIG. 101 is a perspective view of a single light emission source employed FIG. 100.

FIG. 100 is a perspective view of a high mount strap lamp 171 employing light emission sources 173 according to a fiftieth preferred embodiment, in which a plurality of light emission devices 173 each having about an ellipse shape as shown in FIG. 101 are aligned in a line and mounted on a laterally long substrate 174.

The light emission source 173 for the high mount strap lamp has a same construction as that of the light emission source 24 as shown in FIGS. 8 to 10, but a disc-shaped light reflecting portion 20 is inserted within a mold resin 13 by bending both ends thereof because the whole configuration of the light emission source has a laterally long front wall such as generally ellipse, oval or rectangle. The light emission sources 173 are mounted on the substrate 174 so that their major axis directions are parallel with a length direction of the substrate.

The high mount strap lamp 171 is installed in an inside of a rear window 175 of a vehicle 172. When a driver of the vehicle 172 steps on a brake pedal, all light emission sources 173 illuminate at once to alarm its following vehicle.

When the high mount strap lamp 171 employs such laterally long light emission sources 173, oblong light can be emitted with good efficiency. In addition, the number of necessary light emission sources 173 may be reduced by making each light emission source 173 laterally long, thereby reducing the manufacturing cost of the high mount strap lamp 171.

Several applications of a light emission source having major and minor axial directions when it is viewed from its front, such as the light emission source in the embodiments as shown in FIGS. 22 to 33 will be described hereinafter.

FIFTY-FIRST PREFERRED EMBODIMENT

Figure 102:
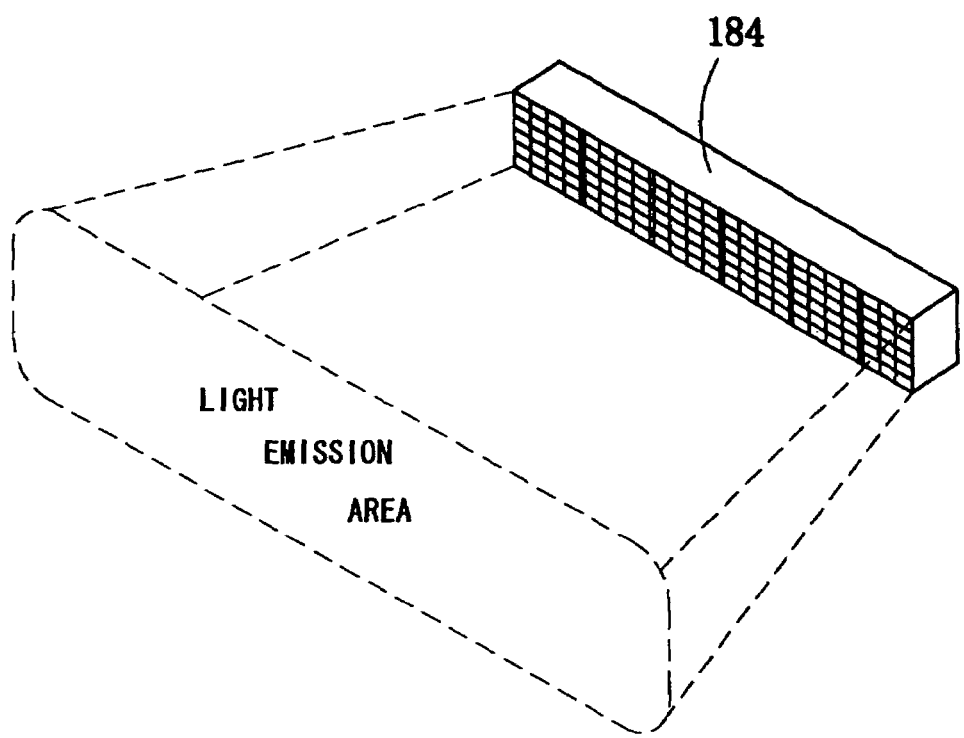
FIG. 102 is a perspective view of a high mount strap lamp according to a fifty-first preferred embodiment of this invention.
Figure 103:
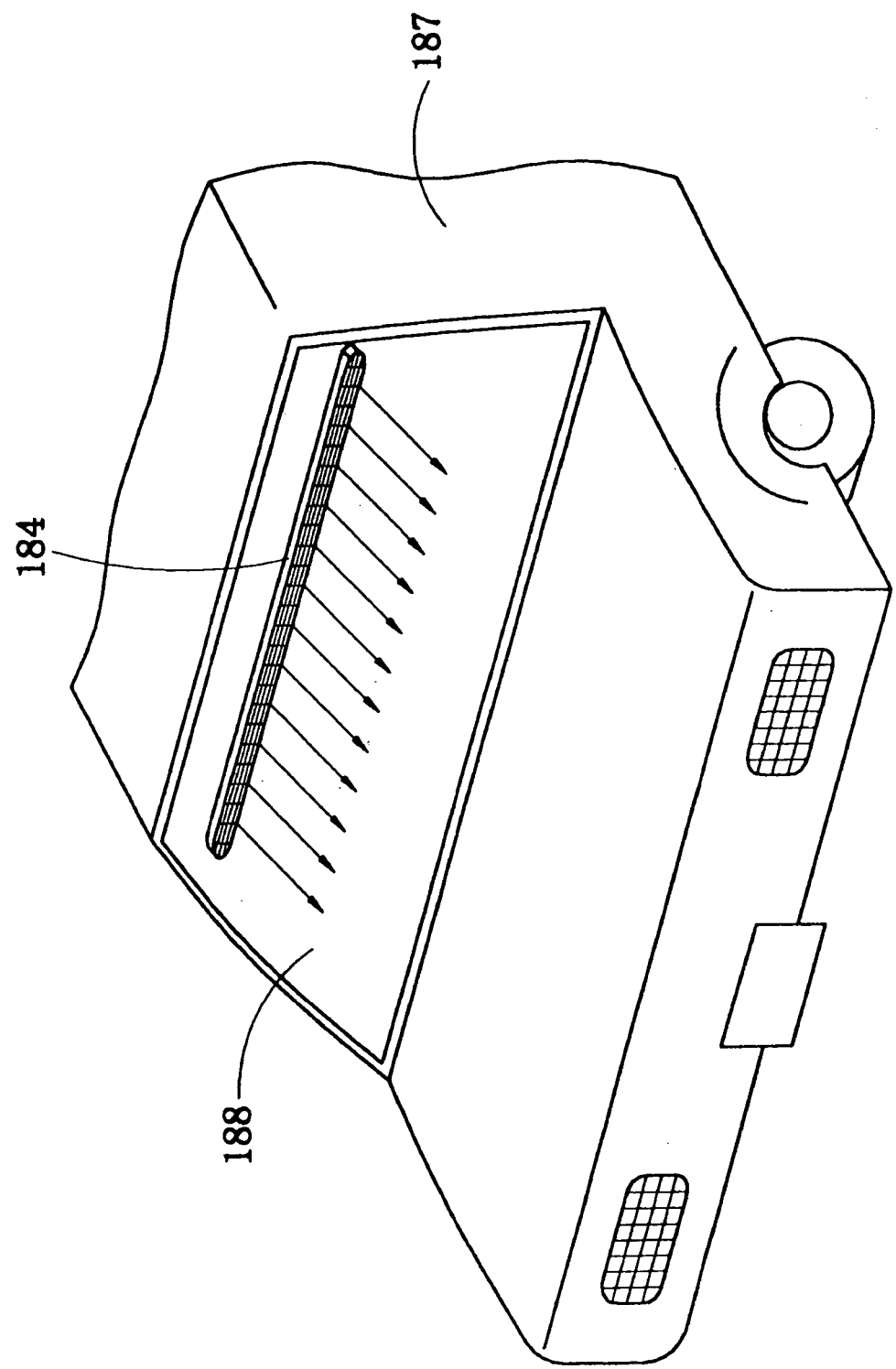
FIG. 103 is a perspective view of the high mount strap lamp of FIG. 102 installed into a car.

FIG. 102 is a perspective view of a high mount strap lamp 184 according to a fifty-first preferred embodiment, in which light emission sources according to this invention are aligned in a line and mounted, and which is installed inside of a rear window 188 of a vehicle 187 so as to illuminate when a driver steps a brake pedal of the vehicle 187. The light emission source composing the high mount strap lamp 184 may employ a light emission source like each of the above-described embodiments, but the light emission source 67 shown in FIG. 41 is preferred.

Figure 105:
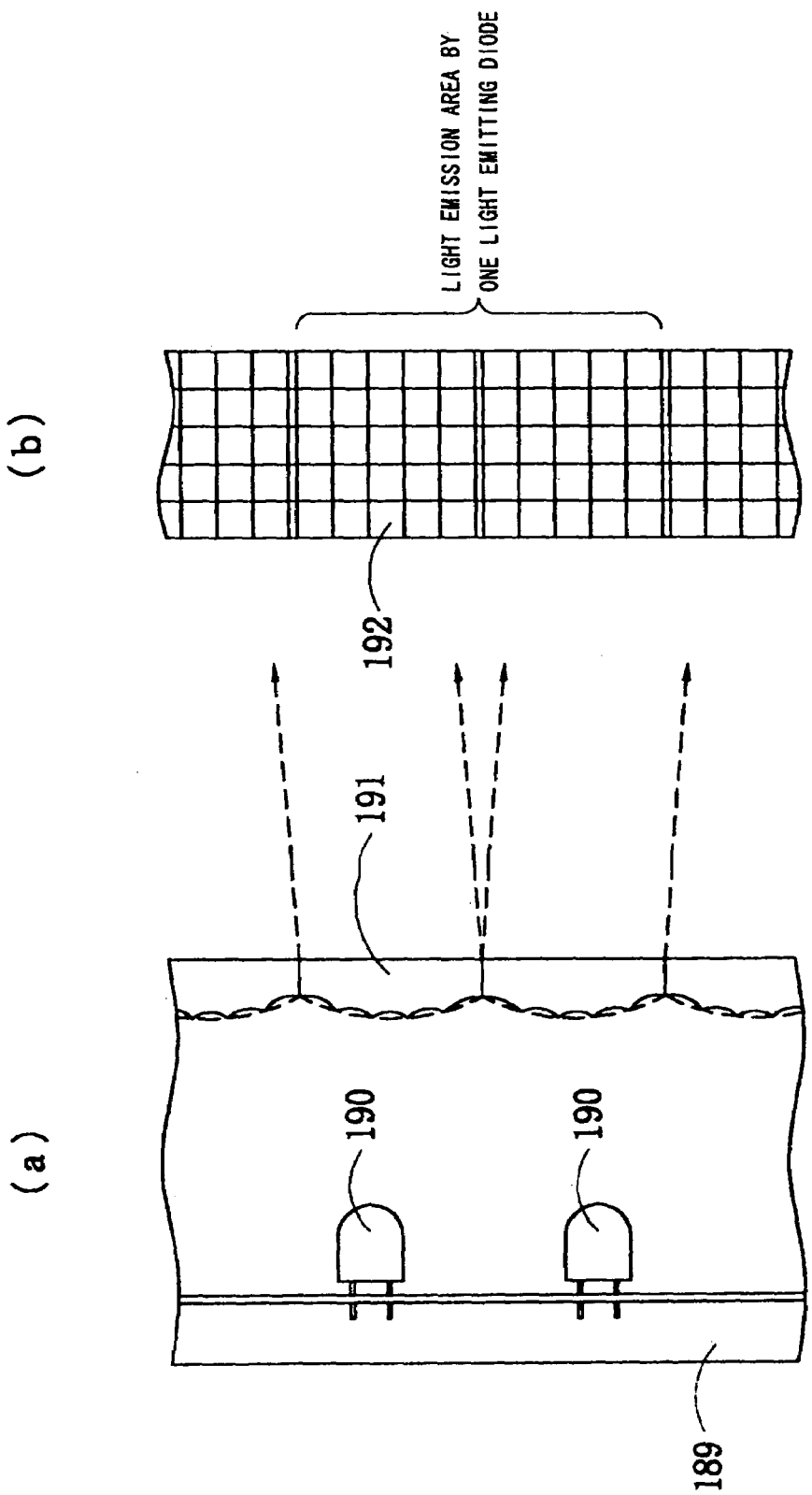
FIG. 105 shows at (a) an enlarged sectional view of a portion of a conventional high mount strap lamp, and at (b) a front view thereof.

As shown in FIG. 105 at (a), a conventional high mount strap lamp 189 generates laterally long light beams by arranging a plurality of light emitting diodes 190 in a line and emitting light thorough a scattering optical lens 191 disposed on a front wall of the lamp. In the conventional high mount strap lamp 189, a single light emitting diode 190 can emit light on a square region shown in FIG. 105 at (b), thereby requiring a lot of light emitting diodes 190.

Figure 104:
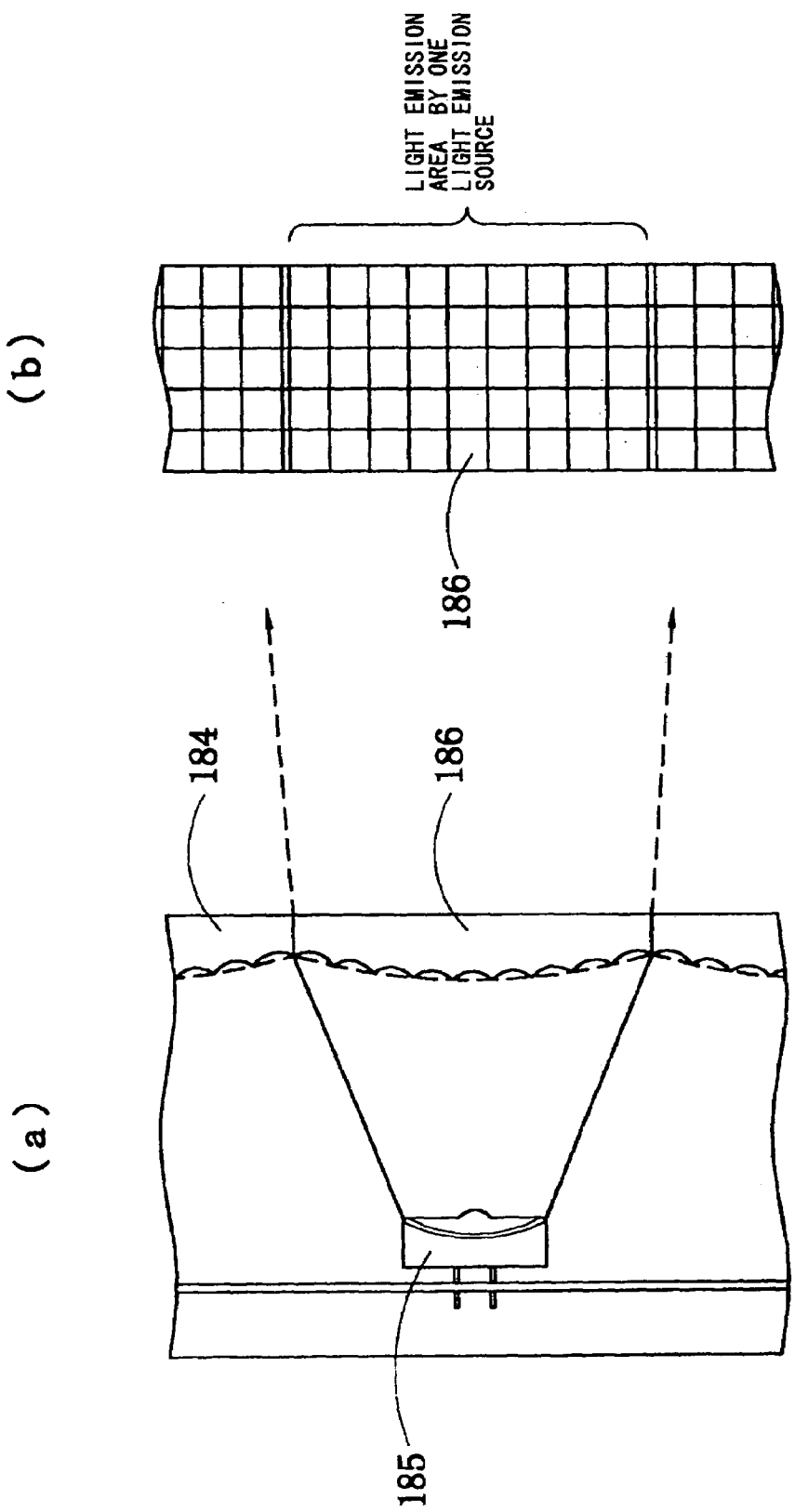
FIG. 104 shows at (a) an enlarged sectional view of a portion of the high mount strap lamp of FIG. 102, and at (b) a front view of the same.

As shown in FIG. 104 at (a), the high mount strap lamp 184 of this invention employs a light emission source 185 emitting beams having the ratio of (major axial length): (minor axial direction)=2:1 and a spreading optical lens 186 disposed in front of the source corresponding to a beam profile of the light emission source 185, so that one light emission source 185 can emit light from two times of emission areas by the conventional light emitting diode 190. Accordingly, the arrangement pitch of light emission sources 185 can be a half of the arrangement pitch of the conventional light emitting diodes 190.

The light emission source 185 of this invention can realize more than two times of the conventional efficiency of light use in comparison with the conventional light emitting diodes 190. When the arrangement pitch is designed to be two times of the conventional light emitting diodes 190, light power emitted by each light emission source 185 becomes two times, and the light power emitted from the high mount strap lamp 184 becomes the same as a conventional lamp. According to the high mount strap lamp 184 employing the light emission sources 185 of this invention, the number of light emission sources can be reduced to half, its assembling becomes easy by reducing the number of components number, and reduction in cost becomes possible largely.

FIFTY-SECOND PREFERRED EMBODIMENT

Figure 106:
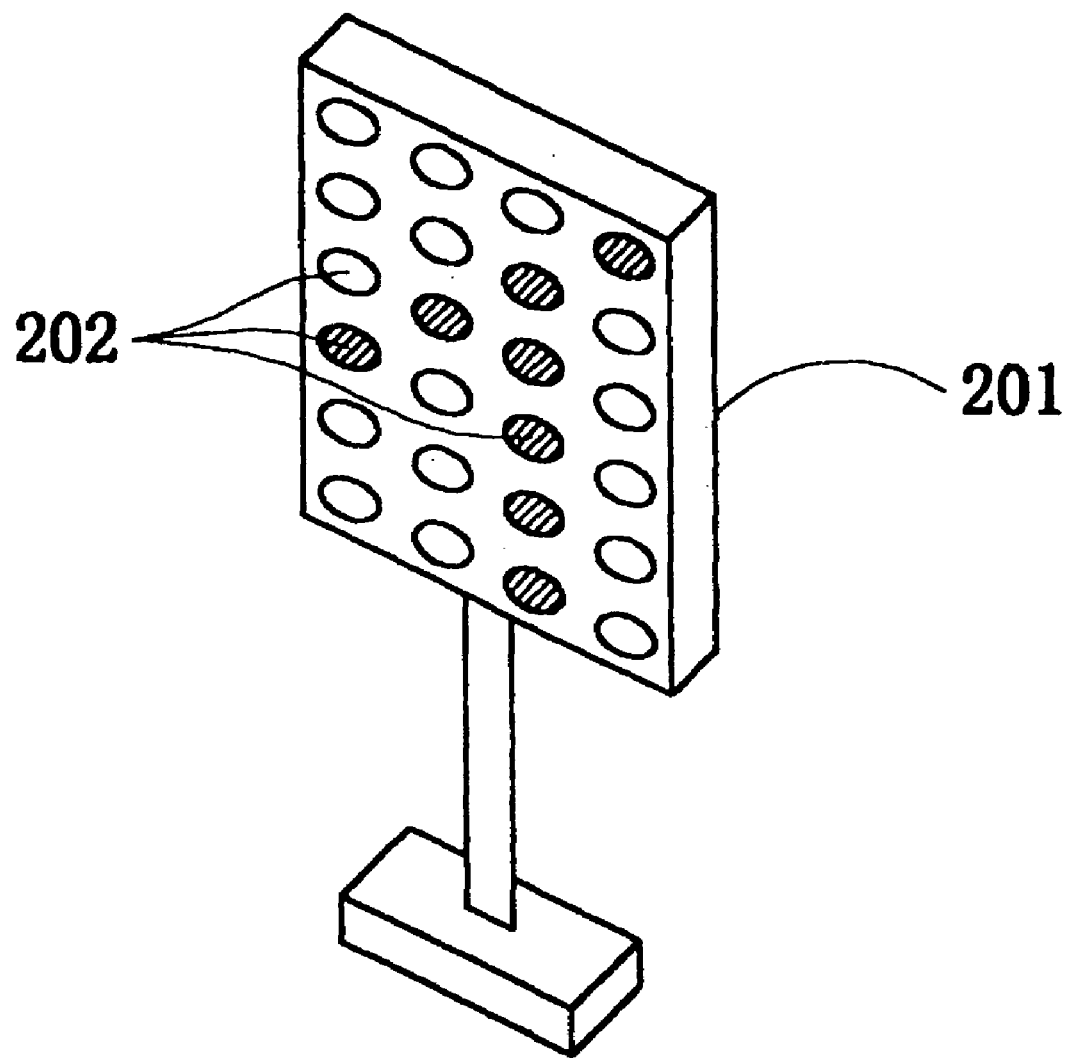
FIG. 106 is a perspective view of a display apparatus according to a fifty-second preferred embodiment of this invention.

FIG. 106 is a perspective view of a display unit 201 employing light emission sources according to a fifty-second preferred embodiment. In the display unit 201, a lot of light emission sources 202 are arranged in a matrix or honeycomb fashion, and each light emission source 202 is arranged so that its major axis direction turns to a horizontal direction. Though FIG. 106 shows a stand shape, the unit may be installed in a wall hanging type or on an external wall of a house.

Figure 107:
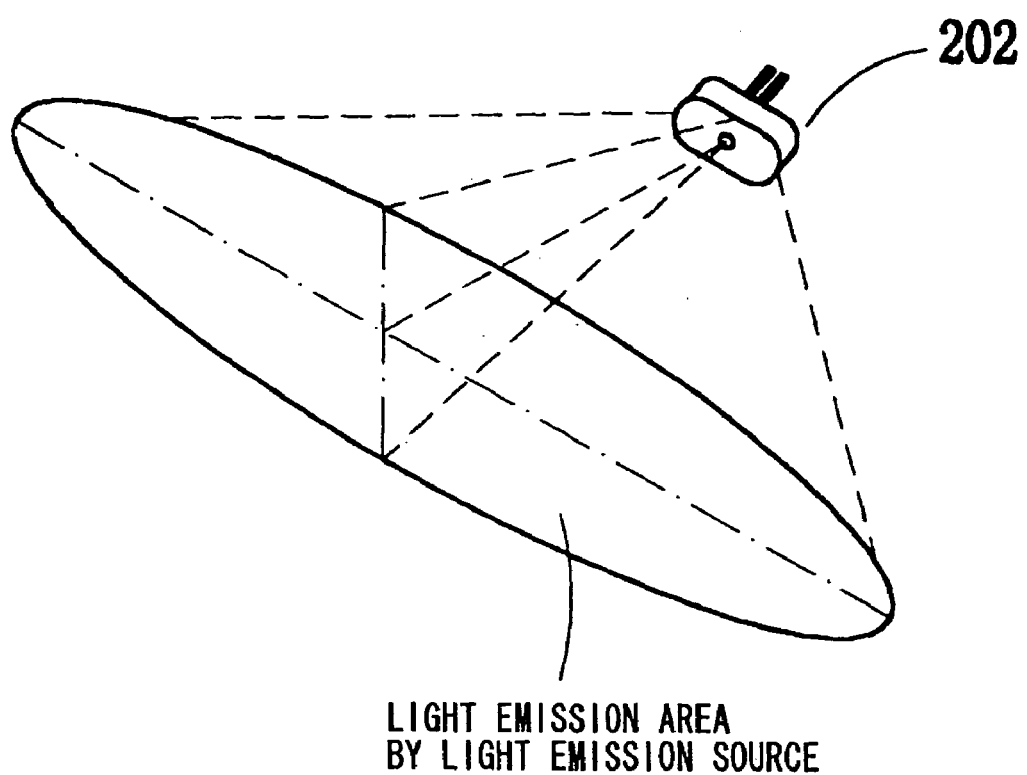
FIG. 107 is a perspective view showing a beam configuration of light emitted from a light emission source employed in the display apparatus of FIG. 106.
Figure 108:
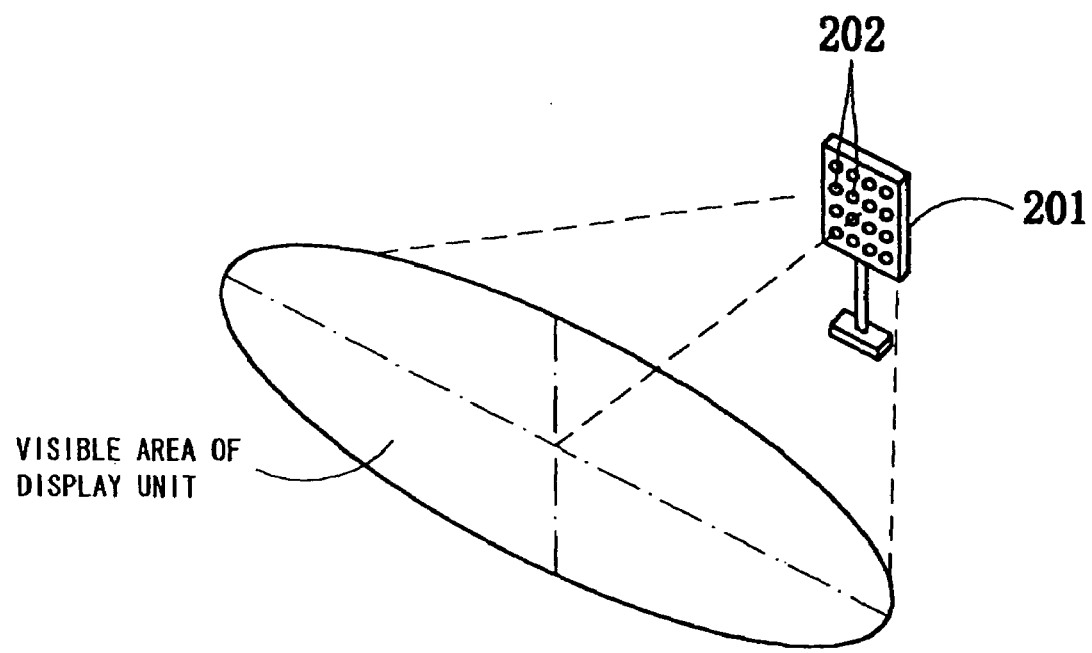
FIG. 108 is a perspective view showing an area where display by the display apparatus of FIG. 106 can be recognized.

In the event of display unit installed in bearing height dimension of order of a person, it is preferable that the display unit can be seen from various angles in a horizontal direction as an angle of beam spread of the display unit. The display unit 201 employs the light emission sources 202 each arranged directing its major axis direction in the horizontal direction, and the light itself emitted form each light emission source 202 has the directivity pattern opened in a transverse direction as shown in FIG. 107, so that the display unit 201 can have a wide directivity pattern in the transverse direction as shown in FIG. 108. Thus, a display unit having a good visual effect can be produced.

Several applications when this invention is applied a light receiver will be described hereinafter.

FIFTY-THIRD PREFERRED EMBODIMENT

Figure 109:
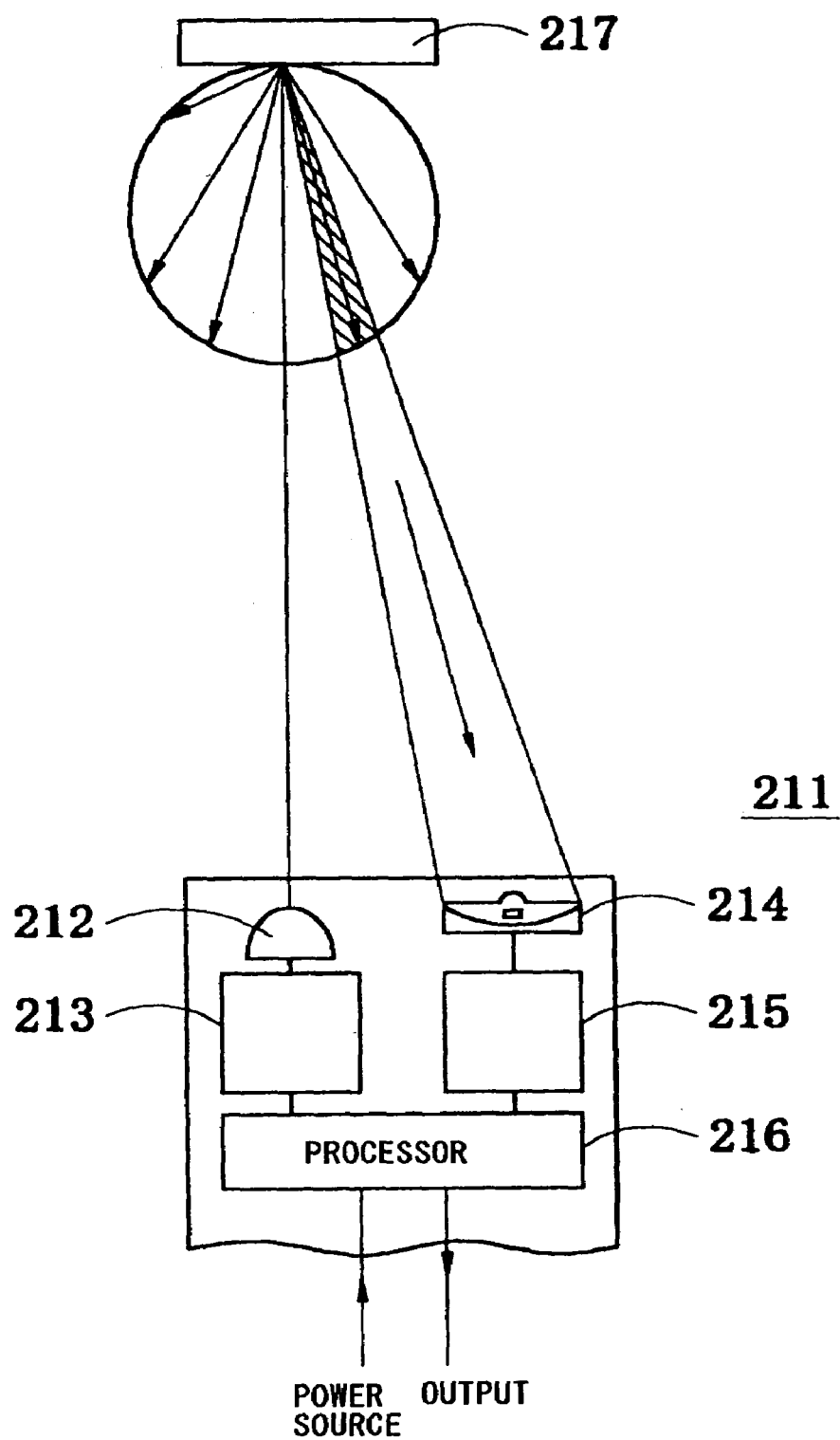
FIG. 109 is a sectional view of a photoelectric sensor according to a fifty-third preferred embodiment of this invention.

FIG. 109 is a schematic view showing a construction a photoelectronic sensor 211 to detect the presence of an object of a diffuse reflection type according to a fifty-third preferred embodiment. The photoelectronic sensor 211 includes a projector 212 employing a light emitting diode, a driving circuit 213 for driving the light emitting diode, a light receiver 214 of this invention (for example, the light receiver shown in FIG. 30 or 31), an amplifier circuit 215 for amplifying an output from the light receiver 214, and a processing circuit 216 for controlling the driving circuit 213 and receiving a light receive signal from the amplifier circuit 215 to do distinction of the presence of the object.

As shown in FIG. 109, when there appears an object 217 in ahead of photoelectronic sensor 211 that diffuses and reflects light and the light emitted from the projector 212 of the photoelectronic sensor 211 strikes against a surface of the object 217, the reflection light in a region shown by oblique lines in the light reflected by the surface of object 217 is received by the light receiver 214, whereby the presence of the object is determined by the processing circuit 216 and a detection signal is produced.

In this photoelectronic sensor 211, detection distance of object is determined by the minimum quantity of incident light (S/N ratio) that can distinguish the reflection light from object 217 from an internal noise of sensor. If light intensity emitted by the projector 212 is the same, the intensity of reflection light from object 217 does not change, but the light receiving efficiency is improved and the quantity of incident light is increased by using the light receiver 214 of this invention, thereby providing room in the detection. By employing this photoelectronic sensor 211, an object in a further distance can be detected and the quantity of incident light becomes big, thereby prolonging the detection distance. For example, the detection distance spreads in generally $\sqrt{2}$ times when the quantity of incident light doubles.

In order to get such an effect, a large optical lens is disposed in front of a light receiver of a conventional photoelectronic sensor, and it is necessary for condensing the reflection light in the region marked by the obliquelines shown in FIG. 109 to be received by a small light receiver. The photoelectronic sensor 211 of this invention, however, can be realized without employing lens, so that the light receiver 214 is thinned in thickness, the photoelectronic sensor 211 is miniaturized, and the number of components is reduced, thereby reducing variation of light receiving system and manufacturing cost of the photoelectronic sensor 211.

This photoelectronic sensor is not limited to this reflection type, and similar effect can be performed in a transmission type photoelectronic sensor. The detection also is not limited to sensing the presence of an object, but can be applied to detecting a distance (analog quantity) to an object.

FIFTY-FOURTH PREFERRED EMBODIMENT

Figure 110:
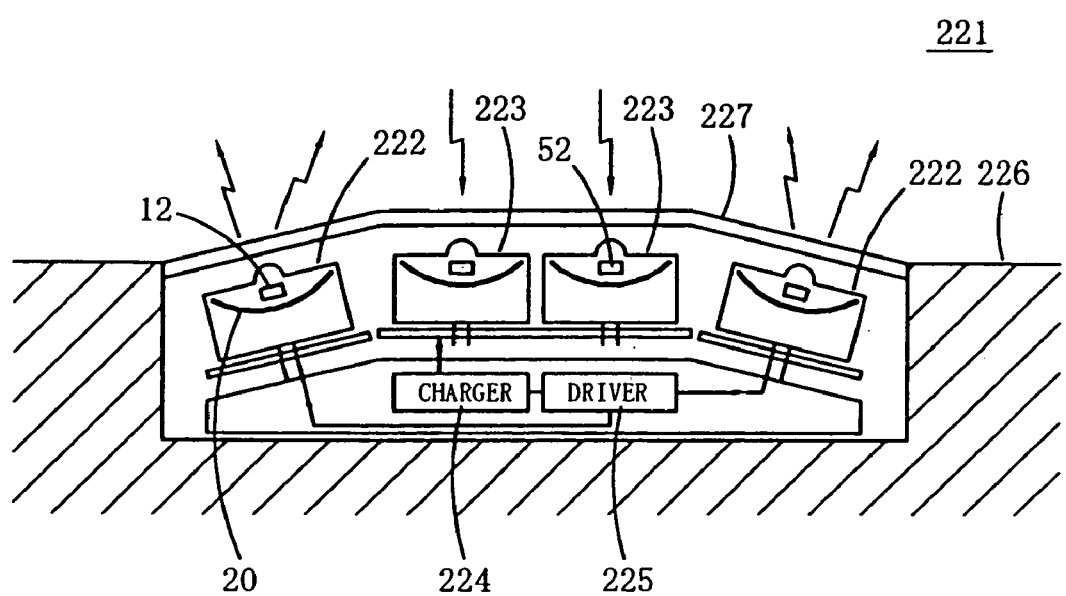
FIG. 110 is a sectional view of a road tack according to a fifty-fourth preferred embodiment of this invention.

FIG. 110 is a sectional view of a road tack 221 according a fifty-fourth preferred embodiment. Generally a road tack is buried in road in a safety zone or crossover of road, but a conventional road tack has characteristics only reflecting back a headlight of motor.

The road tack 221 shown in FIG. 110 houses light emission sources 2222 of this invention, light receivers 223 of this invention a rechargeable battery 224, and a drive circuit 225, a surface of which is covered by a transparent cover 227. Solar light is received by the light receivers 223 in the daytime to charge the rechargeable battery 224, and the light emission source 222 is activated by the drive circuit 225 by using an electric power of the rechargeable batter 224 in the nighttime.

According to this road tack 221, the rechargeable battery 224 can effectively be charged by employing the light receivers 223 of this invention in the daytime. The light receiver 223 can be thinned in thickness, so that the road tack 221 also becomes too thin and embedding in the road 226 is eased.

This embodiment is described about a road tack, but may be widely applied to a self light generator in which a light unit is activated in the nighttime by using the electric energy charged in a rechargeable battery by a light receiver in the daytime, such as a delineator or a sight line guidance light other than the road tack.

FIFTY-FIFTH PREFERRED EMBODIMENT

Figure 114:
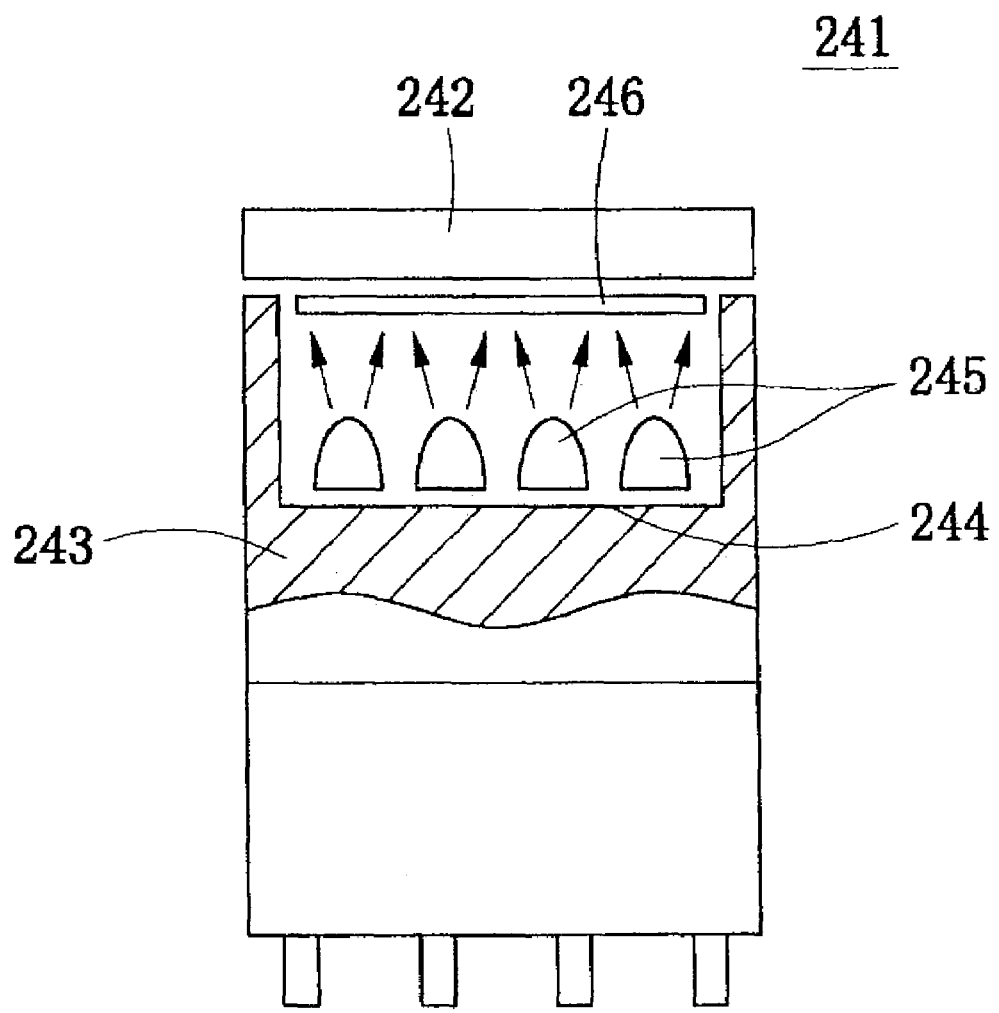
FIG. 114 is a schematic sectional view of a conventional illumination-type switch.

An illuminated-type switch will be described hereinafter as an application of a light emission source employing an optical module. As shown in FIG. 114, a conventional illuminated-type switch 241 includes a plurality of LEDs 245 installed within a recess 244 disposed in a light emission unit 243 on a back side of a transparent or semitransparent cap 242 which serves as a push switch, and a diffusing plate 246 above the same. As the cap 242 is depressed and the switch is turned on, the LED 245 is activated to illuminate the cap 242 in whole by the diffusing plate 246. In order to illuminate the cap 242 in whole in a large area, the illuminated-type switch 241 is necessary to have the plural LEDs 245 and the diffusing plate 246, whereby the number of components becomes large, and the switch is costly, large power consumptive, and bulky.

Figure 111:
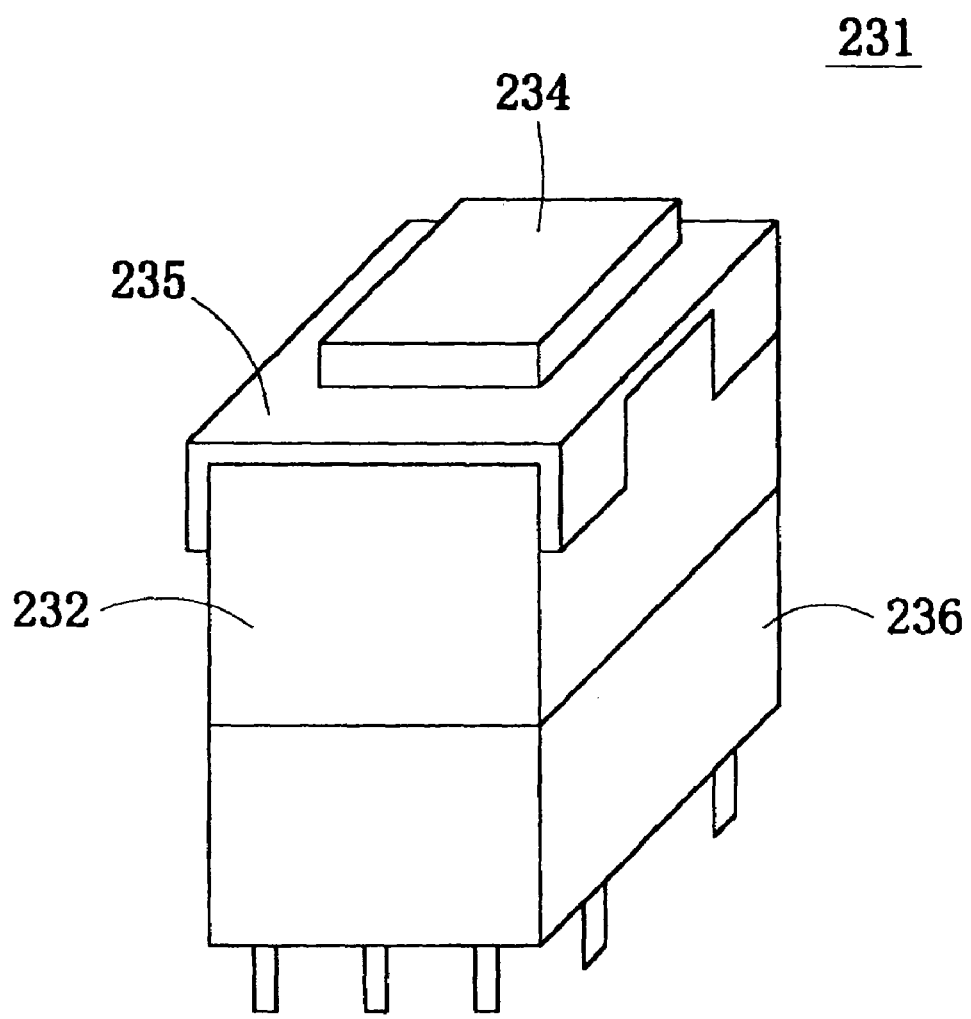
FIG. 111 is a perspective view of an illumination-type switch according to a fifty-fifth preferred embodiment of this invention.
Figure 112:
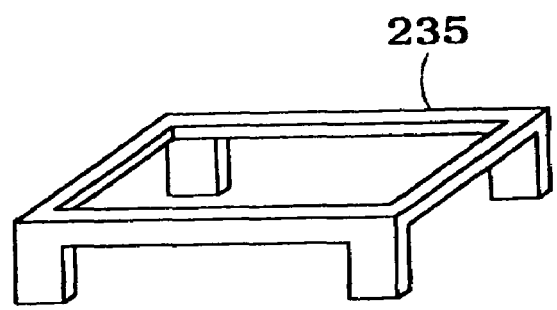
FIG. 112 is a disassembled perspective view of the illumination-type switch according of FIG. 111.
Figure 112:
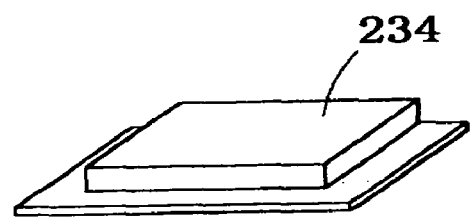
Figure 112:
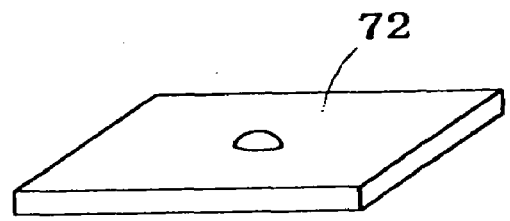
Figure 112:
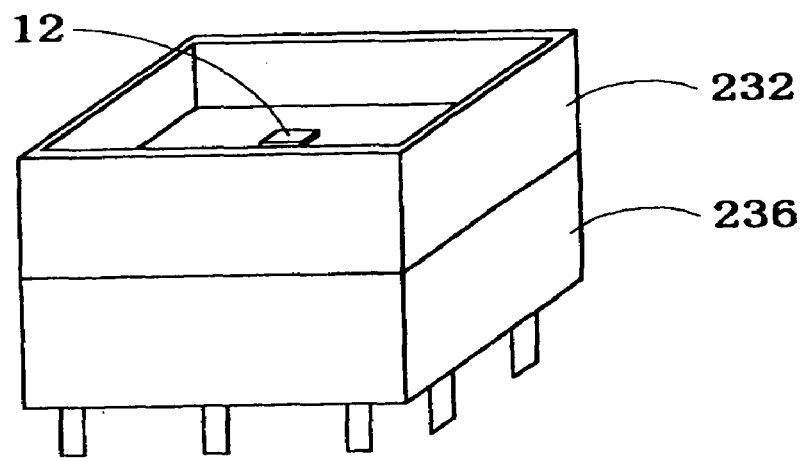
Figure 113:
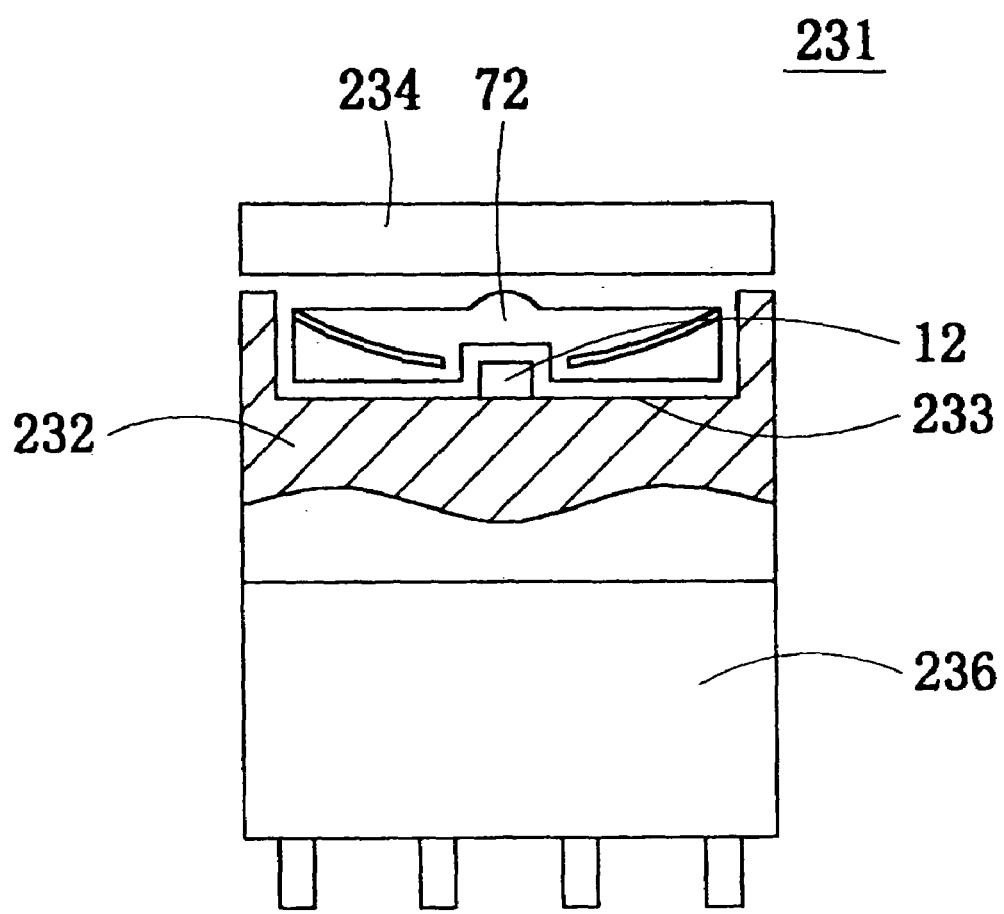
FIG. 113 is a schematic sectional view of the illumination-type switch according of FIG. 111.

FIG. 111 shows a schematic perspective view of an illuminated-type switch 231, FIG. 112 shows its perspective disassembled view, and FIG. 113 shows a generally sectional view of the switch, according to a fifty-fifth preferred embodiment. In this illuminated-type switch 231, one light emitter 12 is installed within a recess 233 disposed on an upper wall of a light emission unit 232, and an optical module 72 as shown in FIG. 47 is put to cover the light emitter 12. Above the recess 233, there is arranged a transparent or semitransparent cap 234 (a cut pattern may be formed in the rear face) which is elastically pushed upward by a spring (not shown) and held by a cap holder 235. The light emission unit 232 is mounted on a top wall of a switch body 236.

In this illuminated-type switch 231, when the cap 234 serving as a push switch is depressed to be turned on, the light emitted from the light emitter 12 is spread over the optical module 72 by the optical module 72 to radiate the cap 234 for illuminating the cap 234 in whole.

Therefore, according to such illuminated-type switch 231, the number of components and cost can be decreased, thereby reducing the power consumption in lighting, and enabling miniaturization.

In a self light generator, such as the solar cell (FIG. 33) or the road track (FIG. 110), or a light emission source of FIG. 6, a conventional photo detector or a photoelectric transducer can be combined with the optical module shown in FIGS. 46 to 49 and 50 to 56.

INDUSTRIAL APPLICABILITY

The present invention is used to a light source for emitting light, a light receiver which external light enters into, a self light generating apparatus for emitting light and receiving light (which may be emitted from the self light generating apparatus or other apparatus) etc. Further, it is applied to a display device using light, an advertising tower, a road tack, a solar cell.

The invention claimed is:

1. A light emission source comprising: a reflecting member; a resin layer disposed in proximity of a light reflecting surface of the reflecting member; and a light-emitting element to emit light rays toward the resin layer, wherein a light-outgoing surface of the resin layer has a direct light-outgoing region and total reflection region, wherein the direct light-outgoing region passes light rays emitted from the light-emitting element therethrough so as to emerge out of the resin layer, wherein the total reflection region reflects the light rays emitted from the light emitting element so as to be directed to the reflecting member and passes the light rays reflected by the reflecting member therethrough so as to emerge out of the resin layer, and wherein dimensions of the total reflecting region is larger than that of the direct light-outgoing region, wherein a portion of a boundary between the total reflection region and the direct light-outgoing region is inclined in a direction opposite to a direction that the light rays emerge with respect to a plane perpendicular to an optical axis of the light-emitting element.

2. A light emission source comprising: a reflecting member; a resin layer disposed in proximity of a light reflecting surface of the reflecting member; and a light-emitting element to emit light rays toward the resin layer, wherein a light-outgoing surface of the resin layer has a direct light-outgoing region and total reflection region, wherein the direct light-outgoing region passes light rays emitted from the light-emitting element therethrough so as to emerge out of the resin layer, wherein the total reflection region reflects the light rays emitted from the light emitting element so as to be directed to the reflecting member and passes the light rays reflected by the reflecting member therethrough so as to emerge out of the resin layer, and wherein dimensions of the total reflecting region is larger than that of the direct light-outgoing region, wherein a portion of the reflecting member to which the light rays reflected by the total reflection region reaches is configured to be a concave lens having a focus positioned in proximity of a mirror image of the light-emitting element with respect to the total reflection region.

3. A light emission source comprising: a reflecting member; a resin layer disposed in proximity of a light reflecting surface of the reflecting member; and a light-emitting element to emit light rays toward the resin layer, wherein a light-outgoing surface of the resin layer has a direct light-outgoing region and total reflection region, wherein the direct light-outgoing region passes light rays emitted from the light-emitting element therethrough so as to emerge out of the resin layer, wherein the total reflection region reflects the light rays emitted from the light emitting element so as to be directed to the reflecting member and passes the light rays reflected by the reflecting member therethrough so as to emerge out of the resin layer, and wherein dimensions of the total reflecting region is larger than that of the direct light-outgoing region, wherein distribution ranges of curvature of the light reflecting surface of the reflecting member are different in any two of cross-sectional areas that pass through an axis of the light-emitting element and that are orthogonal to each other.

4. A light emission source comprising: a reflecting member; a resin layer disposed in proximity of a light reflecting surface of the reflecting member; and a light-emitting element to emit light rays toward the resin layer, wherein a light-outgoing surface of the resin layer has a direct light-outgoing region and total reflection region, wherein the direct light-outgoing region passes light rays emitted from the light-emitting element therethrough so as to emerge out of the resin layer, wherein the total reflection region reflects the light rays emitted from the light emitting element so as to be directed to the reflecting member and passes the light rays reflected by the reflecting member therethrough so as to emerge out of the resin layer, and wherein dimensions of the total reflecting region is larger than that of the direct light-outgoing region, wherein an optical lens is disposed in front of the light-emitting element, and wherein distribution ranges of curvature of a surface of the optical lens are different in any two of cross-sectional areas that pass through an axis of the light-emitting element and that are orthogonal to each other.

5. A light emission source comprising: a reflecting member; a resin layer disposed in proximity of a light reflecting surface of the reflecting member; and a light-emitting element to emit light rays toward the resin layer, wherein a light-outgoing surface of the resin layer has a direct light-outgoing region and total reflection region, wherein the direct light-outgoing region passes light rays emitted from the light-emitting element therethrough so as to emerge out of the resin layer, wherein the total reflection region reflects the light rays emitted from the light emitting element so as to be directed to the reflecting member and passes the light rays reflected by the reflecting member therethrough so as to emerge out of the resin layer, and wherein dimensions of the total reflecting region is larger than that of the direct light-outgoing region, wherein the light rays reflected by the reflecting member are output in a direction inclined with respect to an optical axis of the light-emitting element.

6. A light emission source comprising: a reflecting member; a resin layer disposed in proximity of a light reflecting surface of the reflecting member; and a light-emitting element to emit light rays toward the resin layer, wherein a light-outgoing surface of the resin layer has a direct light-outgoing region and total reflection region, wherein the direct light-outgoing region passes light rays emitted from the light-emitting element therethrough so as to emerge out of the resin layer, wherein the total reflection region reflects the light rays emitted from the light emitting element so as to be directed to the reflecting member and passes the light rays reflected by the reflecting member therethrough so as to emerge out of the resin layer, and wherein dimensions of the total reflecting region is larger than that of the direct light-outgoing region, wherein a portion of the reflecting member to which the light rays reflected by the total reflection region reaches is configured to be a concave lens, and wherein the light-emitting element is disposed to offset from a mirror image corresponding to a focus of the concave lens with respect to the total reflection region.

7. A light emission source comprising: a reflecting member; a resin layer disposed in proximity of a light reflecting surface of the reflecting member; and a light-emitting element to emit light rays toward the resin layer, wherein a light-outgoing surface of the resin layer has a direct light-outgoing region and total reflection region, wherein the direct light-outgoing region passes light rays emitted from the light-emitting element therethrough so as to emerge out of the resin layer, wherein the total reflection region reflects the light rays emitted from the light emitting element so as to be directed to the reflecting member and passes the light rays reflected by the reflecting member therethrough so as to emerge out of the resin layer, and wherein dimensions of the total reflecting region is larger than that of the direct light-outgoing region, wherein a portion of the reflecting member abuts an outer portion of the resin layer that serves as the total reflection region.

* * * * *